US011066296B1

(12) United States Patent
Uz et al.

(10) Patent No.: US 11,066,296 B1
(45) Date of Patent: Jul. 20, 2021

(54) METHODS, APPARATUS, AND SYSTEMS FOR FABRICATING SOLUTION-BASED CONDUCTIVE 2D AND 3D ELECTRONIC CIRCUITS

(71) Applicant: Iowa State University Research Foundation, Inc., Ames, IA (US)

(72) Inventors: Metin Uz, Ames, IA (US); Surya Mallapragada, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 16/547,239

(22) Filed: Aug. 21, 2019

Related U.S. Application Data

(60) Provisional application No. 62/720,693, filed on Aug. 21, 2018.

(51) Int. Cl.
*B81C 1/00* (2006.01)
*B81B 3/00* (2006.01)
*B81C 99/00* (2010.01)

(52) U.S. Cl.
CPC ......... *B81C 1/0019* (2013.01); *B81B 3/0097* (2013.01); *B81C 1/00071* (2013.01); *B81C 99/0025* (2013.01); *B81B 2203/0338* (2013.01)

(58) Field of Classification Search
CPC .............. B81C 1/0019; B81C 1/00071; B81C 99/0025; B81B 1/0097; B81B 2203/0338
See application file for complete search history.

(56) References Cited

U.S. PATENT DOCUMENTS 8,921,473 B1 * 12/2014 Hyman ................... C08K 3/04
524/445
9,112,272 B2   8/2015 Finn et al.
(Continued)

FOREIGN PATENT DOCUMENTS

WO        2017040947 A1    3/2017

OTHER PUBLICATIONS

Mahajan et al., "A Self-Aligned Strategy for Printed Electronics: Exploiting Capillary Flow on Microstructured Plastic Surfaces", Adv. Electron. Mater., 9 pages, 2015.
(Continued)

*Primary Examiner* — Zandra V Smith
*Assistant Examiner* — Andre C Stevenson
(74) *Attorney, Agent, or Firm* — McKee, Voorhees & Sease, PLC

(57) ABSTRACT

This work develops a novel microfluidic method to fabricate conductive graphene-based 3D micro-electronic circuits on any solid substrate including, Teflon, Delrin, silicon wafer, glass, metal or biodegradable/non-biodegradable polymer-based, 3D microstructured, flexible films. It was demonstrated that this novel method can be universally applied to many different natural or synthetic polymer-based films or any other solid substrates with proper pattern to create graphene-based conductive electronic circuits. This approach also enables fabrication of 3D circuits of flexible electronic films or solid substrates. It is a green process preventing the need for expensive and harsh postprocessing requirements for other fabrication methods such as ink-jet printing or photolithography. We reported that it is possible to fill the pattern channels with different dimensions as low as 10×10 μm. The graphene nanoplatelet solution with a concentration of 60 mg/mL in 70% ethanol, pre-annealed at 75° C. for 3 h, provided ~0.5-2 kOhm resistance. The filling
(Continued)

of the pattern channels with this solution at a flow rate of 100 µL/min created a continuous conductive graphene pattern on flexible polymeric films. The amount of graphene used to coat 1 cm² of area is estimated as ~10 µg. A second method regarding the transfer of graphene material-based circuits with small features size (5 µm depth, 10 µm width) from any solid surface to flexible polymeric films via polymer solvent casting approach was demonstrated. This method is applicable to any natural/synthetic polymer and their respective organic/inorganic solvents.

32 Claims, 119 Drawing Sheets
(103 of 119 Drawing Sheet(s) Filed in Color)

(56) References Cited

U.S. PATENT DOCUMENTS

| | | | | |
|---|---|---|---|---|
| 2008/0004743 | A1* | 1/2008 | Goers | B24B 53/017 |
| | | | | 700/121 |
| 2010/0108959 | A1* | 5/2010 | Carson | C09K 19/02 |
| | | | | 252/585 |
| 2015/0315026 | A1* | 11/2015 | Cheng | C01B 32/194 |
| | | | | 423/460 |
| 2016/0009021 | A1* | 1/2016 | Okada | B29C 43/021 |
| | | | | 264/40.1 |
| 2018/0128823 | A1* | 5/2018 | Lee | G01N 27/227 |
| 2020/0282591 | A1* | 9/2020 | Hu | B27K 3/34 |

OTHER PUBLICATIONS

Das et al., "3D nanostructured inkjet printed graphene via UV-pulsed laser irradiation enables paper-based electronics and electrochemical devices", Nanoscale, vol. 8, pp. 15870-15879, published Jul. 12, 2016.

Das et al., "Superhydrophobic inkjet printed flexible graphene circuits via direct-pulsed laser writing", Nanoscale, vol. 9, No. 48, pp. 19058-19065, published Oct. 30, 2017.

Han et al., "Multiscale nanowire-microfluidic hybrid strain sensors with high sensitivity and stretchability", Flexible Electronics, vol. 16, 10 pages, published Jun. 4, 2018.

Jung et al., "High-performance green flexible electronics based on biodegradable cellulose nanofibril paper", Nature Communications, 11 pages, published May 26, 2015.

Najafabadi et al., "Biodegradable Nanofibrous Polymeric Substrates for Generating Elastic and Flexible Electronics", Adv. Mater., vol. 26, pp. 5823-5830, 2014.

Oren et al., "High-Resolution Patterning and Transferring of Graphene-Based Nanomaterials onto Tape toward Roll-to-Roll Production of Tape-Based Wearable Sensors", Adv. Mater. Technol., vol. 2, 14 pages, 2017.

* cited by examiner

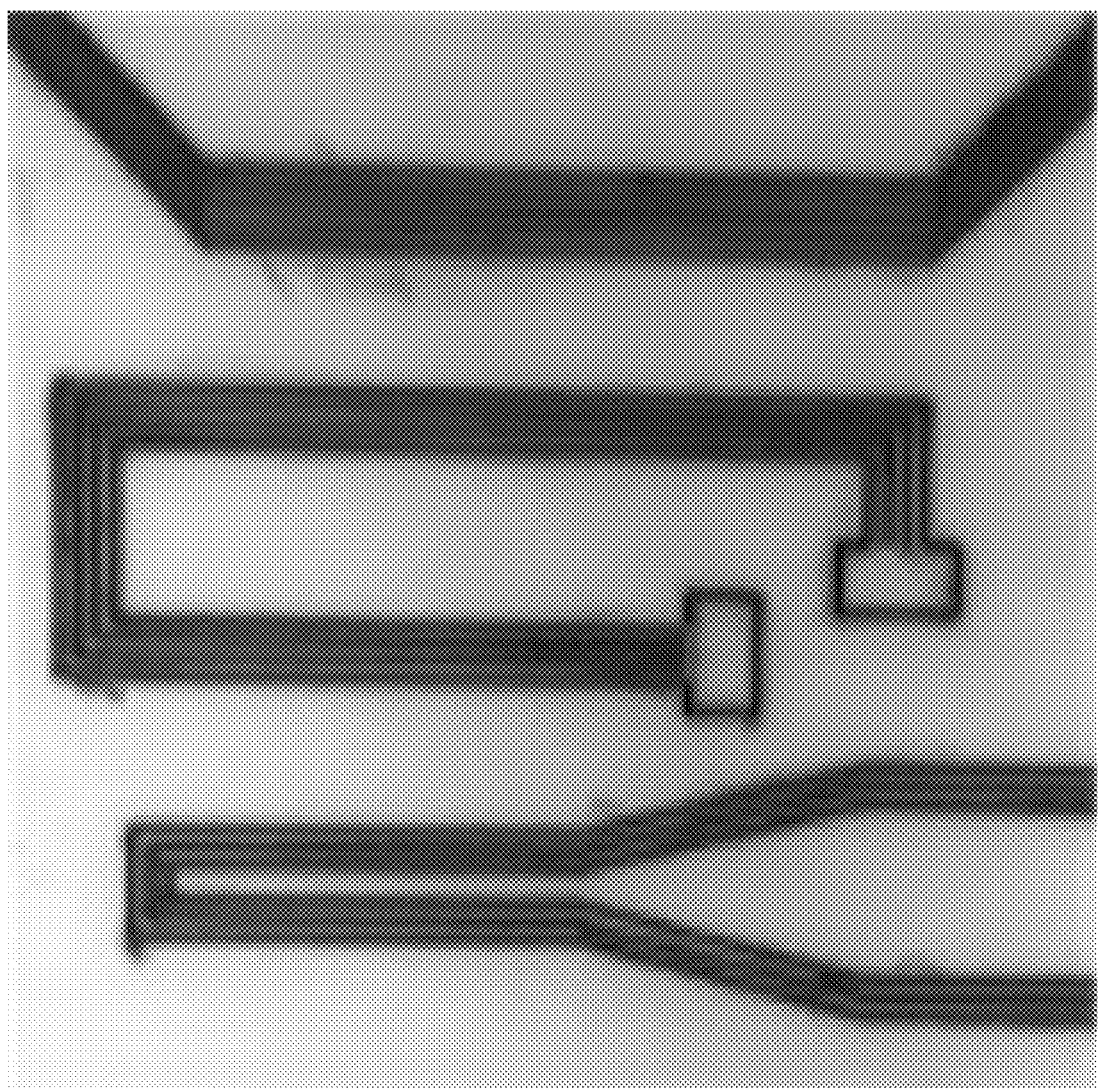

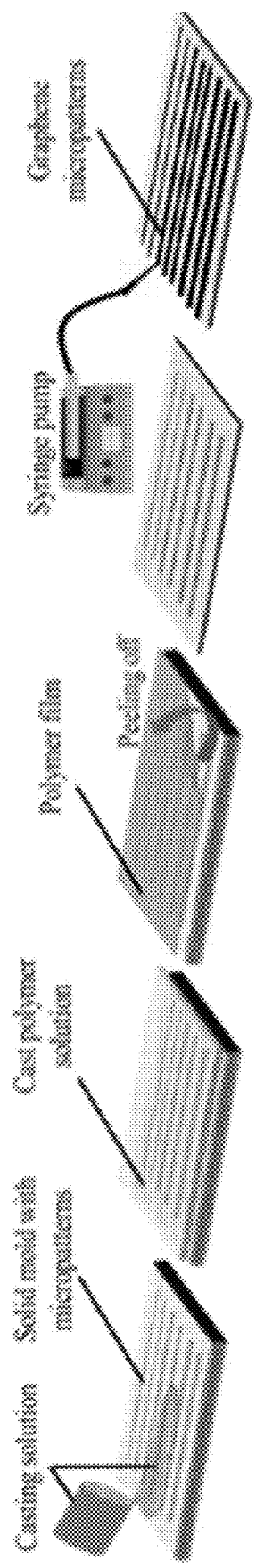

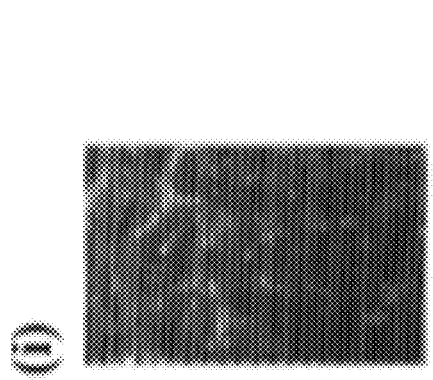
FIGURE 1I
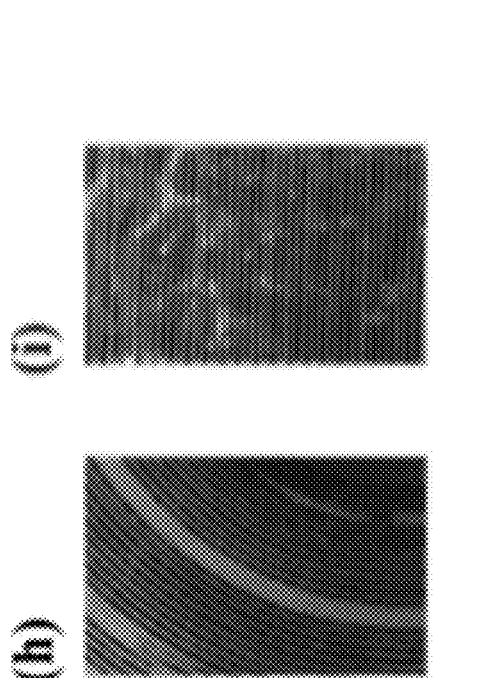
FIGURE 1H
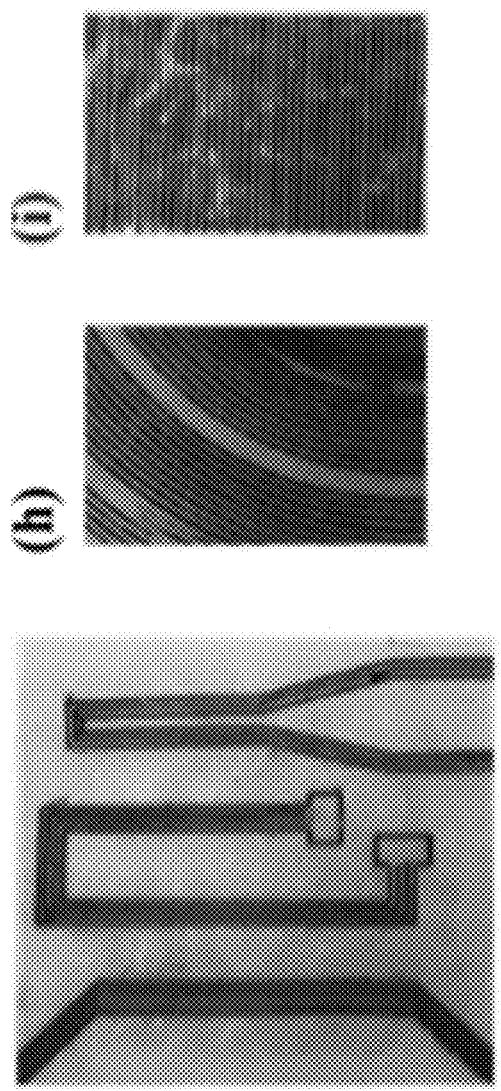
FIGURE 1G
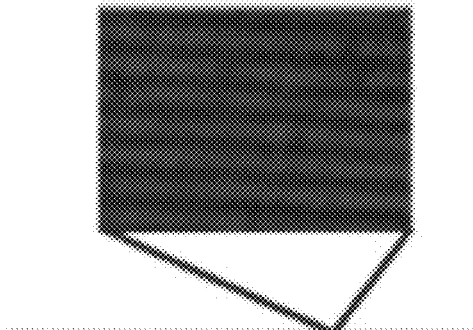
FIGURE 1L
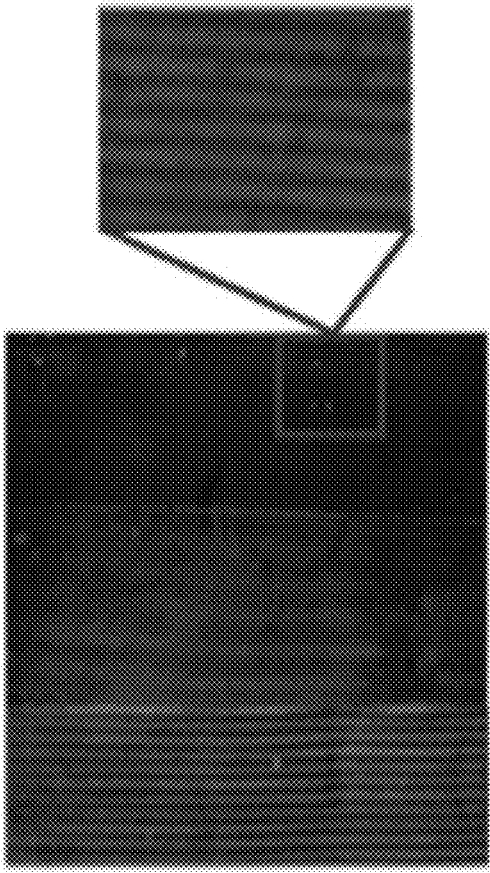
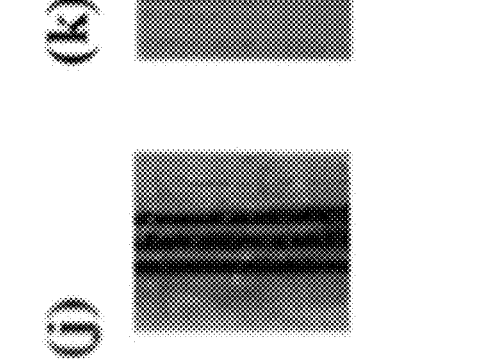
FIGURE 1J   FIGURE 1K

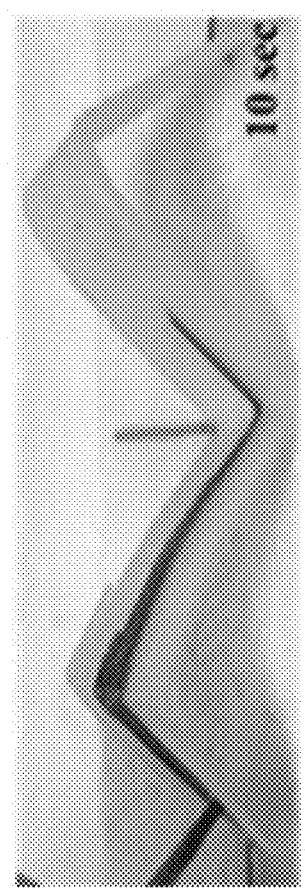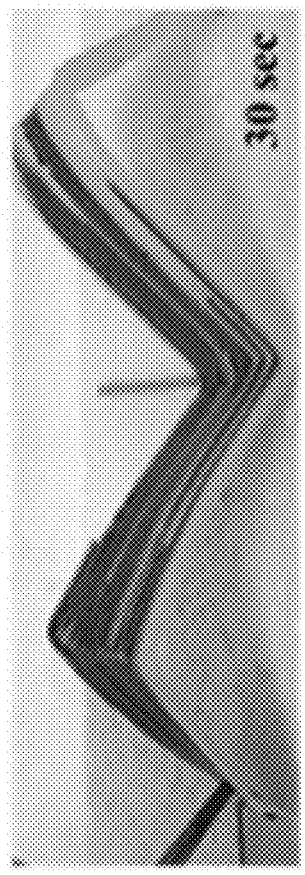
FIGURE 1R
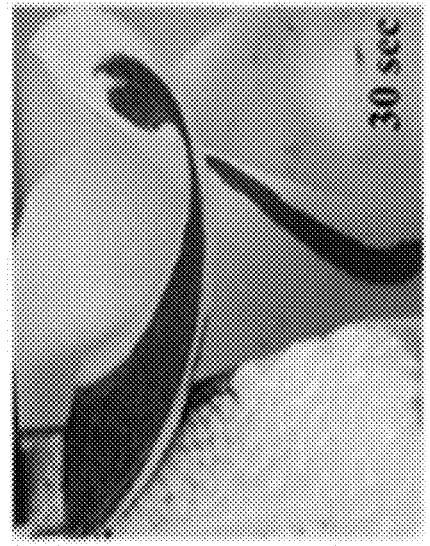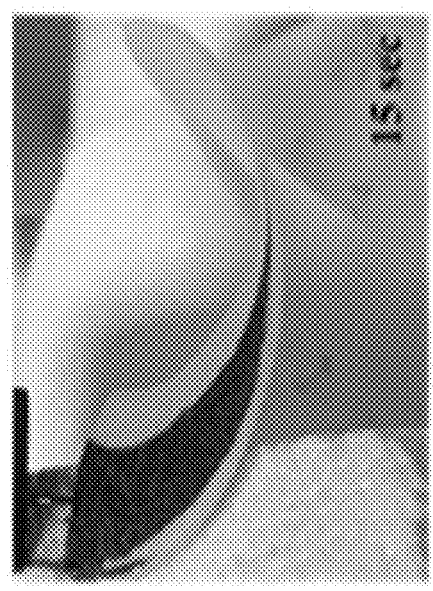
FIGURE 1S

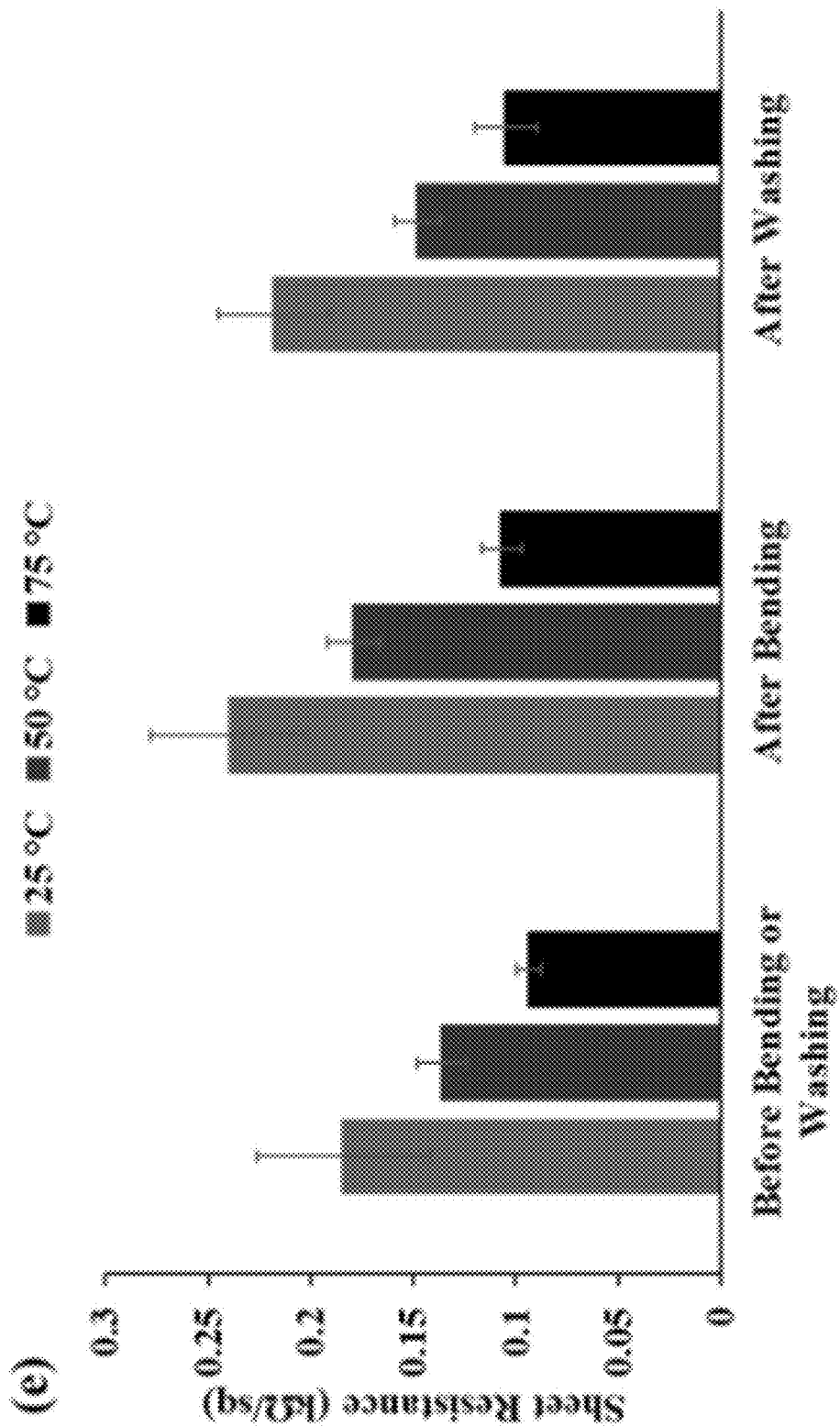

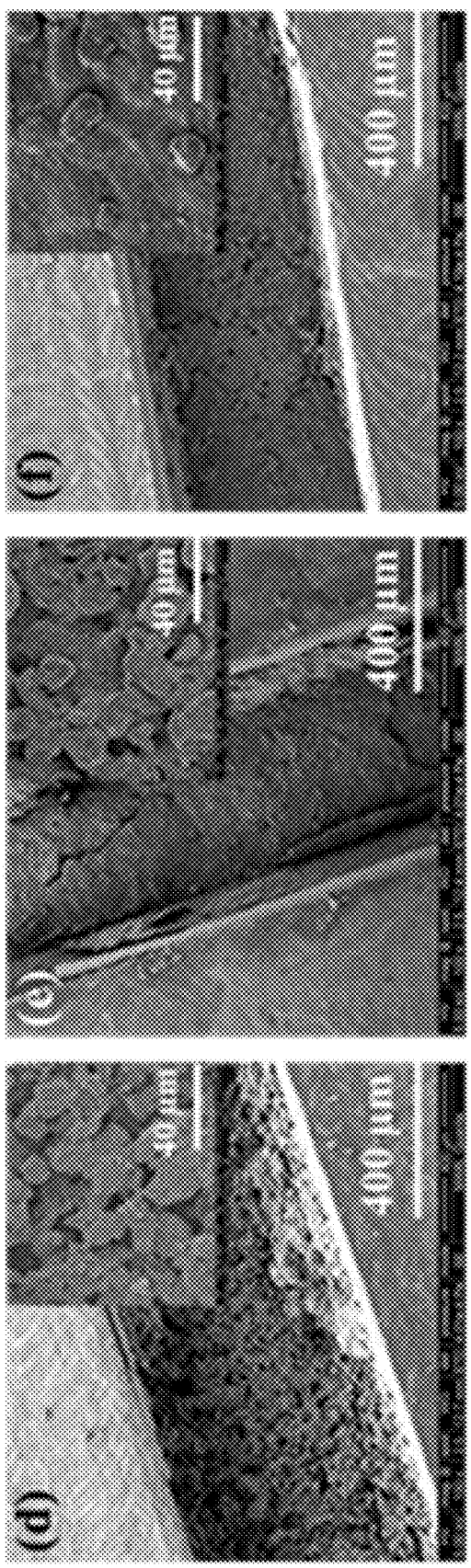

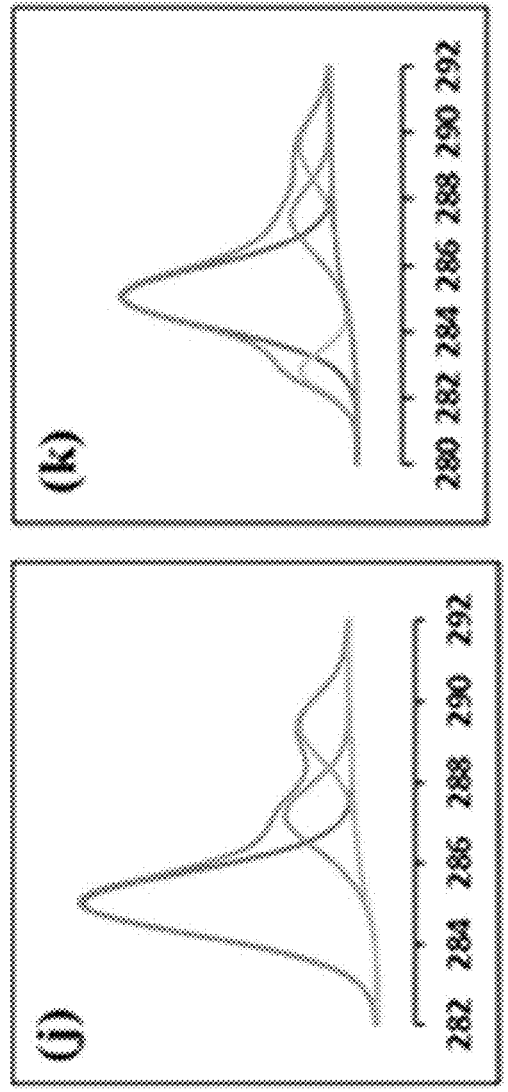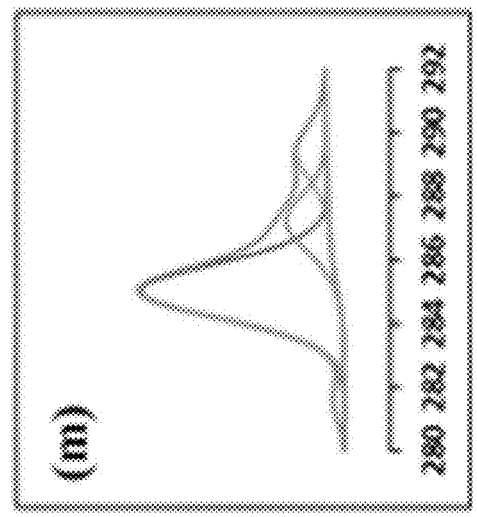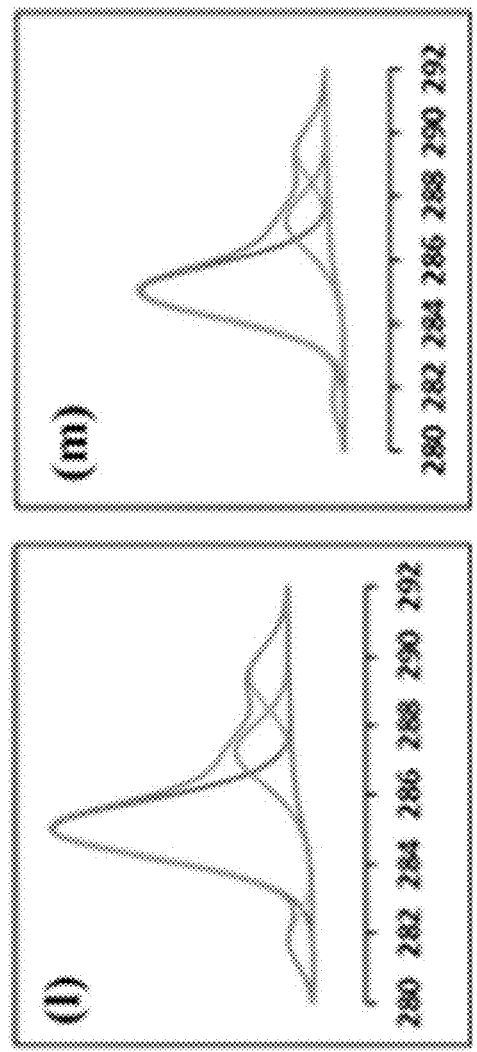

FIGURE 28A — Drop casting of graphene on silicon wafer with small features RESISTIVITY
Resistance of prior art device (kOhm)

RESISTANCE OF EMBODIMENT OF INVENTION (kOHM)

Microfluidic approach using flow rate controlled syringe pump

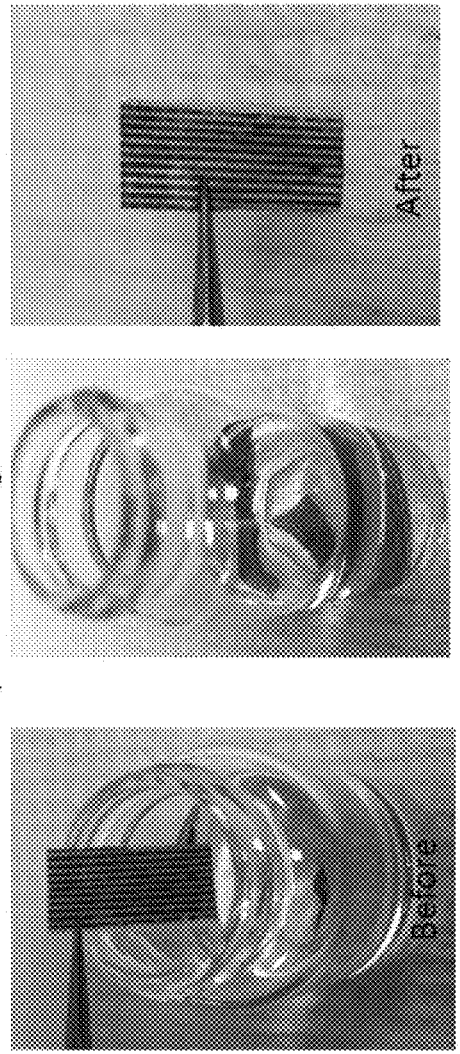
FIGURE 33B.

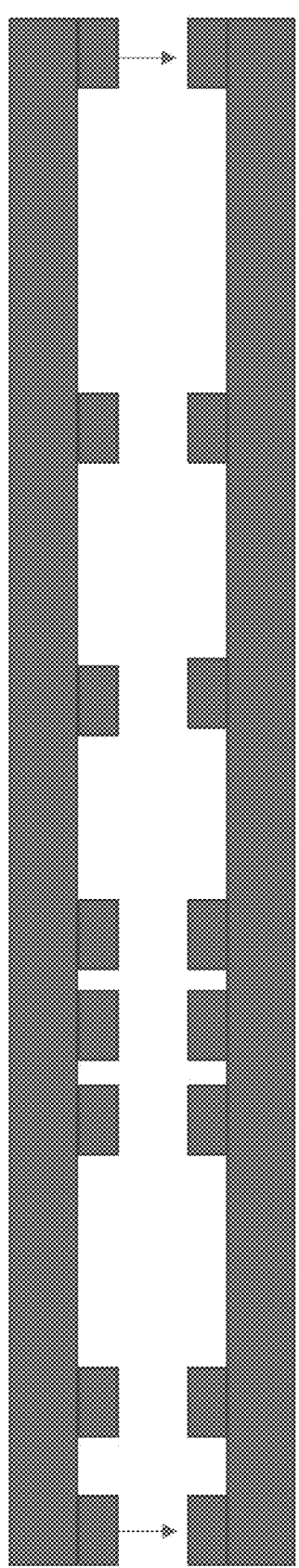
FIGURE 35A (exploded view)
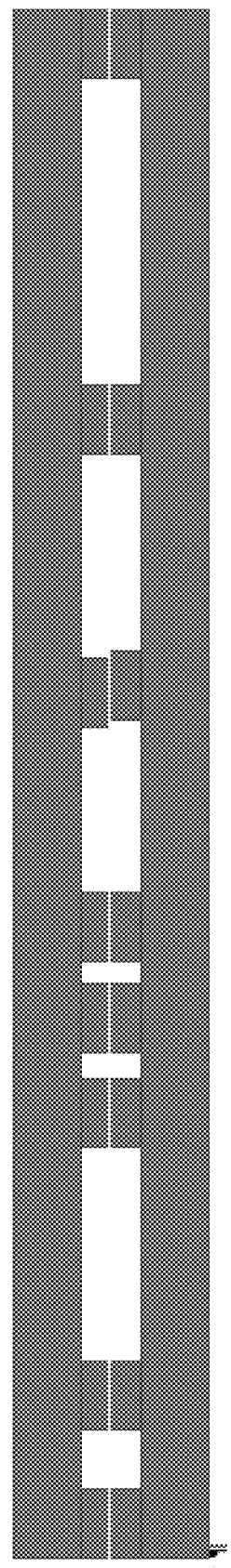
Figure 35B. (assembled view)

METHODS, APPARATUS, AND SYSTEMS FOR FABRICATING SOLUTION-BASED CONDUCTIVE 2D AND 3D ELECTRONIC CIRCUITS

CROSS-REFERENCE TO RELATED APPLICATIONS

This application claims the benefit of Provisional Application U.S. Ser. No. 62/720,693, filed on Aug. 21, 2018, which is herein incorporated by reference in its entirety.

1. BACKGROUND OF THE INVENTION

1.1 Field of the Invention

The present invention is related to electronic circuits and, in particular, to electronic circuits, including microelectronic scale, which can have a variety of 2D and/or 3D features formed on a variety of substrates including but not limited to flexible substrates.

1.2 Problems in the State of the Art

INTRODUCTION

The field of flexible electronics has been receiving growing interest due to their flexible and stretchable nature, especially for portable energy-harvesting devices, electronic skin, wearable electronic devices and so on, as opposed to the non-flexible, rigid inorganic electronic materials with limitations in mechanical properties. [1]

Flexible polymer and plastic-based substrates (e.g., polyethylene terephthalate, polyimide, and polydimethylsiloxane or PDMS) [2-7] along with other non-conventional substrates (e.g., paper, tape, and cloth) [8-11] have been widely used in combination with conductive nanomaterials or metal alloys (such as carbon nanotubes, metal oxide nanowires, and graphene) for the fabrication of flexible electronic devices targeting various applications ranging from transistors, to sensors, to energy harvesting and storage devices [12-20]. Among these conductive nanomaterials, graphene, which has unique properties such as exceptional electrical and thermal conductivity, mechanical strength and chemical stability, plays a key role in producing next-generation flexible electronics. [21, 22] Therefore, the integrated use of graphene in combination with flexible substrates through different fabrication processes have resulted in development of novel electronic devices for various applications. [23-29] However, the use of other potential natural or synthetic polymer-based materials such as gelatin, poly-1-lactic acid (PLLA), poly(lactic-co-glycolic acid) (PLGA), polyvinyl alcohol (PVA), polystyrene (PS), Cellulose acetate etc. as flexible substrates in combination with graphene-based materials are limited due to the limitations of currently available flexible electronics fabrication techniques.

There are various graphene-based flexible device production methods. One of the methods relies on the transfer of graphene using a sticky/adhesive tape via peeling. However, these approaches have difficulties in controlling the number, shape and thickness of graphene layers, and they have poor feature resolution. [30, 31] In addition, transfer printing methods involve creating graphene patterns on an initial substrate followed by utilizing a stamping process to transfer them onto a final substrate. [32] On the other hand, micro transfer molding is based on filling the carved patterns of a stamp emplaced on top of a target substrate with graphene-based suspensions, followed by vacuum drying and removing the stamp from the final substrate. [33] Both the transfer printing and molding methods are not scalable, cost-effective, and have low feature resolution and require special care. However, a very recent study reported a simple, high-resolution, and scalable graphene patterning and transferring method using adhesive tapes and a peeling off approach to produce flexible graphene sensors with high feature resolution. [34] This method involves creation of graphene patterns in the grooves of negative features at the surface of a polydimethylsiloxane (PDMS) substrate, which was followed by subsequent transfer of the resulting graphene patterns onto a final sticky tape via an easy-to-implement "Stick-and-Transfer" process. With this method, they were able to achieve as small as 15 micrometers feature size of the transferred graphene structure. They also claimed that the method is versatile (can be applied to commercially available tapes e.g., polyimide, Scotch, 3M electrically conductive, and aluminum foil adhesive tapes) and does not require the use of any expensive equipment, except for PDMS negative features. However, this method requires use of high graphene amounts and is only valid for adhesive tapes limiting the use of other substrates. [34]

It is possible to achieve small features of graphene patterning via photolithography-based microfabrication [35-42], however, it is a highly complex and expensive approach involving multiple steps such as film deposition, lithography, and etching, which makes this technology costly, time-consuming, [43] and inadequate for rapid prototyping of electrical circuits [44-46]. As an alternative, laser printing of graphene patterns has also been studied by manipulating different parameters such as laser energy, spot size, and pulse duration. However, this approach requires sophisticated lasers and it is not possible to go below several tens of micrometers of feature size. [47-51]

In addition to laser printing, there are numerous other graphene printing techniques, such as screen, gravure, and inkjet printing, to coat graphene flakes onto flexible and non-flexible surfaces. [52, 53] However, most of these techniques are often limited by low resolution, up to 50 μm feature size.

Although the recent studies demonstrated the increase in line resolution of printed graphene up to 5-30 μm via stencil or gravure approach [44, 46], these printing techniques require the use of cleanroom technology for each pattern design. Recently, a new approach based on electrostatic spray deposition (ESD) has been developed to create interdigitated electrodes (IDEs) with finger width of 100 and spacing of 50 μm. [54] However, this solution-phase graphene technique also requires the need for photolithography patterning.

Inkjet printing is a scalable, cost-effective, and versatile technique for depositing highly complicated patterns on flexible or non-flexible substrates without need for masks/stencils or photolithography patterning. [43, 55, 56] The major limitation of inkjet printing is the ink fluid properties which should be within a narrow range such as: viscosity between 2 and 20 cP, surface tension between 30 and 40 mN/m, particle size less than 1% of the nozzle diameter and specific gravity of 1-1.5.[57] In addition, the resolution of ink-jet printed graphene patterns are poor and additional laser or thermal processing is required to improve electrical conductivity of printed graphene. [55, 58-61] These post-processing techniques to improve the electrical conductivity of printed graphene via removing nonconductive ink binders (e.g. ethyl cellulose) and/or reducing graphene oxide to graphene, may require high temperature thermal annealing (170-400° C.), [55, 58-61] mild temperature thermal annealing (90° C.) combined with hydrazine vapor deposition,[62] and more recently pulsed light annealing with a xenon lamp. [61] However, these post-print thermal annealing and chemical reduction methods are not site selective and applied to the whole substrate, therefore, can thermally or chemically degrade polymer-based flexible substrates. Recently, it was demonstrated that the pulsed UV laser irradiation overcomes the shortcomings and significantly improves upon conventional post-print annealing techniques for inkjet printed graphene. However, this method requires sophisticated and expensive lasers. [58] A very recent study demonstrated a photolithography-free, high resolution solution-phase graphene patterning technique, which can form graphene patterns onto any 2D flexible or non-flexible planar substrate. The method involves the following steps; (i) inkjet printing of a polymer pattern, (ii) spin-coating a more viscous/dense solution-phase graphene layer, and (iii) removing the polymer pattern via a solvent-based lift-off process to create the patterned graphene film. This inkjet printed patterning technique increased the graphene line resolutions up to 20 μm and circumvented the need for developing templates. [55, 56] However, this approach consists of multiple steps and can only be applied in 2D planar surfaces and cannot be applied for 3D flexible electronics. [57]

Published international patent application WO2017040947A1, incorporated by reference herein, discusses paper-based support materials with channels coated with conductive material for small-scale circuits. However, it is limited to cellulose based porous support materials for paper-based diagnostics and the feature size is not as low as micron levels. It also requires porous channels and hydrophobic barrier layers via waxing.

Therefore, there is room for improvement in this technical field.

2 SUMMARY OF THE INVENTION

2.1 Objects of the Invention

It is a primary object, feature, aspect, or advantage of the invention to provide methods, apparatus, and systems for fabricating conductive microelectronic circuits which improve over or solve problems and deficiencies in the state of the art.

Other objects, features, aspects, or advantages of the invention include methods, apparatus, and systems as above-described which:
  a. Allows direct formation or transfer of conductive substance onto patterned surfaces of 2D or 3D features.
  b. Can be applied to a variety of substrates of a variety of material properties including but not limited to flexible, stretchable, solid, hydrogels, planar, non-planar, rigid, bendable, porous, non-porous, biodegradable, non-biodegradable.
  c. Can have a variety of circuit patterns, shapes, and features including but not limited to planar/2D or non-planar 3D whether exposed or enclosed, a range of width, lengths, and thicknesses, ranging from few micrometers to the mm scale.
  d. Does not require substantial post-processing steps including but not limited to annealing, cutting, chemical processing or etching.
  e. Is scalable, has some self-assembly aspects, and does not require complex components or numerous different steps, and can even be fabricated under room temperature conditions on the substrates, making the technique suitable for a variety of substrates.
  f. Can be tuned to different electrical, mechanical, microstructural or other properties.
  g. Has good durability and stability over a range of applications, operating conditions, environments, and uses, depending on the substrate used.
  h. Can achieve circuit feature sizes with precision and resolution of down to at least a few hundreds of microns in width and thickness, including on the order of ten microns, and further including down to on the order of five microns in certain circumstances.
  i. Utilizes less conductive material to form the circuit features than most methods.
  j. Is economical, environmental friendly green process with high potential for easy scaling up.
  k. Allows precise control of both 3D microstructural features and properties of both conductive materials, patterns it forms, and the substrate it is formed on.
  l. Can be applied to a variety of end uses including but not limited to shape conforming, wearable on clothing or skin, sensors, or even implantable devices or interfaces or 3D supercapacitors, low cost electronics like toys/games, handheld electronics, RFID/NFC applications etc.
  m. Includes the ability to transfer the circuit pattern from one substrate to another, including with improvements in stability of the transferred conductive pattern on the second substrate in some circumstances.

2.2 Aspects of the Invention

One aspect of the invention comprises a fabrication method for electrical circuits, including but not limited to microelectrical circuits. First, a pre-determined pattern of 3D microstructured channels is formed in the thickness of the surface of a substrate. The pattern can range from simple to complex. It can be created by any of a number of different techniques. One non-limiting technique is creating the pattern in a first substrate, drop-casting a polymeric solution over that pattern, drying the solution in place, and removing a dried polymer, which would include the micropattern from the first substrate and, depending on polymer selection, could be a flexible or stretchable film. Second, selected microchannels or mm-scale channels in the pattern can be coated with a pre-selected conductive material. One non-limiting technique is a pre-processed graphene-based solution which is filled into selected channels. One example of filling is by microfluidic pumping. The flow of a solution of the conductive material (viscosity of the solution can be optimized depending on channel dimensions and design considerations) can be controlled as to control how much of the microchannel is filled. Third, the viscous conductive material is dried in place (including using drying at room temperature conditions) to produce the combination of a conductive pattern on the substrate that mimics the pattern from the original patterned substrate, including 3D microstructural features. The combination can be used in a variety of applications.

Another aspect of the invention relates to systems to practice the method described above and end products from the method and applications of those end products. With respect to systems, scalable fabrication components and techniques can include at least a sub-system to create the patterned substrate, a sub-system to present the patterned substrate to a microfluidic pumping sub-system (or vice versa) that can be manipulated relative the pattern and relative to its volume and flow rate to selectively fill at least portions of the features of the patterns, and a sub-system to finalize the filled pattern into an end product. With respect to end products and their applications, there are many options. Non-limited examples include flexible electronics; biomedical implants; biomedical cell interfaces; biosensors; portable energy harvesting; electronic skin; wearable devices; strain sensors, electrochemical sensors, pressure sensors, transistors, energy harvesting devices, storage devices, to name just some.

3 BRIEF DESCRIPTION OF THE DRAWINGS

The patent or application file contains at least one drawing executed in color. Copies of this patent or patent application publication with color drawing(s) will be provided by the Office upon request and payment of the necessary fee.

The appended drawings illustrate graphically certain aspects and features of exemplary embodiments of the invention, will be described herein, and are summarized below.

FIG. 1A. Magnified images of end products created according to exemplary embodiments of the invention using microfluidic filling of pre-fabricated patterned substrates.

FIGS. 1B-F. Diagrammatic sequence of fabrication process steps using microfluidic filling of pre-fabricated patterned substrates according to an exemplary embodiment of the invention.

FIG. 1G-L. Magnified and highly magnified images of examples of end products according to the invention.

FIG. 1M. Image showing an end product according to the invention and its capability of being fabricated on a flexible substrate. The product showed stable conductivity after multiple bending cycles.

FIG. 1N. Images demonstrating stability of end products according to the invention in water. The product showed stable conductivity after multiple washing cycles.

FIG. 1O. Demonstration of efficacy as an electrical circuit of end products according to the invention.

FIG. 1P. Several frames of video demonstrating microfluidic filling of a pre-fabricated patterned substrate of a first form factor (square step).

FIG. 1Q. Several frames of video demonstrating microfluidic filling of a pre-fabricated patterned substrate of a second form factor (curved steps).

FIG. 1R. Several frames of video demonstrating microfluidic filling of a pre-fabricated patterned substrate of a third form factor (triangle steps).

FIG. 1S. Several frames of video demonstrating microfluidic filling of a pre-fabricated patterned substrate of a fourth form factor (spiral funnel).

FIGS. 2A and B. Several series of images showing filling of patterns based on number of filling passes, and graph of test data showing variation of electrical properties of an end product based on number of filling passes. FIG. 2A is images showing light microscope images of PLLA films filled with graphene solution at different passes and pre-annealing temperatures (annealing of graphene solution at certain temperatures prior to filling/coating the channels on the substrate) according to an embodiment of the invention. FIG. 2B shows the change in sheet resistance with respect to number of passes and the pre-annealing temperature of conductive graphene solution.

FIGS. 2C and D. Several series of images showing filling of patterns based on number of filling passes, and graph of test data showing variation of flow rates for filling passes. FIG. 2C images show the effect of graphene nanoplatelet concentration and coating flow rate on channel filling according to an embodiment of the invention. FIG. 2D represents that increasing the graphene concentration reduces the number of passes to obtain low sheet resistance or higher conductivity. The pre-annealing temperature of the graphene solution was kept at 75° C., where the lowest sheet resistance was obtained.

FIG. 2E. Graph of test data showing electrical properties of end products in various states, including after multiple bending or washing of flexible substrate.

FIGS. 3A-I. Highly magnified images of microfluidic-filled patterns according to the invention. FIGS. 3A-C include SEM images of the PLLA film channels filled with graphene solution (e.g. 9 passes and 75° C. pre-annealing temperature) according to an embodiment of the invention.

FIGS. 3J-M. Graphs of test data regarding end products related to the invention. XPS data shows that graphene exists on the micropatterns through the classical graphene peaks on XPS scan.

FIGS. 3N-O. Highly magnified images of graphene nanoplatelets upon pre-annealing and sonication according to the invention. Reduction in the graphene nanoplatelet size upon pre-annealing and sonication resulted in easy filling of the channels and the formation of continuous, intact and stable graphene patterns on the substrate channels.

FIG. 3P. Graph related to optical properties of microfluidic-filled patterns according to the invention. Raman spectroscopy indicates the presence of graphene channels on the substrate through the existence of classical graphene peaks in the spectrum.

FIGS. 4A-D. Highly magnified images of microfluidic-filled patterns according to the invention. FIGS. 4A and B are images showing filling of small size channels (5 μm depth 15 μm width) using the microfluidic approach under a microscope according to embodiments of the invention. FIG. 4D shows the images for solid silicon wafer substrate while FIG. 4C shows the images for flexible PLLA film. This figure demonstrates that the microfluidic approach can be applied for very small feature sizes on both solid and flexible substrates under microscope.

FIGS. 5A-G. Graph of test data and highly magnified images of microfluidic-filled patterns according to the invention. This method is not limited by the use of conductive graphene solution. Graphene nanoplatelets, flakes, or combinations of graphene-based materials with metal-based (e.g. silver) conductive solutions at certain ratios or other forms can also be used. As a demonstration FIG. 5A shows how the conductive solution made using different ratios of silver and graphene affect the conductivity/sheet resistance of the patterns. FIG. 5 B-G shows the structure of different silver/graphene solution at different ratios in the channel; (B) 100% silver (C) 80% silver 20% graphene (D) 50% silver 50% graphene (E) 40% silver 60% graphene (F) 20% silver 80% graphene (G) 100% graphene within PLLA channels upon drying.

FIG. 6. Images and data showing change of resistance with respect to graphene solution pre-annealing temperature prior to substrate application and graphene solution number of passes through the microchannels according to an embodiment of the invention.

FIG. 7. Images showing the effect of number of graphene solution passes in the channels according to an embodiment of the invention.

FIG. 8. Images showing the effect of pre-annealing temperature on Graphene nanoplatelets deposition and structure for 9 passes according to an embodiment of the invention.

FIG. 9. Graphs showing XPS analysis of graphene solution pre-annealed at different temperatures according to an embodiment of the invention.

FIG. 10. Image showing PLLA channels (5 μm depth 15 μm width) filled with graphene nanoplatelet solution according to an embodiment of the invention under a microscope (The concentration of Graphene is 40 mg/mL. The flow rate 2 μL/min).

FIG. 11. An image of a microscopic set up used, e.g., in the microfluidic filling of channels in FIGS. 4A-D.

FIG. 12. Images showing steps of graphene transfer with polymer casting approach.

FIG. 13. Image showing graphene material transferred from ink-jet printed lased annealed polyimide surface to cellulose acetate film using polymer casting approach.

FIG. 14. Image showing graphene transfer with small feature size from silicon wafer substrate to PLLA film (5 μm depth-10 μm width) using polymer casting approach.

FIG. 15. Image showing stability of graphene transferred to polymeric film via solvent casting.

FIGS. 16A, 16B, 16C, 16D, 16E, 16F, and 16G are selected frames from a video showing a first example of pattern filling according to an embodiment of the invention (Manual pattern filling_trial_1.wmv).

FIGS. 17A, 17B, 17C, 17D, and 17E are selected frames from a video showing a first example of pattern filling according to an embodiment of the invention (Movie 2.wmv. solid surface, hand pipetted patterns).

FIGS. 18A, 18B, 18C, 18D, 18E, 18F, 18G, 18H, 18I, and 18J are selected frames from a video showing a first example of pattern filling according to an embodiment of the invention (3D filling movie_1.wmv. Bent patterned substrate with microneedle).

FIGS. 21A, 21B, 21C, 21D, and 21E are selected frames from a video showing a first example of pattern filling according to an embodiment of the invention (ED filling movie_4.wmv—spiral surface patterned substrate).

FIGS. 22A, 22B, 22C, 22D are selected frames from a video showing a first example of pattern filling according to an embodiment of the invention (Conductivity movie.wmv. Proof of concept that coated microchannels are conductive between electrical power source and LED).

FIGS. 23A, 23B, 23C, 23D are selected frames from a video showing a first example of pattern filling according to an embodiment of the invention Set up for low feature filling.wmv. Shows automated microfluidic filling under microscope assistance.

FIGS. 24A, 24B, 24C, and 24D (after 4 minutes of filling) are selected frames from a video showing a first example of pattern filling according to an embodiment of the invention (Movie (highly magnified) showing filling of microchannels under microfluidic pumping).

FIGS. 25A, 25B, 25C, 25D, 25E, 25F and 25G are selected frames from a video showing a first step in an example of graphene transfer approach (Movie showing filling of microchannels under microfluidic pumping). STEP 1: SOLID SUBSTRATE PREPARATION WITH PATTERNS.

Figure 26B:
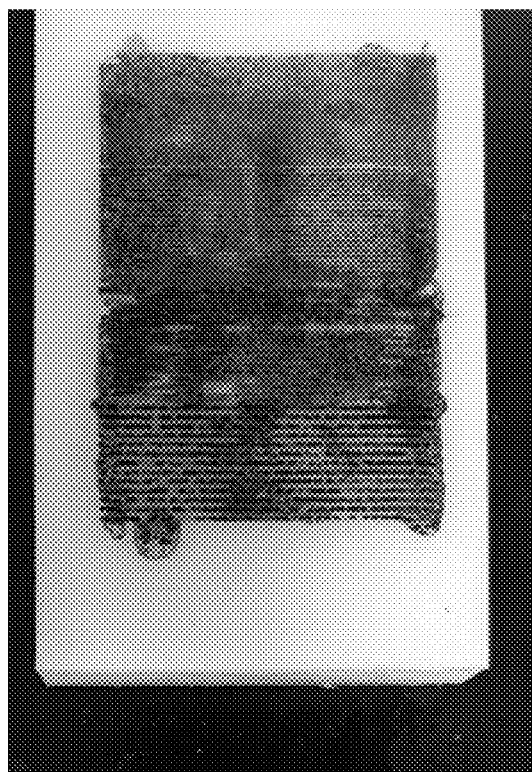
Figure 26A:
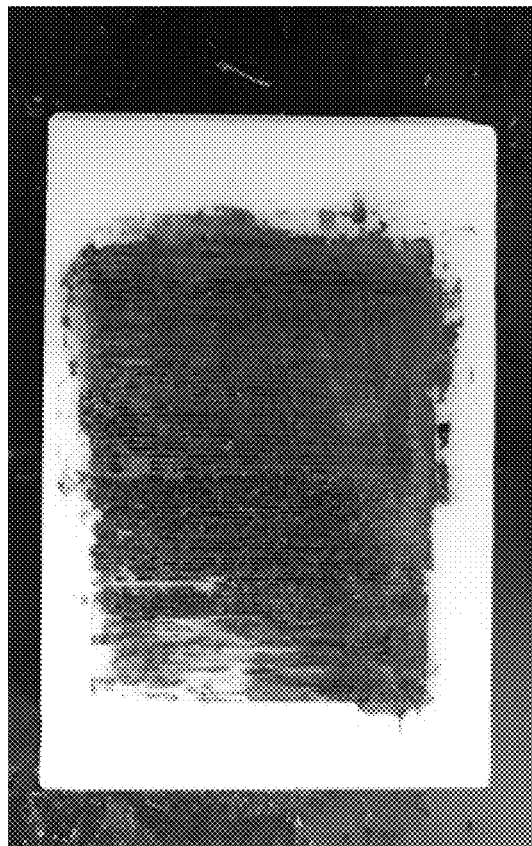
Figure 26D:
Figure 26C:
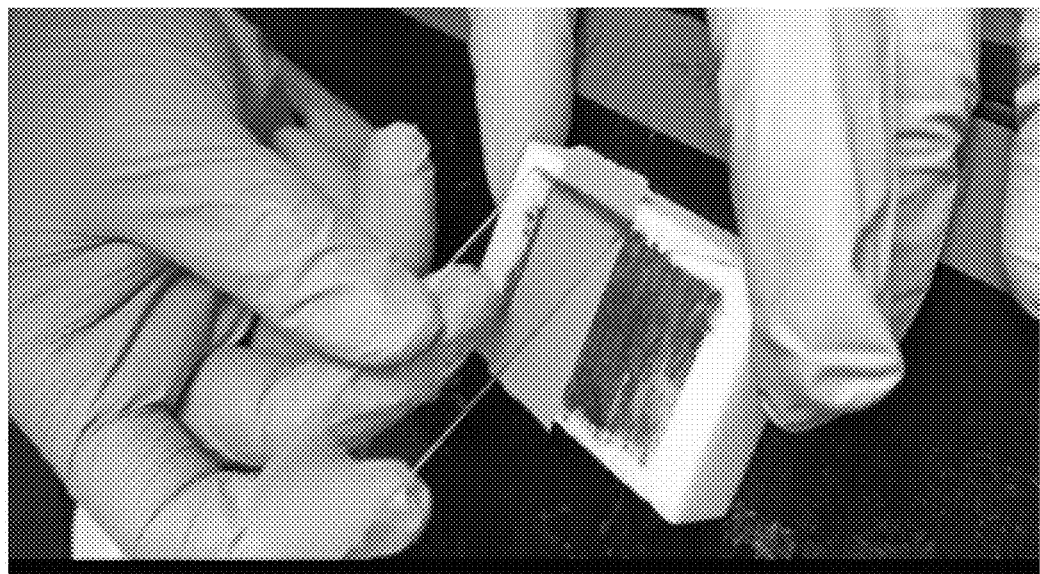
Figure 26F:
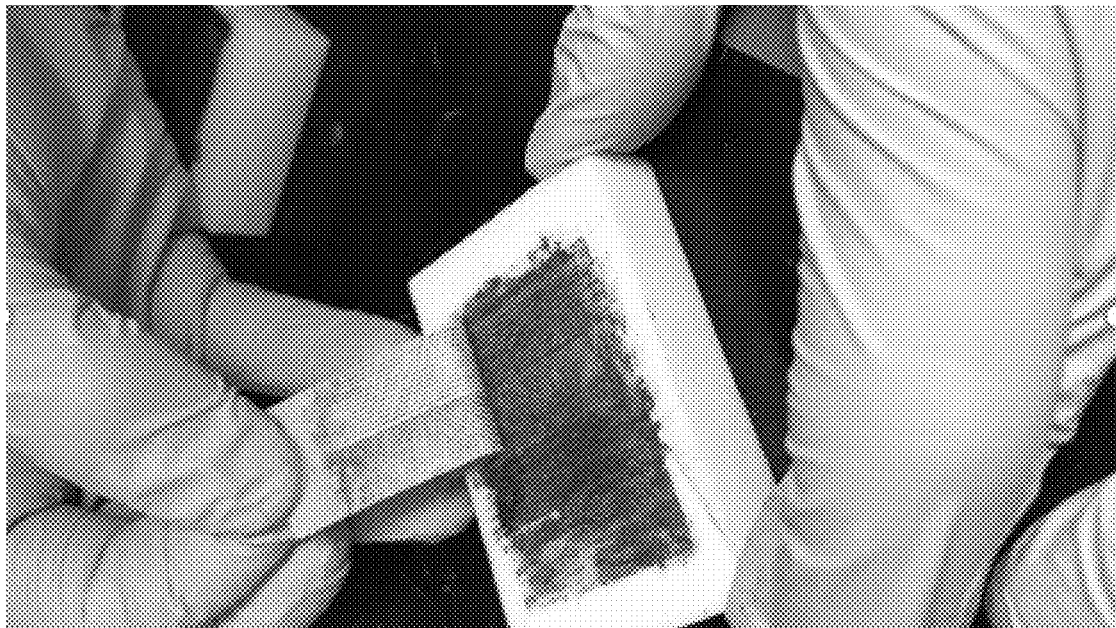
Figure 26E:
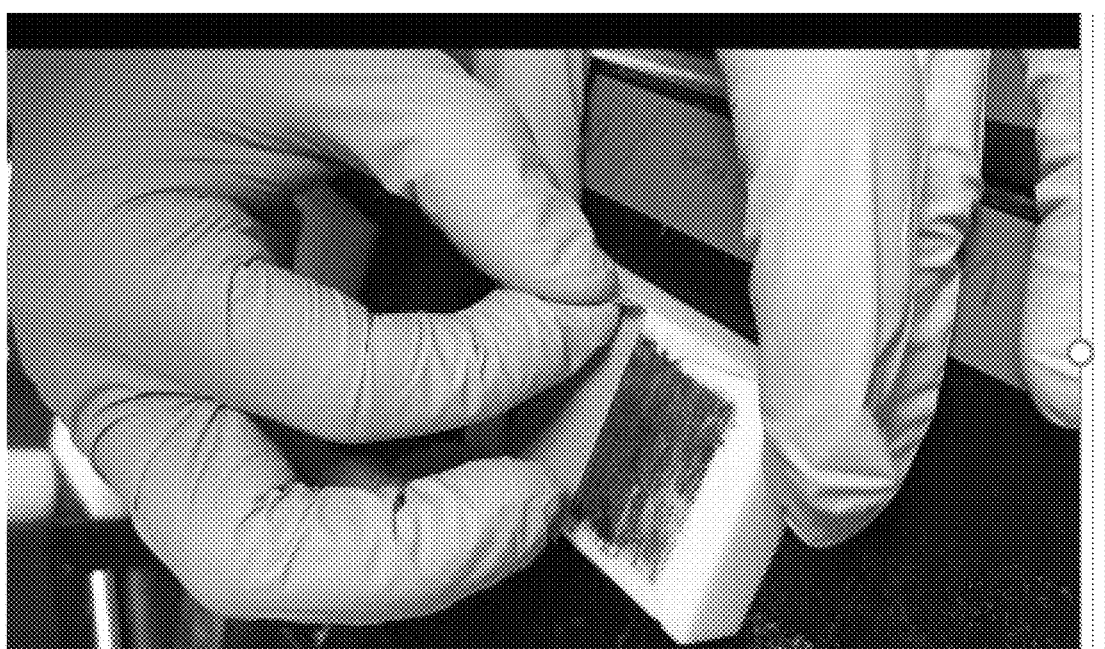
Figure 26I:
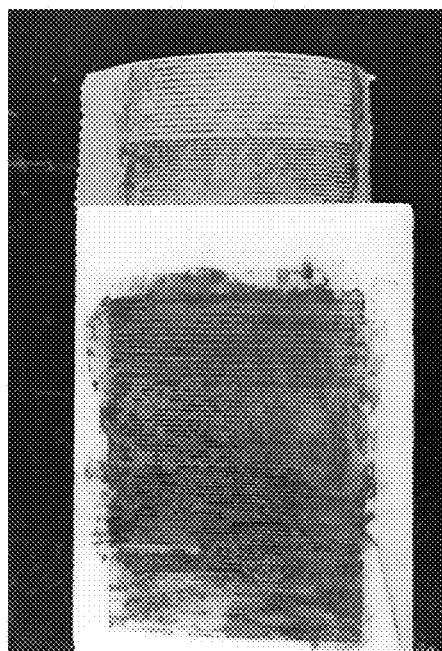
Figure 26H:
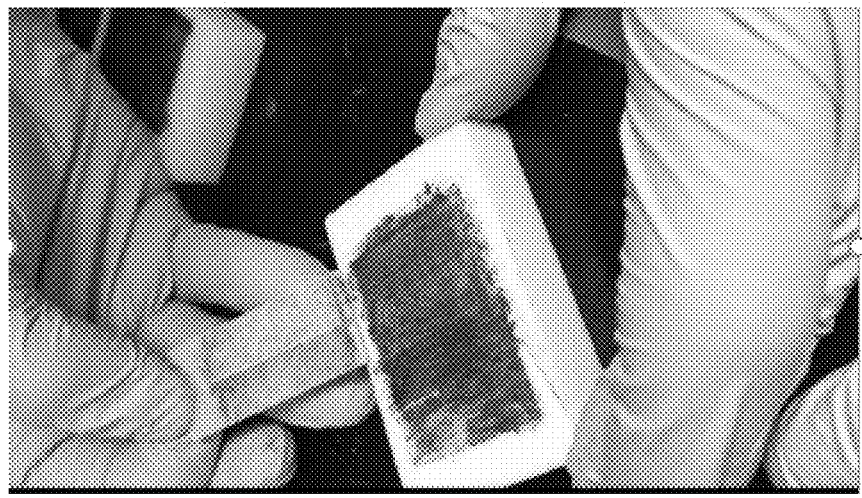
Figure 26G:
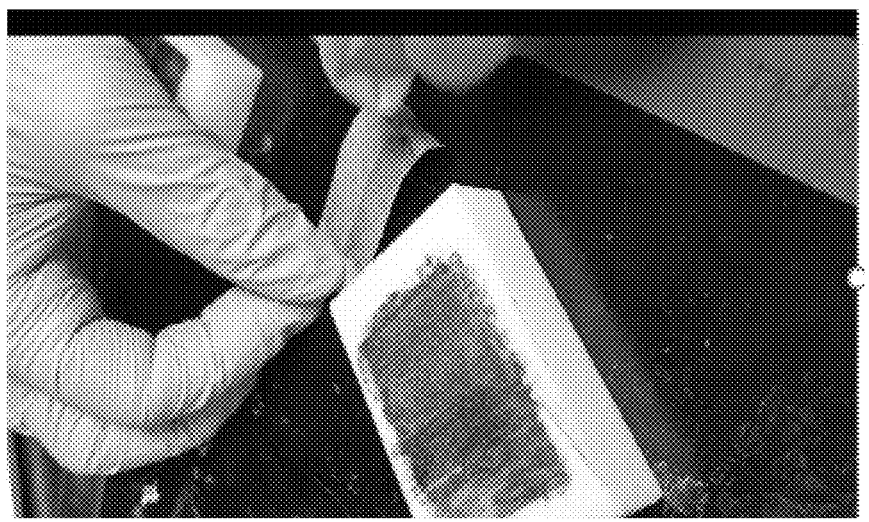

FIGS. 26A and 26B are images showing first solid substrate microchannels of STEP 1 filled with dried graphene-based materials.

FIGS. 26C, 26D, 26E, 26F, 26G, 26H, and 26I are selected frames from a video showing a second step in a first example of graphene transfer. STEP 2: STICK AND PEEL APPROACH.

Figures 26J, 26K:
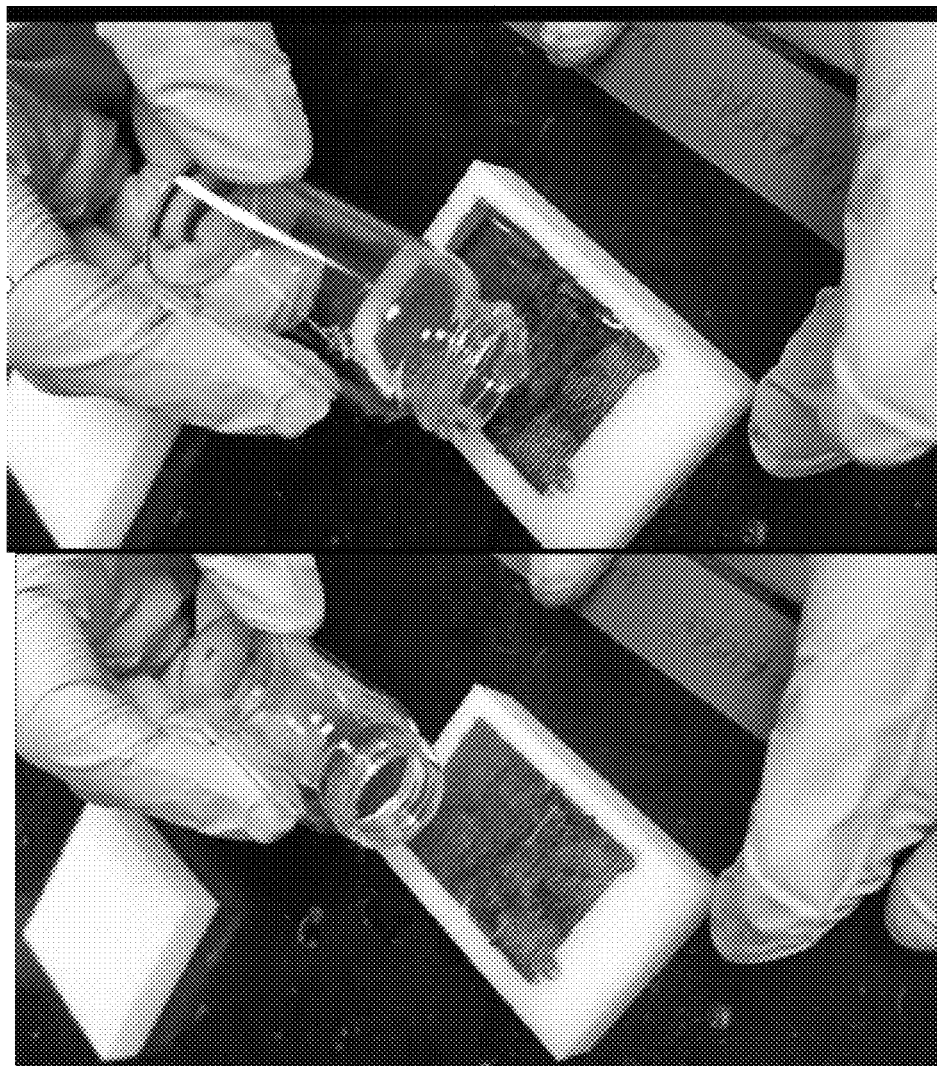
Figure 26L:
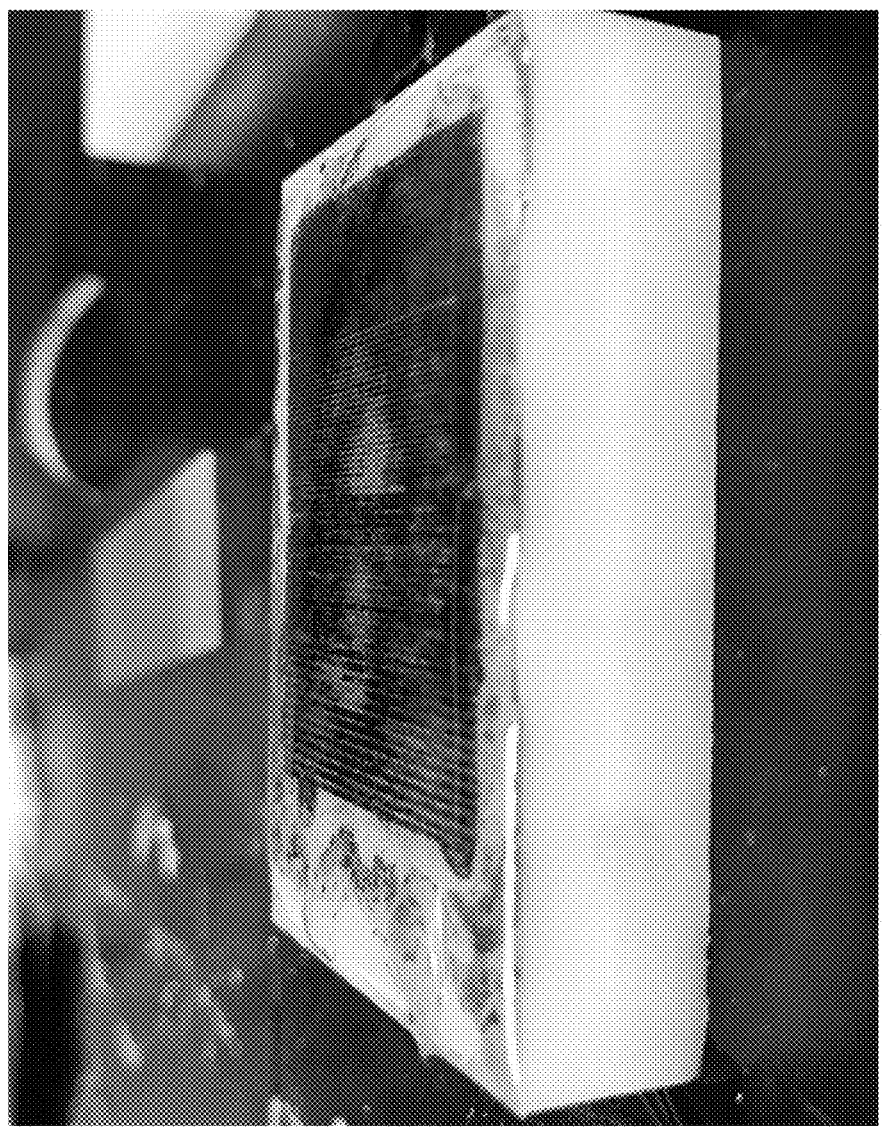

FIGS. 26J, 26K, and 26L are selected frames from a video showing a third step in a first example of graphene transfer. STEP 3: SOLVENT CASTING.

FIGS. 26M, 26N, 26O, and 26P are selected frames from a video showing a fourth step in a first example of graphene transfer. STEP 4: Polymeric Film Formation and Graphene Transfer.

FIGS. 27A, 27B, 27C, 27D, 27E, 27F, and 27G are selected frames from a video showing an example of graphene transfer from an ink-jet printed circuit.

FIG. 28A is an image demonstrating drop casting of graphene on silicon wafer with small features.

Figure 28B:

FIG. 28B is an image demonstrating polymer solvent casting of graphene on silicon wafer with small features.

FIGS. 28C, 28D, 28E, 28F, 28G, 28H, 28I, 28J, and 28K are selected frames from a video showing an example of graphene transfer.

Figure 29A:
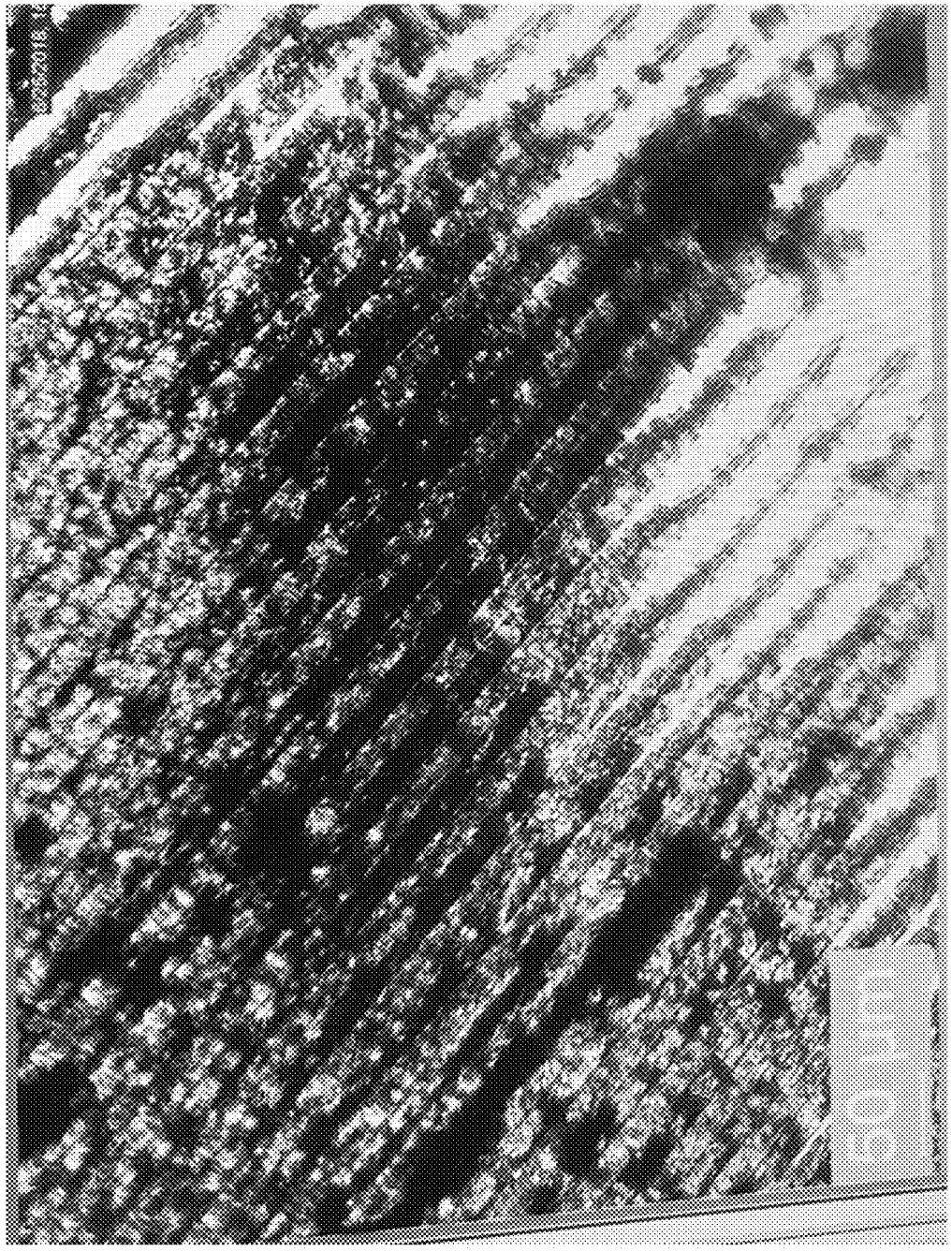
Figure 29B:
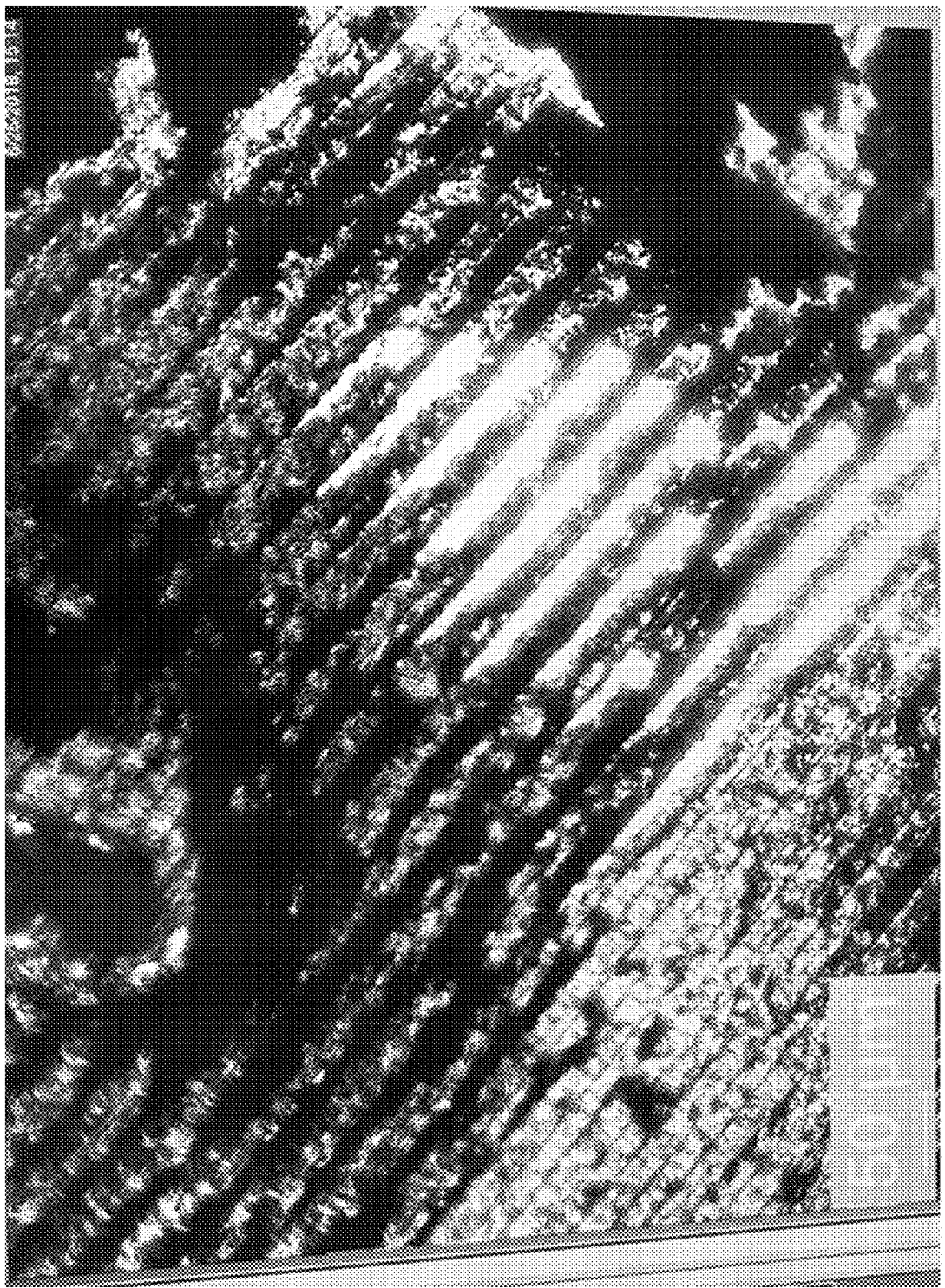
Figure 29C:
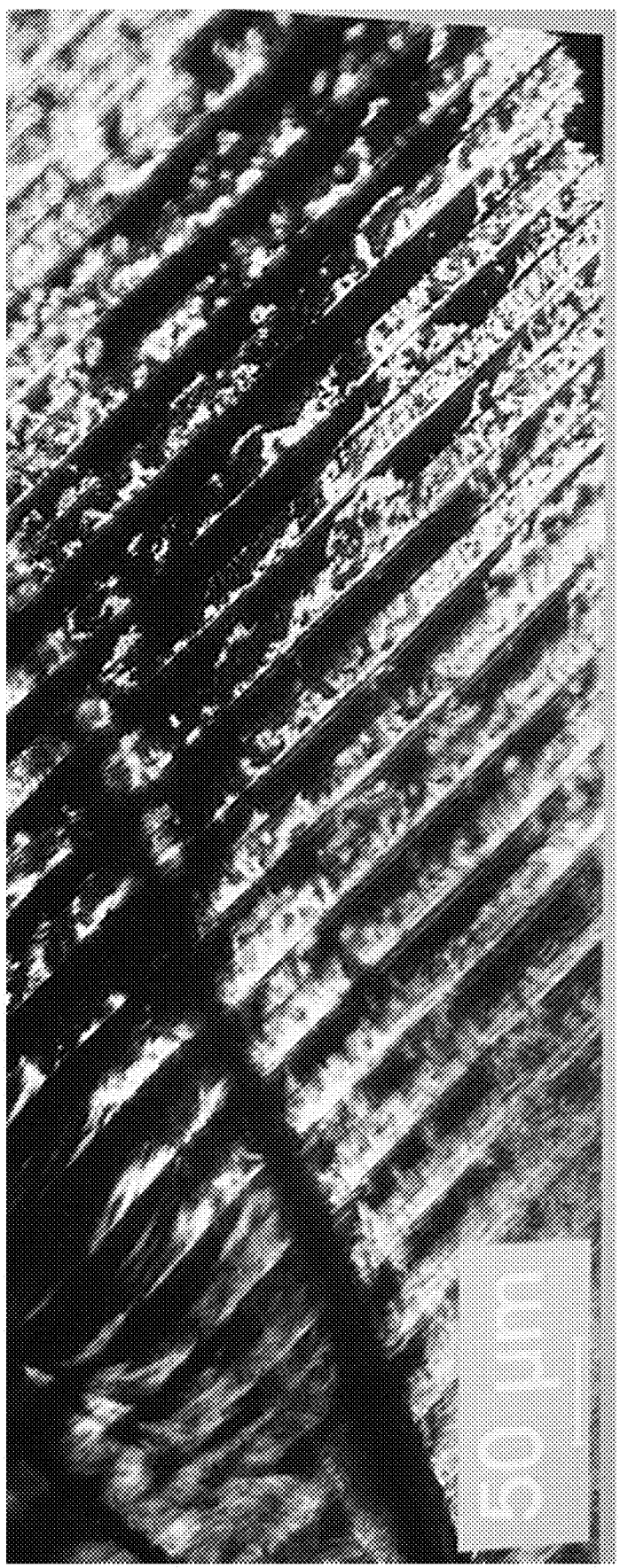

FIGS. 29A, 29B, 29C are images under microscope demonstrating examples of graphene transfer for small features.

Figure 30B:
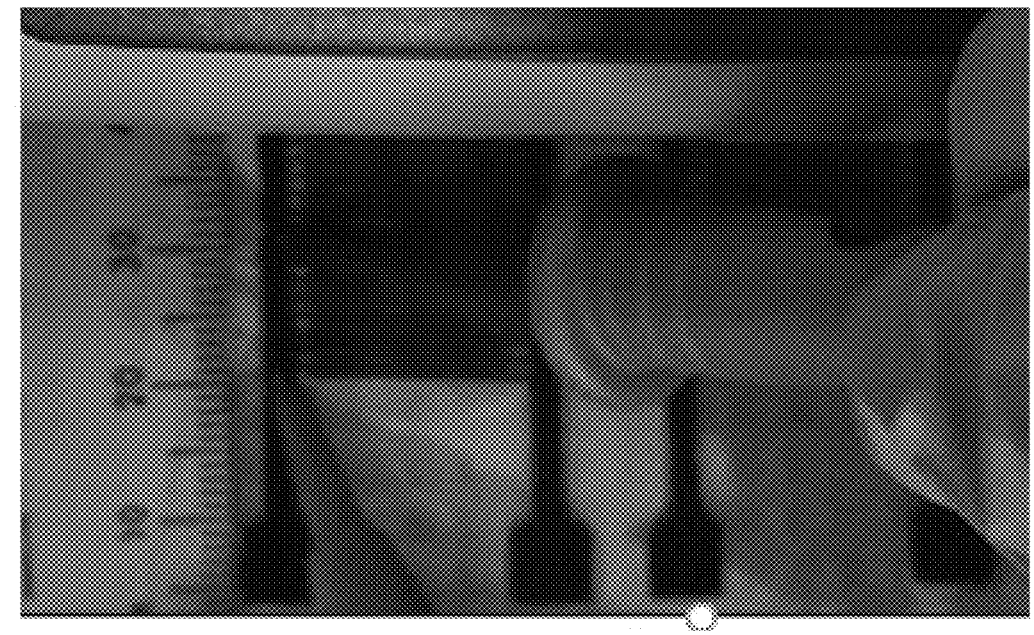
Figure 30A:

FIGS. 30A and 30B are images showing acquisition of resistivity and a resistance measurement of a prior art device (in kOhm).

Figures 30C, 30D:
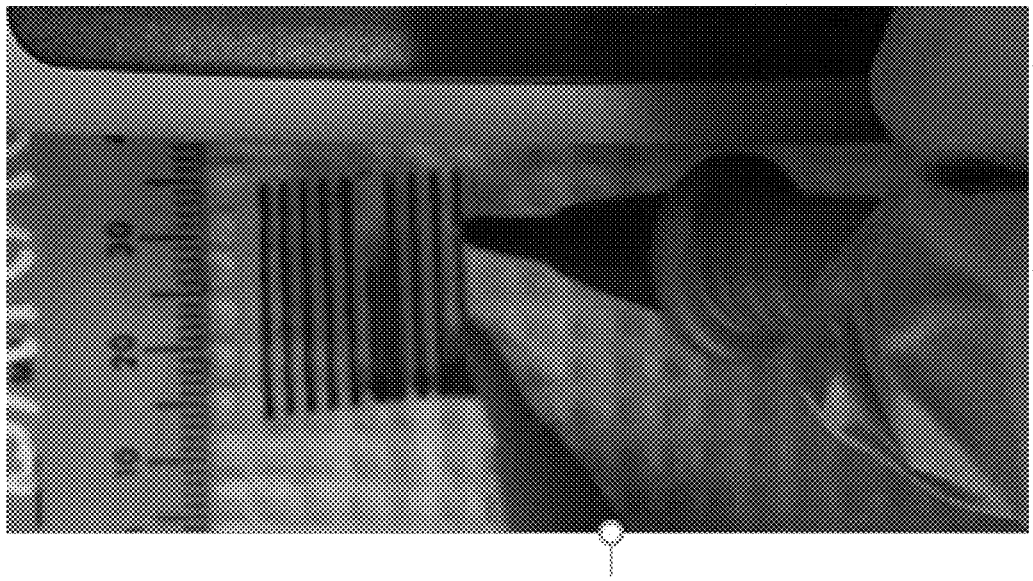

FIGS. 30C and 30D are images showing acquisition of resistivity and a resistance measurement of an embodiment of the invention (in kOhm).

Figures 31A, 31B, 31C:
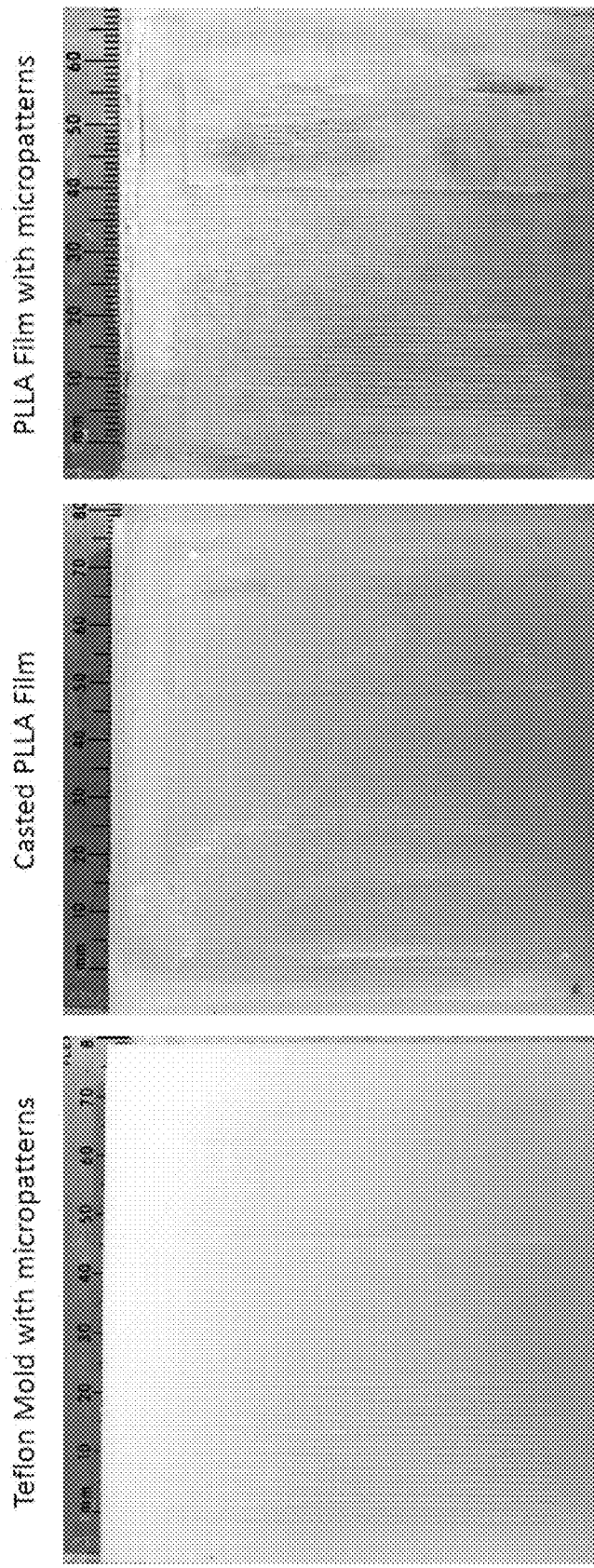

FIG. 31A is an image of a teflon mold with micropatterns before filling with conductive solution.

FIG. 31B is an image of a PLLA film cast onto the mold of FIG. 31A.

FIG. 31C is an image of PLLA film after it is peeled off of the mold, showing transfer of graphene from the mold in the same pattern to the film.

Figure 32A:
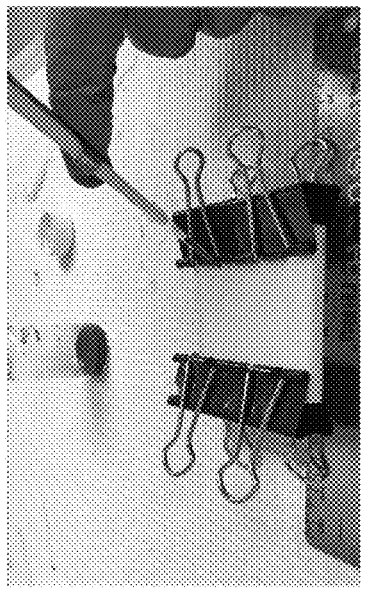
Figure 32B:
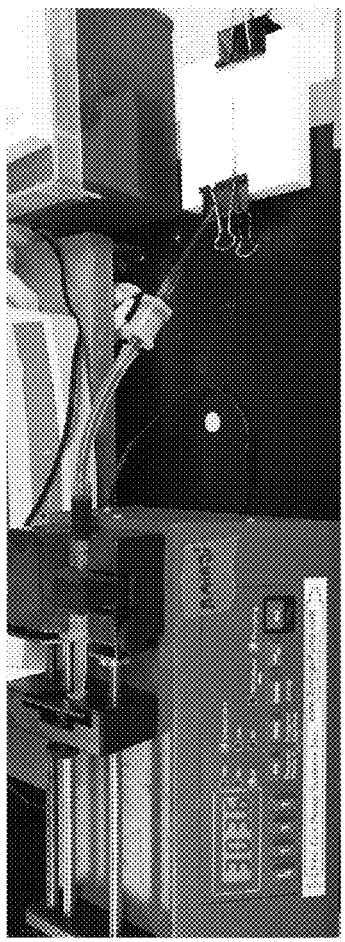
Figure 32C:
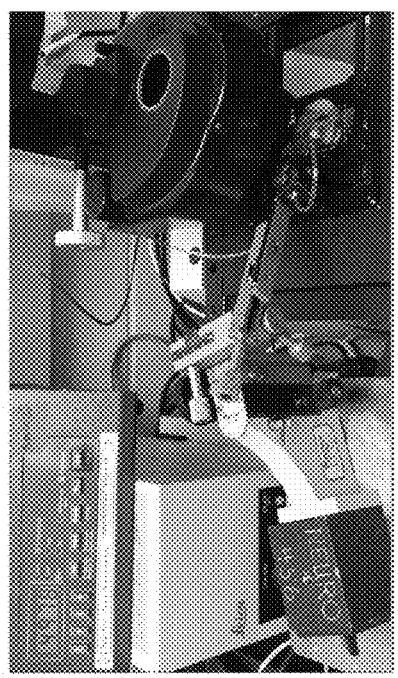

FIGS. 32A, 32B, and 32C are illustrations of a microfluidic approach using flow rate controlled syringe pump to fill patterned molds according to aspects of the present invention.

Figure 33A:
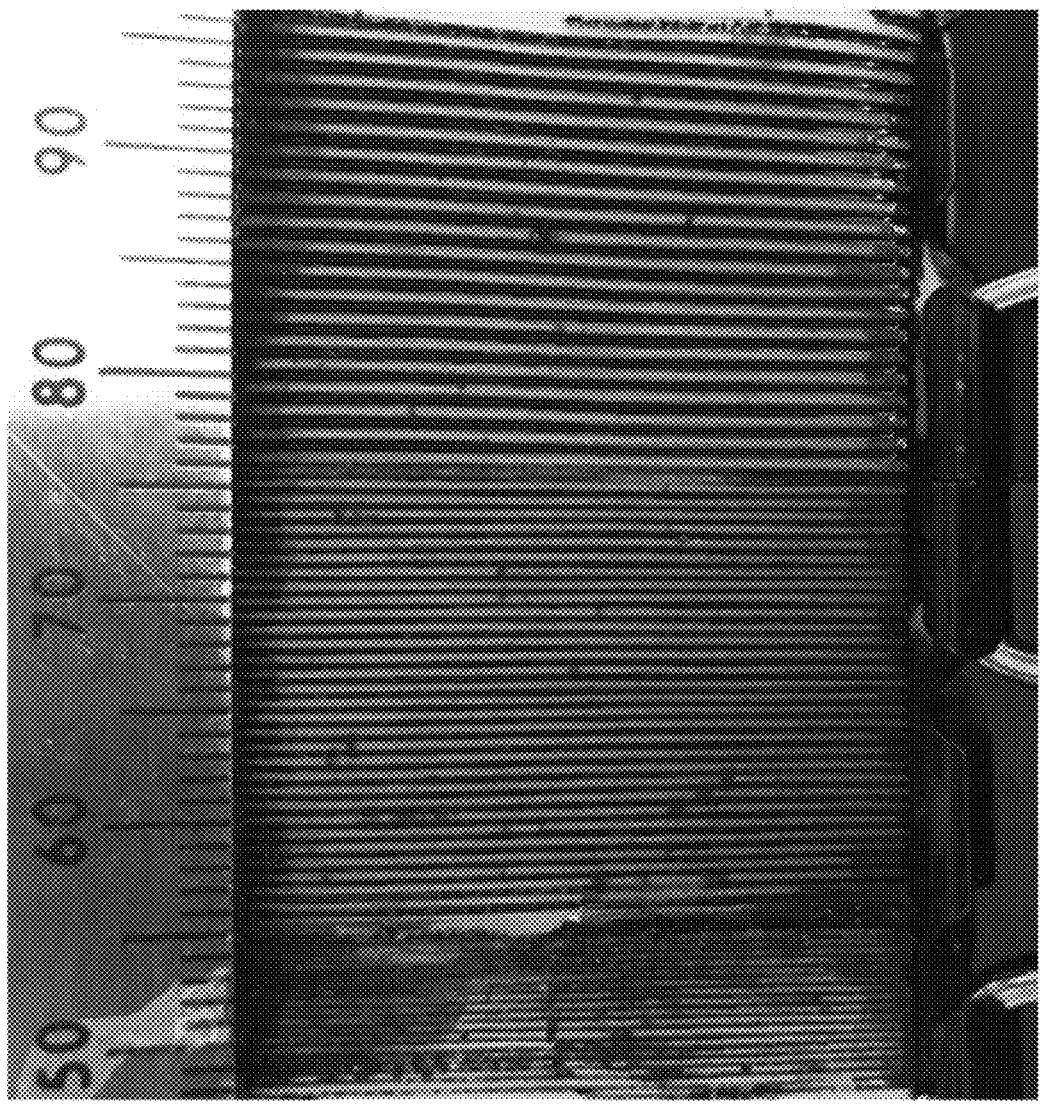

FIG. 33A is a magnified image of the mold of FIGS. 31A-C with microfluidic flow rate controlled graphene added.

FIG. 33B are images demonstrating: (top) films with patterned graphene are flexible and bendable; (bottom three images) graphene coating is stable in water, according to aspects of the invention.

Figure 33C:
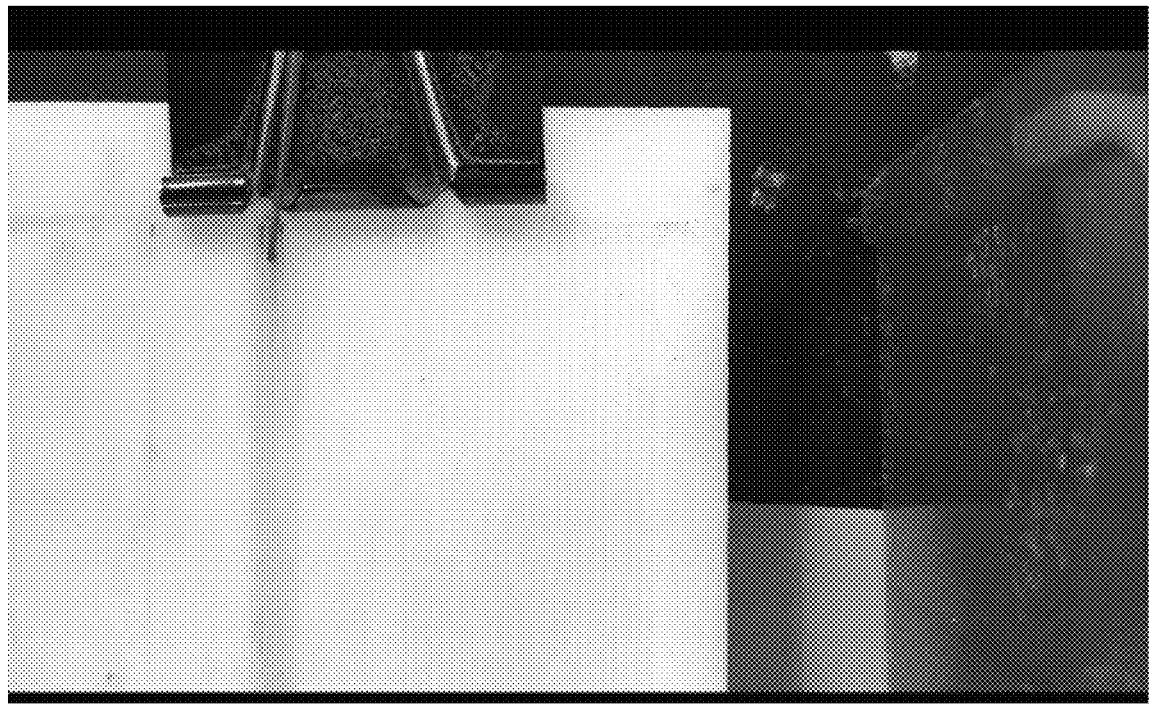

FIG. 33C is an image showing graphene filling.

Figure 34:
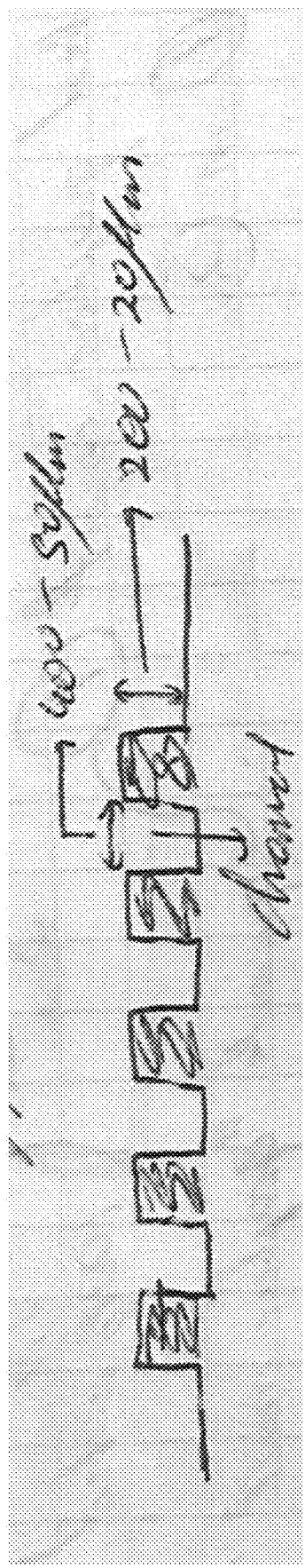

FIG. 34 is a diagram depicting an examples of channel sizes such as can be used with embodiments of the invention.

FIGS. 35A (exploded view) and 35B (assembled view) illustrate diagrammatically how two mirror-image graphene patterns can be assembled to create enclosed channels between the assembled flexible graphene-patterned flexible substrates for a variety of applications according to aspects of the invention.

Figures 36A, 36B:
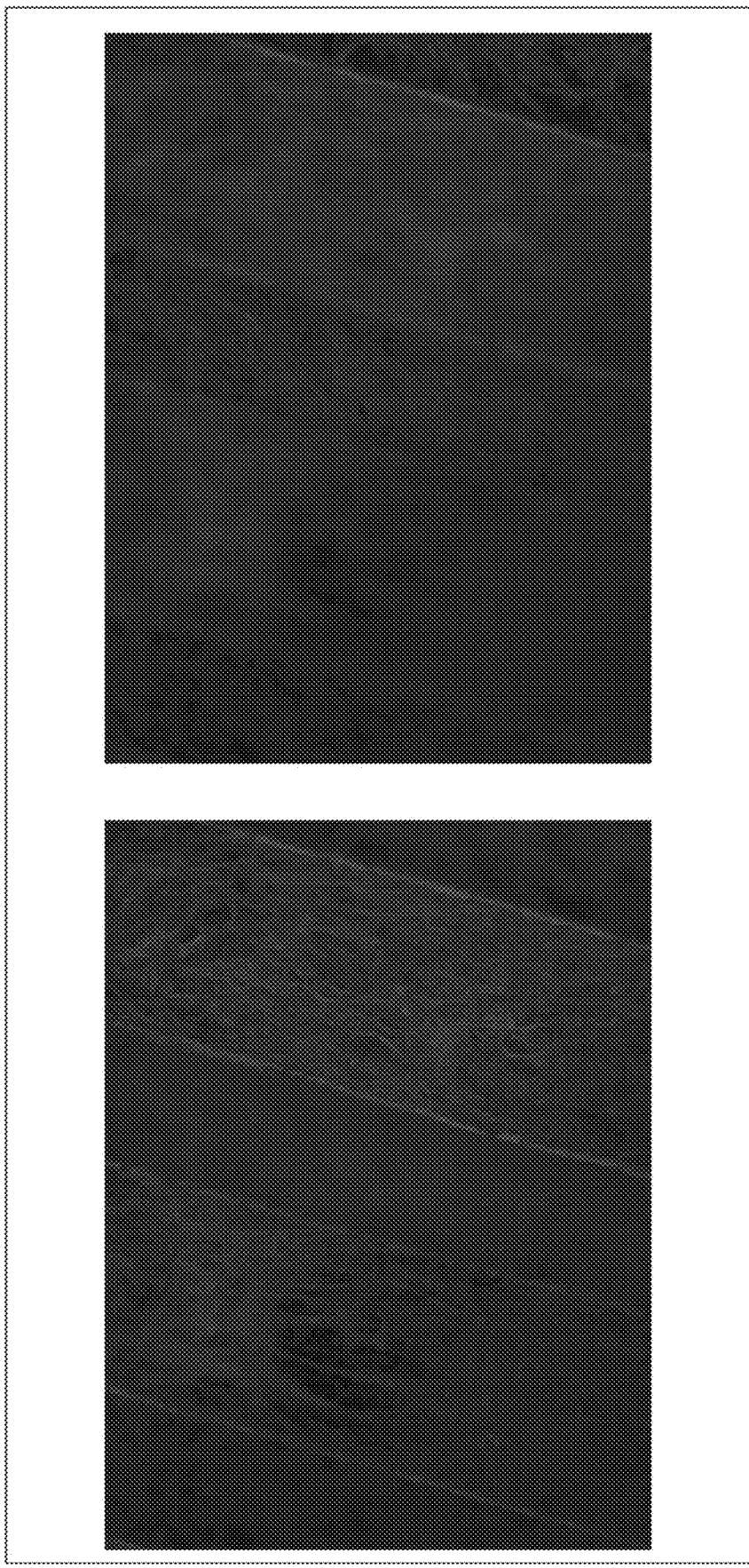

FIGS. 36A and 36B are microscopic images of stem cells attached in the microchannels of patterned graphene made according to the present invention, demonstrating that bio cells can attach to graphene so can use to electrostimulate cells in place on microcircuit.

Figure 11:
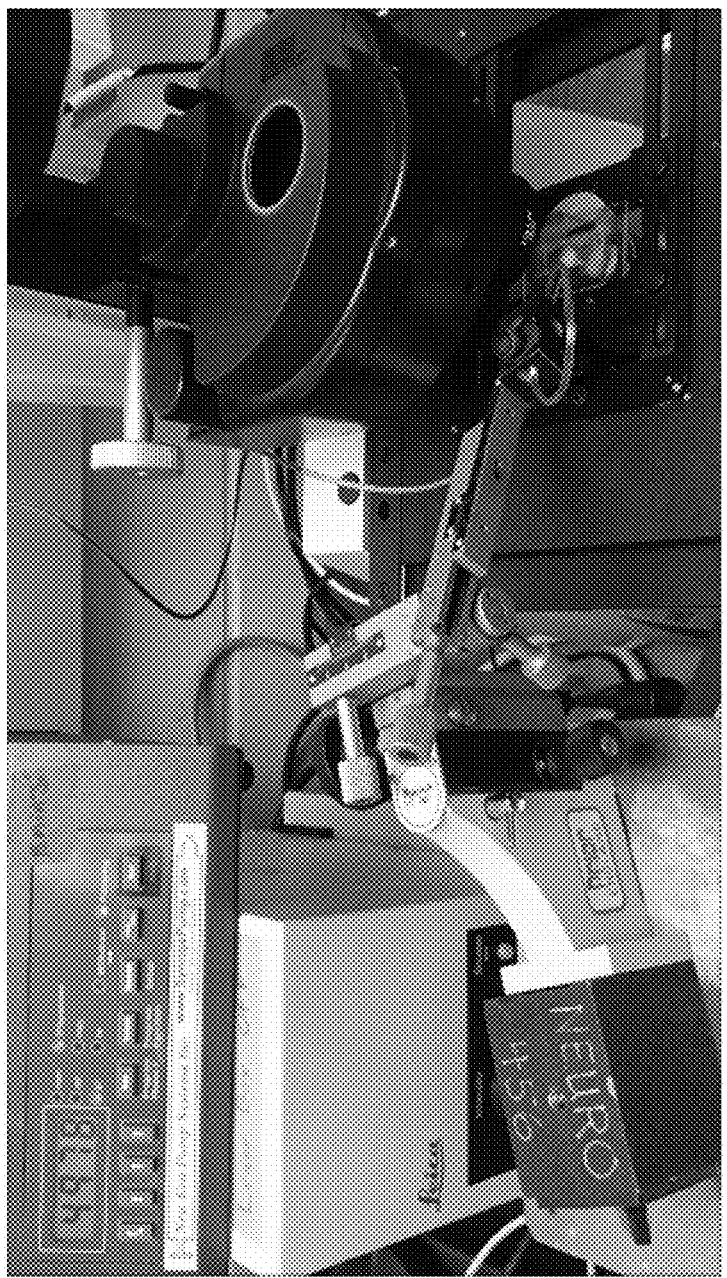
Figure 37A:
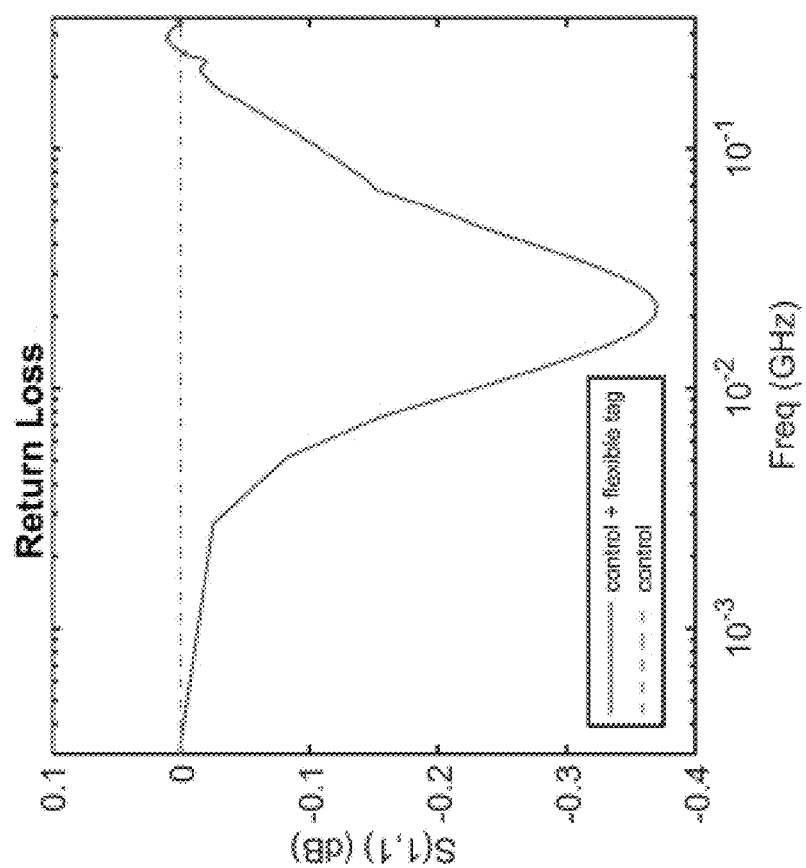
Figure 37B:
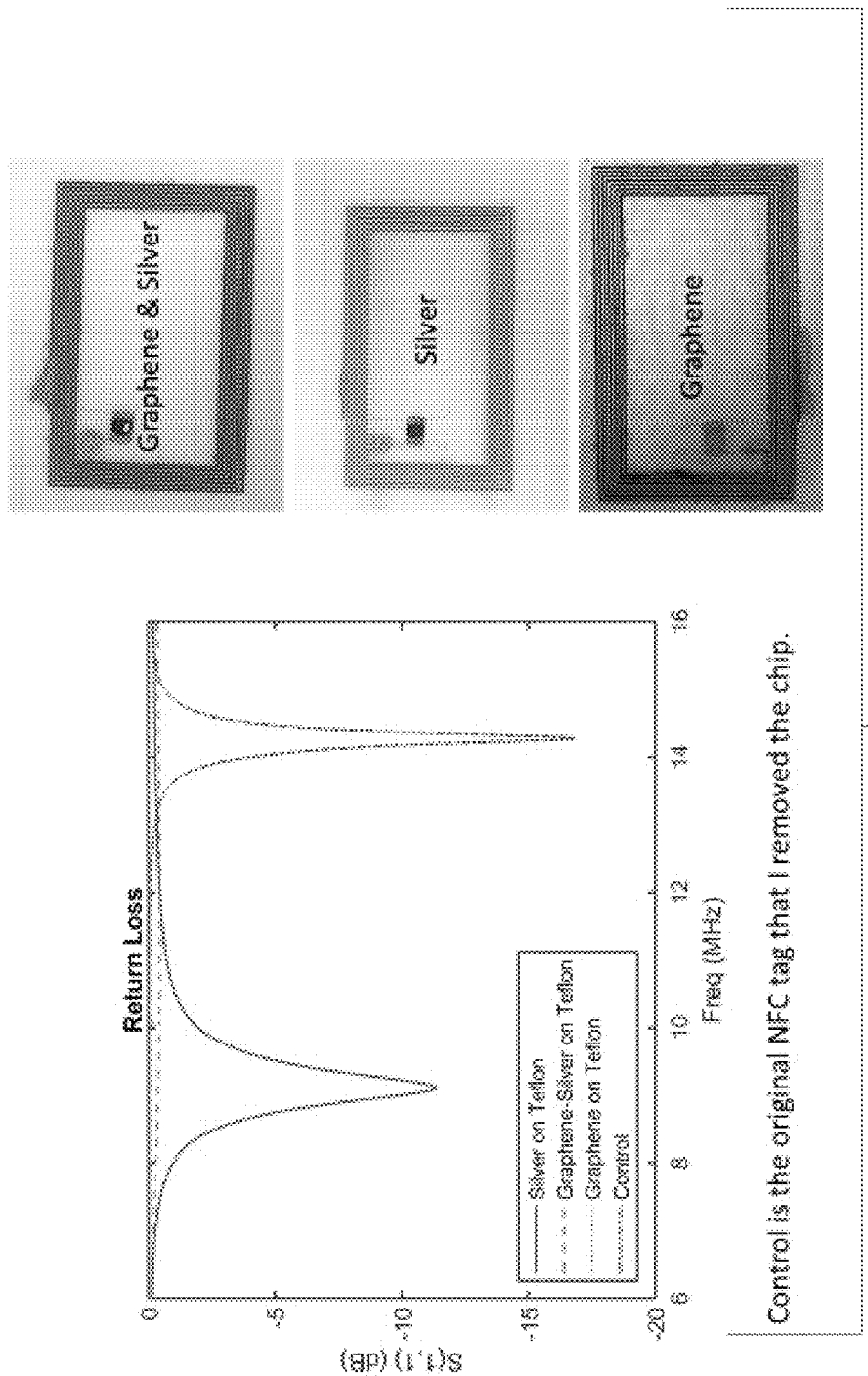
Figure 37E:
Figure 37D:
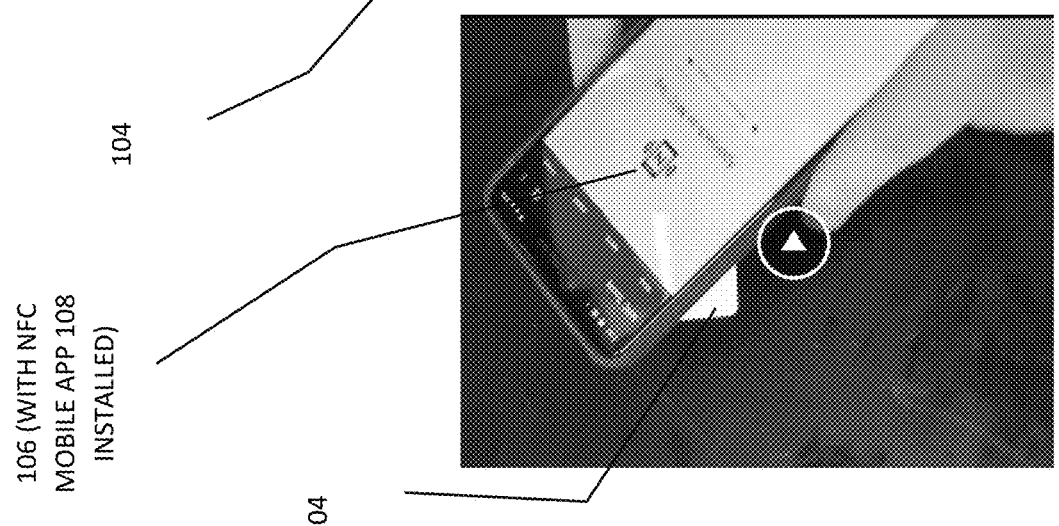
Figure 37C:
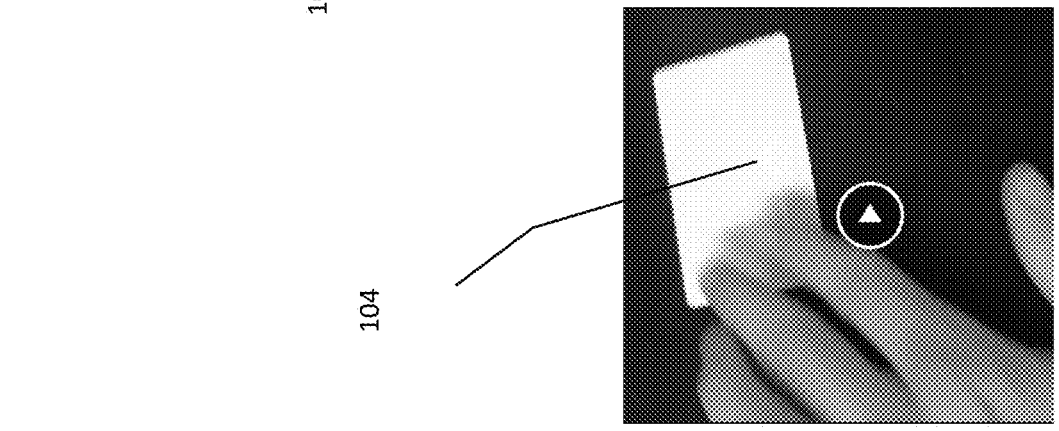
Figures 37F, 37G, 37H:
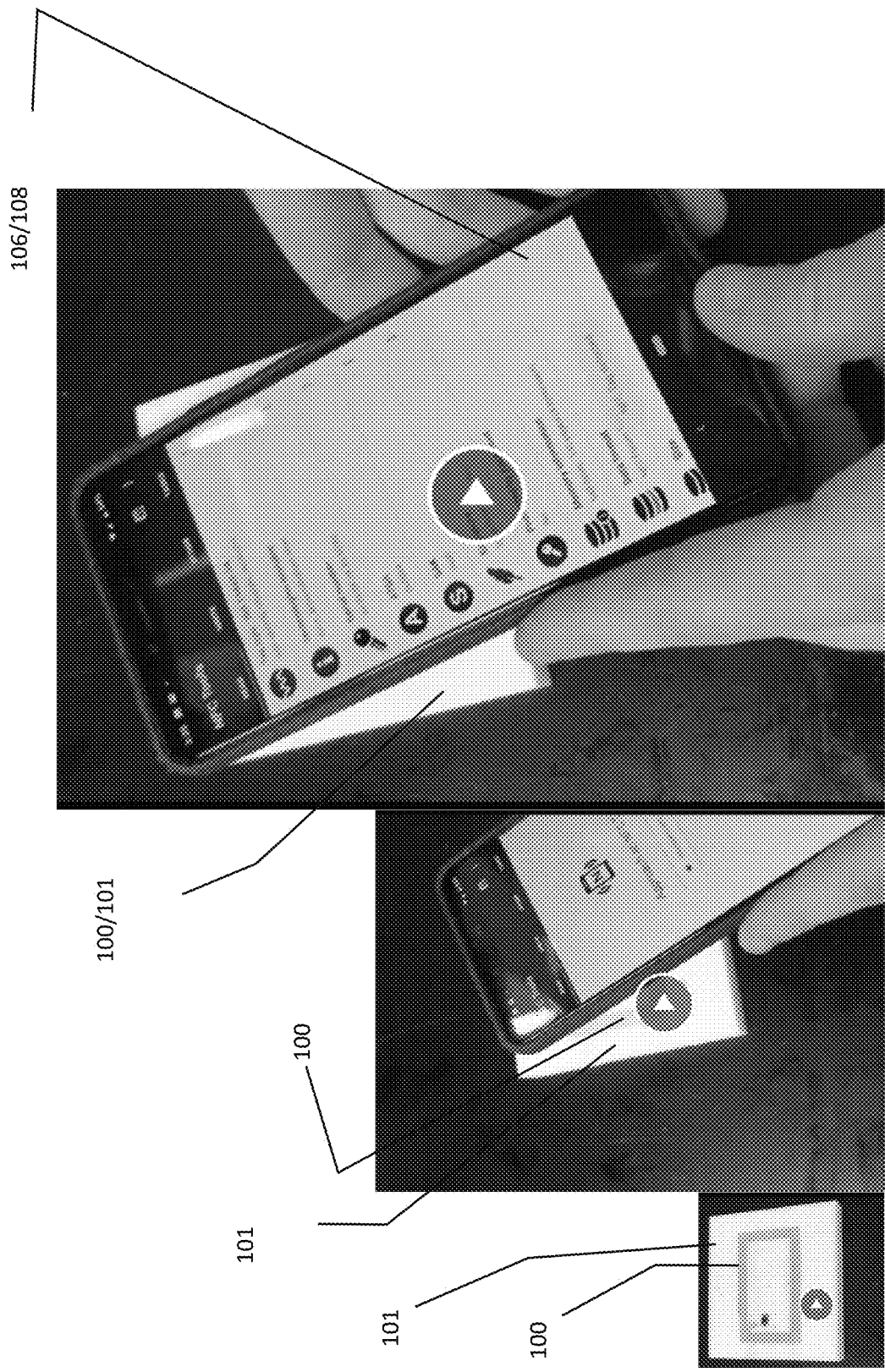

FIGS. 37A-H illustrate one non-limiting specific application using the circuit fabrication method according to the invention to produce an operable end-product, here a near field communication (NFC) circuit on flexible substrate of a size that can operably fit into a smart phone. FIGS. 37A-B are images of, and test data showing efficacy of a several conductor-filled patterned microcircuits formed, by microfluidic techniques according to the present invention and created on both solid and flexible substrate, for near field communication devices such as can work, e.g., with smart phones. The antenna was fabricated using combinations of conductive silver and graphene solutions to achieve different fields. FIG. 37C is an image of a commercially available NFC card with embedded NFC antenna/circuit. FIGS. 37D and E show, respectively, a smart phone with appropriate mobile app searching for the card of FIG. 37C (see FIG. 37D), and then successful NFC with that card (FIG. 37E). FIGS. 37F, G and H show, respectively, a fabricated NFC circuit according to the invention (e.g. FIGS. 37 A, B and F), the same smart phone and mobile app searching for the circuit produced according to the present invention (FIG. 37G), and then successful NFC with it (FIG. 37 11).

4 DETAILED DESCRIPTION OF EXEMPLARY EMBODIMENTS OF THE INVENTION

4.1 Overview

For a better understanding of the invention, aspects of the invention including certain exemplary embodiments, will now be described in detail. It is to be understood that the invention can take a wide variety of forms and embodiments. The embodiments herein are by way of example only and are neither inclusive nor exclusive of all forms and embodiments the invention can take. Variations obvious to those skilled in this technical field will be included within the invention.

For example, the exemplary embodiments will focus on certain exemplary conductive materials (e.g. graphene nanoplatelets, flakes, or the combination of graphene and metal-based solutions (e.g. silver ink) at certain ratios or other forms), certain substrate materials (e.g. polymers or silicon), and patterns (e.g. relatively straight channels). It is to be understood that alternatives and options for each of these is contemplated. The conductive materials are not limited to graphene-based. For example, they could be other carbon or metal-based materials as well. The substrates can take a wide variety of types and properties. And the patterns can take an almost unlimited variety of forms, including variations in length, width, and height (i.e. variations in 3D structural features), variations in direction (e.g. linear, curved, angled, crossing, parallel, non-parallel, etc.) such that they can be filled or coated by the conductive material (usually in viscous or solution form) by microfluidic processes and/or capillary action; or combination of at least any of the above in a single pattern.

A generalized description of aspects of the invention is set forth below followed by more specific examples.

4.2 Generalized Aspects of the Invention

In this section, we report two different, simple, high-resolution, and scalable graphene patterning and transferring methods to address the current limitations of production of solid or flexible graphene circuits.

An exemplary embodiment of a first method involves the following steps:

(i) Preparation of patterned substrates via established techniques such as CNC (Computer numerical control) machine, photolithography, laser etching, deep reactive ion etching, 3D printing or any other technique to create with micro-circuit/channels designs possessing various dimensions; non-limiting examples are width of 5, 10, 50, 100, 200, 300 and 400 Cm and depth of 3, 10, 50 100, 200, 300 μm. These patterns can be directly on silicon wafers, Teflon, Delrin, metal, glass or other flexible polymer substrates. As non-limiting examples, flowrates of 100 μL/min for depths of 50 μm and larger, and flowrates or ~1-2 μL/min for depths smaller than 10 μm can be used. Laser etching, and other techniques can be potentially used to create channels directly in polymer substrates, so it is important to understand there are a variety of techniques and materials that can be used to create the patterned substrate, as will be discussed further below. The patterned substrates can also be used as molds for casting of other biodegradable/non-biodegradable and natural/synthetic polymers to obtain patterned flexible films of these wide range of different materials. Upon film formation, a 3D microstructure with desired mechanical properties is formed. The film microstructure can be porous or non-porous as required. Porous films can be created using phase inversion or pore forming agent leaching methods or any other methods. Then, the dried films can be peeled off from the molds and the circuit/micropattern design (at mentioned pattern dimensions) is transferred to the film surface (ii) The conductive graphene nanoplatelet (GNP) solution (20-60 mg/mL GNP in 70% ethanol) is prepared and sonicated for up to 3 h. After sonication, the solution is annealed at 75° C. for up to 3 h to increase conductivity, sonicated for up to 3 h again and left at room temperature to cool down. The graphene solution can also be used in combination with conductive silver solution (or any other metal-based conducive solution) at certain ratios to enhance the conductivity.

(iii) Following the initial preparation, the GNP solution (or combined GNP//conductive metal solution) is pumped through the microchannels at certain volume and flow rate using a syringe pump set up. A variety of techniques can be used to supply, control flow, and pump the solution into the pattern in effective manner for purposes of the invention. Non-limiting examples are discussed herein. A variety of techniques and apparatus are available and known to those skilled in the art.

(iv) The patterns filled with GNP solution (or combined GNP/metal solution) on solid substrates can be dried (e.g. at room temperature).

Our results indicated that pumping of 60 mg/mL GNP solution at a flow rate of 100 μL/min enables complete coating of the channels (including the channel size ranges mentioned herein) providing good conductivity (~0.5-2 kOhm resistance). In this example, the amount of graphene used to coat 1 $cm^2$ of area is estimated as ~10 μg, which is significantly lower than the other techniques mentioned above.

One advantage of this method is that this microfluidic technique can allow coating in $3^{rd}$ dimension to follow a 3D pattern in the vertical "z" direction, which is difficult to do by ink-jet printing. Another advantage is that the flexible polymeric films with micropatterns can be bent into various 3D shapes (like origami) and then coated with conducted GNP solution using this microfluidic approach. Therefore, 3D geometries of different circuit designs can be obtained.

This approach can be further modified using, e.g., micromanipulators and microcapillary tubes (inner diameter of ~1-2 μm) to create circuits below ~20 μm width/depth. For this purpose, in one example silicon wafers with ~15 μm wide and ~5 μm deep micropatterns were used as solid substrates to directly create the graphene based conductive circuits on silicon wafer or used as molds to cast the polymer solutions to create flexible polymeric films with certain micropatterns. The silicon wafers are placed under the microscope. The films with micropatterns are mounted on a glass slide before placing them under microscope. A capillary tubing with a microcapillary needle (inner diameter of ~1-2 μm) is connected to the syringe pump and micromanipulators. With the help of micromanipulators and microscope the needle is placed into one of the microchannels on the film or solid silicon wafer and a controlled flow of GNP solution is provided to fill the microchannels. This microfluidic approach forms the conductive circuit designs with small dimensions (up to ~5 μm width/depth) on the film or solid substrate surface, which cannot be obtained by any other technique, using significantly lower amount of GNP solution.

The second method is focused on direct transfer of graphene-based patterns from different solid or flexible substrates to the polymeric flexible films via solvent casting. The method consists of three main steps;
 (i) preparation of graphene-based patterns via microfluidic approach on patterned solid substrates (Teflon, glass or Silicon wafer) (Here the ink-jet printed and post-processed graphene-based circuits on any flexible or rigid substrate can also be used)
 (ii) casting of the polymer solution on the graphene-based patterns formed on solid substrates
 (iii) drying of the solvent and formation of films followed by peeling off the films from the substrate, transferring the graphene pattern to the polymeric film surface.

Briefly, Teflon, Delrin, glass or silicon wafer-based substrates with different patterns and dimensions (width: from 10 to 500 μm and depth: from 10 to 300 μm) are prepared using CNC machine or photolithography as in the first method. Then, the graphene nanoflake solution (concentrations varying from 20 to 100 mg/mL in 70% ethanol and thermally annealed at ~75° C. or higher for more than 3 hours) is pumped through the microchannels at certain volume and flow rate using a syringe pump set up as described above. Alternatively, ink-jet printing of graphene patterns on flexible polyimide substrates or any other solid substrate can also be used for graphene-based pattern formation. After the formation of graphene-based patterns, the polymer solution is cast on the patterned substrates at certain volume via direct pouring or spin casting. After the solvent drying, the formed films are peeled off from the substrate surface and the graphene patterns are transferred to the biodegradable/non-biodegradable and porous or non-porous polymer-based 3D microstructured flexible film surface.

The proposed methods are innovative because they represent a substantive departure from the status quo by developing not only direct fabrication of graphene-based circuits on patterned surfaces but also enables the fabrication of polymeric flexible electronics with precise control of 3D microstructural and mechanical properties (such as film porosity, pore size, elasticity etc.) and with high resolutions of graphene patterns (feature dimensions of ~10 μm width/depth). This method can also be broadly applied to various natural or synthetic biodegradable materials with well-defined characteristics such as gelatin, collagen, chitosan, alginate, whey protein isolate, PLLA, PLGA, PVA etc. The conventional flexible electronic films are mostly non-porous, non-biodegradable and inherently planar (2D). Thus, the 3D microstructure, mechanical properties, flexibility and biodegradation rate of the films are controlled by using established phase inversion techniques, pore forming agents, plasticizers or cross-linking strategies. In addition, this method enables the production of 3D flexible electronic devices through 3D molding, 3D printing or bending origami. Development of such electrically conductive, flexible films or solid substrates via this method eliminates the need for any type of expensive equipment (except initial microchannel patterning for the substrates), post-processing, transferring or stamping process and conventionally used PDMS (Polydimethylsiloxane) molding or Cu foil-based transfer. This is a significant advancement over other flexible electronics, including the metal-based, that require expensive pre- or post-processing and are inherently planar. This process also enables circuit design on the biodegradable polymeric films which is not possible with chemically degrading, lithographic patterning techniques. Therefore, this green production method reduces cost, energy and time spent as well as eliminating problem of mounting electronic waste.

As will be appreciated, one unifying theme of these aspects of the invention is: ways to fabricate conductive micro-scale circuits of a wide-variety of high resolution 2D and 3D microstructural forms on a wide-variety of substrates, particularly at room temperature, for a wide-variety of applications without costly or complex procedures, substantial post-processing, or further chemical treatment.

4.2.1 Methods

As indicated above, aspects of the invention can be implemented via methods and techniques of fabrication. The more specific examples below will provide the reader with further information.

4.2.2 Apparatus

As indicated above, aspects of the invention can be implemented via selected apparatus to both fabricate and then use the fabricated circuits. The more specific examples below will provide the reader with further information.

4.2.3 Systems

As indicated above, aspects of the invention can be implemented via systems to fabricate an end product. The more specific examples below will provide the reader with further information.

4.3 Specific Example 1 (Microfluidic Approach)

Fabrication of 2D and 3D High-resolution Graphene Circuits Using a Microfluidic Approach Abstract In this section, described is a simple microfluidic method, which can be universally applied to different rigid (i.e. silicon wafer, Teflon or Delrin) or flexible (made from natural/synthetic and/or non-biodegradable/biodegradable polymers) substrates, was developed for the first time to fabricate high-resolution, conductive, 2D and 3D microstructured graphene-based electronic circuits. Briefly, the method involves controlled filling of predetermined microchannels, created on the surface of any rigid or flexible substrate, with a conductive graphene nanoplatelet (GNP) solution. The annealing of the GNP solution at temperatures up to 75° C., prior to the filling of the channels (pre-annealing), enhances the conductivity, reduces sheet resistance down to ~0.05 kΩ se, enables circuit fabrication at room temperature and eliminates the need for harsh postprocessing, which makes this fabrication technique compatible with substrates that are degradable or otherwise fragile. The method also enables the creation of 3D circuits (circuits with curvatures or different angles relative to the vertical "z" axis) in combination with origami/kirigami or 3D printing, which are difficult to obtain with other methods that work mainly with 2D planar substrates. The final feature sizes of the graphene patterns on the substrates can range from a few micrometers (down to ~5 μm) to millimeters by using very small amounts of GNP solution. This microfluidic approach is not limited to conductive GNP solution but can also be implemented using other conductive liquids, such as a conductive silver solution. This technology has the potential to pave the way for low-cost, disposable and biodegradable circuits for myriad electronic applications.

1. Introduction

The use of graphene-based materials to develop electronic circuits for various applications, including but not limited to portable energy-harvesting devices, sensors, electronic skins, wearable electronic devices, motion trackers, batteries, displays, thin film transistors and so on, has been receiving growing interest[1] due to unique properties of graphene such as exceptional electrical and thermal conductivity, mechanical strength and chemical stability.[2] Most of the graphene-based electronic device fabrication methods, such as photolithography,[3] printing (stencil,[4] gravure,[5] laser[6],[7] and ink-jet[8],[9],[7,8b,10],[11] printing) or pattern transfer (sticky/adhesive tape peeling,[12],[13] transfer printing[14] and micro transfer molding[15]) are complex, require multiple processing steps, additional post treatments (thermal or laser annealing to improve electrical conductivity) and use of high graphene amounts. These processes are not easily scalable and cost- or time-effective, which make them inadequate for rapid prototyping of electrical circuits.[8a],[5a, 5b, 16] Moreover, the post-processing steps, particularly high temperature annealing and chemical etching, are not site selective and are applied to the whole substrate, which can thermally or chemically degrade most substrates and limit the variety of applicable substrate materials.[7] In addition, these methods can only be applied to 2D planar substrates and create patterns with relatively limited resolution and feature sizes.[8b,8c],[9] As opposed to these methods, in this study, a simple, high-resolution, scalable, and post-processing-free, room temperature fabrication of graphene-based electronic circuits on a variety of substrates, using a novel microfluidic approach was developed to address the limitations of current technologies. Although different microfluidic approaches were used before for the fabrication of electronic circuits,[17] they still involve multiple chemical or physical steps such as printing, etching and transferring as well as limitation by the substrate material. Therefore, to the best of our knowledge, a standalone, easy, fast, green and cost-effective microfluidic approach that can create graphene-based electronic circuits on various rigid or flexible substrates in 2D or 3D architectures does not exist in the literature. In this method, graphene nanoplatelet solution is annealed at mild temperatures (~75° C.) prior to the microfluidic process (referred as pre-annealing) eliminating the need for harsh post-processing, enabling room temperature process and in turn, the use of various rigid and flexible substrates, including biodegradable and natural polymers. The presented microfluidic approach can provide high resolution graphene patterns with feature sizes ranging from as low as ~5 μm to millimeters. In addition, since the method is only applied to the surface patterns, a very small amount of graphene is required to obtain the circuits. Moreover, with this microfluidic approach it is possible to create graphene patterns possessing not only 3D microstructure but also 3D geometry/architecture, circuits with curvatures or different angles relative to the vertical "z" axis, using combined approaches with origami/kirigami or 3D printing, which is difficult to obtain with other methods that work mainly with 2D planar substrates. Furthermore, this microfluidic approach can also be broadly applied using other conductive liquids, such as conductive silver solution or solutions obtained by combination of silver and graphene at different ratios, to create high resolution and low feature size patterns on various substrates. In a broader sense, this method can pave the way for the green fabrication of 2D and 3D electronic circuits on different rigid or flexible substrates using various conductive liquids to be used in different electronic applications including but not limited to sensors, electronic skins, robotics, wearable electronics, motion trackers, batteries, displays, thin film transistors and so on.

2. Results and Discussion

This controlled microfluidic approach can be applied to any substrate material (rigid or flexible) with appropriate surface micropatterns with either 2D or 3D geometries. For rigid substrates such as Teflon, Delrin or silicon wafers, the surface micropatterns with desired feature sizes are created using photolithography, reactive ion etching or CNC (computer numerical control) machine techniques. Then, pre-annealed (temperature annealing prior to the application) conductive graphene nanoplatelet (GNP) solutions at predetermined concentrations are flowed through the microchannels at controlled volumes and flow rates using a syringe pump. Upon drying of the GNP solution, a graphene-based electronic circuit on a solid substrate can be achieved (FIG. 1A). The same microfluidic approach can easily be applied to any flexible substrate with predetermined surface micropatterns to create graphene-based flexible electronic circuits. Different techniques can be used for creating surface micropatterns on the flexible polymeric substrates, as long as the feature size of the patterns are appropriate. One way of doing that is to use the rigid substrates with predetermined surface micropatterns as molds to transfer micropatterns to the surface of flexible polymer substrates and subsequently create graphene-based flexible electronic circuits using the microfluidic approach. FIGS. 1B-F show schematic representations of the entire process to achieve graphene-based flexible electronic circuits using the microfluidic approach. These figures illustrate diagrammatically: polymer casting on a solid mold with micropatterns (FIG. 1B); solution drying and film formation (FIG. 1C); peeling off the film and transfer of patterns to the film surface (FIG. 1D); polymer film with surface micropatterns (FIG. 1E) and filling of patterns with conductive graphene solution at controlled flow rate (FIG. 1F). Briefly, biodegradable/non-biodegradable and natural/synthetic polymer-based film formulations are cast on Teflon or silicon wafer molds with microchannel patterns possessing various feature sizes. Upon film formation, with desired 3D porous microstructure and mechanical properties, the films are peeled off from the molds and the micro-circuit patterns are transferred to the film surfaces. Then, the pre-annealed GNP solution is pumped through the micro-circuit channels on the film surfaces at desired concentrations, volumes and flow rates using a syringe pump set up. The patterns filled with GNP solution on flexible polymeric substrates are dried at room temperature.

It is possible to achieve graphene patterns with various sizes and shapes on different polymer-based flexible substrates. FIGS. 1G-L demonstrate the versatility of the microfluidic approach to achieve different feature sizes of graphene patterns on various flexible polymer-based substrates including, but not limited to PLLA, PLGA, CA, GEL and WPI films. However, from this point forward, we will present our results obtained on PLLA films throughout the text. PLLA was selected for this particular study due to its biocompatibility, biodegradability and easy control of microstructural and mechanical properties.

Figure 1M:
Figure 1N:
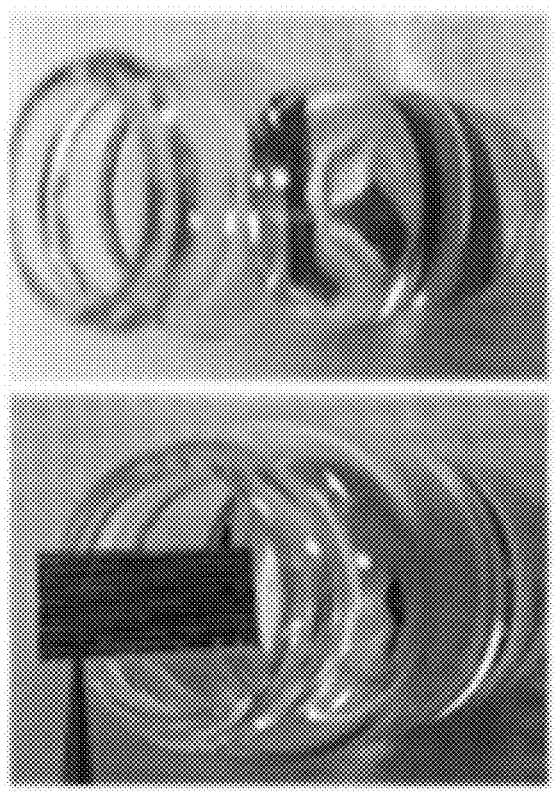

It is anticipated that the graphene nanoplatelets flowing through the PLLA pattern channels attach to the channel walls via non-covalent interactions such as van der Waals, ionic or 7C-7C interactions or hydrogen bonding.[18] The formed graphene patterns demonstrated significant mechanical stability following multiple bending (greater than 100 times) and washing cycles (more than 24 hours) (FIGS. 1M and N). The electrical conductivity of the graphene patterns was also retained along with the mechanical stability. The circuit built in FIG. 1O demonstrated the conductivity of the fabricated device via proper alignment of the patterns, and its low resistance (~1.11 kΩ) even after the multiple bending and washing cycles.

Due to their flexible nature, these polymeric substrates are capable of being bent into various 3D shapes and/or 3D origami patterns, which makes the application of the microfluidic approach and filling of the microchannels with conductive graphene solution in $3^{rd}$ dimension, vertical "z" axis or at different angles relative to vertical "z" axis. FIGS. 1P-S demonstrate filling of channels with graphene solution for different 3D origami shapes such as Z, S, W or spiral. Therefore, 3D geometries of different circuit designs can be obtained using the microfluidic approach. In addition, this method can further be combined with 3D printing to achieve conductive and flexible 3D devices.

Figure 2A:
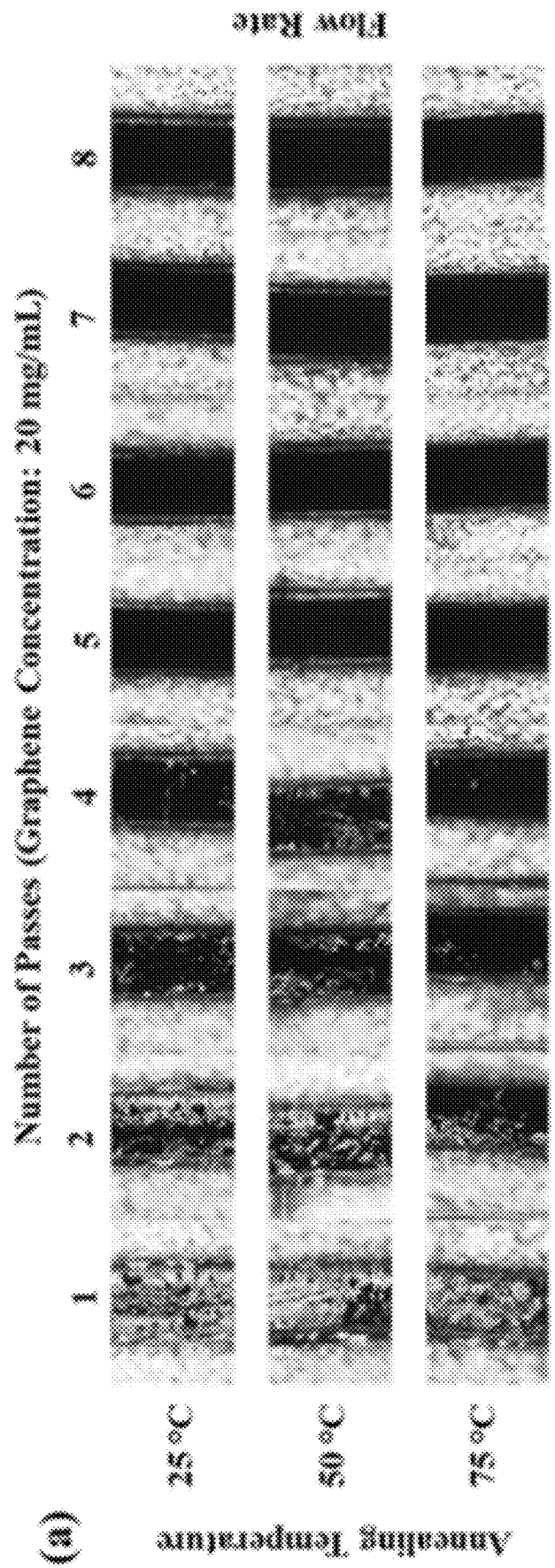
Figure 2B:
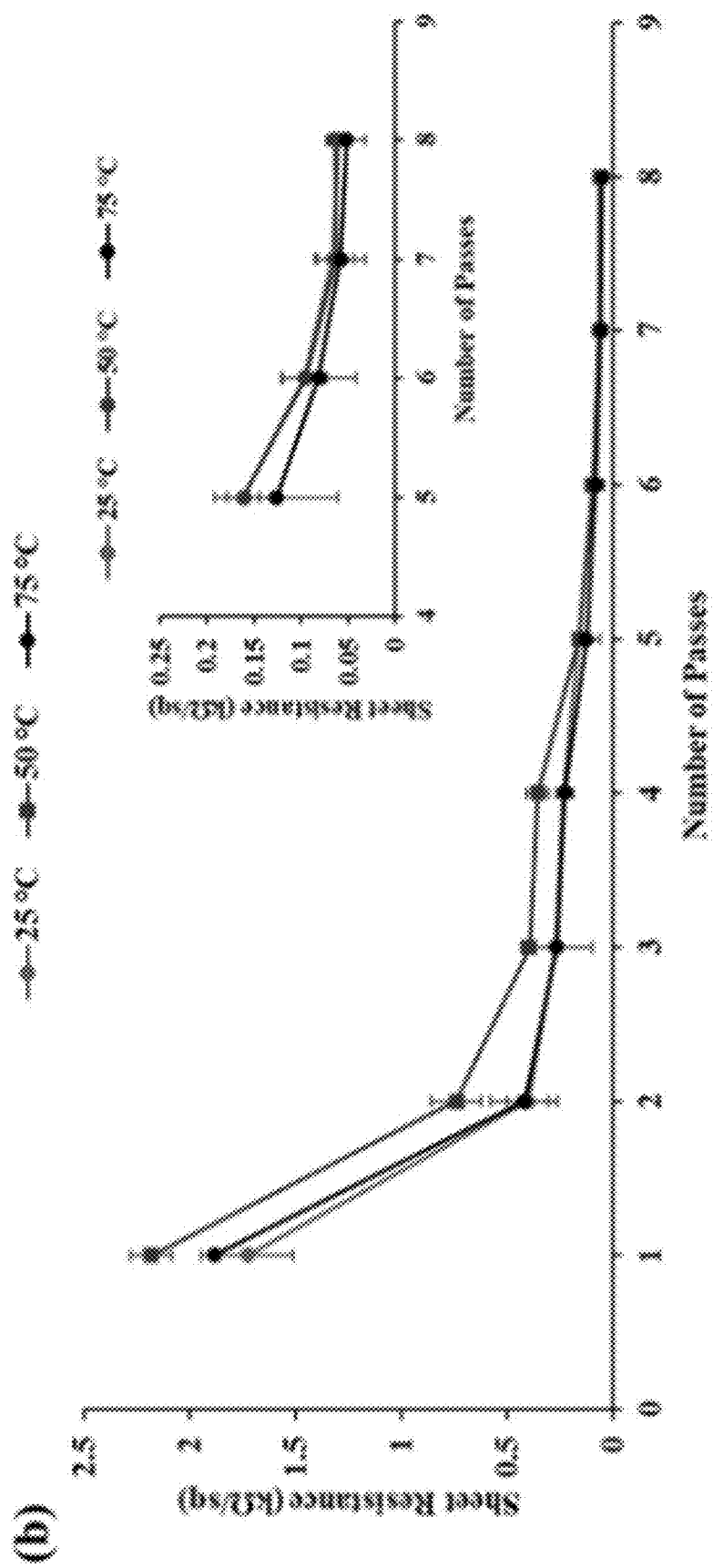

With this microfluidic approach, it is possible to manipulate the conductivity (or sheet resistance) of the graphene patterns by changing various parameters such as concentration of GNP solution, pre-annealing temperature and time, number of passes or the flow rate of GNP solution (FIGS. 2A-E). For the GNP solution with the concentration of 20 mg mL$^{-1}$ in 70% ethanol, the increase in the number of passes resulted in the formation of continuous graphene layers within the microchannels. Particularly after 5 passes, the continuous deposition of the graphene pattern can be observed within the microchannels (FIG. 2A). The pre-annealing of GNP solutions at different temperatures prior to the microfluidic filling process did not show any significant effect on the formation of continuous graphene layers. However, the synergetic effect of pre-annealing temperature and number of passes led to significant enhancement in conductivity. As shown in FIG. 2B, the increase in pre-annealing temperature to 75° C. along with 8 passes decreased the sheet resistance down to ~0.05 kΩ sq$^{-1}$. The temperature-based annealing of GNP solution before the microfluidic filling caused significant alterations in the GNP structure enhancing the conductivity (results shown later in the text). It was noted that the maximum pre-annealing temperature was determined as 75° C., which is right below the boiling point of 70% ethanol. The pre-annealing time was also changed to ascertain its effect on the conductivity. However, results indicated that extending the pre-annealing time beyond 3 hours did not have any significant influence on the conductivity of the graphene nanoplatelet circuits. Therefore, pre-annealing at 75° C. for 3 hours was applied for the rest of the tests. Simultaneously, the increase in the number of passes of the GNP solution augmented the amount of conductive graphene within the microchannels, forming a packed and continuous layer of graphene, leading to pronounced conductivity.

Figure 2C:
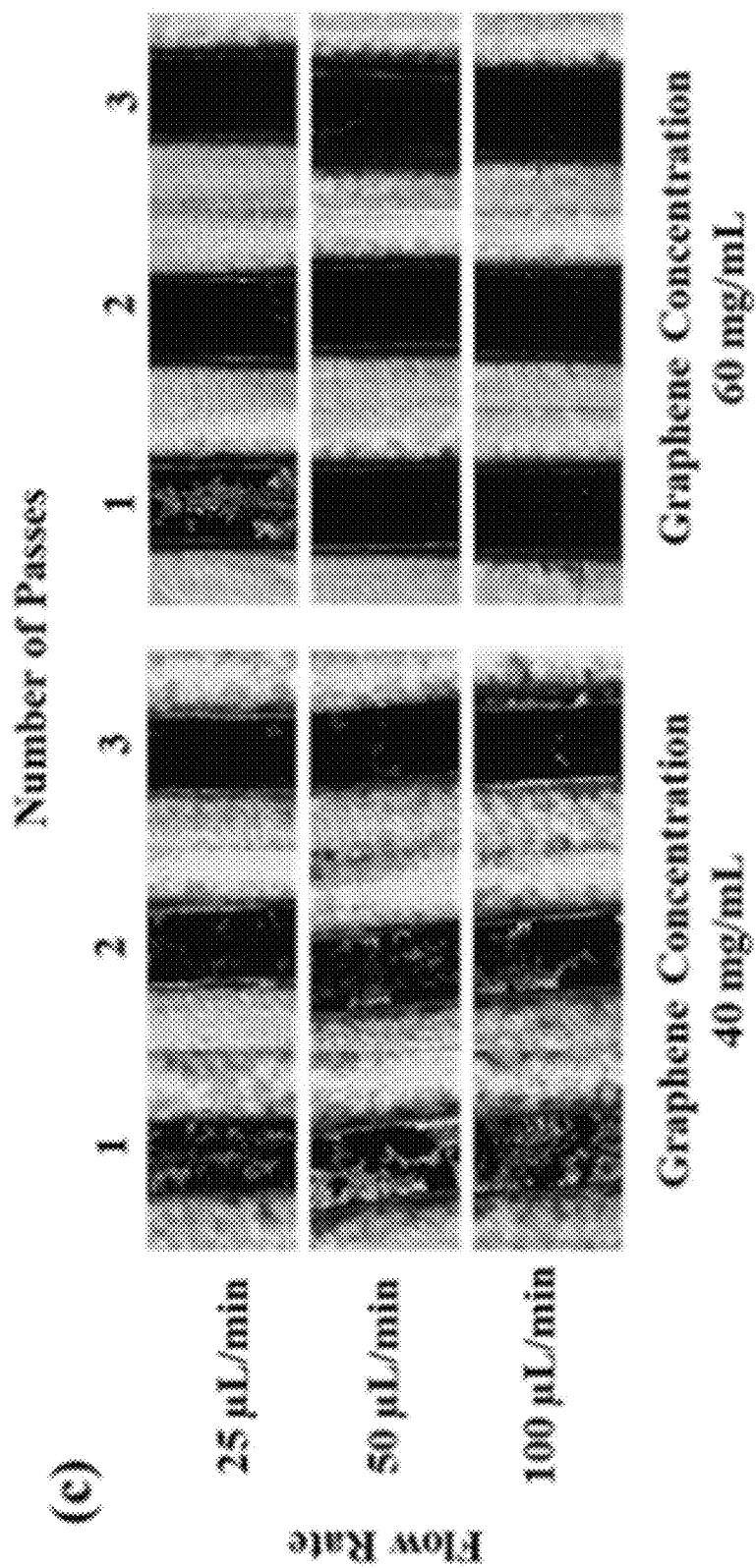
Figure 2D:
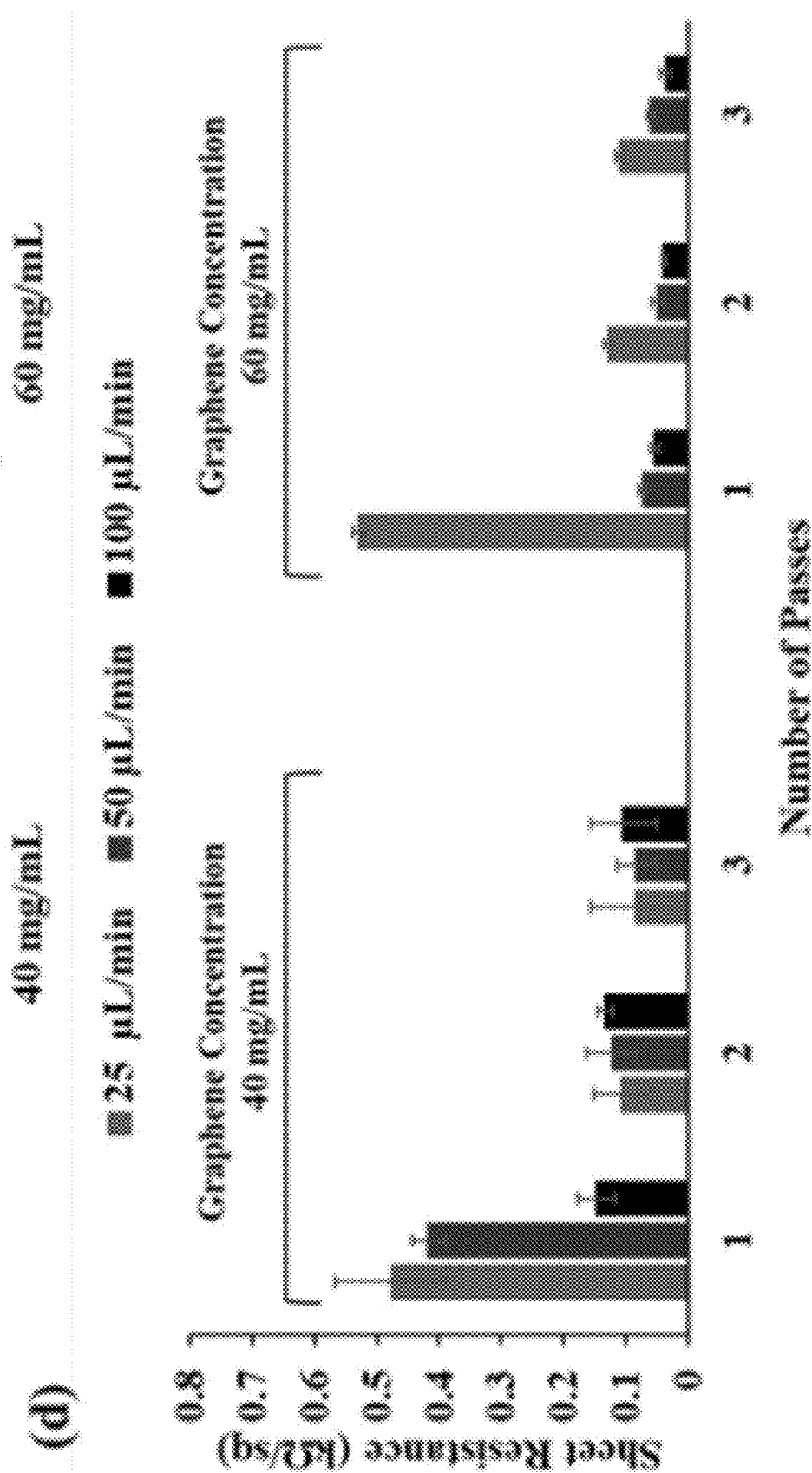

The parameters were further changed to achieve an optimum GNP solution concentration and flow rate that can enable sufficient continuity and conductivity of graphene layers with a single pass. FIG. 2C demonstrated that the GNP solution (pre-annealed at 75° C. for 3 hours at a concentration of 60 mg mL$^{-1}$ in 70% ethanol) pumped through the microchannels at a flow rate of 100 μL min$^{-1}$ provided formation of a continuous graphene layers within the microchannels, while the lower concentrations or flow rates resulted in discontinuous layer formation. This condition also provided the lowest sheet resistance of ~0.1 kΩ se (the highest conductivity) with a single pass (FIG. 2D). It was observed that the higher flow rates resulted in overflow of the GNP solution from the microchannels (data not shown). As the number of passes increased to 3, the sheet resistance decreased down to ~0.03 kΩ sq$^{-1}$ (FIG. 2D). These sheet resistance values are significantly compatible or even better than the values obtained by other techniques, involving heat or laser annealing steps, reported in the literature.[7, 13] In addition, with this approach, in order to obtain ~0.1 kΩsq$^{-1}$ of sheet resistance in an area of 1 cm$^2$, 2.5 mg of graphene is required. This amount is competitive with the other studies, including one study producing graphene circuits on polyimide substrates via ink-jet printing. This particular study used ~1 mg of graphene to coat 1 cm$^2$ of area to obtain the sheet resistance of ~0.7 kΩ sq$^{-1}$.[7] In another study, they used a total of 18 mg graphene to coat 1 cm$^2$ of area and obtained a sheet resistance of ~0.2 kΩ sq$^{-1}$.[13] In addition, both of these prior studies used extensive temperature or laser annealing process to enhance the conductivity. Moreover, in these studies, the thickness of the graphene layer was around ~3.5-15 μm with multiple coatings or passes, however, with our approach, we achieved mechanically stable graphene layers with a thickness of ~20 μm with single pass. The application of pre-annealing approach in our method allows the use of various substrates, particularly natural or synthetic polymers that are sensitive to high temperatures, lasers or chemical processing. Thus, this process also enables fabrication of graphene and polymer-based electronic circuits at room temperature. Furthermore, with this approach, it is also possible to fabricate electronic circuits on various polymeric substrates, including biocompatible/biodegradable polymers, with controllable 3D microstructure, porosity/pore size and mechanical properties for various applications, including but not limited with biomedical applications or implantations. Our results also indicated that these graphene-based circuits on various polymer-based substrates maintained their sheet resistance after multiple bending and washing cycles (FIG. 2E).

Figures 3A, 3B, 3C:
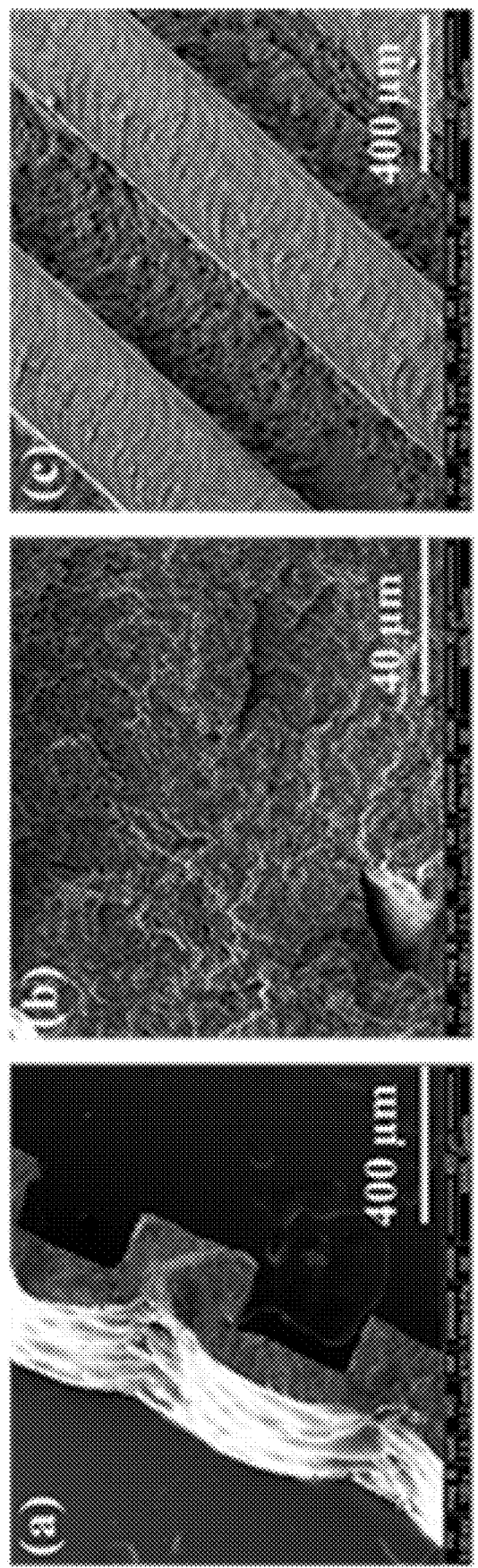
Figure 3I:
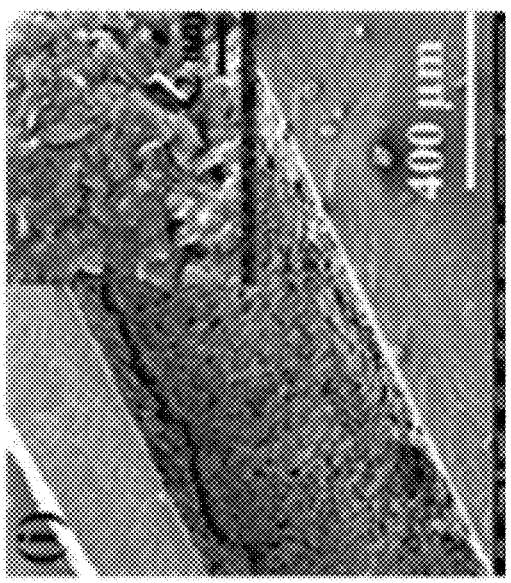
Figure 3H:
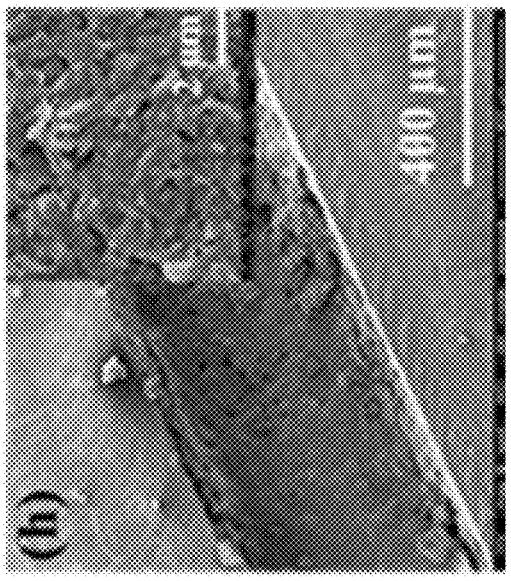
Figure 3G:
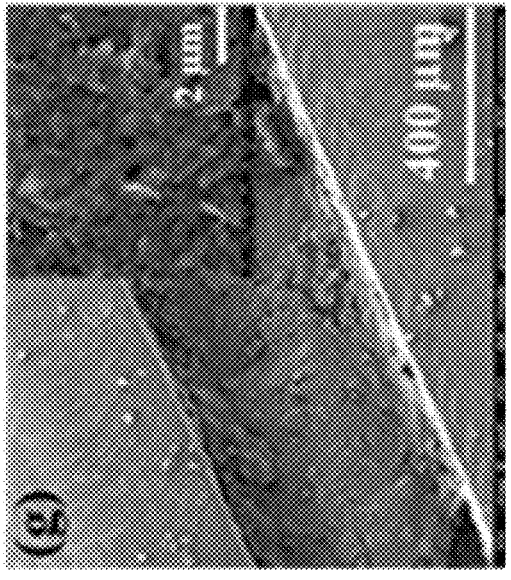
Figure 3O:
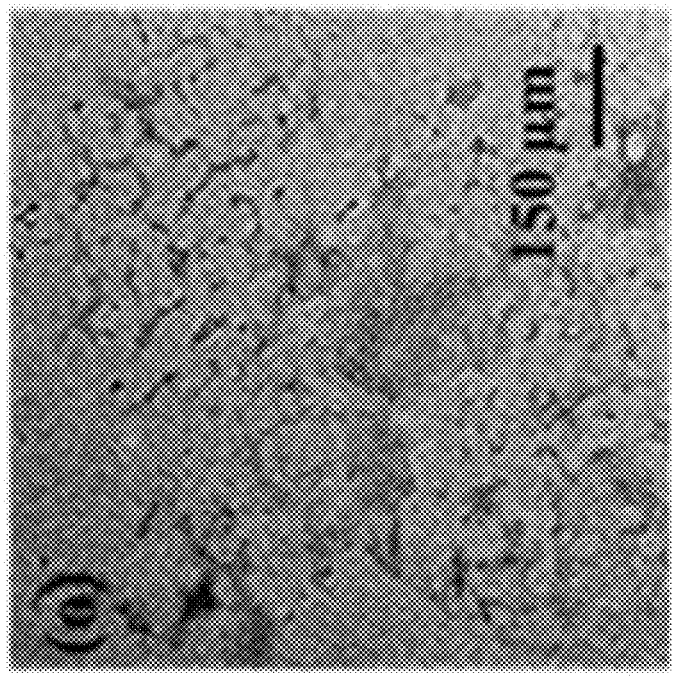
Figure 3N:
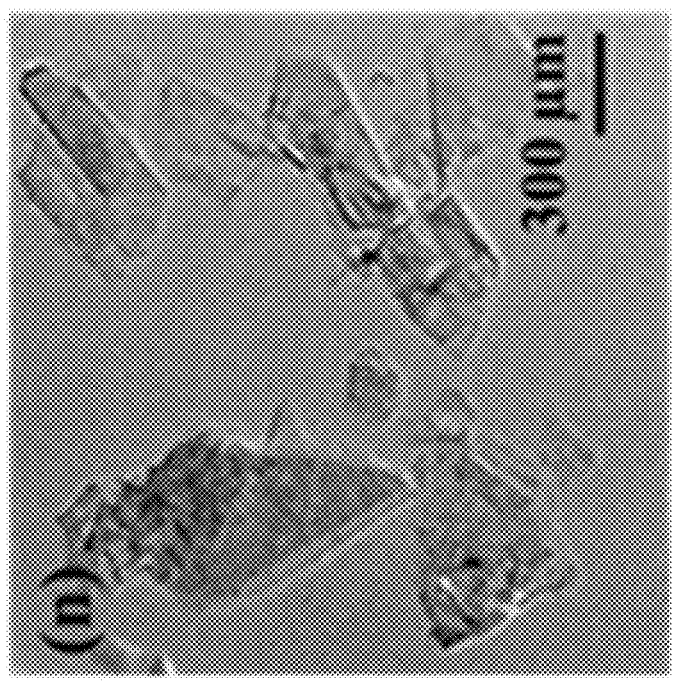
Figure 3P:
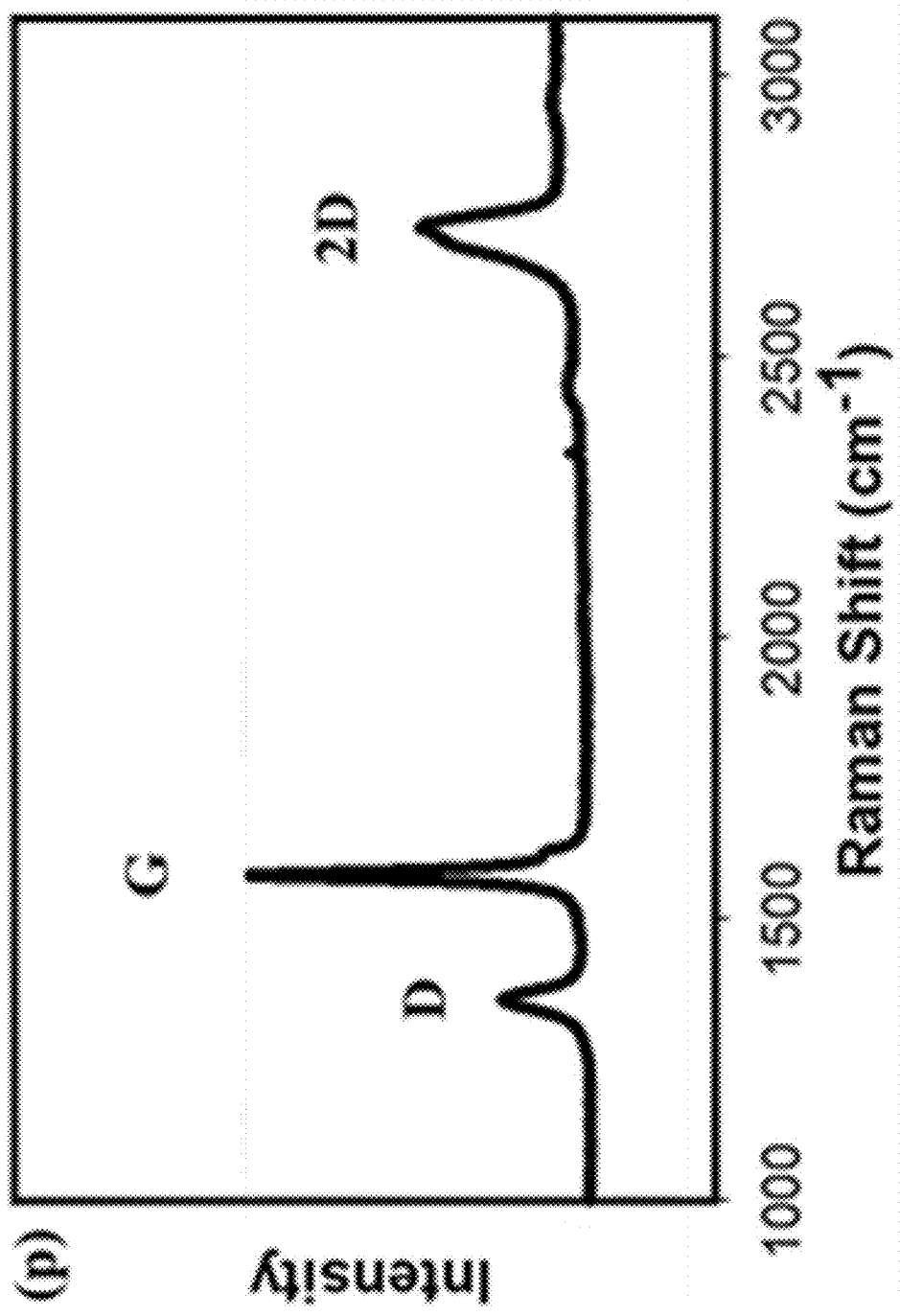

The 3D microstructure of the PLLA films along with the graphene patterns can be seen in FIGS. 3A-C. A precise and accurate transfer of surface micropatterns at various dimensions from rigid molds to the PLLA film surface can be obtained (FIG. 3A). With this approach, it is also possible to control the 3D porous microstructure of the PLLA films via phase inversion (FIG. 3B) as opposed to other graphene-based flexible device fabrication methods. For instance, most of the prior studies with flexible substrates used polyimide or PDMS as their substrate material, which are not biodegradable and difficult to fabricate 3D porous microstructures. The precise surface microchannels also enable the formation of continuous graphene layers within the microchannels via the microfluidic approach (FIG. 3C). The structure of GNPs, pre-annealed at different temperatures and flowed within the microchannels, can be observed in FIG. 3D-F. As the pre-annealing temperature is increased from 25° C. (non-annealed) to 75° C., a more densely packed, continuous graphene structure was observed within the channels. Formation of this structure upon pre-annealing at 75° C. could be one of the main reasons for the high conductivity of the graphene nanoplatelets (FIGS. 2A-E). The increase in the number of passes does not have a significant influence on the graphene structure; however, it leads to an increase in the thickness of the formed graphene layers within the microchannels, enhancing the conductivity (FIGS. 3G-I). The effect of pre-annealing temperature on the graphene structure can also be observed via XPS analysis (FIGS. 3J-M). The classic C1s spectrum of PLLA film was represented with components of C—H/C—C (~284.4 eV), C—O (~286.6 eV), and O—C=O (~289.1 eV) (FIG. 3J). The XPS analysis of graphene pattern on the PLLA film surface revealed the presence of classical C—C (~284.5 eV), C=O (~287.8 eV) and O—C=O (~288.9 eV) graphene peaks[19] along with additional peaks around 282.7 eV, which potentially stems from the existence of graphene layers on the sample (FIGS. 3K-M). With the increase in pre-annealing temperature from 25° C. to 75° C., we did not notice a significant change in C—C (~284.5 eV), C=O (~287.8 eV) and O—C=O (~288.9 eV) graphene peaks whereas a significant decrease in 282.7 eV peak, accompanied by a slight shift toward ~281.5 eV, was also observed, indicating the structural change upon pre-annealing. These peaks formed at binding energies around 282 eV are not classical graphene peaks, which generally can be observed in the range of 284-288 eV[19a], but could be stem from the carbides in the structure of graphene.[20] Carbides are also known as excellent semiconductors and simple thermal annealing induces an in-situ transformation of silicon carbide films into the graphene matrix.[20-21] Therefore, the decrease in the carbide peak upon temperature annealing could be another reason for enhanced conductivity. In addition, the reduction in the GNP size and increase in surface area after pre-annealing and probe sonication, observed in TEM images (FIGS. 3N-O), could also be another reason for enhanced electrical conductivity due to the continuous and densely packed graphene platelets within the film microchannels. In FIG. 3N, the GNP structure can be observed (non-annealed), while the structure of graphene was changed from nanoplatelet form to small particulate form upon pre-annealing and sonication (FIG. 3O). The change in the GNP size upon annealing and sonication was also confirmed by dynamic light scattering measurements. The non-annealed GNP size was around ~600 nm while upon annealing and sonication it became ~250 nm. In addition, the neutral surface charge of non-annealed GNPs turned into negative surface charge (−25 mV) upon annealing and sonication, which was also mentioned in previous studies[22]. The negative surface charge could have an effect on the strong deposition and attachment of GNPs on substrate surface. FIG. 3P shows the Raman spectra of the graphene patterns on PLLA films. Graphene patterns displayed classical and distinct D, G, and 2D peaks at ~1350, 1580, and 2700 cm$^{-1}$, respectively.[7, 23] Graphene patterns depicted a small D peak associated with lattice structure imperfections and edge plane defects in the graphene, as well as large G/2D peaks characteristic of sp2-hybridizated carbon (graphite/graphene structure).[17] Graphene patterns displayed low (IG/ID) ratio, 0.32±0.07, which shows the multi-layer graphene structure.[24]

These results clearly indicate that the microfluidic approach can easily be applied for the fabrication of graphene and biodegradable polymer-based flexible devices with the graphene pattern feature sizes as low as 50 μm in width and depth (FIGS. 1A-S). However, with slight modifications in the experimental set up, this approach can further be used to fabricate graphene patterns with the feature sizes as low as 15 μm in width and 5 μm in depth. Briefly, films with micropatterns were mounted on a glass slide and placed under microscope. A capillary tubing with a microcapillary needle (inner diameter of ~1-2 μm) was connected to the syringe pump and micromanipulators. With the help of micromanipulators and a microscope, the needle is placed into one of the microchannels on the film and a controlled flow of GNP solution was provided to fill the microchannels.

Figure 4A:
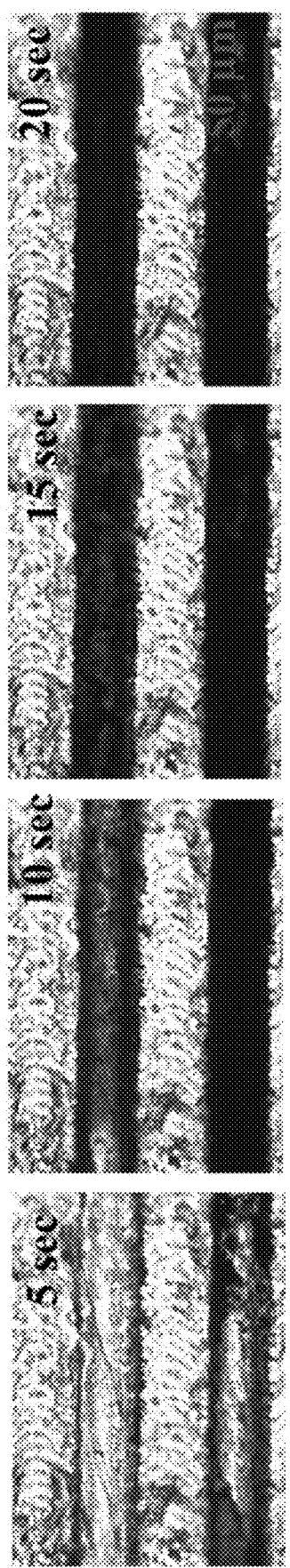
Figure 4B:
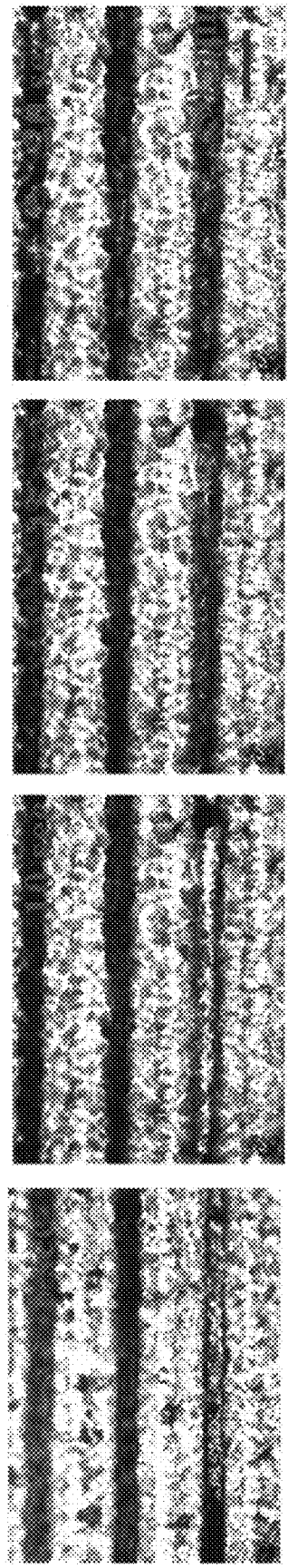
Figure 4C:
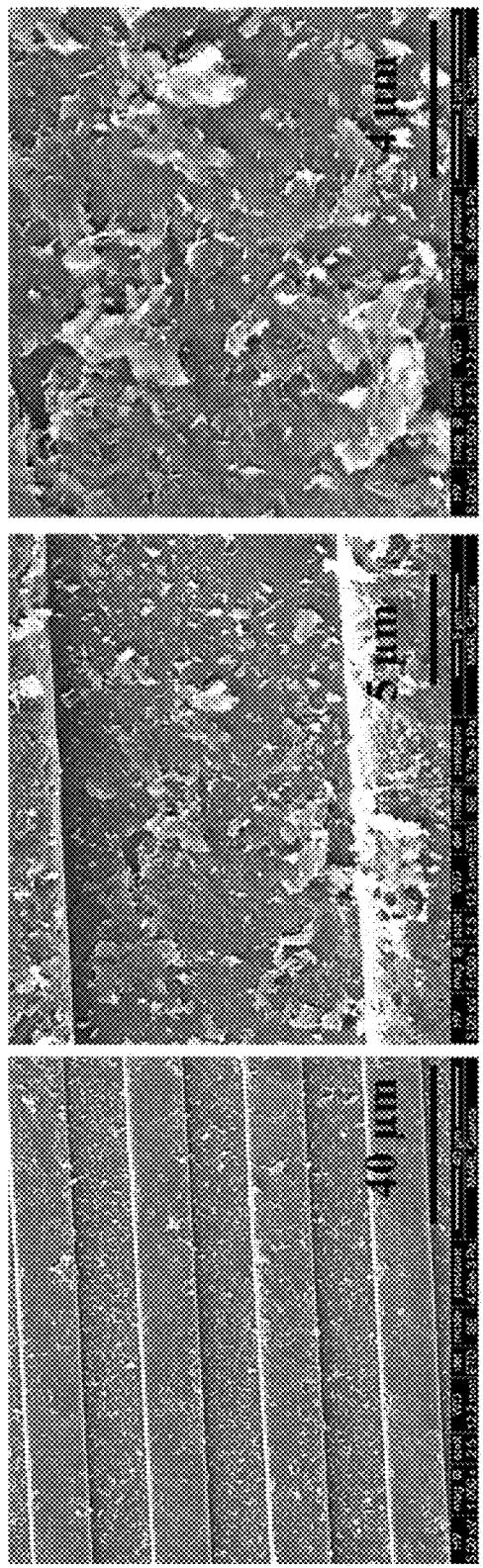
Figure 4D:
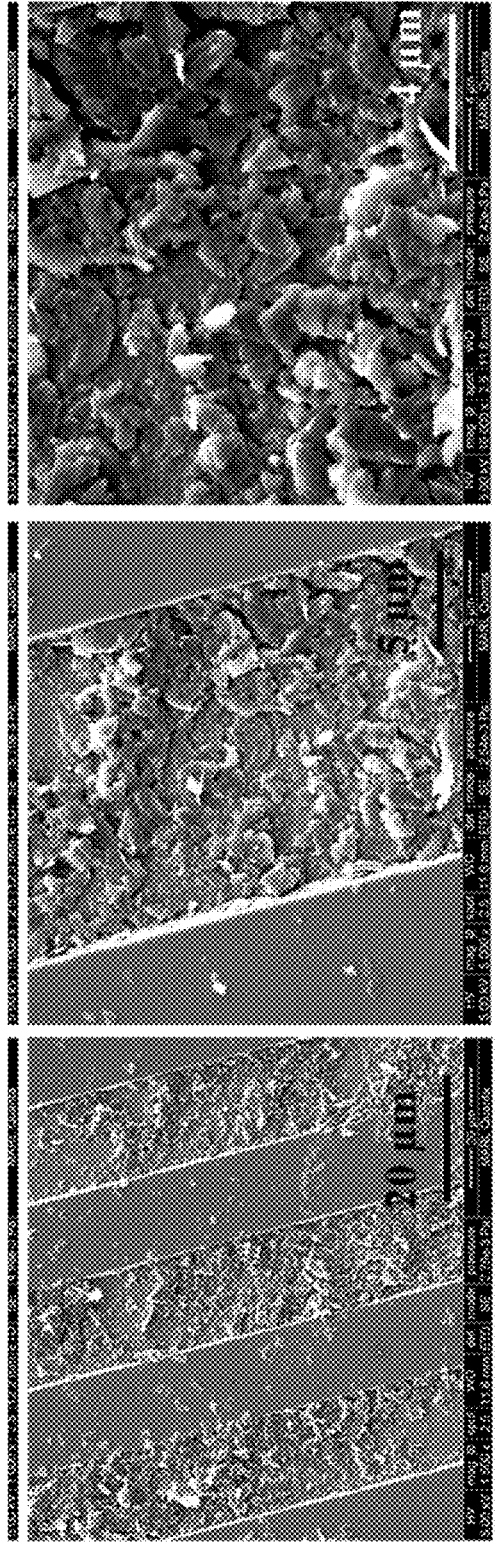

FIGS. 4A-C demonstrate that with this microscopy-aided approach, it is possible to fill the microchannels with feature sizes of less than 50 μm on the PLLA film surface. This approach can form graphene patterns with small features in less than 30 seconds. The microfluidic method (either improved with microscopic approach or not) can also be used for solid substrates with etched surface micropatterns (such as silicon wafer). As seen in FIG. 4D, the graphene patterns on solid silicon wafers with pattern width of ~15 μm form continuous and conductive layers. Therefore, this microfluidic approach can fabricate conductive circuit designs with small dimensions (down to ~5 μm width/depth) on flexible film or rigid substrate surfaces, which cannot be obtained by any other technique, using significantly lower amount of GNP solution.

The appropriate application of the microfluidic method, whether under the microscope or not, depends on the selection of correct flow rate and velocity depending on the channel size. For all of our trials, we were within the limits of laminar flow region (Reynolds number <400). However, flow rate and speed were determinant factors along with the channel dimensions. For channel dimensions ranging from 400 μm to 50 μm width/depth, the maximum flow rate was determined as 100 μL min$^{-1}$. Flow rates above 100 μL min$^{-1}$ resulted in overflow and improper filling. For the channel dimensions smaller than 50 μm width/depth, the maximum flow rate was selected as 1 μL/min. Therefore, the flow rate and speed can be adjusted according to channel dimensions.

Figure 5A:
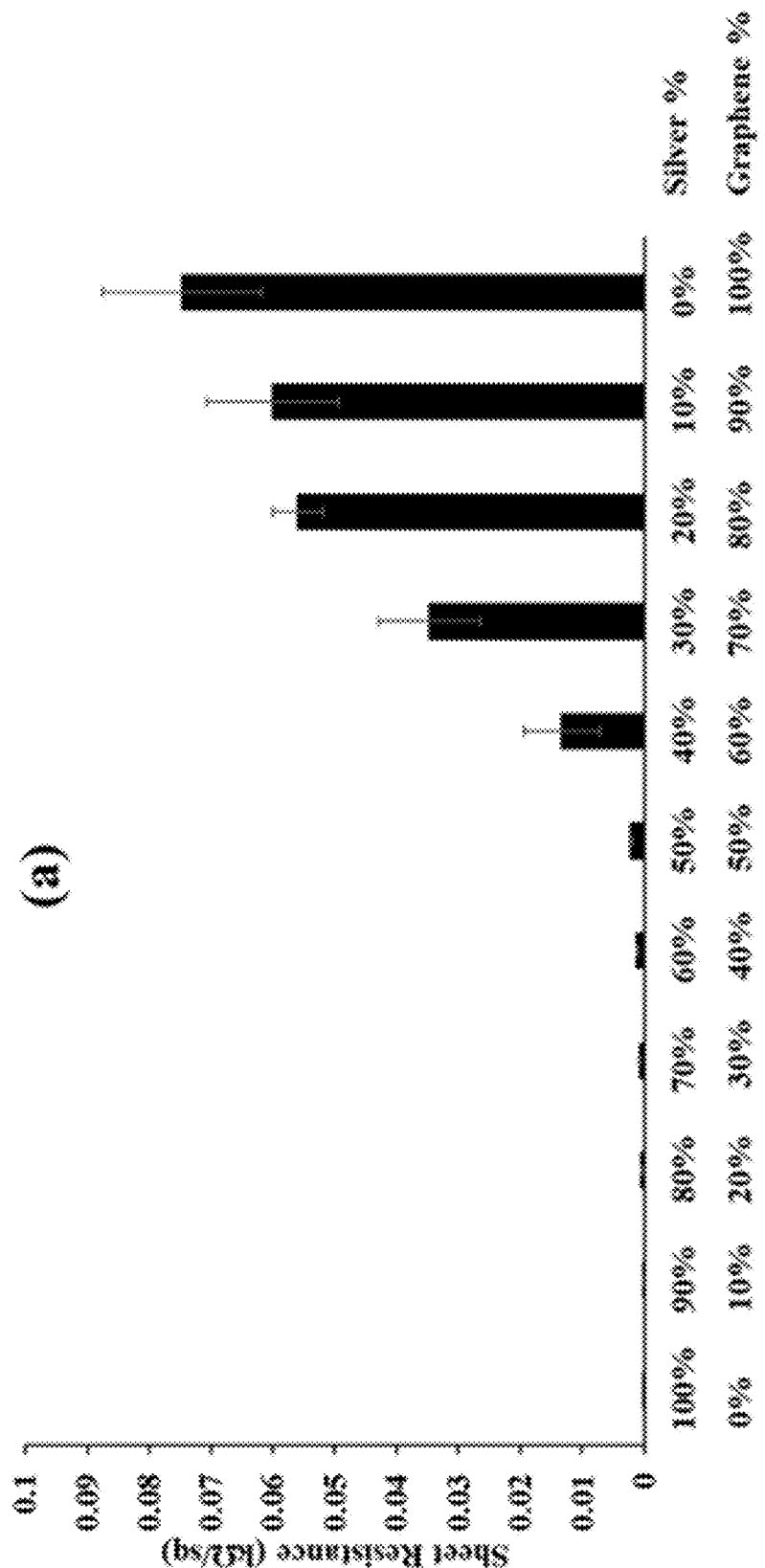
Figure 5B:
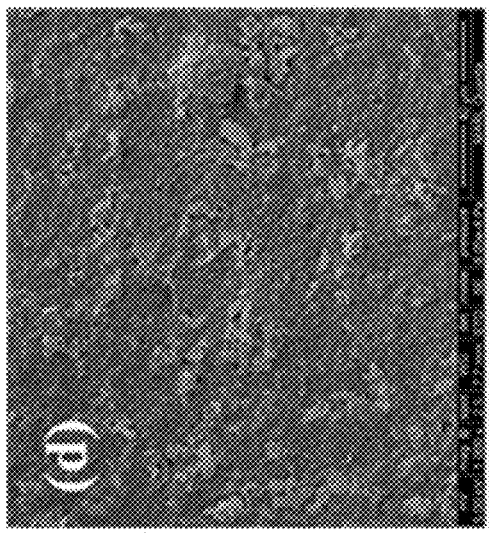
Figure 5C:
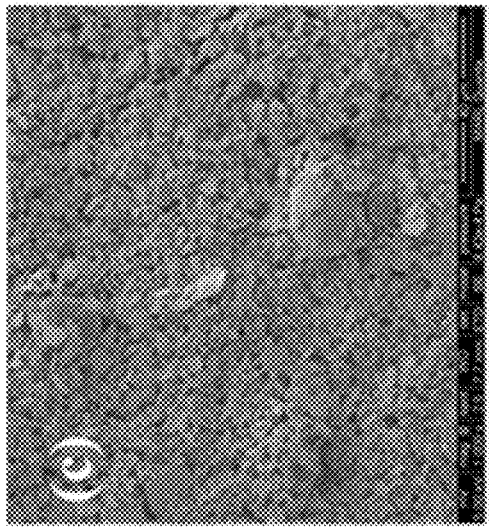
Figure 5D:
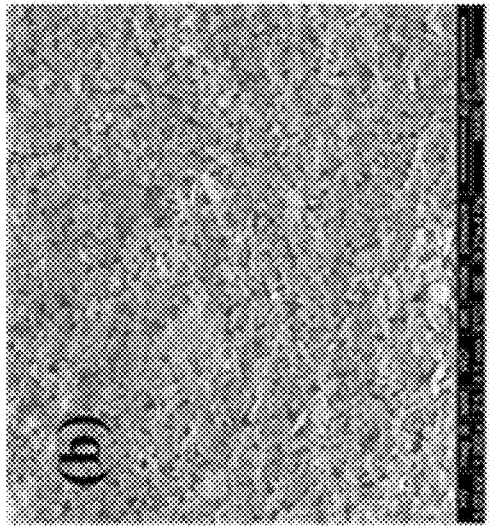
Figure 5E:
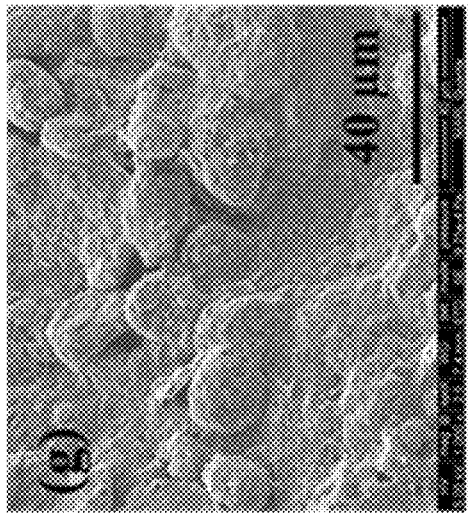
Figure 5F:
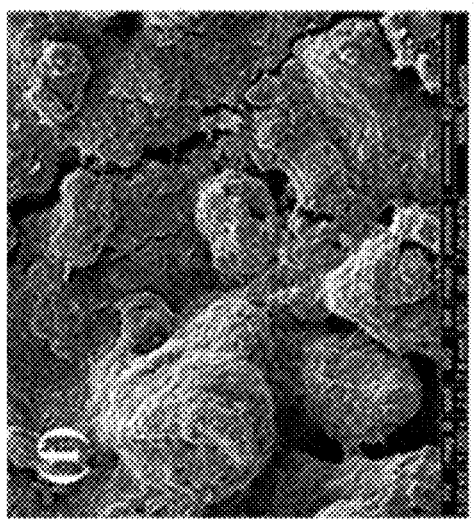
Figure 5G:
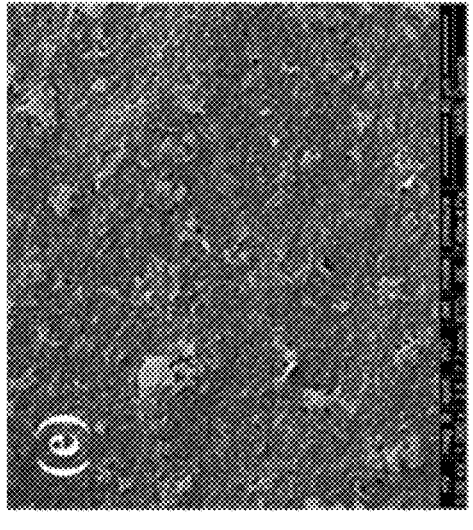

This microfluidic approach is not only limited to conductive graphene solutions but can also be applied using different conductive liquids. We used conductive silver solution and combinations of conductive silver and graphene solutions at different ratios to demonstrate the applicability of the microfluidic approach using different conductive solutions. As can be seen from FIG. 5a, by changing the silver to graphene ratio, it is possible to control the conductivity of the solutions, which in turn controls the conductivity of the formed circuits. Increasing the silver content clearly indicates that the sheet resistance decreases and conductivity increases (FIG. 5A). The change in the structure of silver/graphene solution within the PLLA film channels upon drying can also be observed in FIGS. 5B-G. It was noted that the increase in the graphene content and decrease in the silver content resulted in the formation of more discontinuous patterns compared to the patterns with higher content of silver (FIGS. 5B-G). The XPS analysis in FIGS. 5H and I also indicate classical peaks of silver and graphene as their combination ratios change. The silver peaks at ~382 and ~373 eV showed a decrease, shift towards ~377 and 371 eV and disappear as the silver content decreases (FIG. 5I1). The similar behavior can also be observed in the graphene peaks (FIG. 5I). The obtained circuits also maintained their conductivity and showed stability after multiple binding and washing cycles (data not shown). It is anticipated that the silver and graphene is attached to each other through the effect of binders in silver paste structure and pre-annealing.

These results clearly demonstrate that it is an easy, fast, green and cost-effective method to fabricate graphene-based rigid or flexible electronic devices on various substrates with desired 3D microstructural properties, small feature sizes and high-resolution via the mentioned microfluidic method. The fabricated devices can be used in various biomedical and healthcare applications including, but not limited to, portable energy-harvesting devices, sensors, electronic skins, wearable electronic devices, brain-computer interfaces and many others.

3. Conclusions

The proposed methods are innovative because they represent a substantive departure from the status quo by developing not only direct fabrication of graphene or other conductive solution-based circuits on patterned rigid surfaces under facile and ambient conditions, but also enabling the fabrication of polymeric flexible electronics with precise control of 2D and 3D microstructural and mechanical properties (such as film porosity, pore size, elasticity etc.) and with high resolution of conductive patterns (feature dimensions of as low as ~5 μm width/depth). This method can also be broadly applied to various natural or synthetic biodegradable materials with well-defined characteristics such as gelatin, collagen, chitosan, alginate, whey protein isolate, PLLA, PLGA, PVA etc. The conventional flexible electronic films are mostly non-porous, non-biodegradable and inherently planar (2D). Thus, the 3D porous microstructure, mechanical properties, flexibility and biodegradation rate of the films can be controlled by using established phase inversion techniques, pore forming agents, plasticizers or cross-linking strategies. In addition, these methods enable the production of 3D flexible electronic devices through 3D molding or bending origami. Development of such electrically conductive, and flexible films or rigid substrates via this method eliminates the need for any type of expensive equipment (except photolithography for initial microchannel patterning for the molds or solid substrates), post-processing, transferring or stamping process and conventionally used PDMS molding or Cu foil-based transfer. This is a significant advancement over other flexible or rigid electrode-based electronics, including metals, that require expensive pre- or post-processing, high temperatures, and are inherently planar. This process also enables circuit design on biodegradable polymeric films, which is not possible with chemically degrading, lithographic patterning techniques. Therefore, this green production method reduces cost, energy and time spent, as well as eliminating problem of mounting electronic waste.

4. Experimental Section 4.1. Conductive Solution Preparation: Graphene nanoplatelets were dissolved in 70% ethanol (20-60 mg mL$^{-1}$), bath sonicated for 3 hours and pre-annealed at 25, 50 and 75° C. for another 3 hours. Following this, the GNPs were further probe sonicated at 50% amplification for 15 min. The conductive solution based on the combination of silver and graphene at different ratios was prepared in the same way. Briefly, 60 mg of silver paste (Sigma Aldrich, 791873) was dissolved in 70% ethanol and mixed with graphene nanoplatelet (Sigma Aldrich, 799084) solution (60 mg/mL in ethanol) at different ratios. Then, the sonication and pre-annealing steps were followed as described.

4.2. Micropatterned Film Preparation: The micropatterned molds or solid substrates, Teflon or Delrin, with different surface patterns were prepared using CNC (computer numerical control) machine. On the other hand, silicon wafer molds or rigid substrates with small pattern features were prepared using photolithography. Following the mold preparation, the polymer solutions at desired concentrations (for this case 10% (wt) PLLA in dichloromethane) were casted on the mold and left for drying. The 3D microstructure, porosity and pore size of the films can be adjusted via well-established phase inversion techniques. Upon the film formation the film was peeled off from the solid mold and surface patterns were transferred from slid mold to flexible film surface.

4.3. Graphene Pattern Fabrication: The patterned films (pattern dimensions range 400-50 μm) were mounted on a flat surface. The prepared graphene solution (concentration range 20-60 mg mL$^{-1}$) was pumped through the microchannels with the aid of a syringe pump at a flow rate of 1-100 μL/min in a controlled manner. For the fabrication of 3D flexible circuits, the prepared films were bent into different 3D shapes (like origami) and the microfluidic filling of the channels with graphene solution was conducted in a controlled way using a syringe pump. For the flexible films with micropattern sizes of smaller than 50 μm, we used a microscopic set up consisting of micromanipulators, microneedles, microtubing and syringe pump attached to a microscope. In this set up, the films with micropatterns were mounted on a glass slide and the microfluidic filling of graphene was conducted under microscope. The same approach was also applied to conductive silver/graphene solutions.

4.4. Characterization of the Devices: The stability of the graphene patterns on devices was tested through multiple washing, bending and peeling-off cycles. The conductivity of the devices was determined by building up a circuit and measuring resistance. The microstructure of graphene patterns and devices were characterized through SEM, TEM and XPS analysis.

4.5. Statistical Analysis: The significant differences were evaluated using ANOVA analysis by Tukey's method with a 95% confidence interval. The results are presented as average standard deviation calculated from at least three independent experiments.

References for Specific Example 1

[1] H. Jang, Y. J. Park, X. Chen, T. Das, M. S. Kim, J. H. Ahn, *Advanced Materials* 2016, 28, 4184.

[2] C. Lee, X. Wei, J. W. Kysar, J. Hone, *Science* 2008, 321, 385; b) K. Xu, K. Wang, W. Zhao, W. Bao, E. Liu, Y. Ren, M. Wang, Y. Fu, J. Zeng, Z. Li, W. Zhou, F. Song, X. Wang, Y. Shi, X. Wan, M. S. Fuhrer, B. Wang, Z. Qiao, F. Miao, D. Xing, *Nature Communications* 2015, 6, 8119.

[3] B. Alemán, W. Regan, S. Aloni, V. Altoe, N. Alem, C. Girit, B. Geng, L. Maserati, M. Crommie, F. Wang, A. Zettl, *ACS Nano* 2010, 4, 4762; b) S.-H. Bae, Y. Lee, B. K. Sharma, H.-J. Lee, J.-H. Kim, J.-H. *Ahn, Carbon* 2013, 51, 236; c) M. Hofmann, Y.-P. Hsieh, A. L. Hsu, J. Kong, *Nanoscale* 2014, 6, 289; d) D. Kuzum, H. Takano, E. Shim, J. C. Reed, H. Juul, A. G. Richardson, J. de Vries, H. Bink, M. A. Dichter, T. H. Lucas, D. A. Coulter, E. Cubukcu, B. Litt, *Nature Communications* 2014, 5, 5259; e) X. Li, W. Cai, J. An, S. Kim, J. Nah, D. Yang, R. Piner, A. Velamakanni, I. Jung, E. Tutuc, S. K. Banerjee, L.

Colombo, R. S. Ruoff, *Science* 2009, 324, 1312; f) A. M. H. Ng, Y. Wang, W. C. Lee, C. T. Lim, K. P. Loh, H. Y. Low, *Carbon* 2014, 67, 390; g) K. Yong, A. Ashraf, P. Kang, S. Nam, *Scientific Reports* 2016, 6, 24890; h) L. Zhang, S. Diao, Y. Nie, K. Yan, N. Liu, B. Dai, Q. Xie, A. Reina, J. Kong, Z. Liu, *Journal of the American Chemical Society* 2011, 133, 2706.

[4] Y. Aleeva, B. Pignataro, *Journal of Materials Chemistry C* 2014, 2, 6436; b) X. Zhou, F. Boey, F. Huo, L. Huang, H. Zhang, *Small* 2011, 7, 2273.

[5] J. Hyun Woo, B. Secor Ethan, C. Hersam Mark, C. D. Frisbie, F. Francis Lorraine, *Advanced Materials* 2014, 27, 109; b) B. Secor Ethan, S. Lim, H. Zhang, C. D. Frisbie, F. Francis Lorraine, C. Hersam Mark, *Advanced Materials* 2014, 26, 4533; c) M. Beidaghi, C. Wang, *Advanced Functional Materials* 2012, 22, 4501.

[6] M. F. El-Kady, R. B. Kaner, *Nature Communications* 2013, 4, 1475; b) J. Lin, Z. Peng, Y. Liu, F. Ruiz-Zepeda, R. Ye, E. L. G. Samuel, M. J. Yacaman, B. I. Yakobson, J. M. Tour, *Nature Communications* 2014, 5, 5714; c) B. Senyuk, N. Behabtu, A. Martinez, T. Lee, D. E. Tsentalovich, G. Ceriotti, J. M. Tour, M. Pasquali, I. I. Smalyukh, *Nature Communications* 2015, 6, 7157; d) H. Tian, Y. Shu, Y.-L. Cui, W.-T. Mi, Y. Yang, D. Xie, T.-L. Ren, *Nanoscale* 2014, 6, 699; e) H. Tian, Y. Shu, X.-F. Wang, M. A. Mohammad, Z. Bie, Q.-Y. Xie, C. Li, W.-T. Mi, Y. Yang, T.-L. Ren, *Scientific Reports* 2015, 5, 8603.

[7] S. R. Das, Q. Nian, A. A. Cargill, J. A. Hondred, S. Ding, M. Saei, G. J. Cheng, J. C. Claussen, *Nanoscale* 2016, 8, 15870.

[8] C. M. Weber, C. N. Berglund, P. Gabella, *IEEE Transactions on Semiconductor Manufacturing* 2006, 19, 465; b) E. B. Secor, P. L. Prabhumirashi, K. Puntambekar, M. L. Geier, M. C. Hersam, *The Journal of Physical Chemistry Letters* 2013, 4, 1347; c) M. Singh, M. Haverinen Hanna, P. Dhagat, E. Jabbour Ghassan, *Advanced Materials* 2009, 22, 673.

[9] J. A. Hondred, L. R. Stromberg, C. L. Mosher, J. C. Claussen, *ACS Nano* 2017, DOI: 10.1021/acsnano.7b03554.

[10] K.-Y. Shin, J.-Y. Hong, J. Jang, *Advanced Materials* 2011, 23, 2113; b) F. Torrisi, T. Hasan, W. Wu, Z. Sun, A. Lombardo, T. S. Kulmala, G.-W. Hsieh, S. Jung, F. Bonaccorso, P. J. Paul, D. Chu, A. C. Ferrari, *ACS Nano* 2012, 6, 2992; c) B. Secor Ethan, Y. Ahn Bok, Z. Gao Theodore, A. Lewis Jennifer, C. Hersam Mark, *Advanced Materials* 2015, 27, 6683.

[11] K.-Y. Shin, J.-Y. Hong, J. Jang, *Chemical Communications* 2011, 47, 8527.

[12] K. S. Novoselov, A. K. Geim, S. V. Morozov, D. Jiang, Y. Zhang, S. V. Dubonos, I. V. Grigorieva, A. A. Firsov, *Science (New York, N.Y.)* 2004, 306, 666; b) L. Wang, J. Yu, Y. Zhang, H. Yang, L. Miao, Y. Song, *ACS Applied Materials & Interfaces* 2017, 9, 9089.

[13] S. Oren, H. Ceylon, P. S. Schnable, L. Dong, *Advanced Materials Technologies* 2017, 2.

[14] S. Lee Joong, H. Kim Nam, S. Kang Moon, H. Yu, R. Lee Dong, H. Oh Joon, T. Chang Suk, H. Cho Jeong, *Small* 2013, 9, 2817.

[15] Q. He, H. G. Sudibya, Z. Yin, S. Wu, H. Li, F. Boey, W. Huang, P. Chen, H. Zhang, *ACS Nano* 2010, 4, 3201.

[16] N. E. Sanjana, S. B. Fuller, *Journal of Neuroscience Methods* 2004, 136, 151.

[17] S. Lee, A. J. Aranyosi, M. D. Wong, J. H. Hong, J. Lowe, C. Chan, D. Garlock, S. Shaw, P. D. Beattie, Z. Kratochvil, N. Kubasti, K. Seagers, R. Ghaffari, C. D. Swanson, *Biosensors and Bioelectronics* 2016, 78, 290; b) Y. Mohamed, S. Saurabh, N. Homayoun, *Journal of Micromechanics and Microengineering* 2015, 25, 057001; c) W. Su, B. S. Cook, Y. Fang, M. M. Tentzeris, *Scientific Reports* 2016, 6, 35111; d) M. M. Hamedi, A. Ainla, F. Gilder, D. C. Christodouleas, M. T. Fernandez-Abedul, G. M. Whitesides, *Advanced Materials* 2016, 28, 5054.

[18] V. Georgakilas, J. N. Tiwari, K. C. Kemp, J. A. Perman, A. B. Bourlinos, K. S. Kim, R. Zboril, *Chemical Reviews* 2016, 116, 5464.

[19] a) G. Gao, D. Liu, S. Tang, C. Huang, M. He, Y. Guo, X. Sun, B. Gao, *Scientific Reports* 2016, 6, 20034; b) F. Han, S. Yang, W. Jing, K. Jiang, Z. Jiang, H. Liu, L. Li, *Optics express* 2014, 22, 11436.

[20] K. Nygren, A. M. Andersson, P. Eklund, U. Jansson, *Journal of Materials Science* 2017, 52, 8231.

[21] X. Yu, Z. Zhang, F. Liu, Y. Ren, *Scientific Reports* 2018, 8, 4759; b) F. Bonaccorso, A. Lombardo, T. Hasan, Z. Sun, L. Colombo, A. C. Ferrari, *Materials Today* 2012, 15, 564; c) S. Ivan, K. Volodymyr, Y. Rositsa, *Semiconductor Science and Technology* 2016, 31, 113004.

[22] C. Valles, C. Drummond, H. Saadaoui, C. A. Furtado, M. He, O. Roubeau, L. Ortolani, M. Monthioux, A. Pénicaud, *Journal of the American Chemical Society* 2008, 130, 15802.

[23] Y. Hernandez, V. Nicolosi, M. Lotya, F. M. Blighe, Z. Sun, S. De, I. T. McGovern, B. Holland, M. Byrne, Y. K. Gun'Ko, *Nat Nanotechnol* 2008, 3, 563.

[24] F. R. Wong, A. A. Ali, K. Yasui, A. M. Hashim, *Nanoscale Res Lett* 2015, 10, 233; b) J. A. Hondred, I. Medintz, J. C. Claussen, *Nanoscale Horizons* 2019; c) Q. He, S. R. Das, N. T. Garland, D. Jing, J. A. Hondred, A. A. Cargill, S. Ding, C. Karunakaran, J. C. Claussen, *ACS applied materials & interfaces* 2017, 9, 12719.

Further Discussion of FIGS. 1-5

FIGS. 2A-D. The effect of pre-annealing temperature (refers to the annealing of GNP solution prior to the filling of the microchannels), concentration, number of passes and flow rate on the conductivity of graphene patterns. (a) Light microscopy images showing different number of passes of flowing of the GNP solution (with 20 mg/mL concentration in 70% ethanol and pre-annealed at different temperatures (25, 50 and 75° C. for 3 hours) before filling the channels) through the microchannels to obtain continuous deposition of graphene nanoplatelets within the microchannels. (b) Change of sheet resistance with respect to graphene pre-annealing temperature and number of passes (p<0.05). (c) Light microscopy images showing optimization of the concentration, number of passes and flow rates for the continuous deposition of graphene nanoplatelets within the microchannels (graphene solution pre-annealing temperature: 75° C.; annealing time: 3 hours). (d) Sheet resistance of the graphene patterns for the optimized parameters (p<0.05). Surface micropattern width: 300 µm; depth: 150 µm; length: 2 cm. Graphene solution pre-annealing temperature: 75° C.; annealing time: 3 hours. (e) Stability of the circuits after multiple bending (100 times) and washing cycles (100 times) (p<0.05). Graphene concentration: 60 mg mL$^{-1}$. Flow rate: 100 µg mL$^{-1}$. Number of passes: 1.

FIGS. 3A-P. (a-c) SEM images of PLLA films and graphene filled microchannels. (a) Cross section of PLLA film and surface micropatterns. (b) 3D porous microstructure of PLLA film. (c) PLLA film surface microchannels filled with GNPs. (d-f) SEM images of GNPs, previously annealed at different temperatures and filled in microchannels. (d) Non-annealed GNPs. (e) GNPs pre-annealed at 50° C. (f) GNPs pre-annealed at 75° C. (g-i) The effect of number of passes of the GNP solution. Flow rate: 100 µL min$^{-1}$; Pre-annealing temperature: 75° C. (g) 1 pass. (h) 2 passes. (i) 3 passes. (j-m) XPS analysis of PLLA films with graphene surface patterns. (j) PLLA film (k) PLLA film with graphene pattern, non-annealed. (l) PLLA film with graphene pattern, pre-annealed at 50° C. (m) PLLA film with graphene pattern, pre-annealed at 75° C. (n-o) TEM images of GNPs. (n) non-annealed. (o) pre-annealed at 75° C. (p) Raman spectra of graphene patterns on PLLA films. (Graphene concentration: 60 mg mL$^{-1}$. Flow rate: 100 µg mL$^{-1}$. Number of passes: 1)

FIGS. 4A-D. Images showing graphene patterns with feature size lower than 50 µm using microscopic approach. (a-b) Images captured from movie demonstrating filling of the microchannels with GNP solution under microscope. GNP filling of PLLA microchannels with microchannel width of (a) 50 µm and (b) 20 µm. SEM images of graphene patterns with pattern width of 15 µm (c) on PLLA films and (d) on solid silicon wafer.

FIGS. 5A-I. (a) Sheet resistance of the patterns created using conductive silver/graphene solution combined at different ratios (p<0.05). Structure of silver/graphene solution. (b) 100% silver (c) 80% silver 20% graphene (d) 50% silver 50% graphene (e) 40% silver 60% graphene (f) 20% silver 80% graphene (g) 100% graphene within PLLA channels upon drying. The change in the (h) silver and (i) graphene XPS peaks as the silver/graphene ratio changes.

4.4 Specific Example 2 (Microfluidic Approach)

With particular reference to appended FIGS. 6-11 (and also some references to FIGS. 1-10 related to Specific Example 1), additional specific supplementing but non-limiting examples of fabrication of a graphene-based microcircuit with microfluidic techniques according to aspects of the invention will be described.

The example has the following characteristics:

a. A pre-processed solution of graphene-based particles in a carrier fluid (e.g. alcohol). The concentration can be varied (see below). The graphene-based particles can be tuned regarding electrical properties by annealing or other techniques (see below). The annealing process of graphene solution is conducted through heating the graphene solution at certain temperature and duration before the filling/coating of the channels via microfluidic approach. Henceforth, we refer to this process as "pre-annealing" The solution is configured to be cast or distributed over or into microchannels by microfluidic techniques or a pipette.

b. A flexible polymer film having the microchannels created by casting or distributing a polymer solution over a prefabricated high-resolution mold with a negative of the microchannels. The polymer solution is distributed over the mold. Some of it settles by gravity into the microchannels but a layer is formed over the mold. By simple drying at room temperature, a unitary film can be peeled from the mold. The film thus has a reproduced positive of the microchannels on one side.

c. The graphene-based solution is then introduced to the microchannels. In one example, it is pumped into the channels with microfluidic apparatus. By pumping force and capillary action, the graphene-based solution moves through the length of a channel. By room-temperature drying, it dries in place along that channel to form a coating of at least some of the 3D structural features of the channel. Additional coatings over that first coating can then be sequentially conducted to build up coating layers in the channel, as desired. The entire width and height of a channel can be filled up, or just a low-profile single coating (see below).

d. The dried graphene-based material adheres to the substrate. The combination of graphene-based material coated in the 3D microchannels of the substrate presents a combination that can then be applied for use. The electrical properties of the graphene-based material can be used as a microcircuit. The material properties of the substrate can be selected for the desired use. Repetitions of steps c and d (multiple passes) can lead to thicker conductive material in the channels with enhanced conductivity as shown below.

e. The combination allows fabrication of a wide variety of microelectrical circuits of a wide variety of 3D structural features without complex post-processing, including on substrates that range from rigid/solid to flexible/stretchable.

f. The possible applications are many, including but not limited to wearable circuits, implants, sensors, and many more (see below).

Results for the Microfluidic Method:

The versatility of this method was demonstrated with various polymeric materials including gelatin, whey protein isolate, PVA, PS, PLGA etc. The presented data is for PLLA based films. The pre-annealing of the graphene solution is done prior to introducing it on the substrate.

Figure 6:
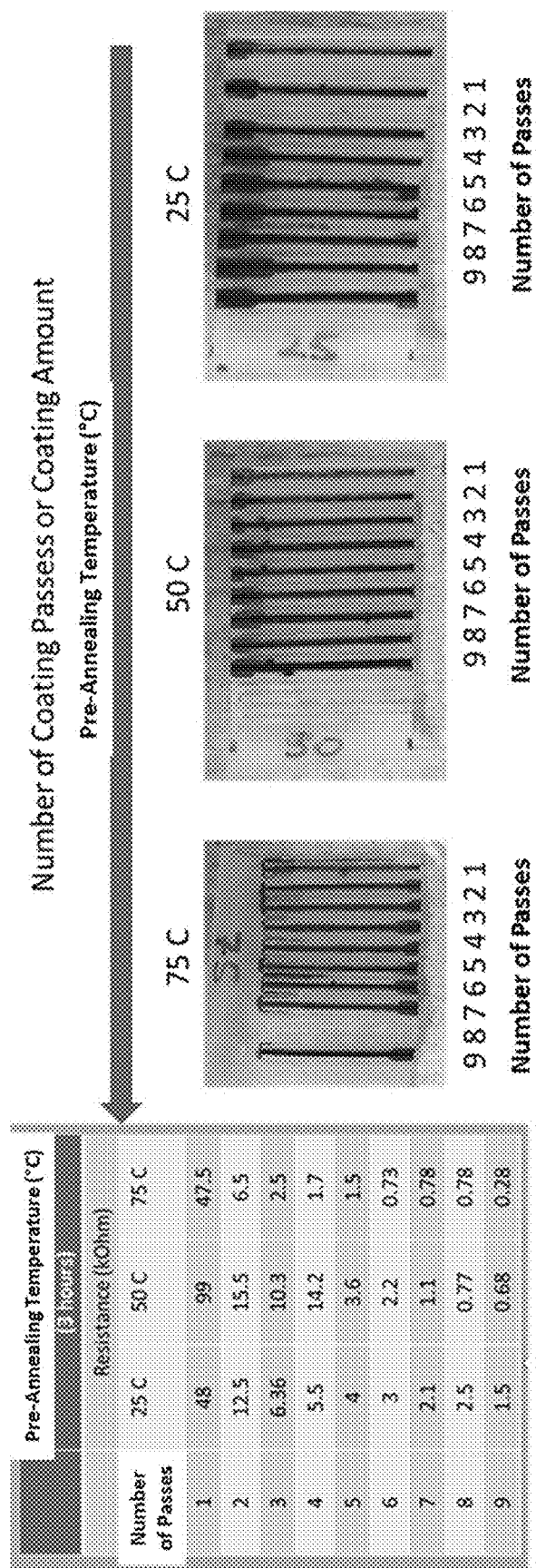

FIG. 6 indicates change of resistance with respect to graphene solution pre-annealing temperature prior to substrate application and graphene solution number of passes through the microchannels. The resistivity of graphene coating in the channels decreases as the pre-annealing temperature increases from 25 to 75° C. Similarly, the increase in the graphene solution pass number through the microchannels (the graphene solution concentration was kept at 20 mg/mL) from 1 to 9 passes, led to a significant decrease in resistivity. With the annealing temperature of 75° C. and 9 passes of graphene solution (20 mg/mL), we were able to decrease the resistance to ~0.28 kOhm.

FIG. 2A shows that after 5 number of passes the deposited graphene nanoplatelets in the channels form a continuous circuit.

FIGS. 3A-C shows the 3D porous microstructure of PLLA film and pattern grooves filled with graphene nanoplatelets. The continuous graphene nanoplatelet deposition can also be observed.

Figure 7:
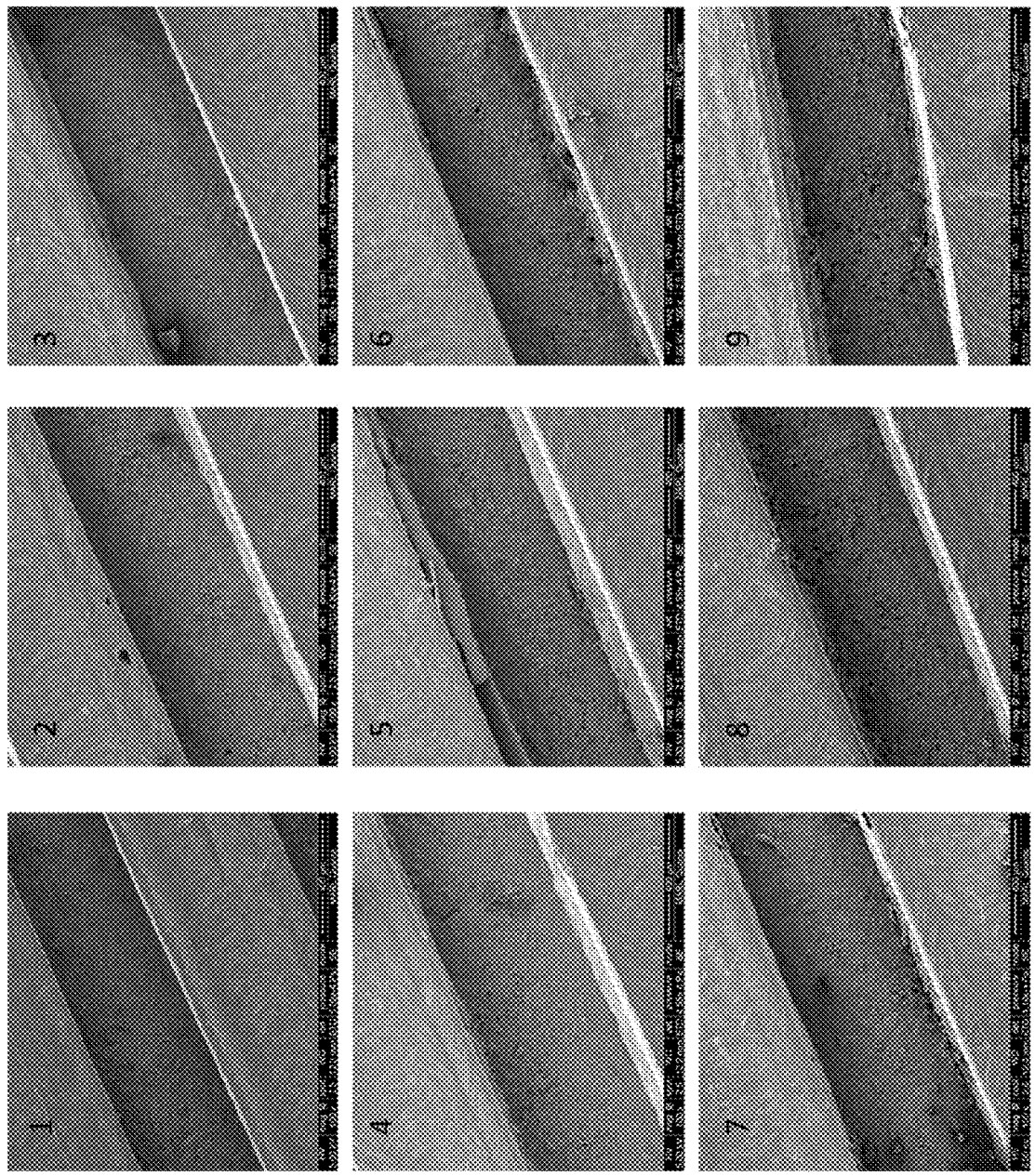

FIG. 7 demonstrates the continuous deposition of graphene nanoplatelets in the channels as the number of passes increases, thus indicating the effect of number of graphene solution passes in the channels.

Figure 8:
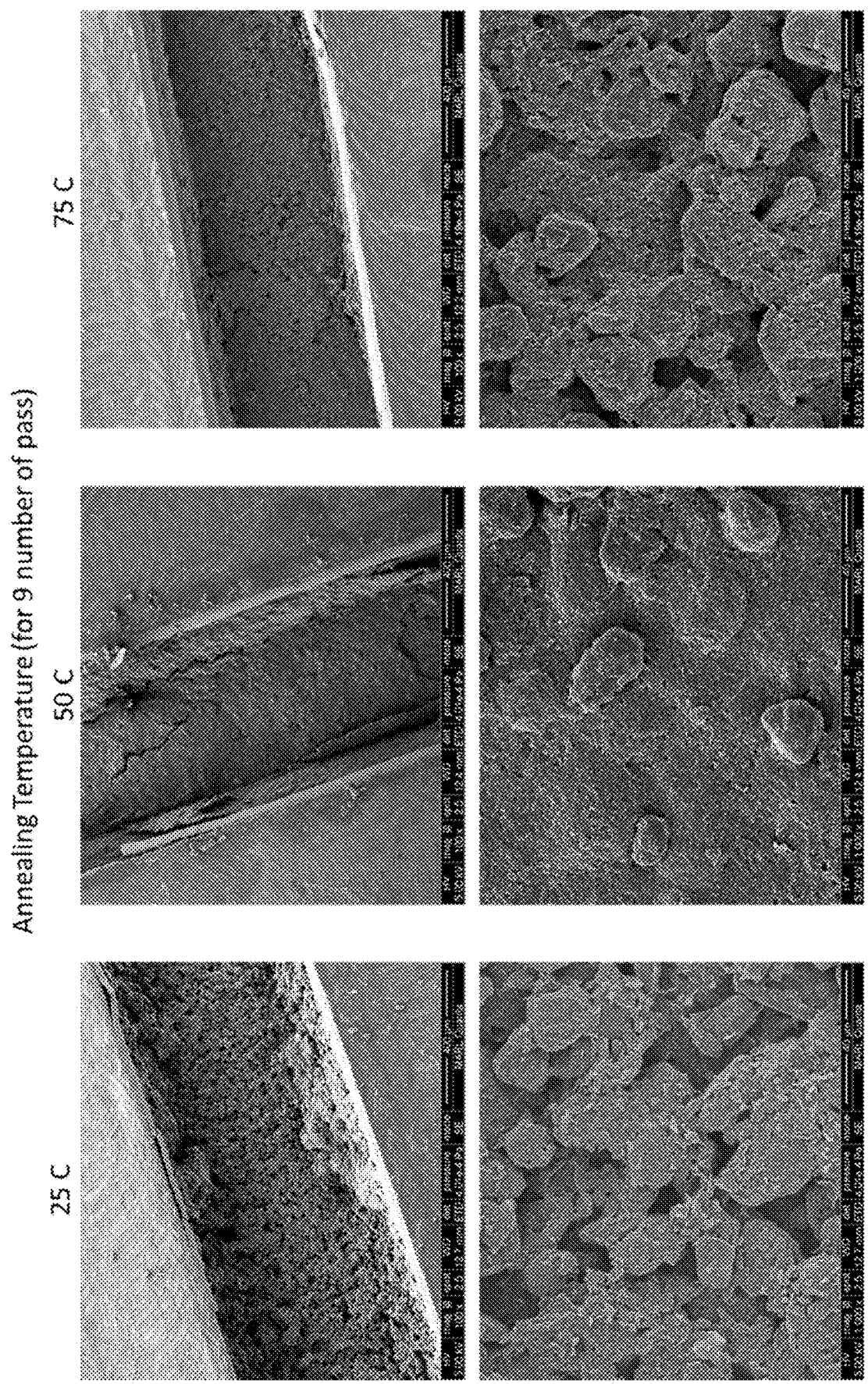

FIG. 8 shows that with the increase in pre-annealing temperature from 25 to 75° C., the graphene nanoplatelet structure in the channels become denser and stiffer increasing the conductivity and reducing the resistance, thus indicating the effect of pre-annealing temperature on graphene nanoplatelets deposition and structure for 9 passes.

FIG. 2C shows that as we increase the graphene concentration up to 60 mg/mL, we can achieve a continuous filling of the channels with 1 pass at a flow rate of 100 µL/min. The resistance for this case is at ~0.5 kOhm.

Figure 9:
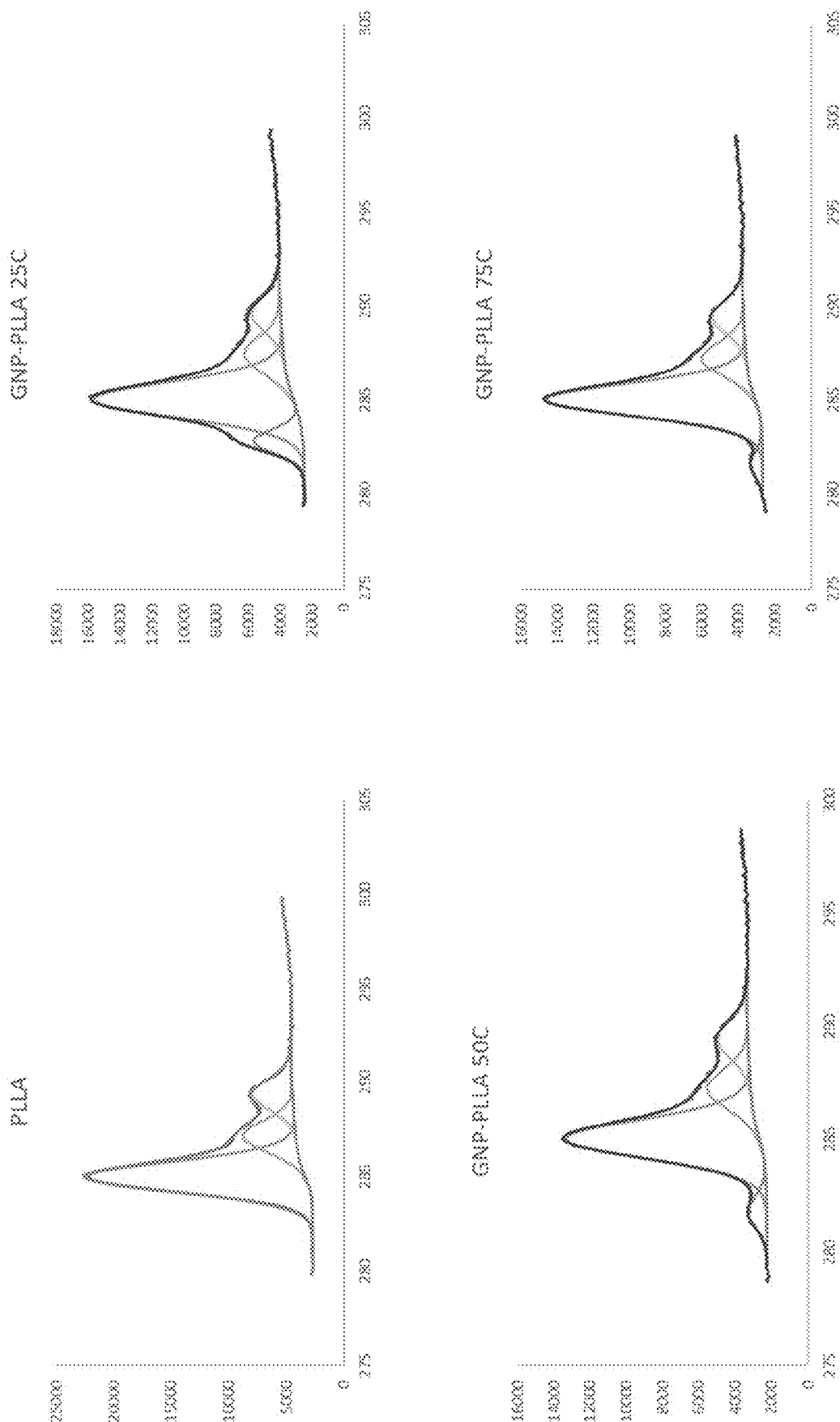

FIG. 9, an XPS analysis of graphene solution pre-annealed at different temperatures, shows that the graphene nanoplatelets annealed at 75° C. has expected structural changes to increase the conductivity after filling the PLLA film patterns.

Based on these results, the rest of the experiments were conducted using a graphene solution (60 mg/mL) annealed at 75° C. and filled with 100 µL/min in the pattern grooves. At these conditions the resistance of the PLLA based device that we developed was compared with ink-jet printed and laser annealed device. Our approach provided lower resistance. The calculated sheet resistance of our device was reported as ~0.2 kohm/sq while the ink-jet printed had ~1.5 kohm/sq sheet resistance. See FIG. 1O.

Figure 1O:
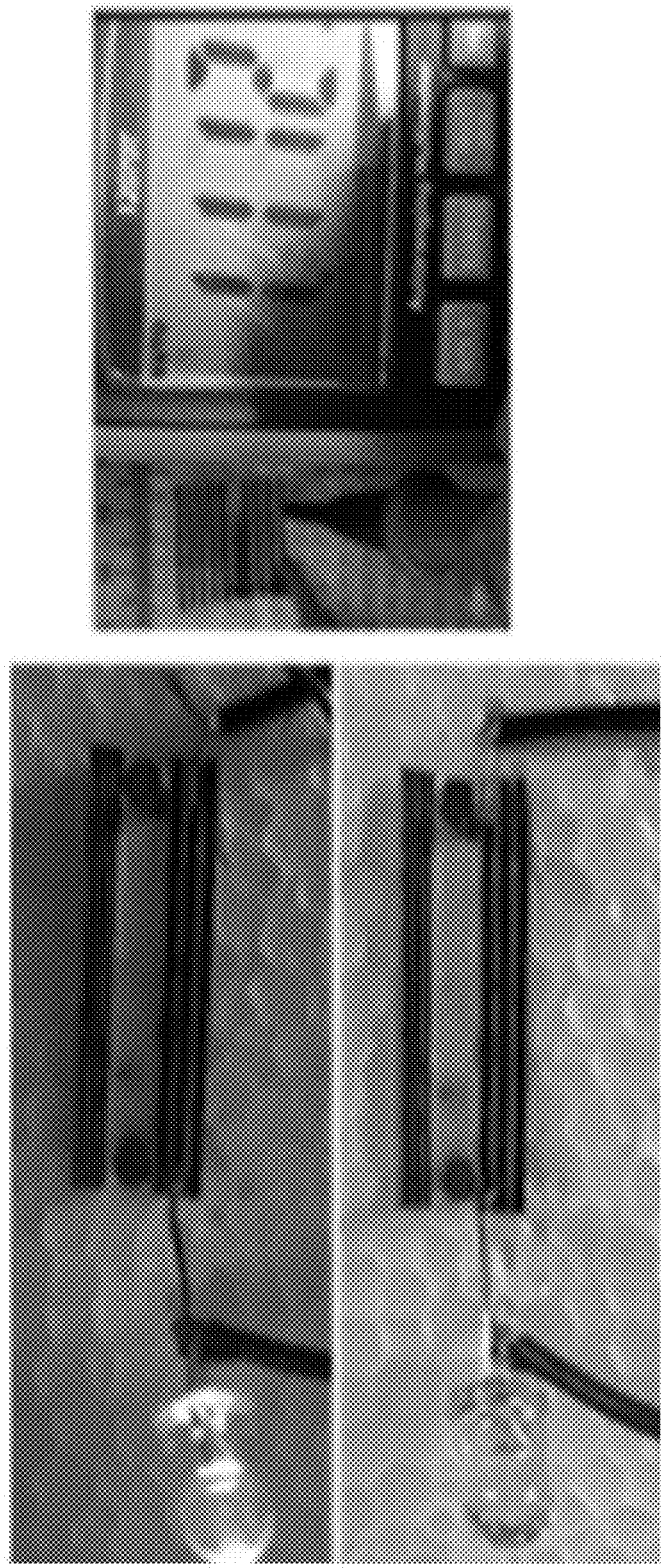
Figure 1P:
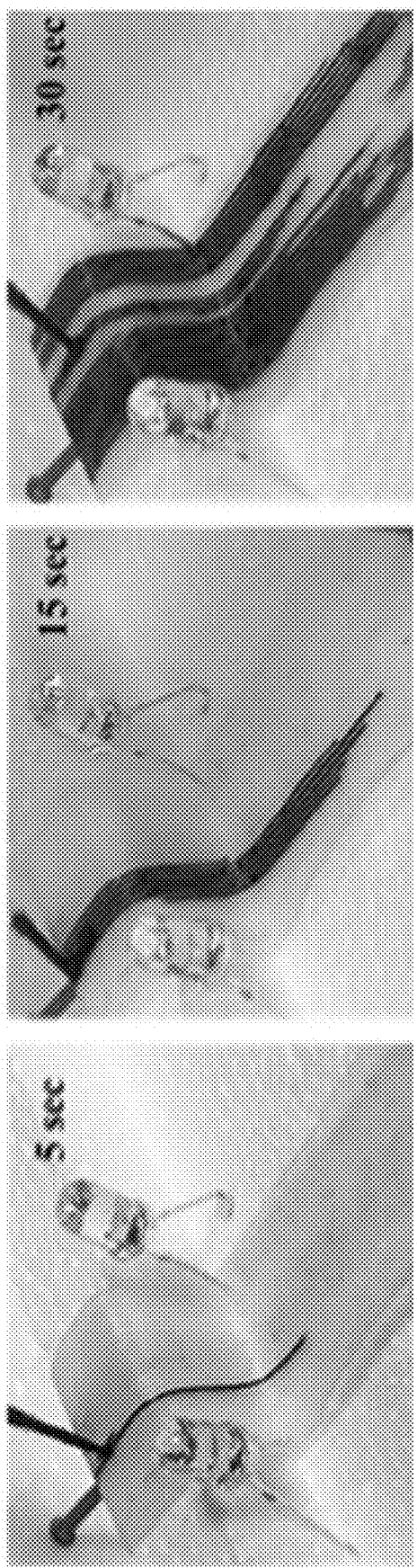
Figure 1Q:
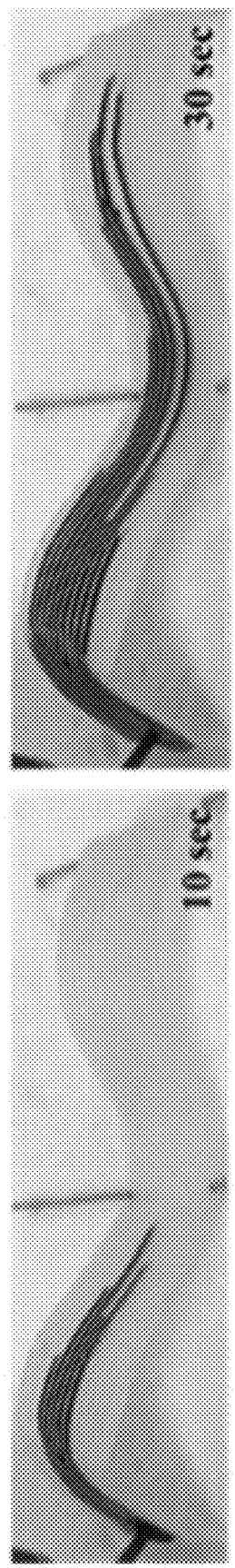

FIG. 1O also demonstrated the conductivity of the fabricated device and proper alignment of the patterns.

The prepared PLLA and graphene based flexible electronic devices provide good flexibility/bendable and stability. The deposited graphene nanoplatelets are strongly adhering the film patterns via self-assembly and physical interactions and do not scratched from the surface via water or mechanical pressure (FIGS. 1M and N).

Most of the currently available technology creates circuits in 2D planar substrates. See, e.g., frames reproduced from a Movie at FIGS. 16A-G (planar micropattern on solid substrate), and FIGS. 17A-E (another planar micropattern on solid substrate). However, with our new microfluidic approach, it is possible to directly create 3D circuits using specifically designed 3D molds or 3D origami (or 3D printing) as shown in frames from Movies at FIGS. 18A-J (flexible substrate bent into backwards Z-shape), FIGS. 19A-D (flexible substrate bent into inverted W-shape), FIGS. 20A-B (flexible substrate bent into wave form), and FIGS. 21A-E (flexible substrate pre-cut and formed in spiral shape). This approach also is used to fill the patterns with different geometries. In addition to flexible polymeric materials, the microfluidic approach can also be used to fill the pattern grooves of solid substrates like silicon wafer or Teflon or Delrin.

Another advantage is that this microfluidic approach is not only limited with the channels open to the air, but also can be used for the closed channels. See diagrammatic depiction of how closed channels might be created at FIGS. 35A and B.

Figure 10:
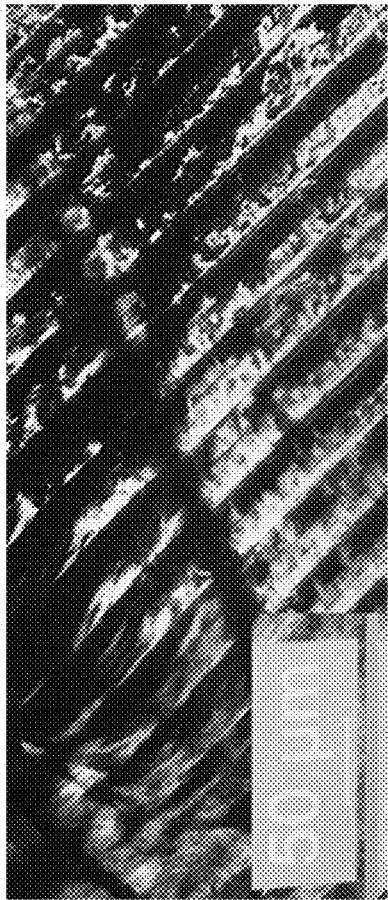

The data represented here were obtained in the films with different pattern dimensions; width of 50, 100, 200, 300 and 400 µm and depth of 50 100, 200, 300 µm. However, with this approach it is possible to fabricate circuits with smaller feature sizes, ranging 5-20 µm width and depth. This approach is further modified using micromanipulators and microcapillary tubes (inner diameter of ~1-2 µm) to create circuits below ~20 µm width/depth. Below this range it is hard to create a micro circuit without using a microscopic approach. For this purpose, silicon wafers with ~15 µm wide and ~5 µm deep micropatterns were used as molds. The same film solutions were cast on micropatterned silicon wafers and peeled off after dried as mentioned above. The films with micropatterns were mounted on a glass slide and placed under microscope. See, e.g., FIGS. 23A-D. A capillary tubing with a microcapillary needle (inner diameter of ~1-2 µm) was connected to the syringe pump and micromanipulators. With the help of micromanipulators and microscope the needle is placed into one of the microchannels on the film and a controlled flow of GNP solution was provided to coat the microchannels. This microfluidic approach forms the conductive circuit designs with small dimensions (up to ~5 µm width/depth) on the film surface, which cannot be obtained by any other technique, using significantly lower amount of GNP solution. See, e.g. (FIGS. 10 and 11). FIG. 10 shows an example of PLLA channels (5 µm depth 15 µm width) filled with graphene nanoplatelet solution under the microscope. The concentration of graphene is 40 mg/mL. The flow rate 2 µL/min. The microscopic set up (see FIG. 11). See also, e.g., LED circuit at FIGS. 21A-E. See also FIGS. 4C and D which clearly demonstrate the filled silicon wafer and PLLA channels with graphene using microscopic approach. The channels in this example are 5 µm depth 15 µm width. Graphene filling and channels are demonstrated with SEM very clearly, in very small size-featured channels on both solid/rigid silicon wafer (FIG. 4D) and on flexible PLLA substrate (FIG. 4C) with surface channels obtained by casting on the same silicon wafer (used as a mold this time).

The frames reproduced from a Movie at FIGS. 23A-D also demonstrates the flow of graphene nanoplatelets in the PLLA film channels (5 µm depth 15 µm width) under the microscope using the same set up.

4.4.1 Supplemental Information for Example 2

By particular reference to FIGS. 16A through 23D, additional details and examples regarding Specific Example 1. It will be understood these figures are frames from video movies. The frames are selected to illustrate certain features of these examples.

FIGS. 16A-G

[From Supplementary Information Movie Entitled "Manual Pattern Filling Trial 1.Wmv]

Figure 16A:
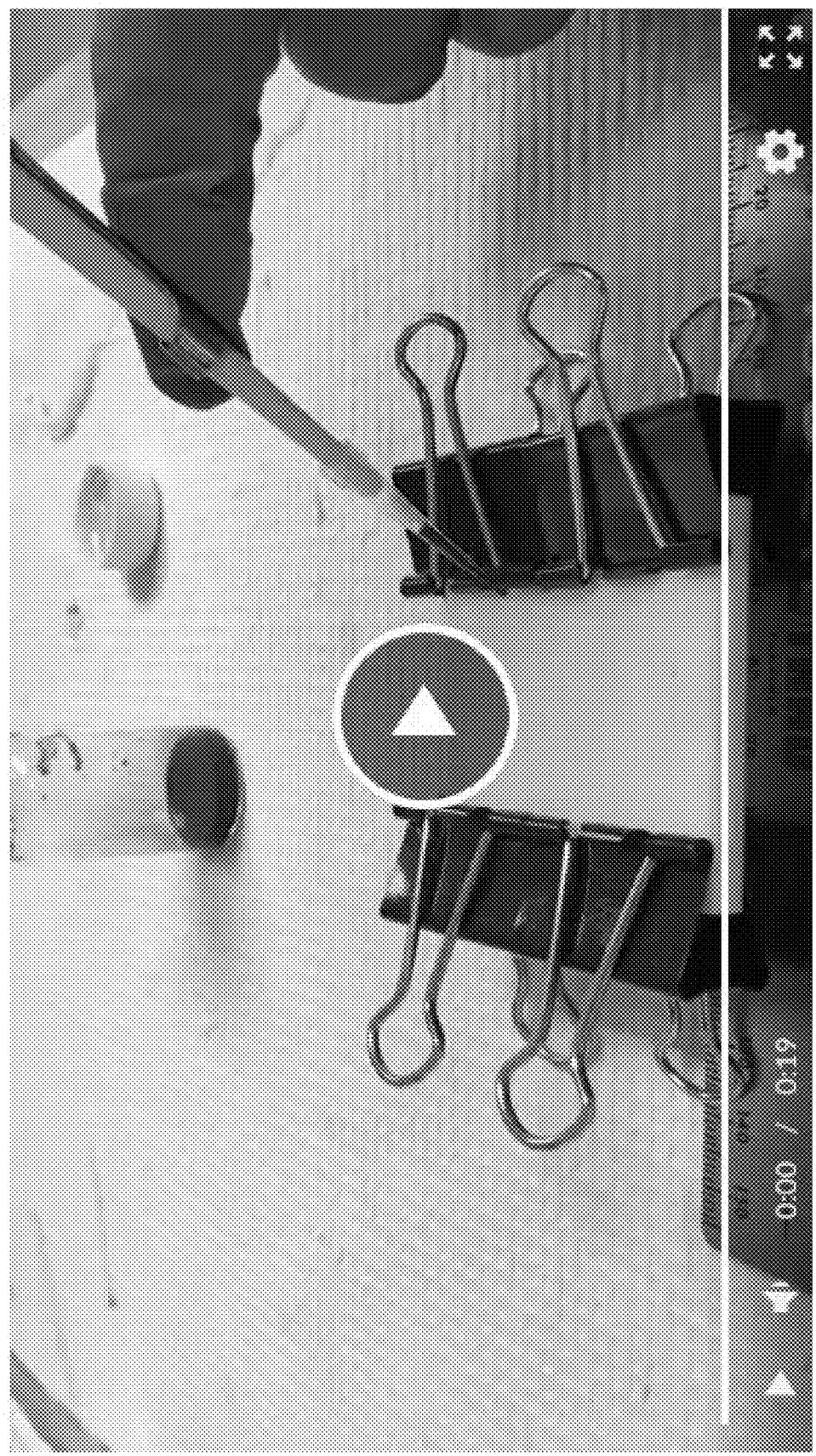
Figure 16B:
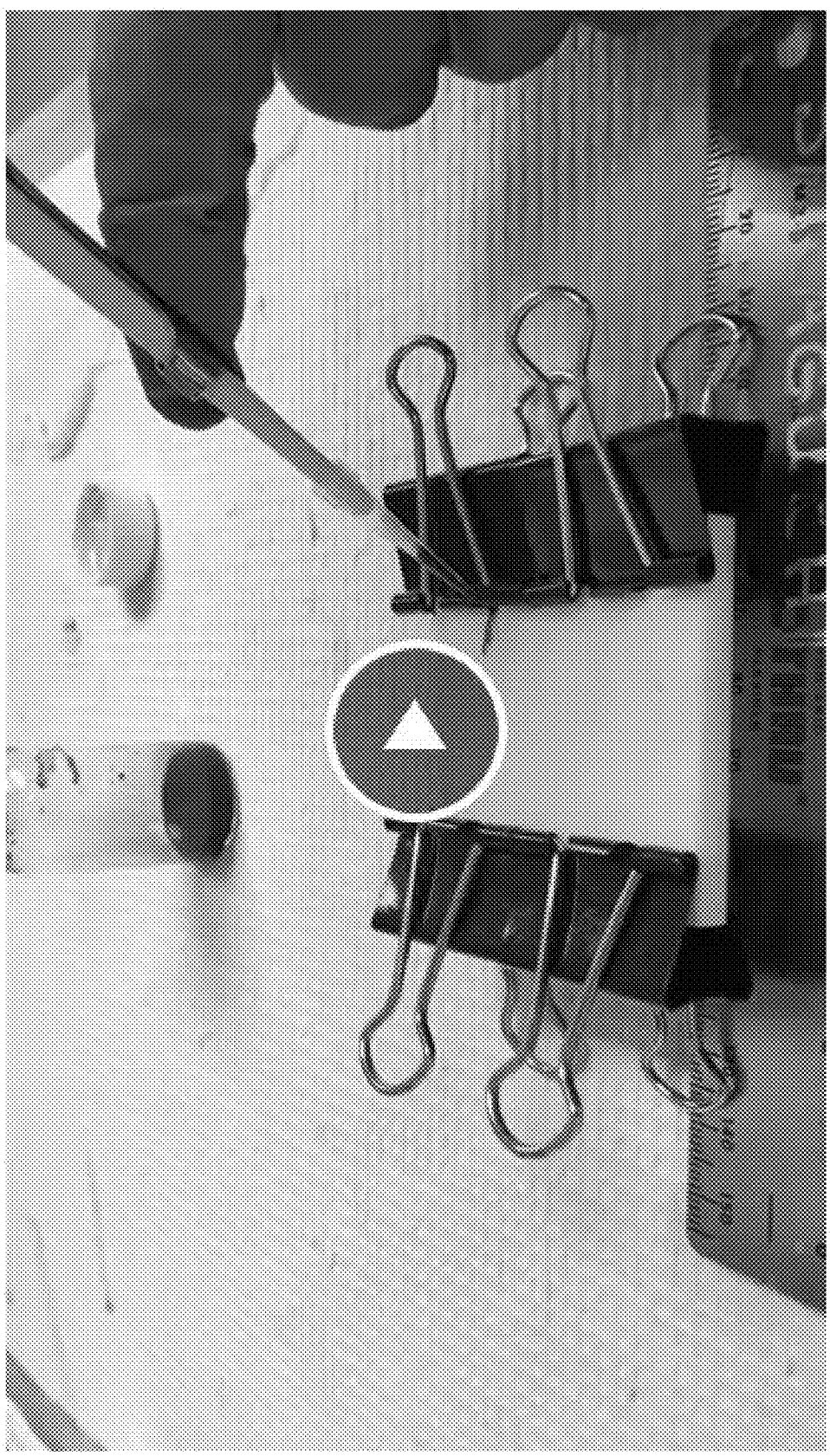
Figure 16C:
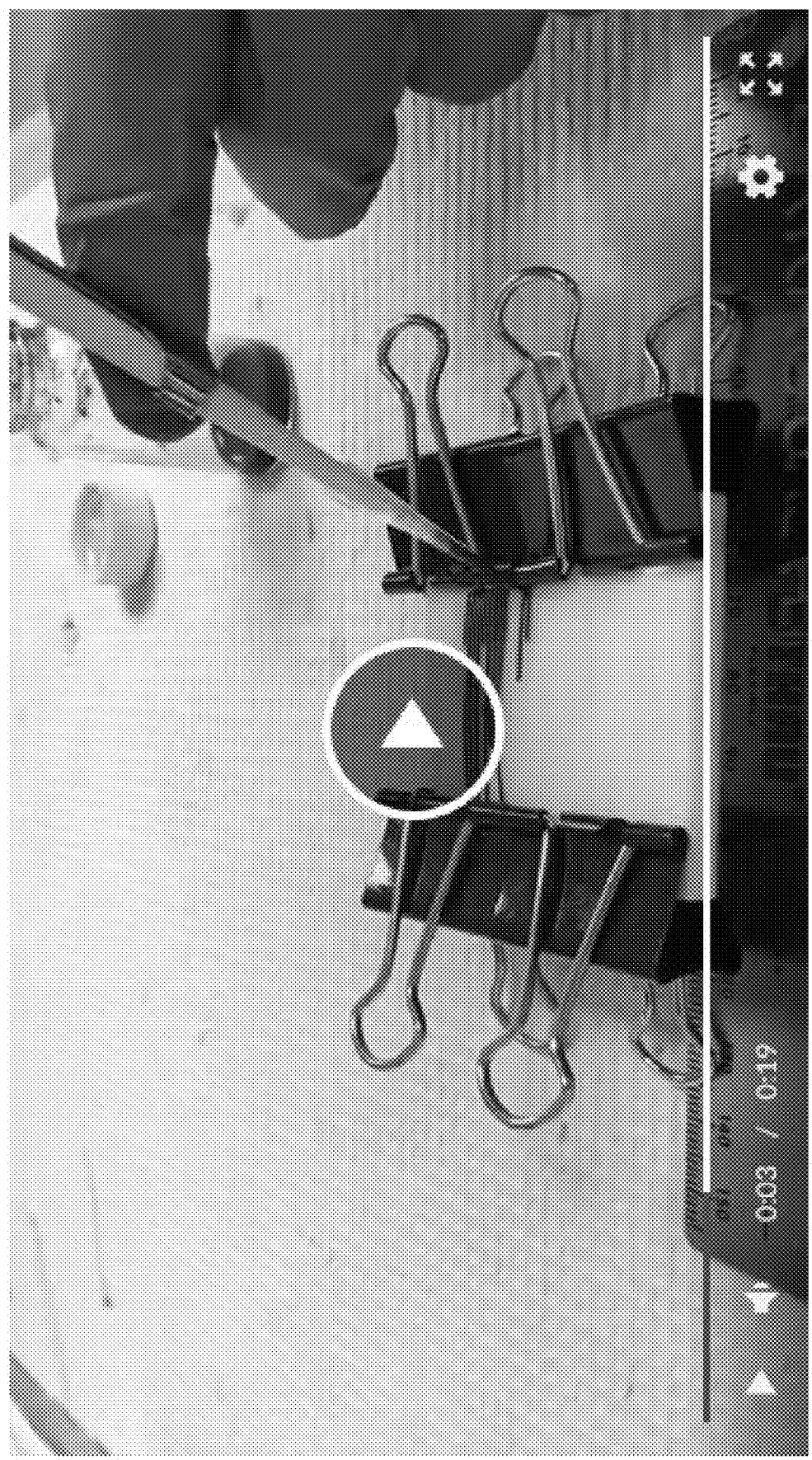
Figure 16D:
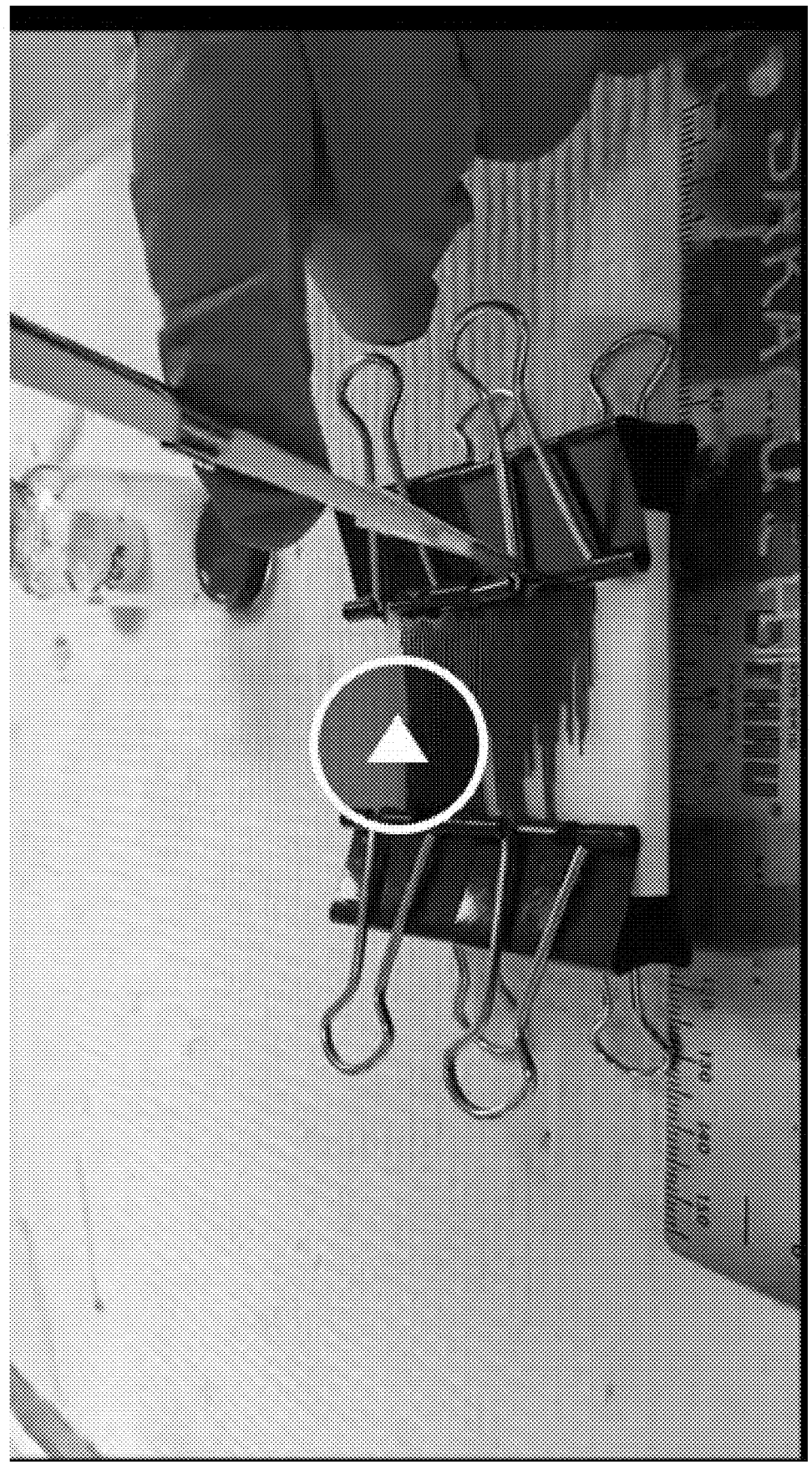
Figure 16E:
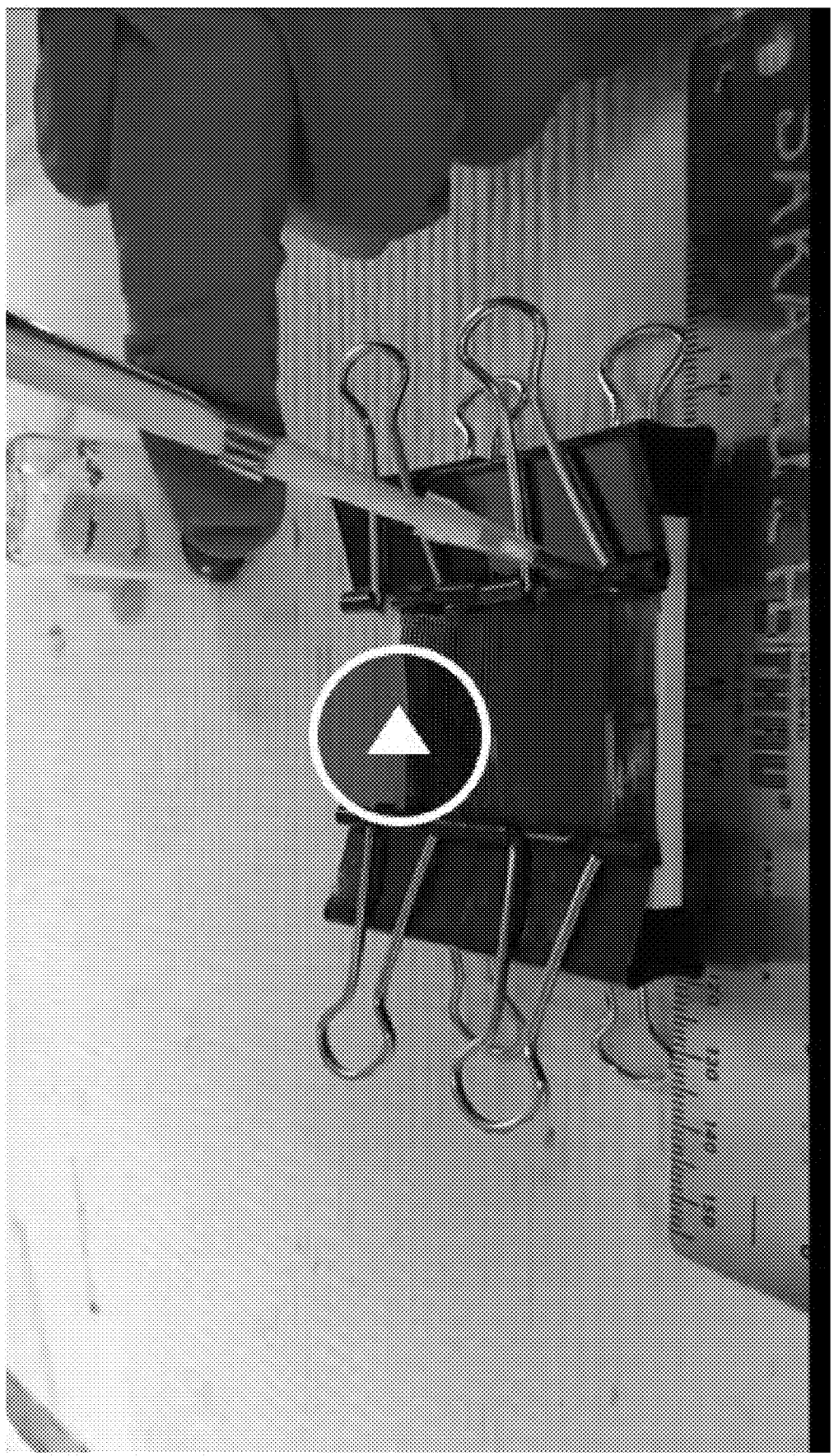
Figure 16F:
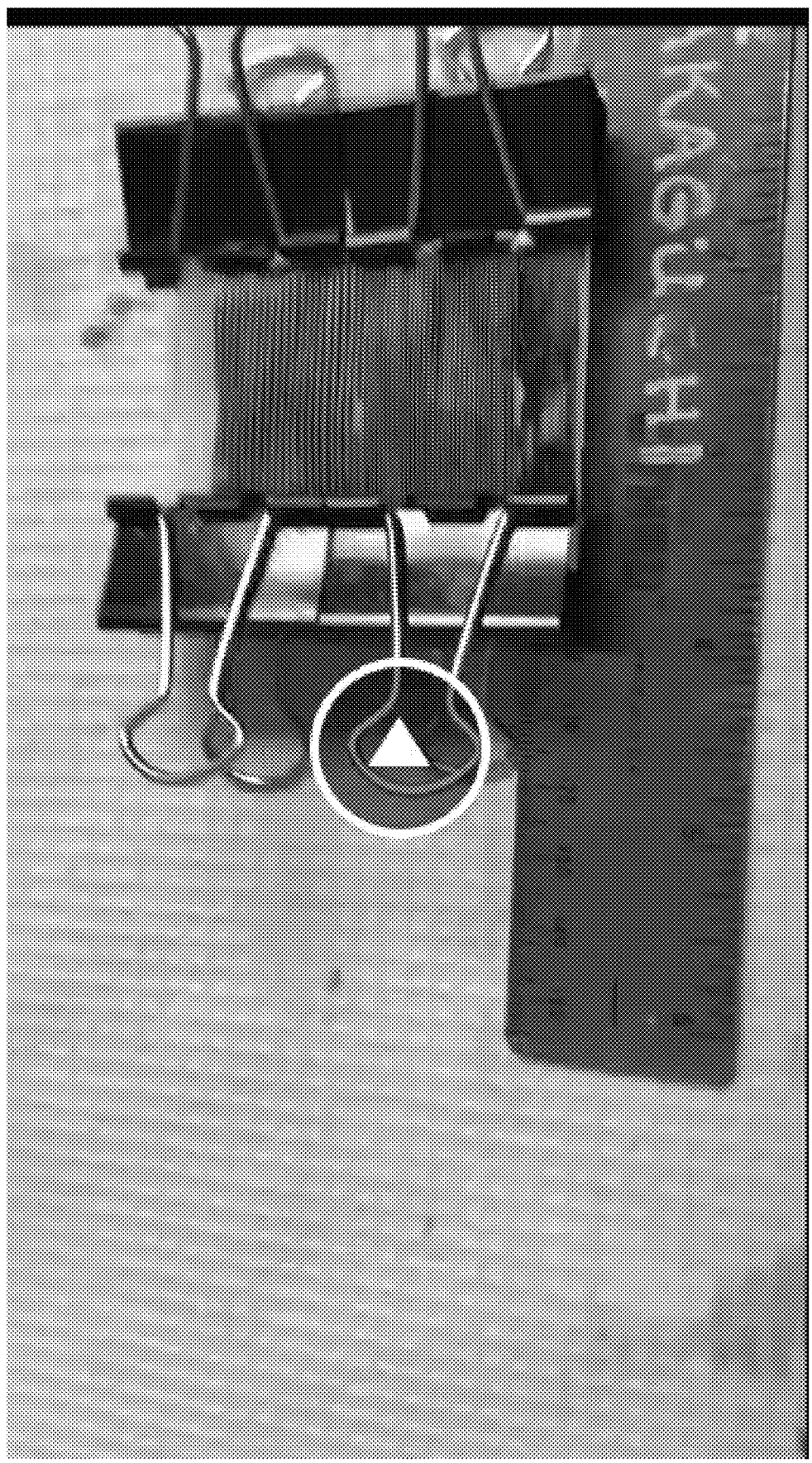
Figure 16G:
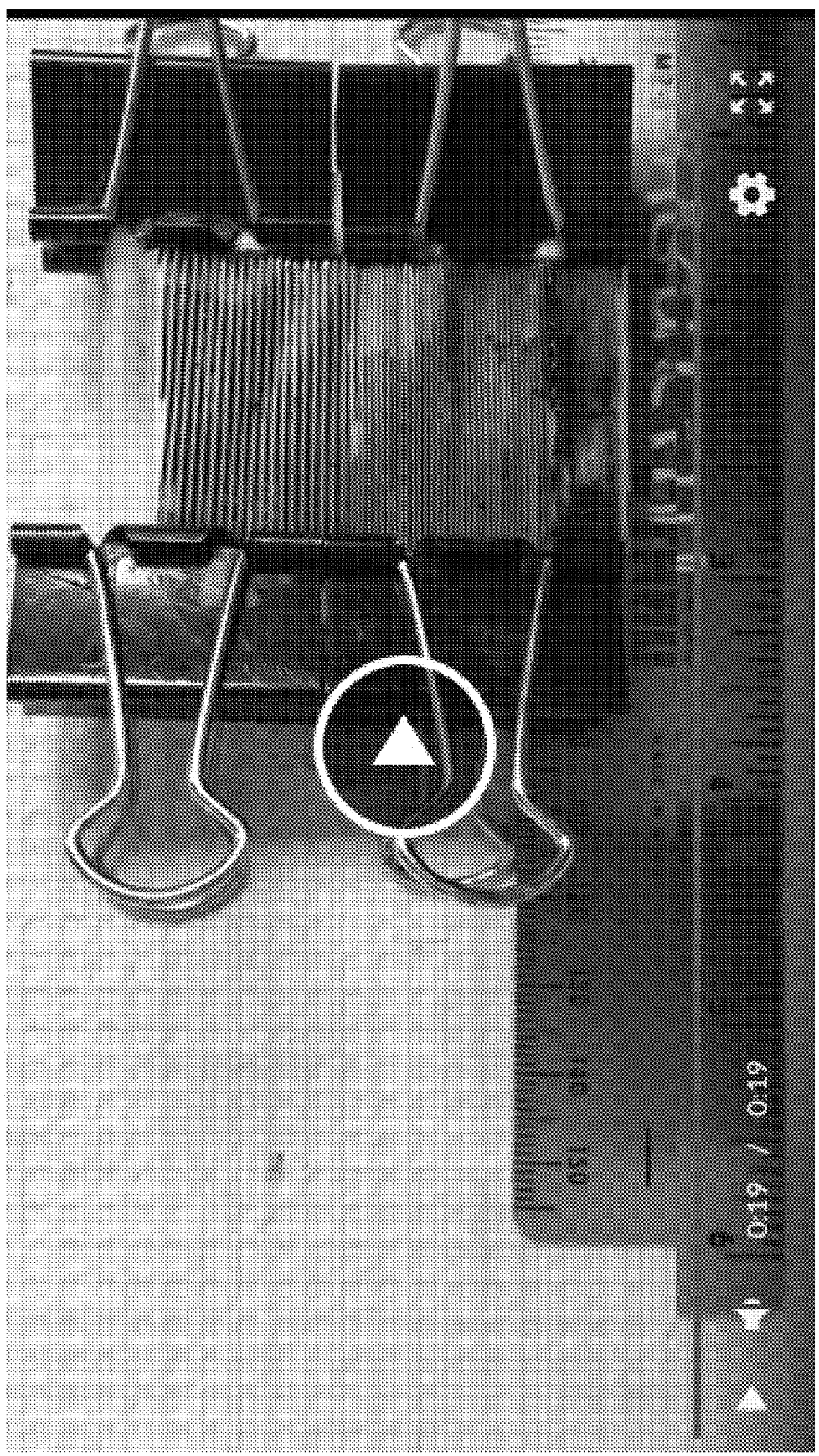

One way of filling micro channels in a substrate are with a microneedle/pipette filled with the conductive material (here a graphene-based solution). The substrate with the micro structural features is presented horizontally. The micropipette is brought to a selected channel. FIG. 16A. The pipette is operated to inject or manually pump the solution into selected channel or channels. FIG. 16B. The user manually moves the microneedle and operates the pipette to fill selected channels, the nature of the solution and the injection causes the solution to move on its own by force of the injection and capillary action through the selected channels. FIG. 16C. The user continues until the selected channels are filled. It is to be understood the filling could be controlled as to the amount of solution placed in a channel relative to the three-dimensional structural features of the channel. FIG. 16D. Once completed. FIG. 16E. The solution can be air-dried in place on the micro pattern substrate. FIG. 16F. The cried conductive material will adhere in the micro channels basically as a coating. Thus, the substrate can be manipulated vertically, horizontally, upside down, or otherwise and the combination remains intact. FIG. 16G.

FIGS. 17A-E

[From Supplementary Information Movie Entitled "Movie2.Wmv.-Solid Surface, Hand Pipetted Patterns"]

Figure 17C:
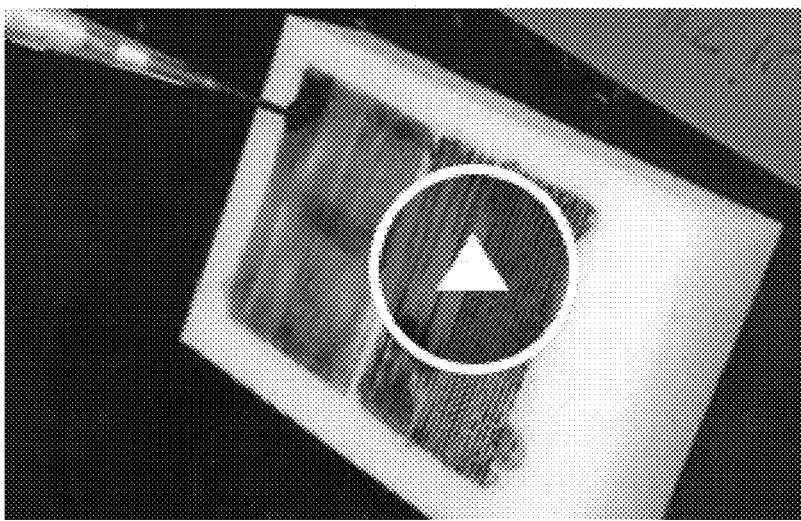
Figure 17B:
Figure 17A:
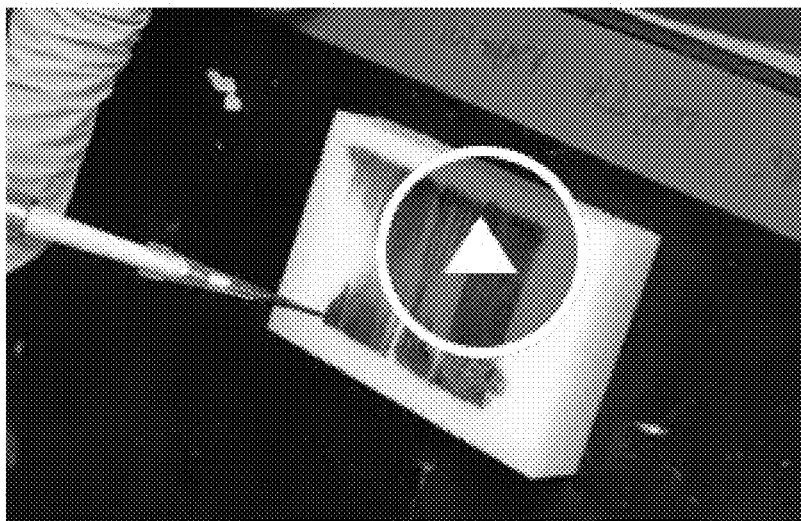
Figure 17E:
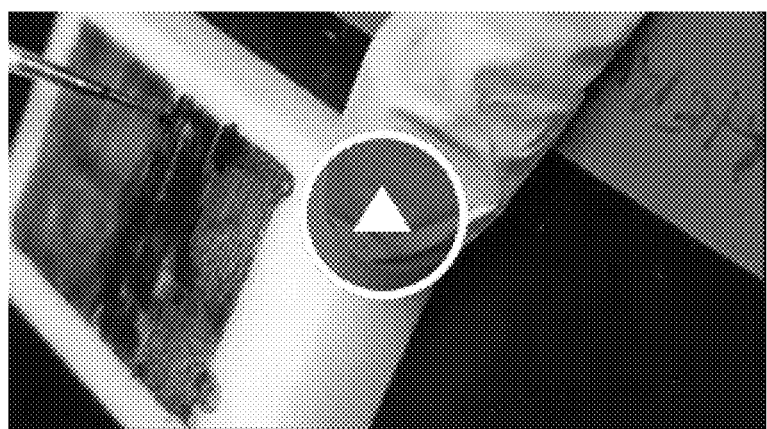
Figure 17D:
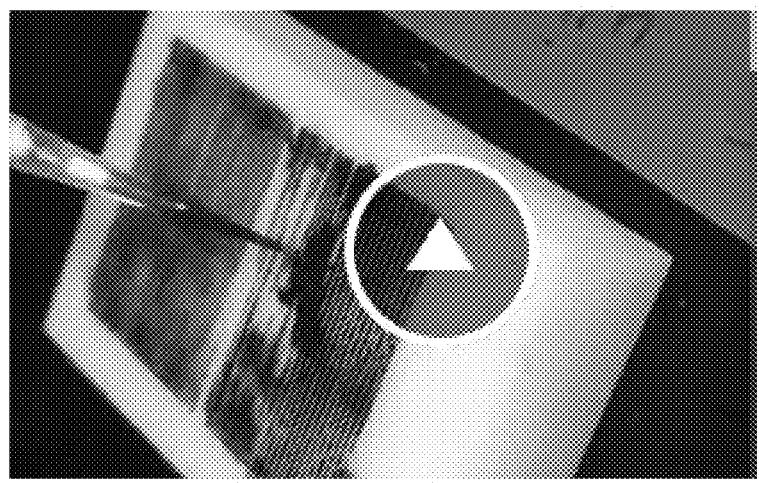

It will be appreciated that a manually controlled injection of solution on a patterned substrate can be to any patterned surface. The substrate surface could be solid, rigid. FIGS. 17A-C. The user selects which and how much of the channels to fill. FIGS. 17D and 17F.

FIGS. 18A-J

[From Supplementary Information Movie Entitled "3D Filling Movie_1.Wmv. Bent Patterned Substrate with Microneedle".]

Figure 18A:
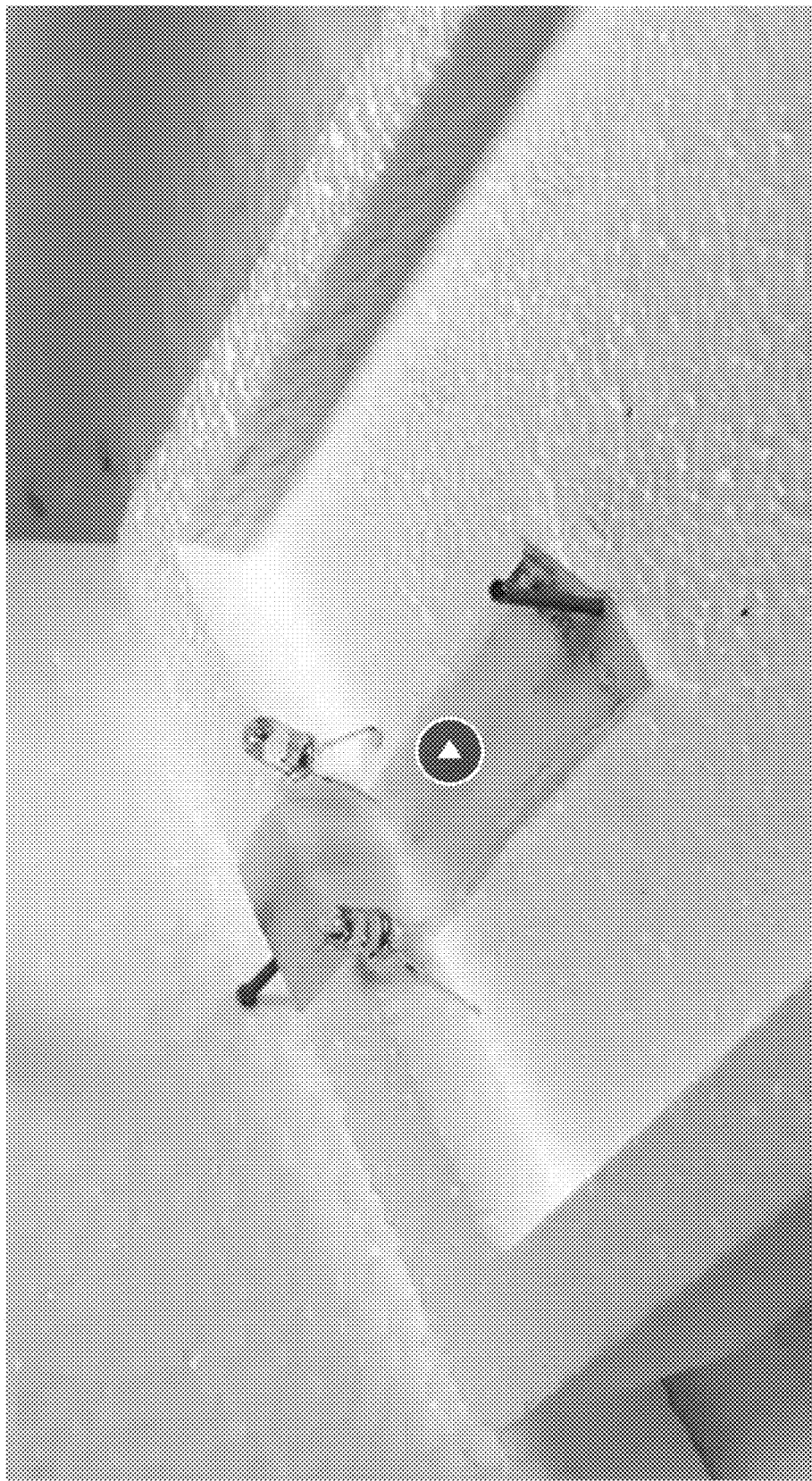
Figure 18B:
Figure 18C:
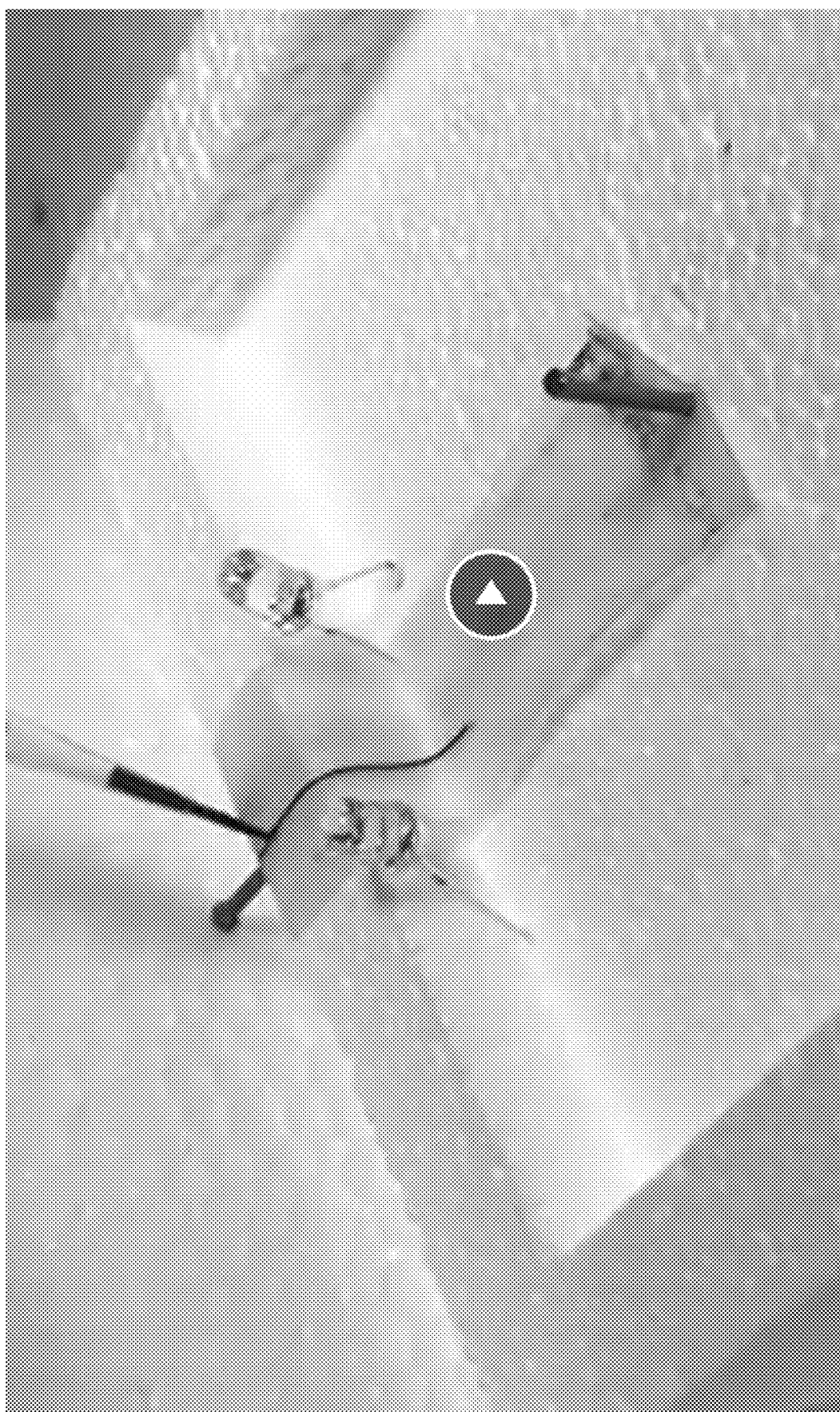
Figure 18D:
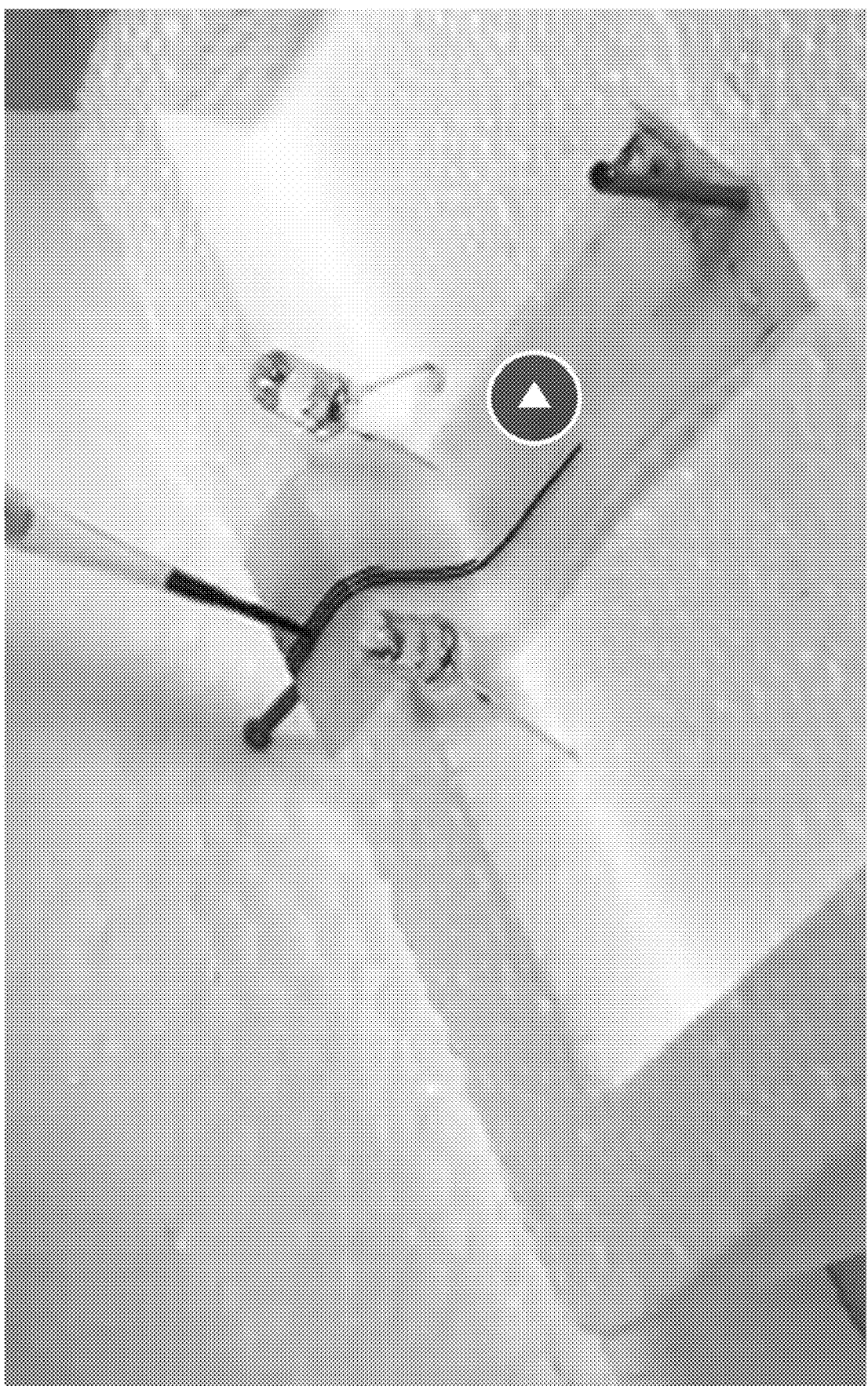
Figure 18E:
Figure 18F:
Figure 18G:
Figure 18H:
Figure 18I:
Figure 18J:
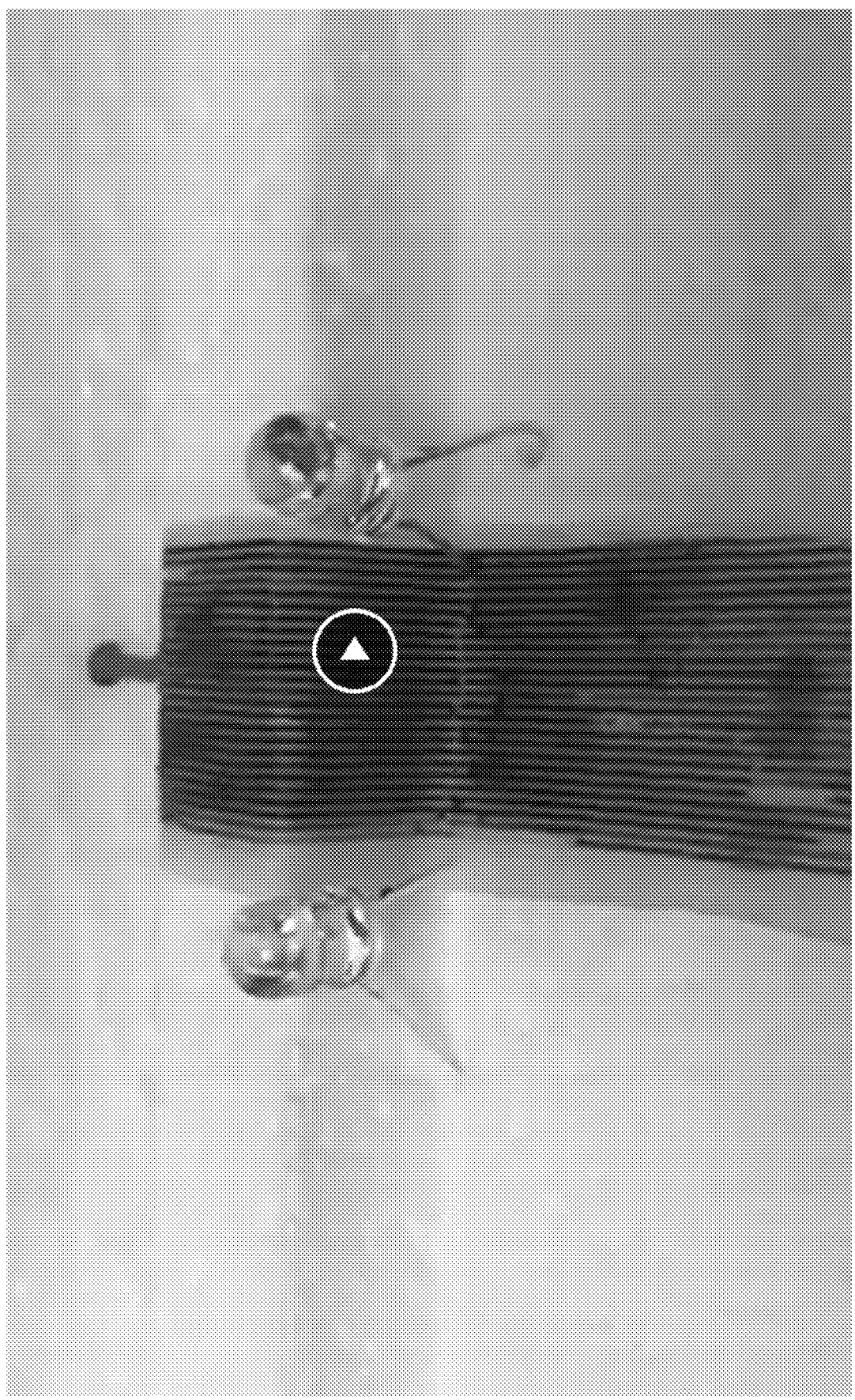
Figure 19A:
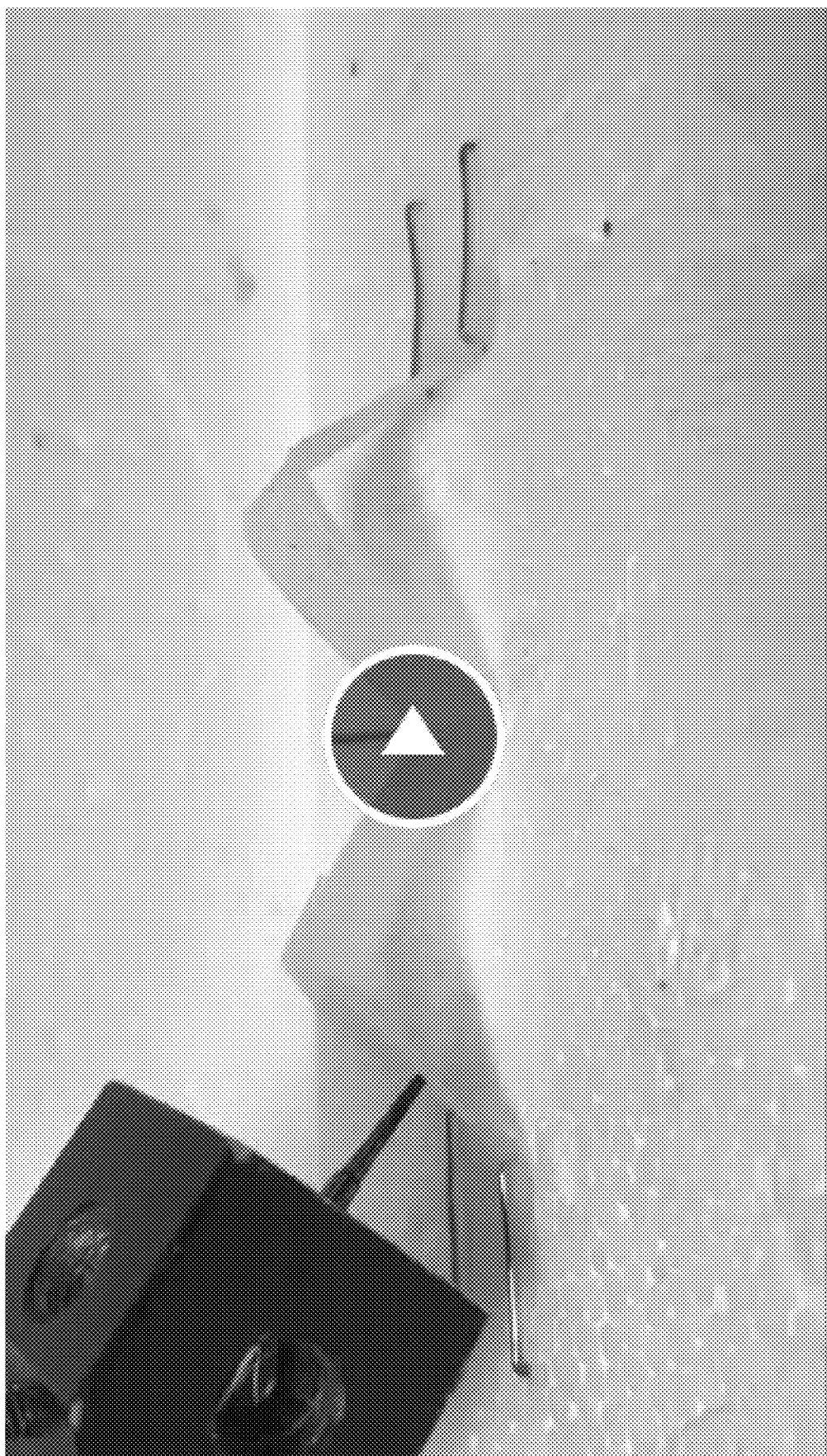
FIGS. 19A, 19B, 19C, 19D are selected frames from a video showing a first example of pattern filling according to an embodiment of the invention (3D filling movie_2.wmv. Multiple bends in patterned substrate).
Figure 19B:
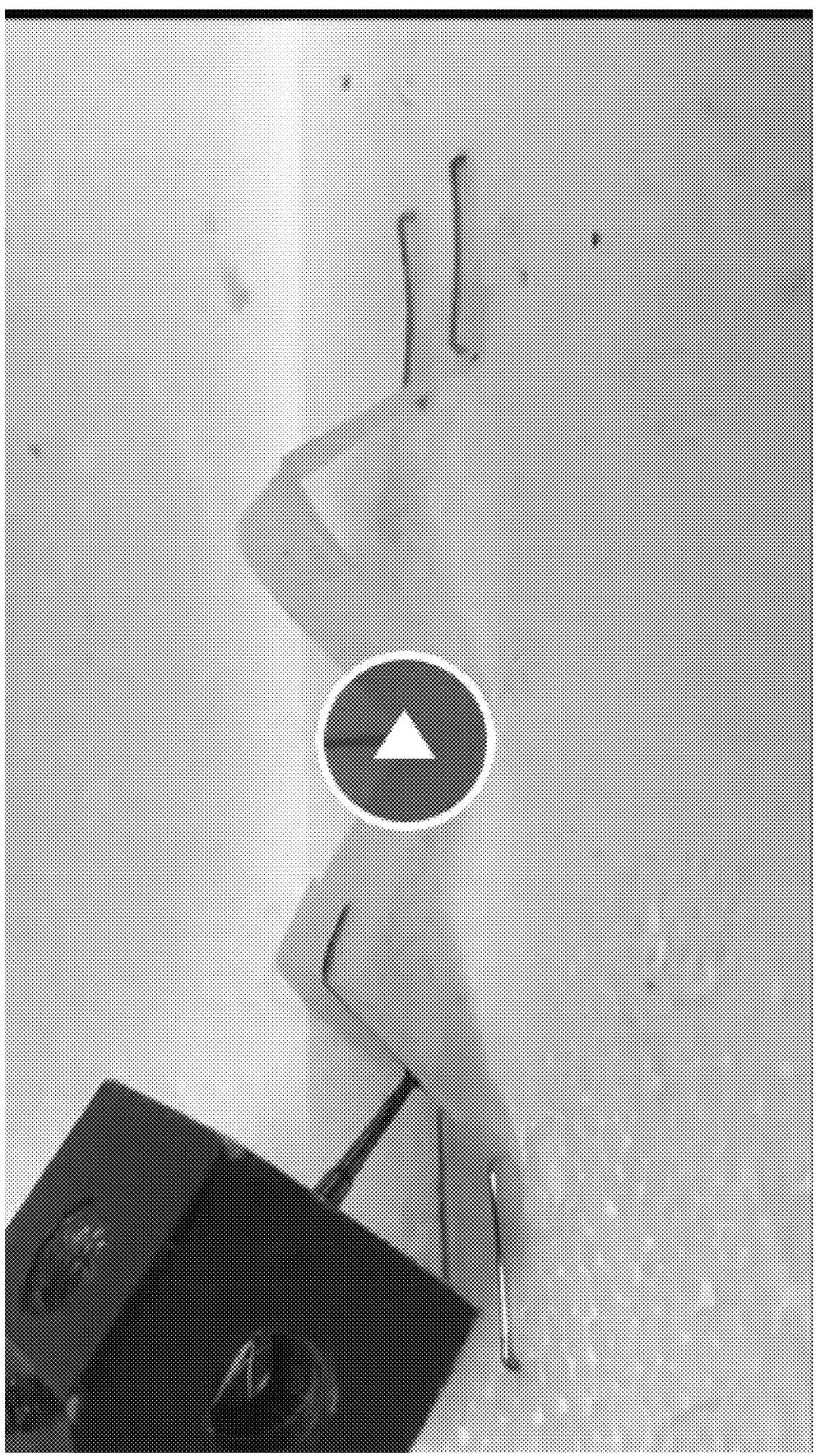
Figure 19C:
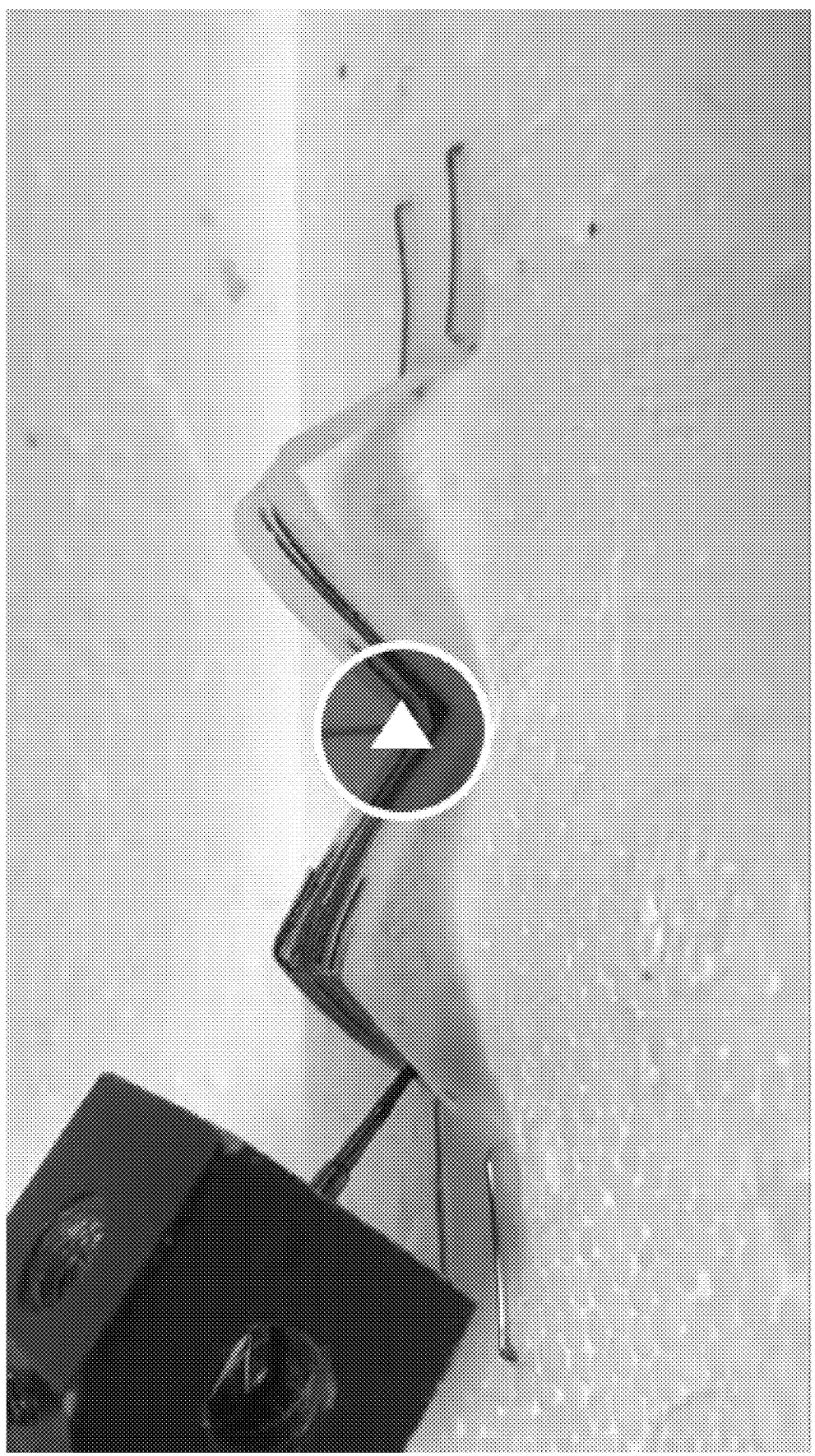
Figure 19D:
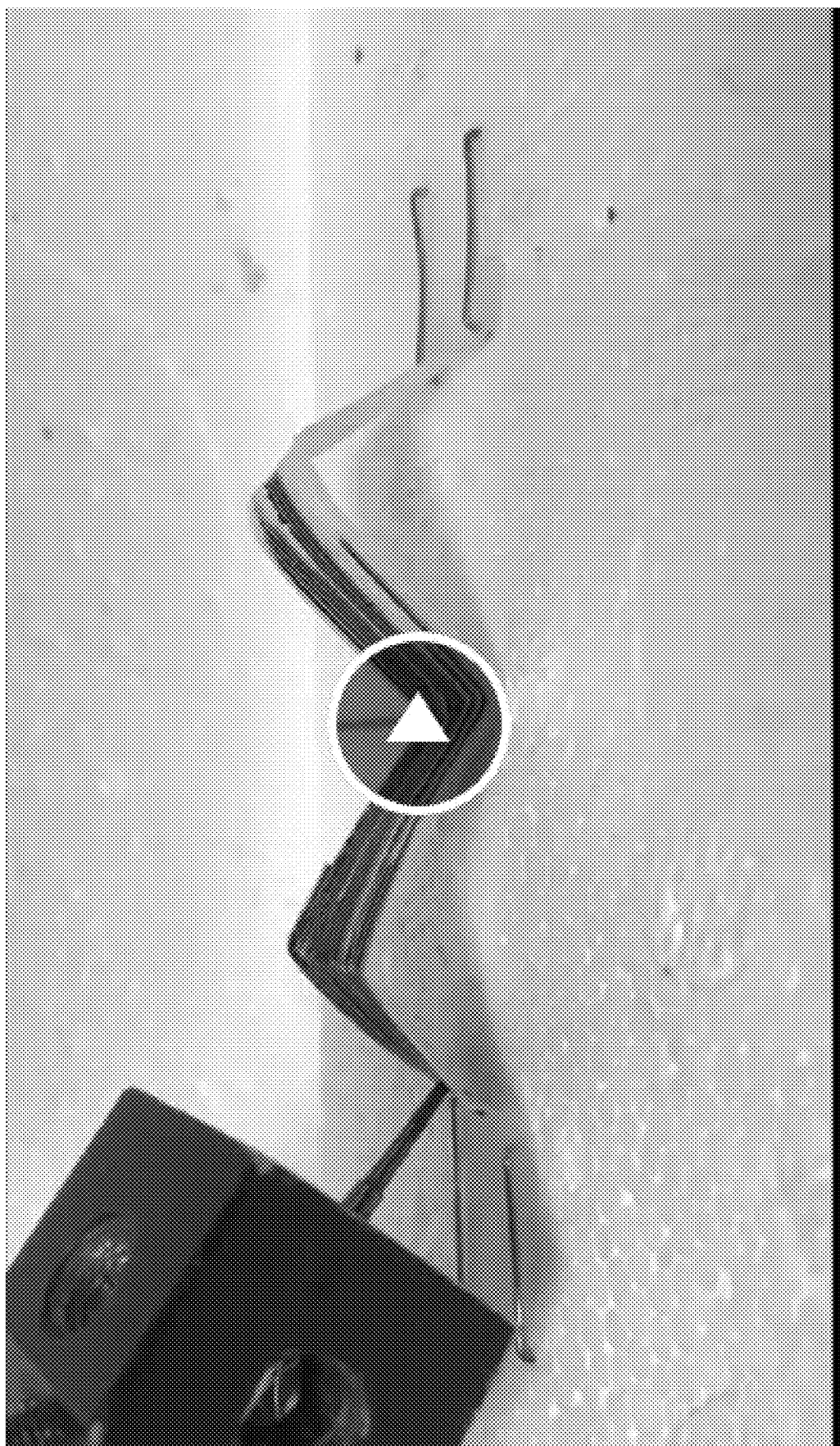

On the other hand, the substrate that is patterned could be of a variety of materials including bendable or flexible. FIG. 18A. By appropriate setup, the source of conductive solution can be moved into place on a pre-bent patterned substrate. FIG. 18B. As described above, injection of the solution causes the solution to follow a selected micro channel. Here it could be by the pumping force, capillary action, and/or gravity. FIG. 18C. The source of solution is move from channel to channel as desired. FIG. 18D. This can include partially filling a portion of the micro patterned bent surface and then moving the injector to a different location. FIG. 18E. The process continues until the user completes desired filling. FIGS. 18F-J. Again, the solution can be dried in place to create the combined patterned bent substrate with adhered in place conductive dried material coating selected three-dimensional micro structural features in the patterned substrate.

FIGS. 19A-D

[From Supplementary Information Movie Entitled "3D Filling Movie_2.Wmv. Multiple Bends in Patterned Substrate".]

FIGS. 19A-D show essentially a similar technique for a differently pre-shaped non-planar patterned substrate. Here it is bent in several locations. The images show how injection at one point of a micro channel can fill a channel across the multiple bends by pumping force, micro capillary action, and gravity.

FIGS. 20A-B

[From Supplementary Information Movie Entitled "3D Filling Move_3.Wmv. Multiple Curves in Patterned Substrate".]

Figure 20A:
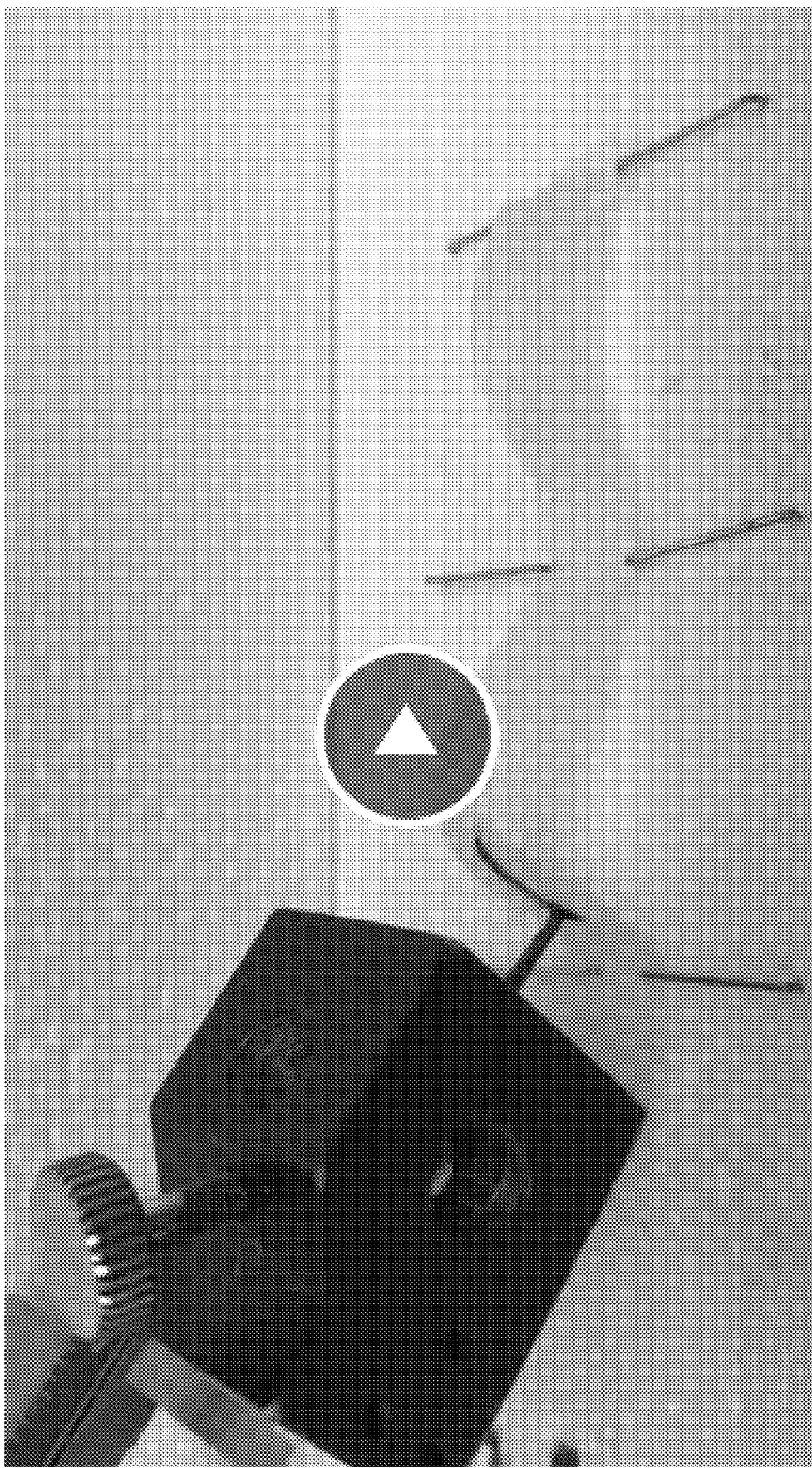
FIGS. 20A and 20B are selected frames from a video showing a first example of pattern filling according to an embodiment of the invention (3D filling move_3.wmv. Multiple curves in patterned substrate).
Figure 20B:
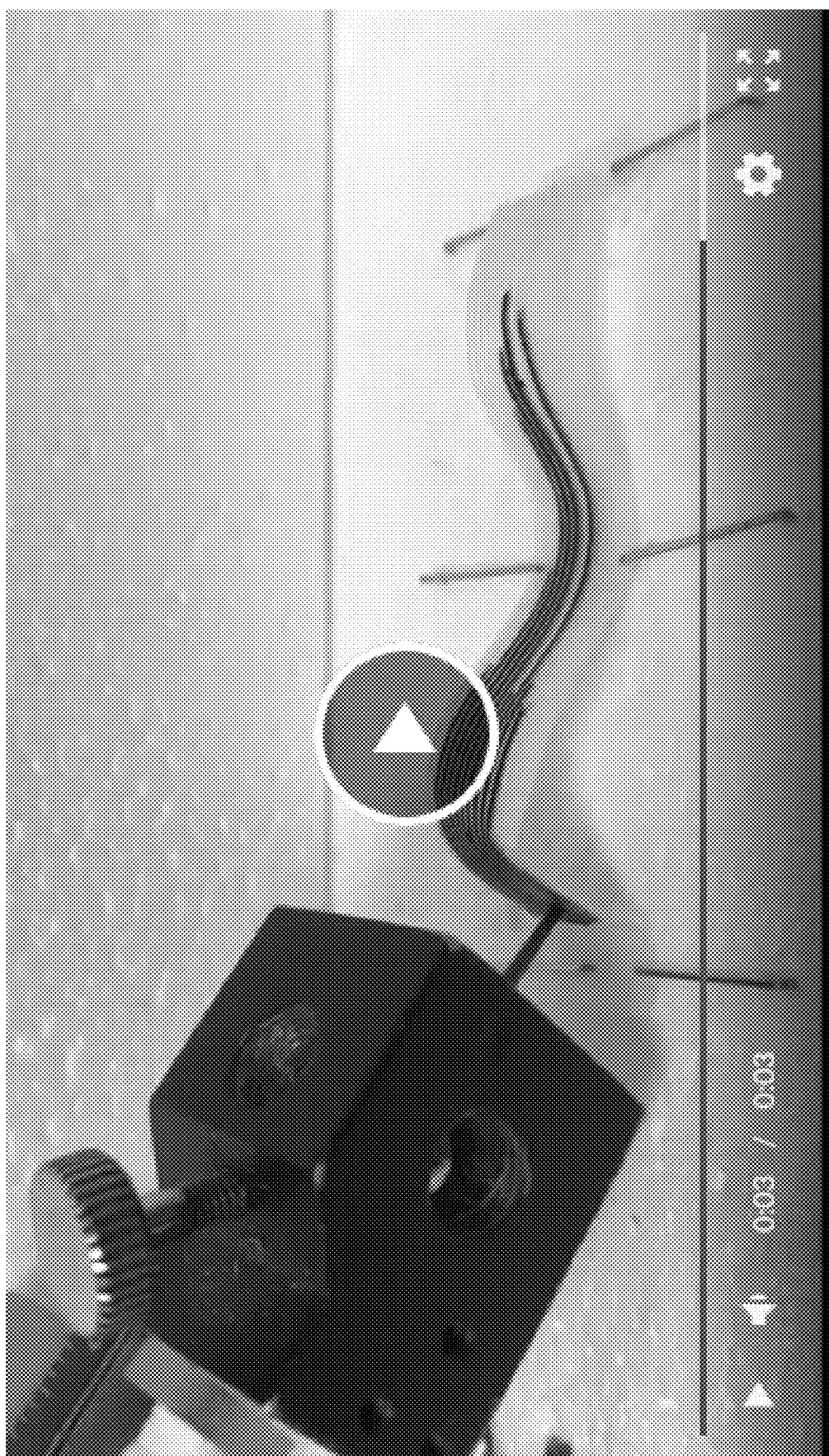
Figure 21A:
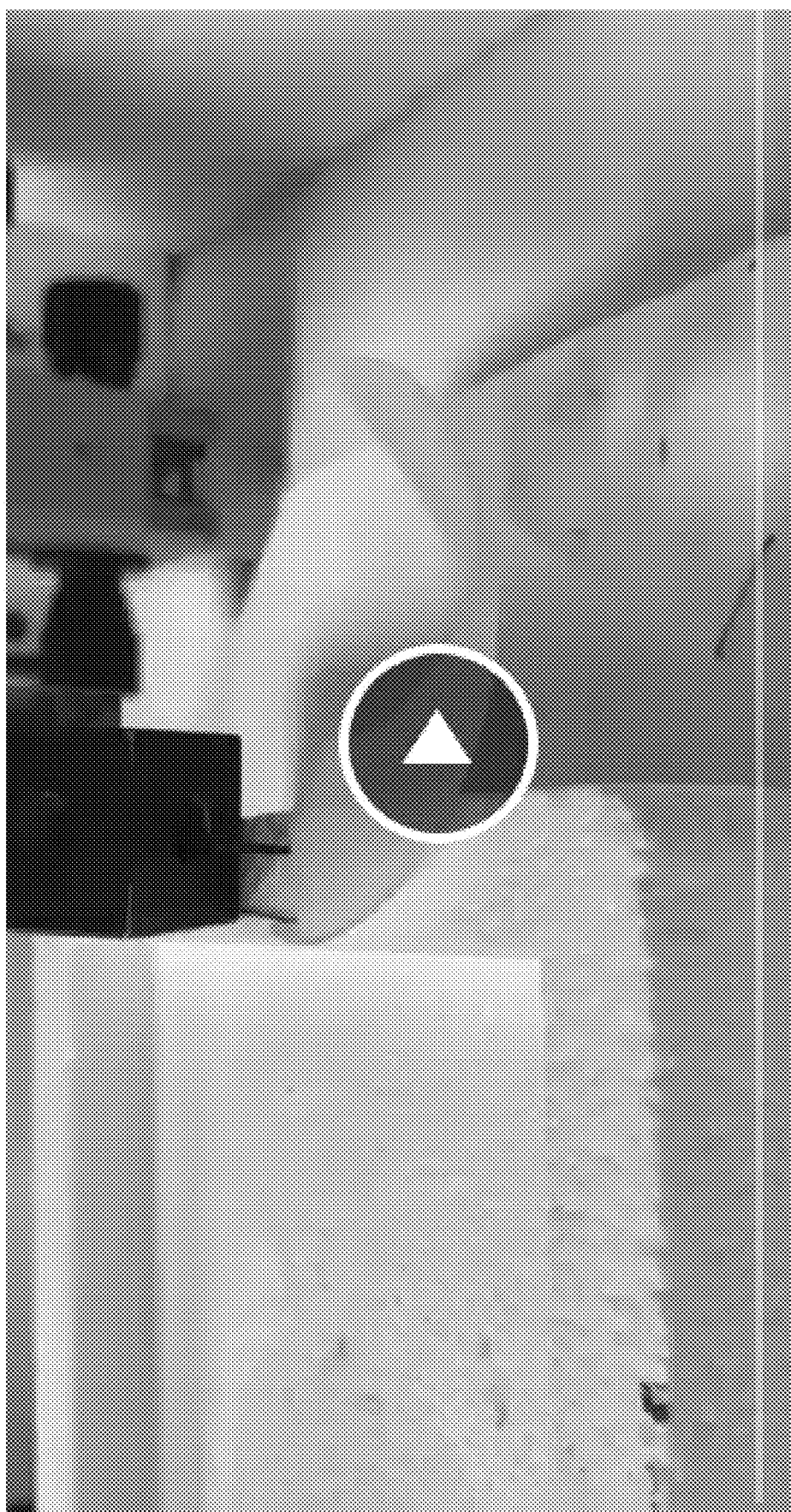
Figure 21B:
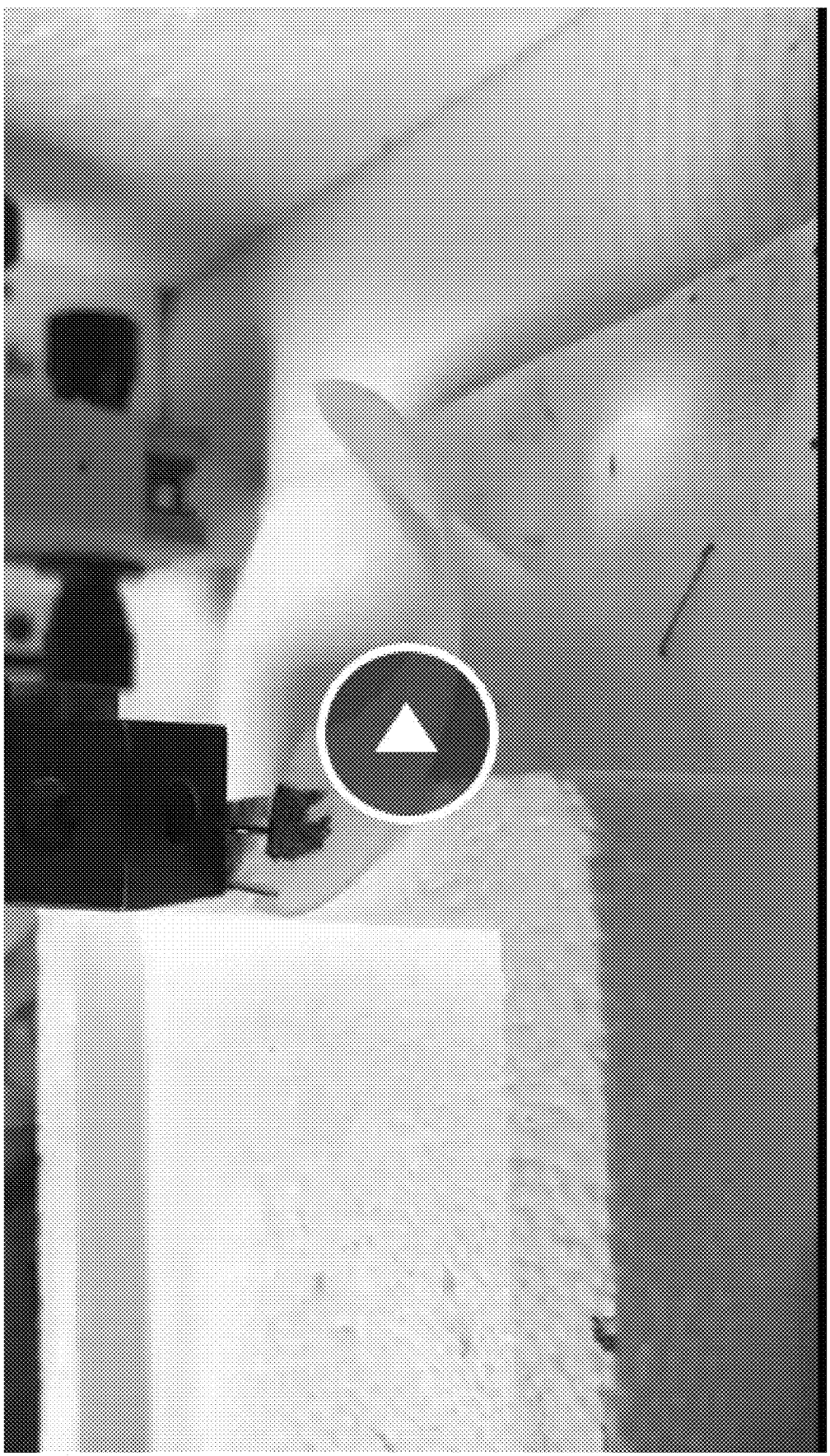
Figure 21C:
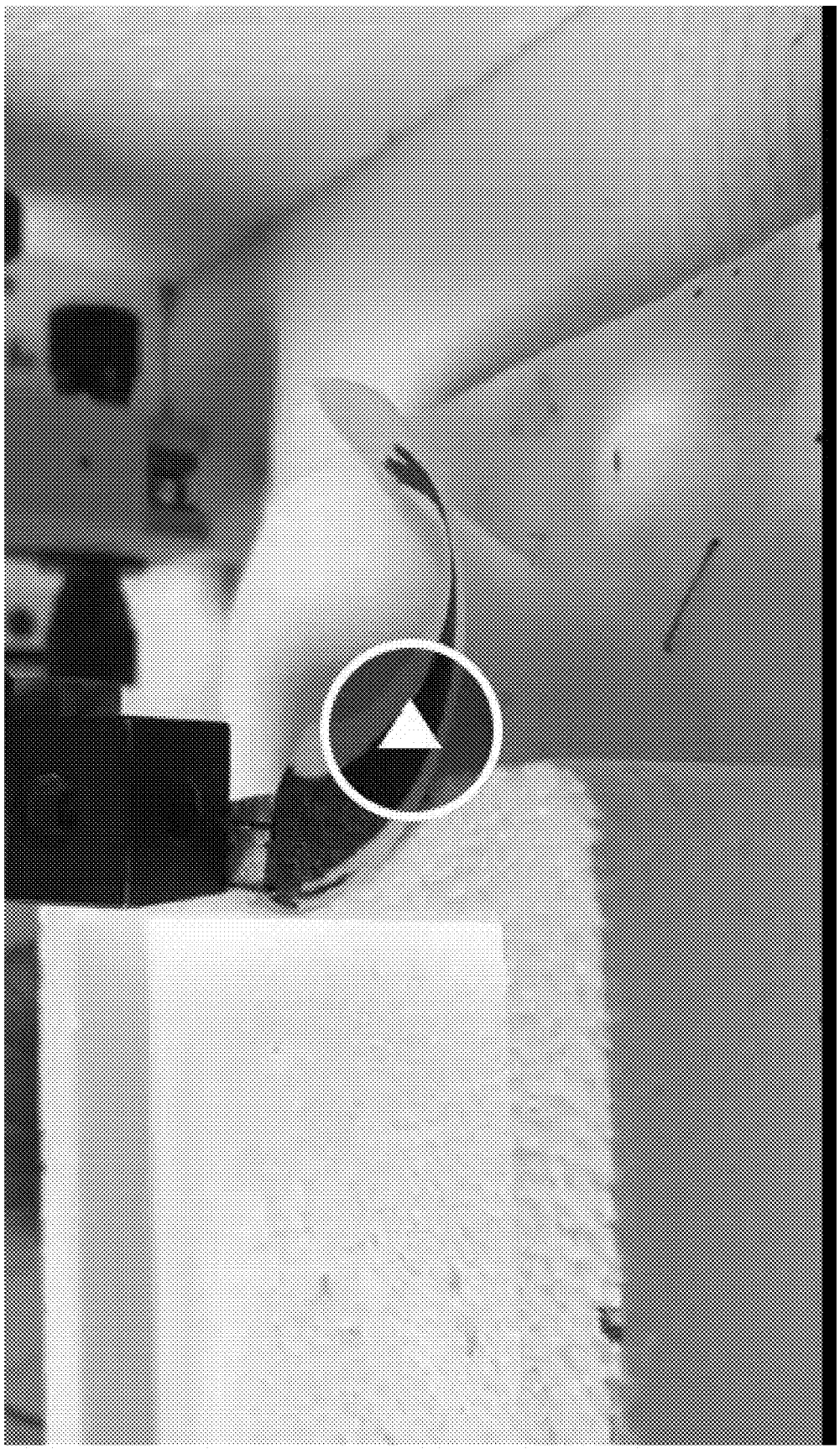
Figure 21D:
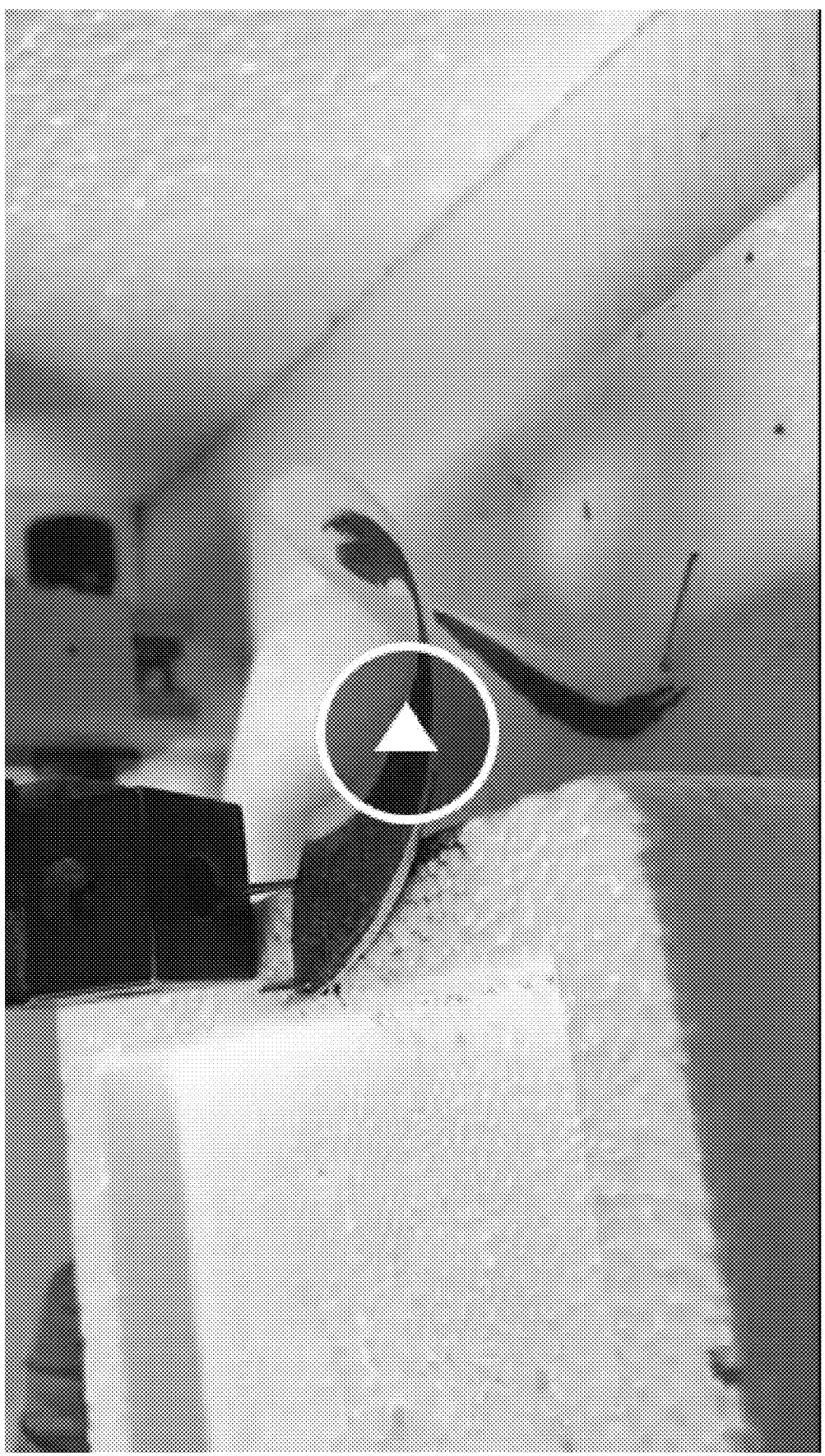
Figure 21E:

FIGS. 20A-B show a still further example of a form factor patterned substrate, here curved in multiple locations.

FIGS. 21A-E

[From Supplementary Information Movie Entitled "ED Filling Movie_4.Wmv-Spiral Surface Patterned Substrate."]

FIGS. 21A-E show a similar setup for a different form factor patterned substrate, here a spiral-shaped patterned substrate. Note also that some of these examples show a machine controlled conductive solution source that can be manipulated with high resolution to selected micro channels in the patterned substrate, instead of a hand-held manually controlled pipette. Such micro systems are commercially available.

FIGS. 22A-D

[From Supplementary Information Movie Entitled "Conductivity Movie.Wmv. Proof of Concept that Coated Microchannels are Conductive Between Electrical Power Source and LED.]

Figure 22A:
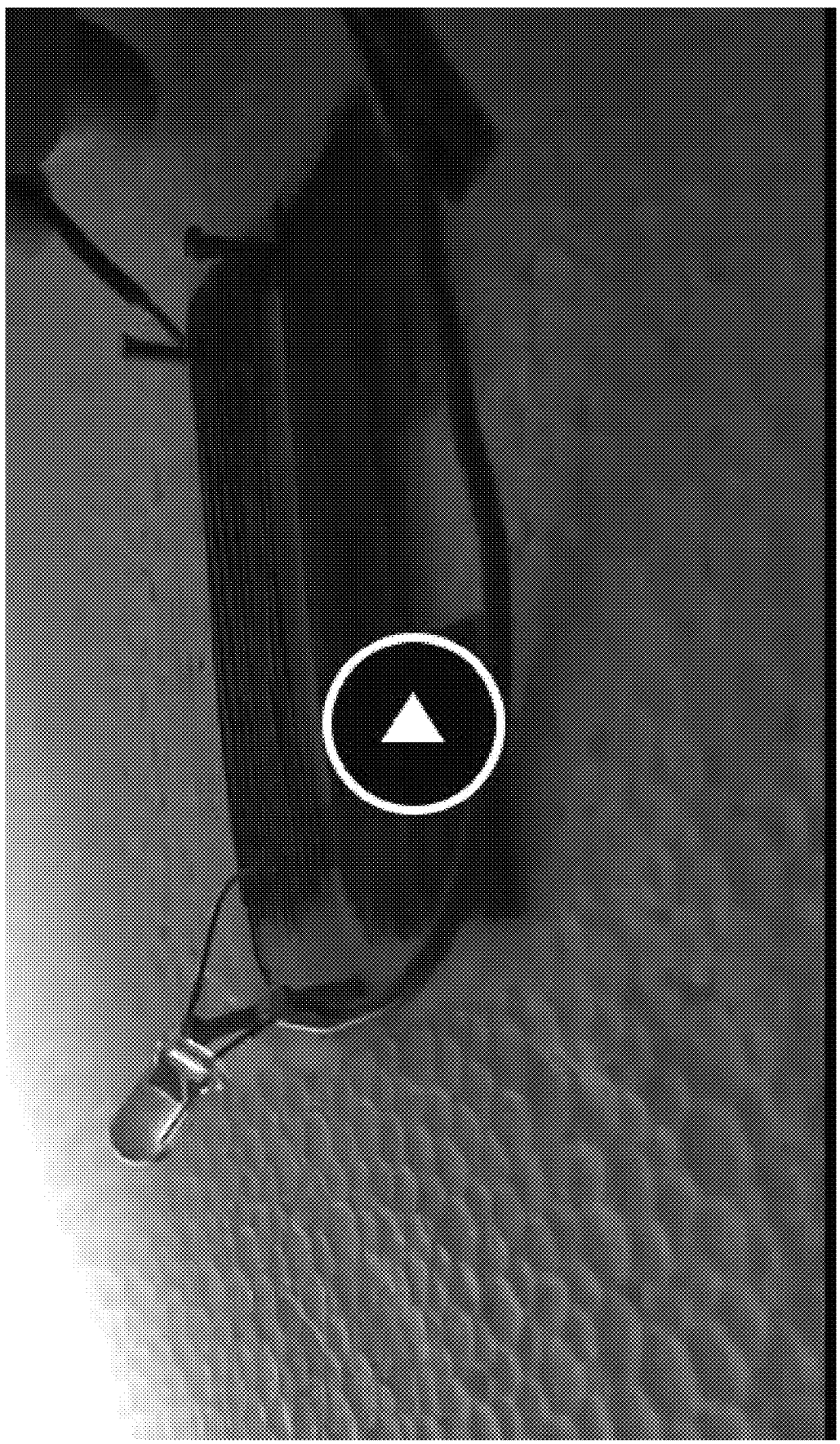
Figure 22B:
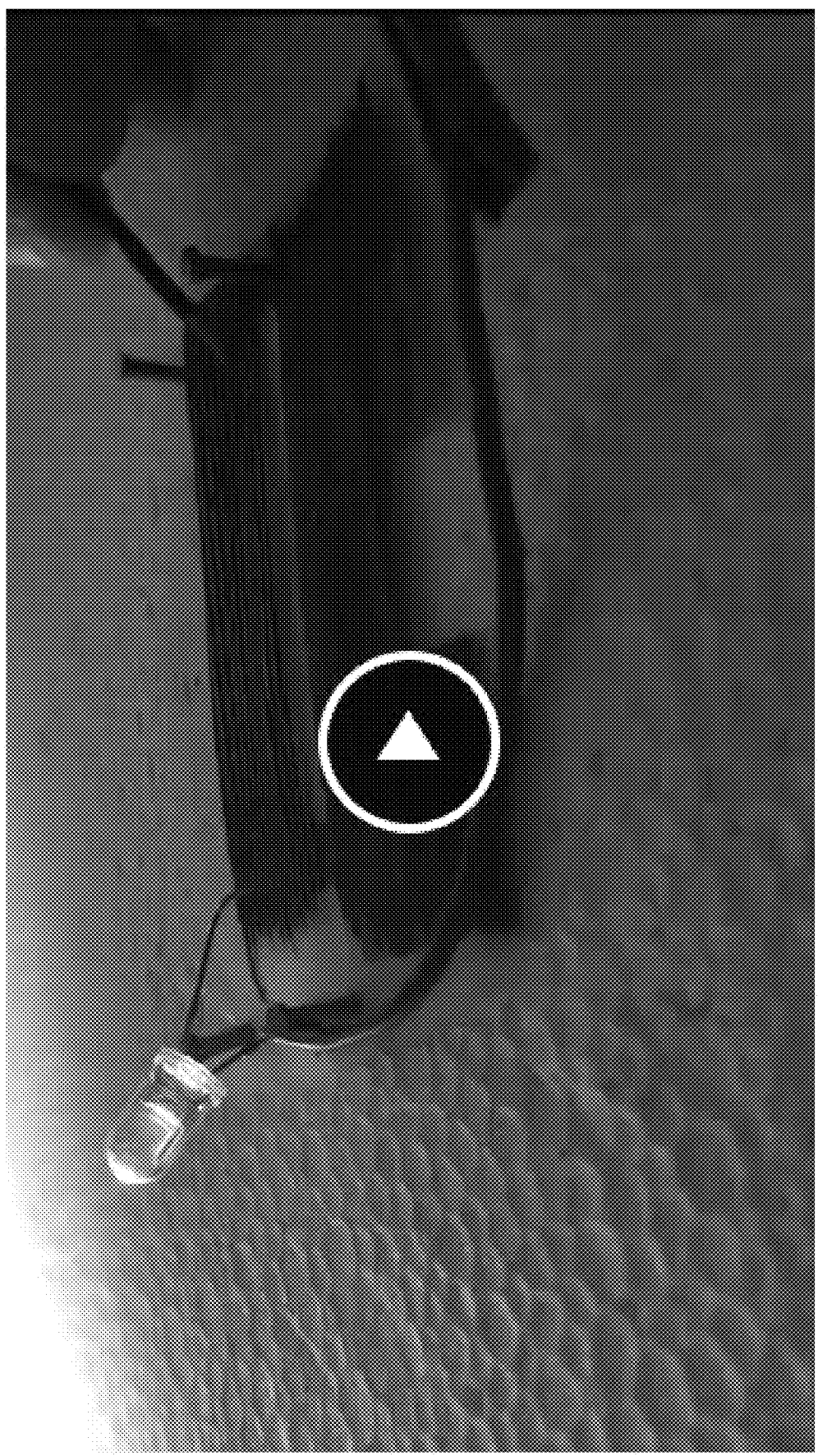
Figure 22C:
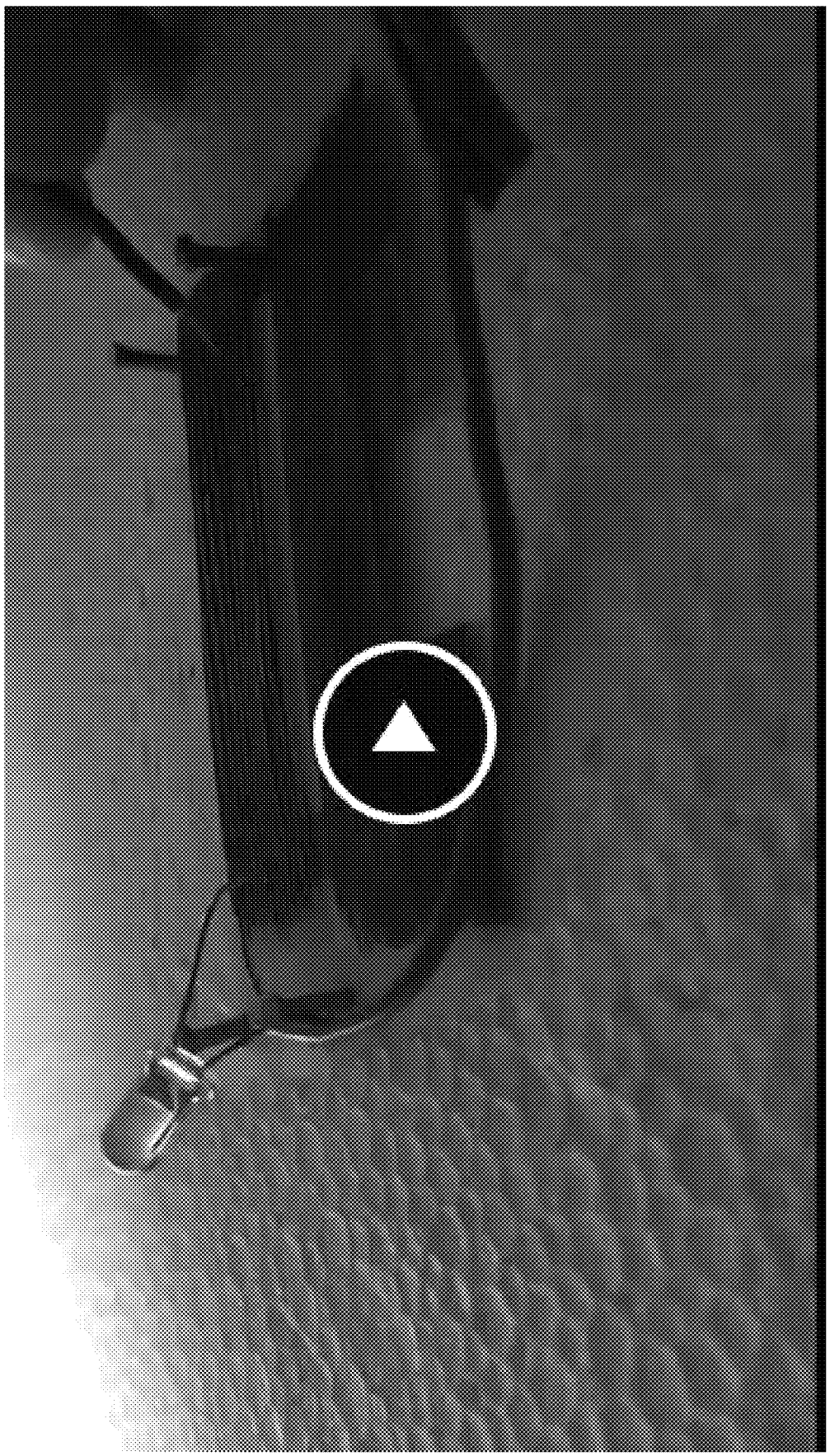
Figure 22D:
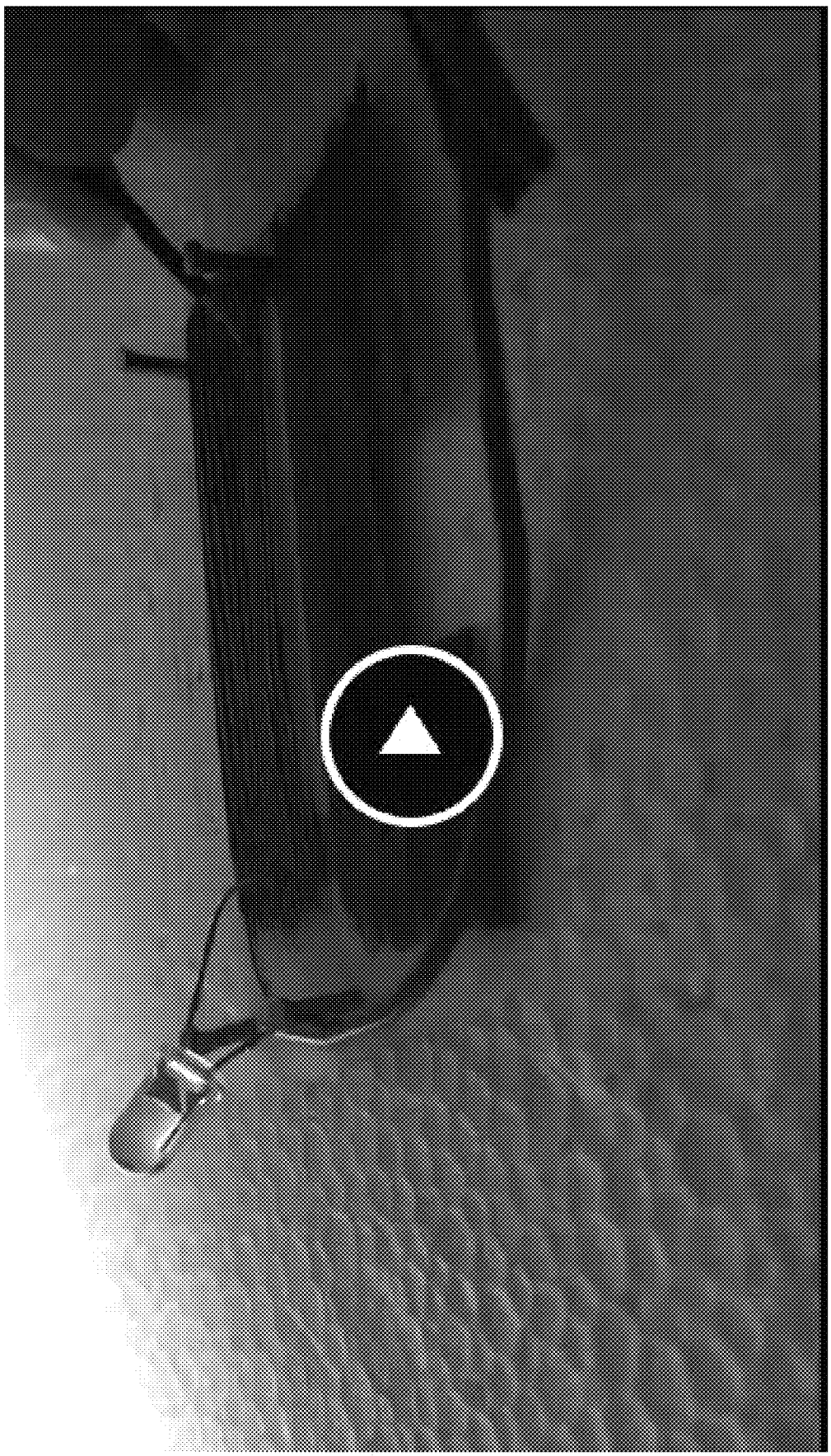

FIGS. 22A-D illustrate how once the combination of dried conductive material in the micro patterned substrate combination is created, electrical leads to form a circuit between one portion of the coated channel and, in this example, an electrical lead powered element such as an LED, can effectuate electrical conduction sufficient to operate the electrical device. FIG. 22A shows one electrical connection being brought to a channel to which the LED is electrically connected. FIG. 22B shows that electrical lead touching that coated channel to light the LED. FIG. 2C shows the electrical lead touching a different channel, not the one connected to the LED, to illustrate there is no shorting or cross feed between channels. FIG. 22D shows touching of a still further non-connected channel which does not light the LED.

FIGS. 23A-D

[From Supplementary Information Movie Entitled "Set Up for Low Feature Filling.Wmv. Shows Automated Microfluidic Filling Under Microscope Assistance."]

Figure 23A:

FIG. 23A illustrates an exemplary setup for more automated filling of channels of a patterned substrate. In this example, a micro fluidic system connected to a source of conductive solution has an output head that can be controlled with fine resolution to micro pattern channels. Micro manipulators, commercially available, can machine control that positioning. In this example, the micro patterned substrate is placed on a microscope to allow microscopic assistance regarding placement of the output head relative to the pattern during filling.

Figure 23B:
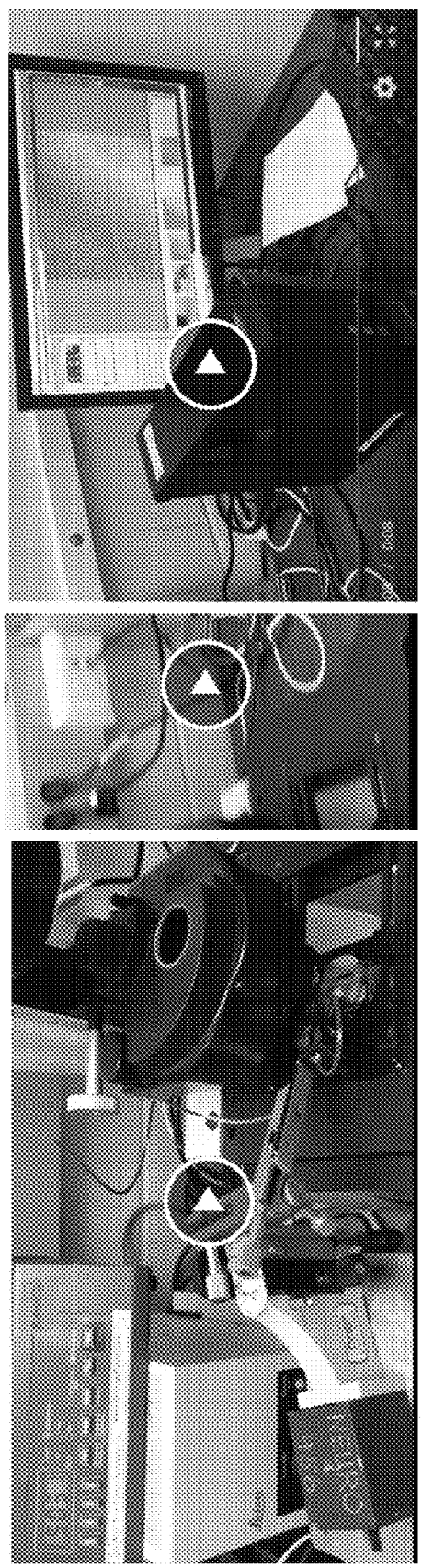
Figure 23D:

FIG. 23B shows an entire system including the microfluidic and micro manipulator subsystems, the microscopic stage and microscope, as well as a computer and display that would show the microscope field of view as magnified to assist in placement of the conductive solution.

Figure 23C:
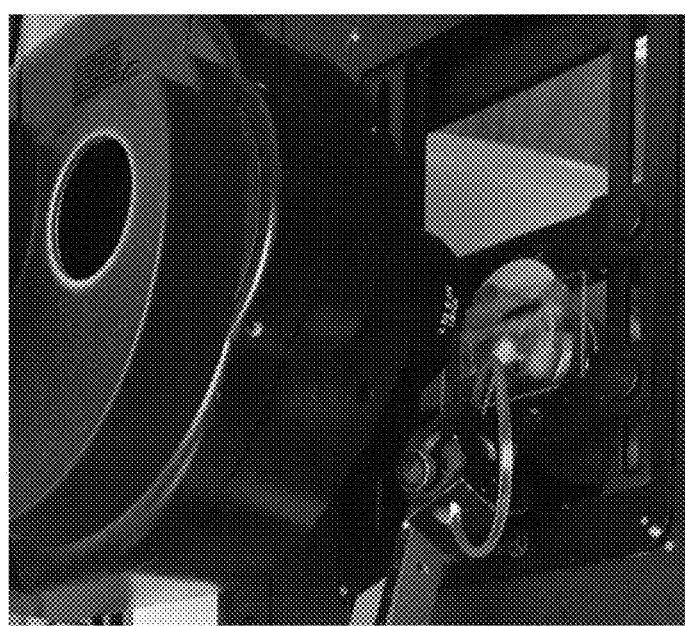

FIGS. 23C and D are enlargements showing the microscopic stage and micro pattern on it.

FIGS. 24A-D

[From Supplementary Information Movie Entitled "Movie (Highly Magnified) Showing Filling of Microchannels Under Microfluidic Pumping.]

Figure 24A:
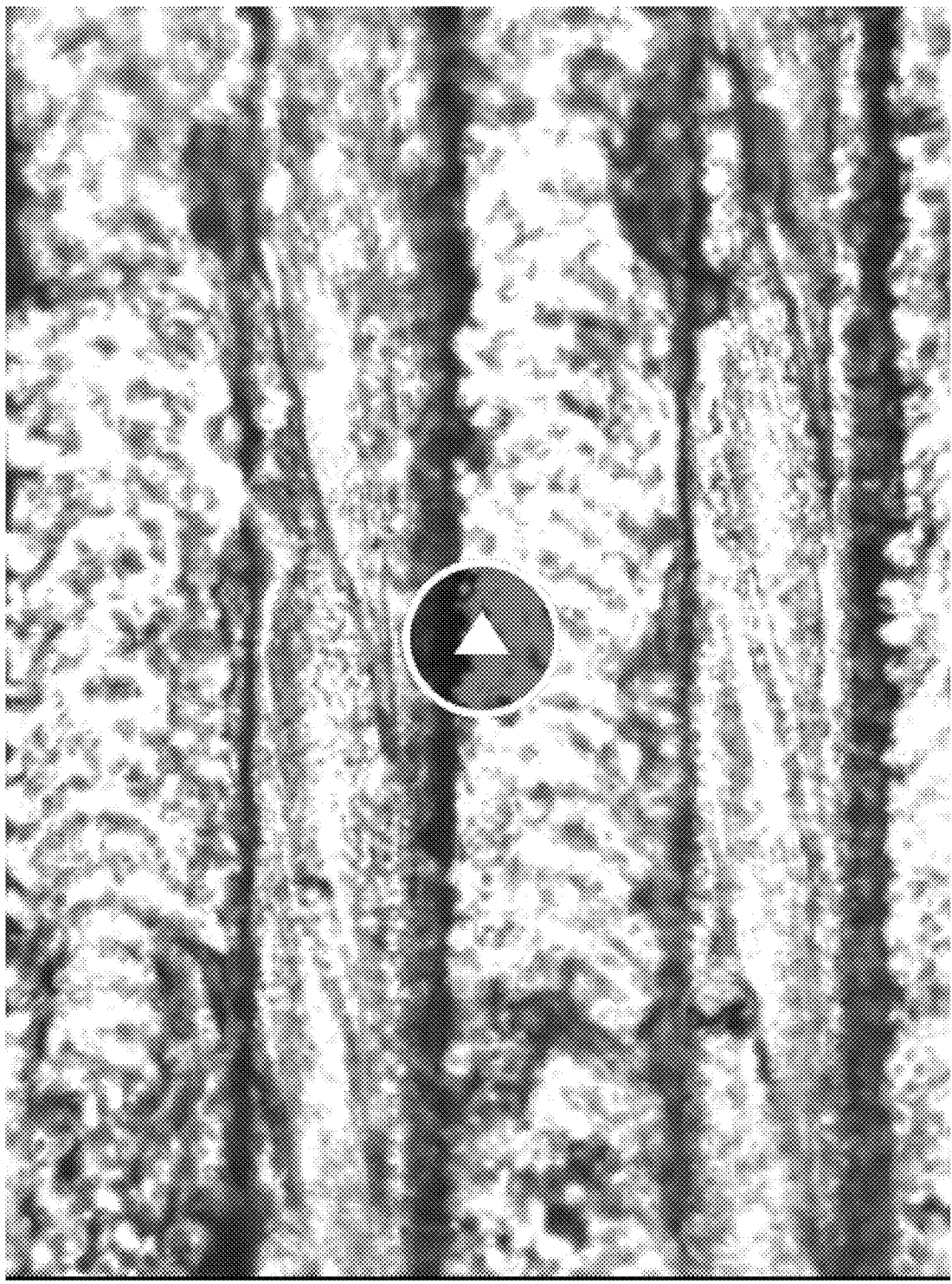
Figure 24B:
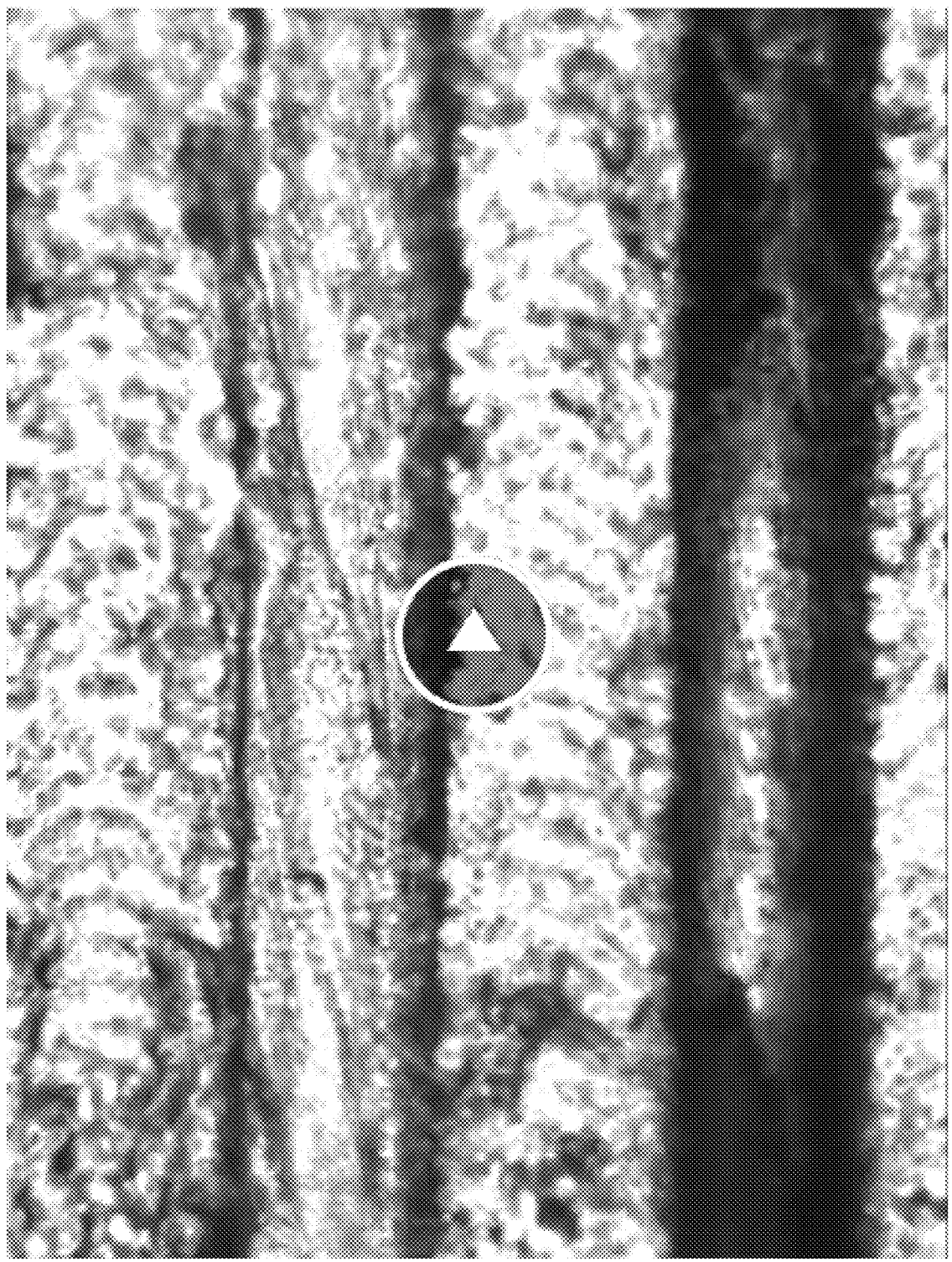
Figure 24C:
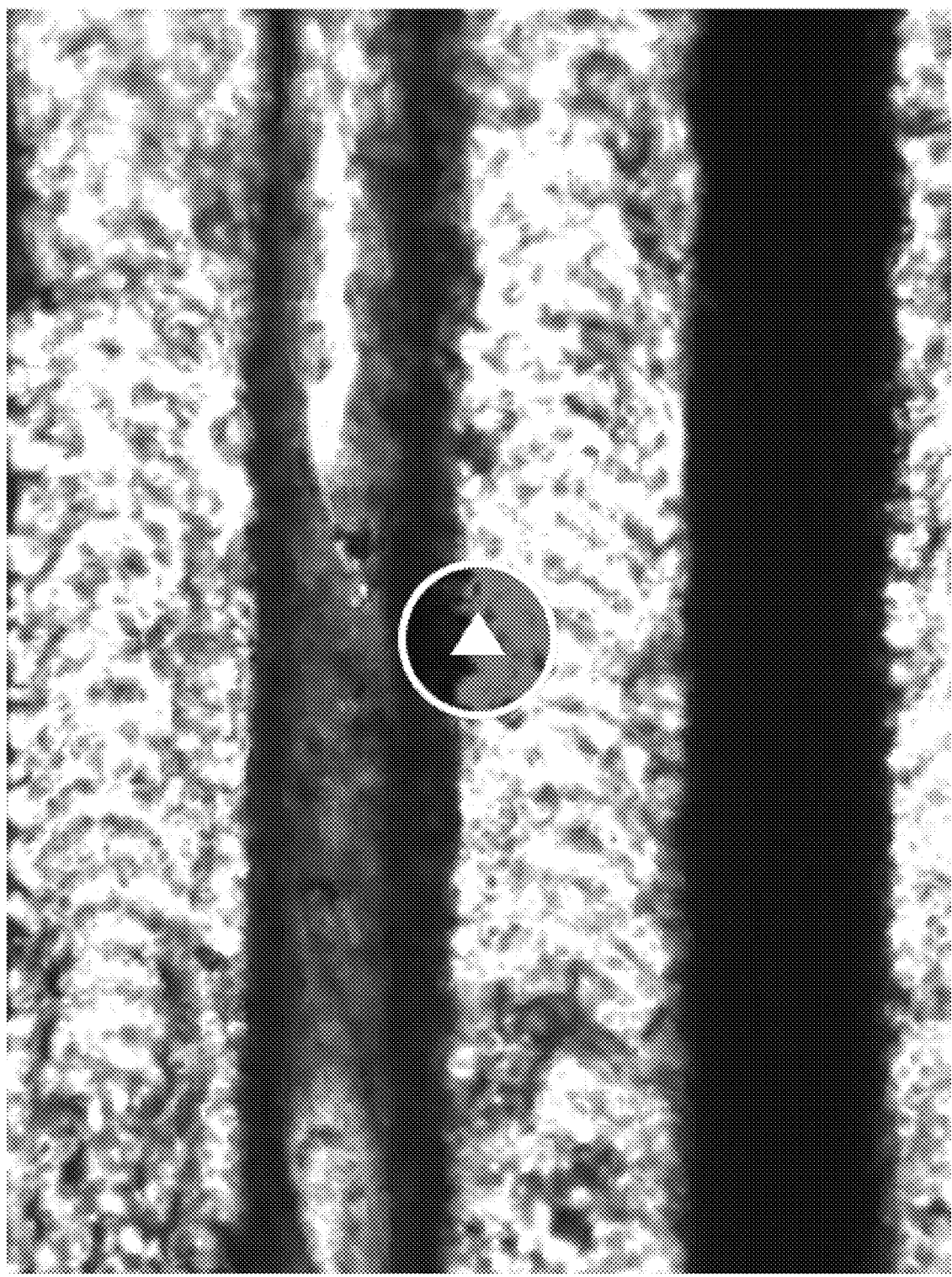
Figure 24D:
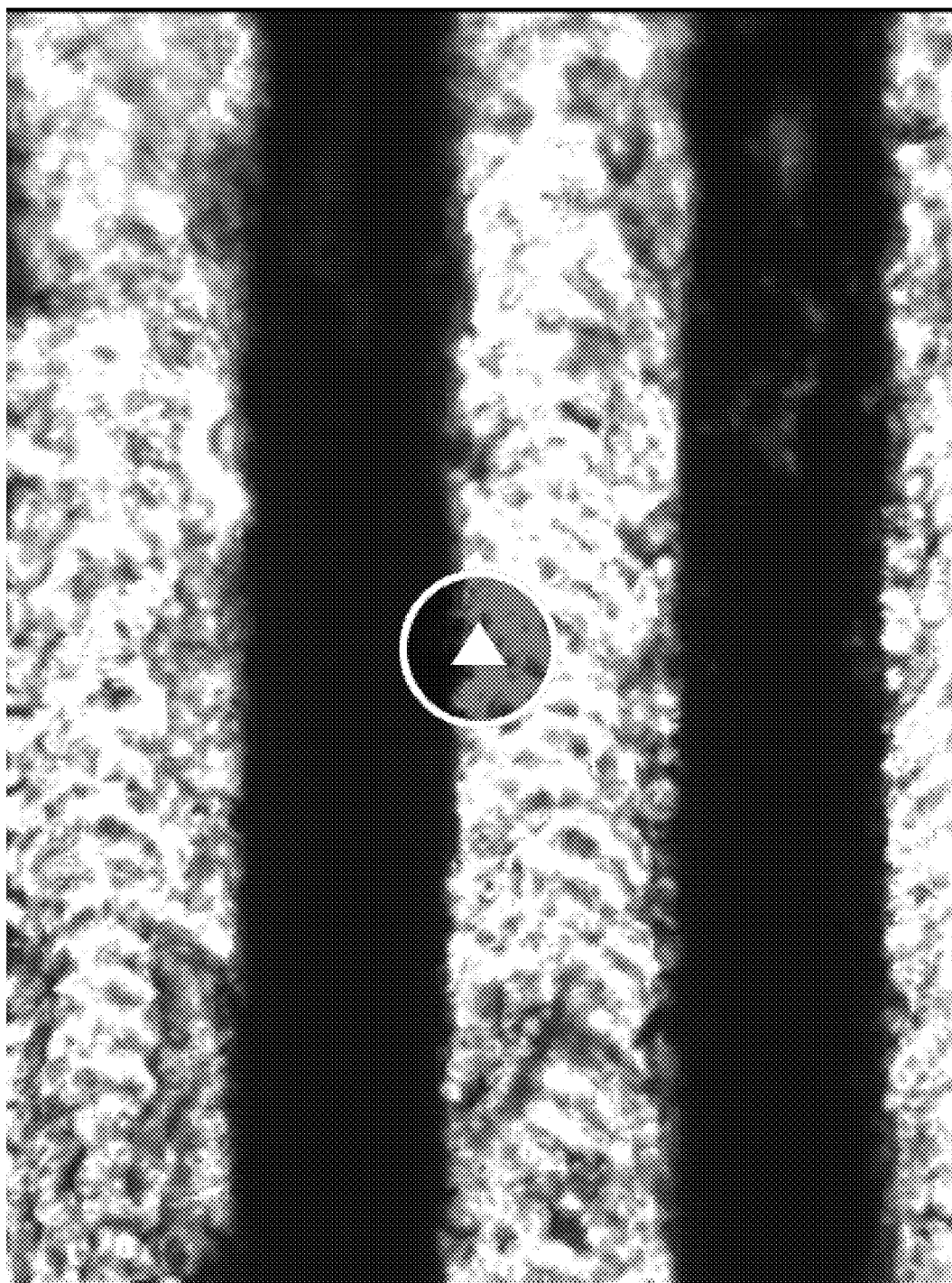
Figure 25A:
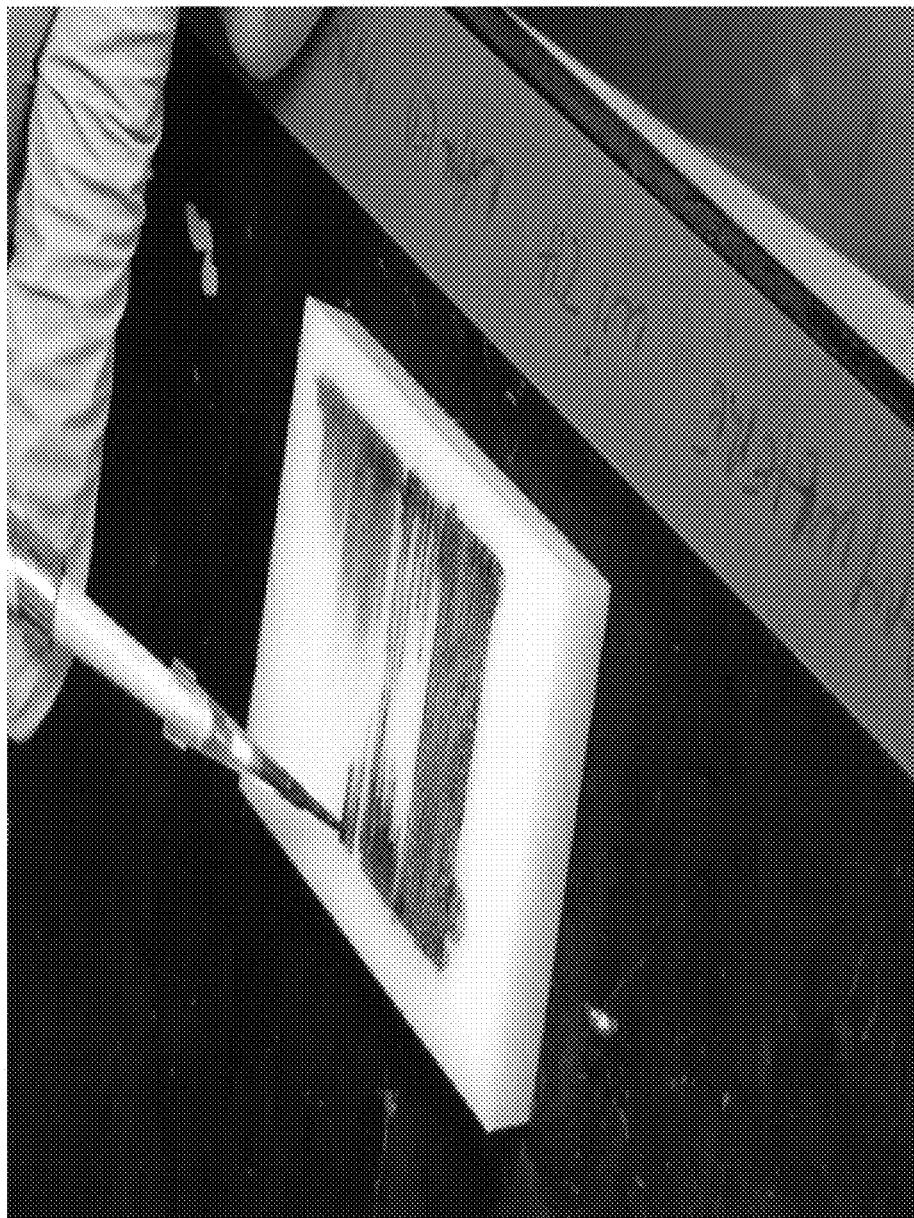
Figure 25C:
Figure 25B:
Figure 25F:
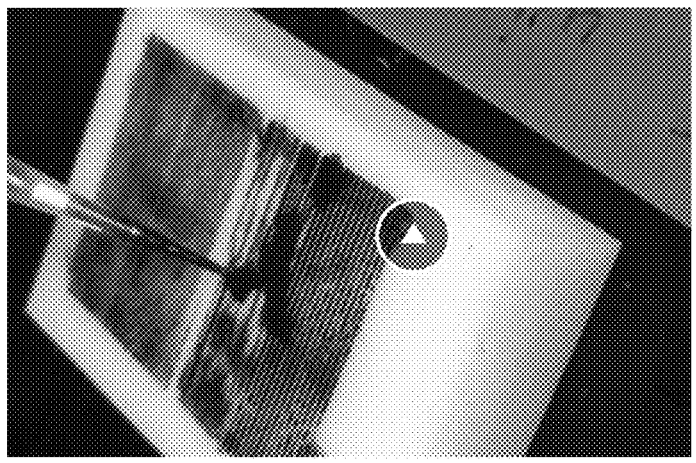
Figure 25E:
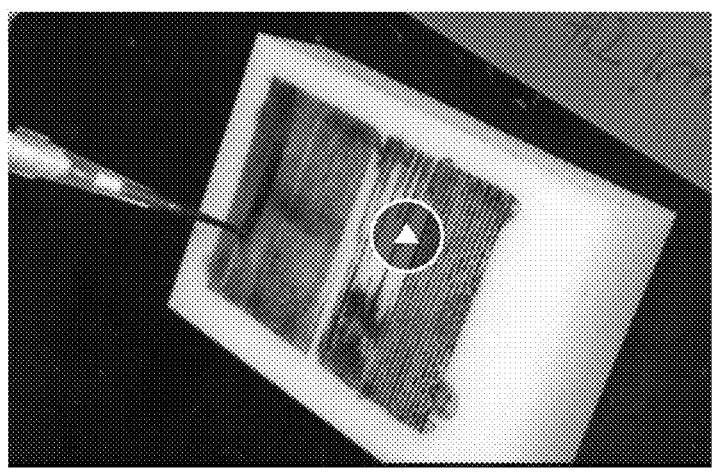
Figure 25D:
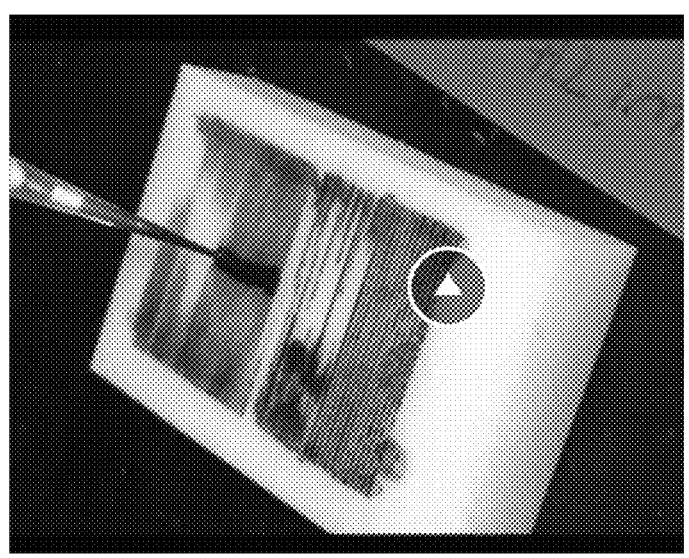
Figure 25G:
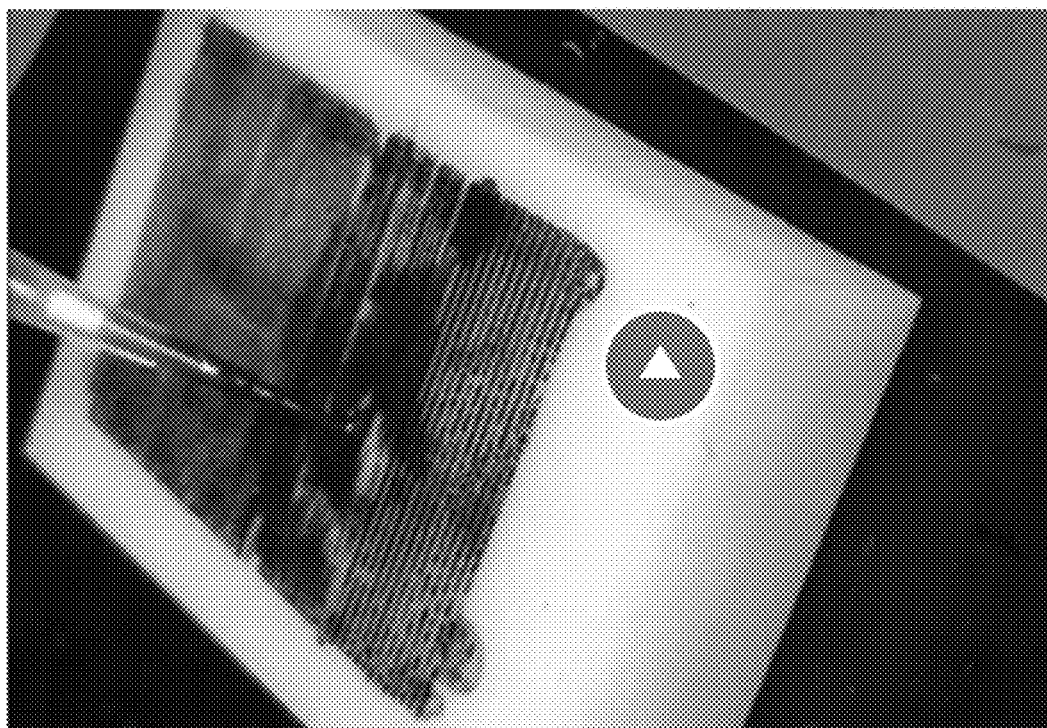

FIGS. 24A-D are highly magnified images of parallel generally linear microchannels being filled. FIG. 24A. By placement of a pump and output head, conductive solution can be beginning to be pumped through one of the channels. FIG. 24B. Once a channel is filled, the head can be moved to another channel and pumping started. FIGS. 24C-D. FIG. 24D is after 4 minutes of filling. The user can control the pumping by volume and flow rate to fill each channel as desired.

4.5 Casting Concept

With particular reference to FIGS. 12-15, we have also developed another concept for fabrication of a graphene-based microcircuit on a substrate which will here be further described. In particular, the technique includes ways to transfer a pre-formed conductive pattern from a first substrate to a second substrate. The second substrate can have, but is not required to, have different material properties than the first substrate. The pre-formed conductive pattern can be fabricated according to techniques also discussed in Specific Examples 1 and 2 related to the microfluidic concept but does not have to be.

This casting concept example has the following characteristics:

a. A pre-formed pattern of conductive material on a first substrate is prepared. This can be by any number of techniques including but not limited to those of Specific Examples 1 and 2 (see below for other examples). The first substrate pattern can have 3D microstructural features as with the Specific Examples 1 and 2.

b. The pre-formed pattern on the first substrate is transferred to a second substrate. A polymer solution is cast or distributed over the conductive pattern on the first substrate. Some of it settles by gravity onto the conductive pattern but a layer is formed over the conductive pattern and the first substrate. By simple drying at room temperature, a unitary film comprising the second substrate can be peeled from the mold. The film by adhesion removes at least substantially the conductive material from the pattern on the first substrate. Thus, the second substrate had transferred to it substantially the 3D structural features of the conductive material in substantially the pattern on the first substrate (see below).

c. The transferred conductive material adheres to the second substrate. The combination of transferred conductive in 3D form on the second substrate presents a combination that can then be applied for use. The electrical properties of the conductive material can be used as a microcircuit. The material properties of the second substrate can be selected for the desired use.

d. The combination allows fabrication of a wide variety of microelectrical circuits of a wide variety of 3D structural features without complex post-processing, including on substrates that range from rigid/solid to flexible/stretchable.

e. The possible applications are many, including wearable circuits, implants, sensors, and many f. more (see below).

Figure 12:
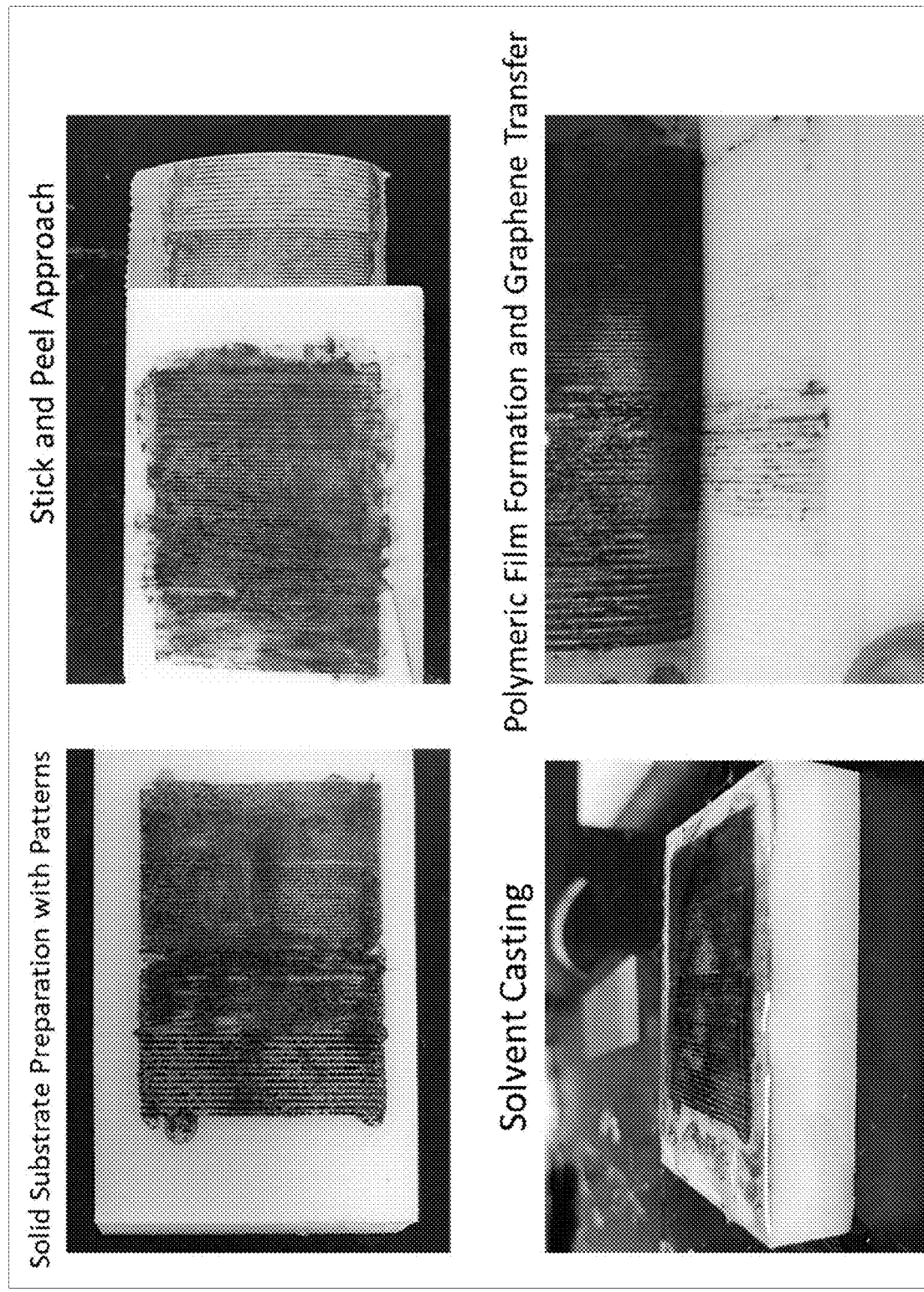

Results for the Graphene Transfer Via Polymer Casting Method:

The method was described in FIG. 12, which shows steps of graphene transfer with polymer casting approach. This process works with various natural or synthetic polymers and their organic or inorganic solvents. We have tried Gelatin/water, PLLA/Chloroform and Cellulose Acetate/Acetone. In all of these trials the method worked perfectly.

Figure 13:

The solid molds of different materials (Teflon, Delrin, silicon wafer) with graphene circuits can be prepared either using our demonstrated microfluidic approach or other techniques such as lithography and ink-jet printing. We have shown that this method also works to transfer graphene material-based circuits from ink-jet printed and laser annealed polyimide substrate to cellulose acetate or PLLA films (FIG. 13). The graphene material is transferred from an ink-jet printed lased annealed polyimide surface to a cellulose acetate film using the polymer casting approach.

Figure 14:
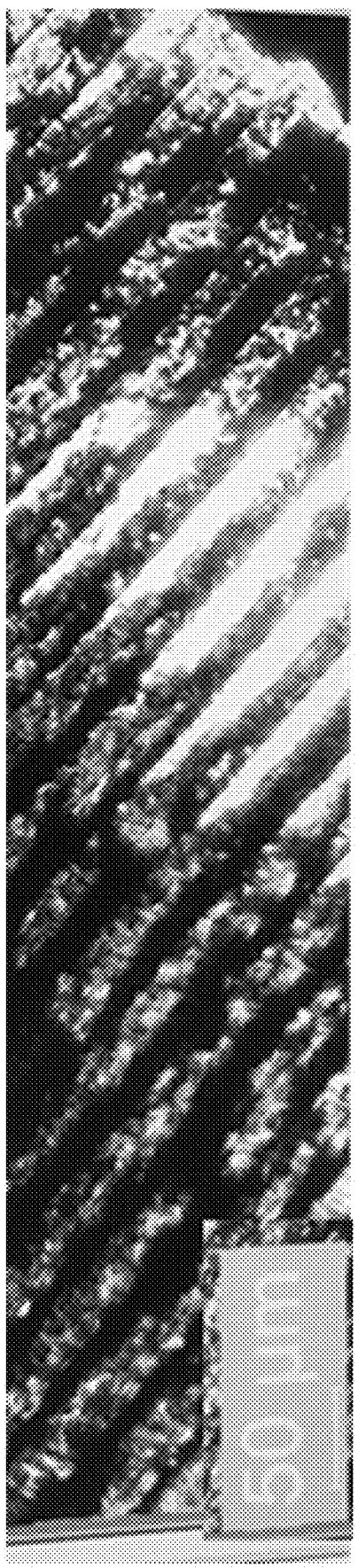

With this approach, it is also possible to easily transfer the graphene-based materials with very small feature sizes (5-10 μm) from the solid mold to flexible polymeric films. FIG. 14 shows the graphene transfer with small feature size from silicon wafer substrate to PLLA film. The graphene transfer is with small feature size from a silicon wafer substrate to a PLLA film (5 μm depth-10 μm width).

Figure 15:
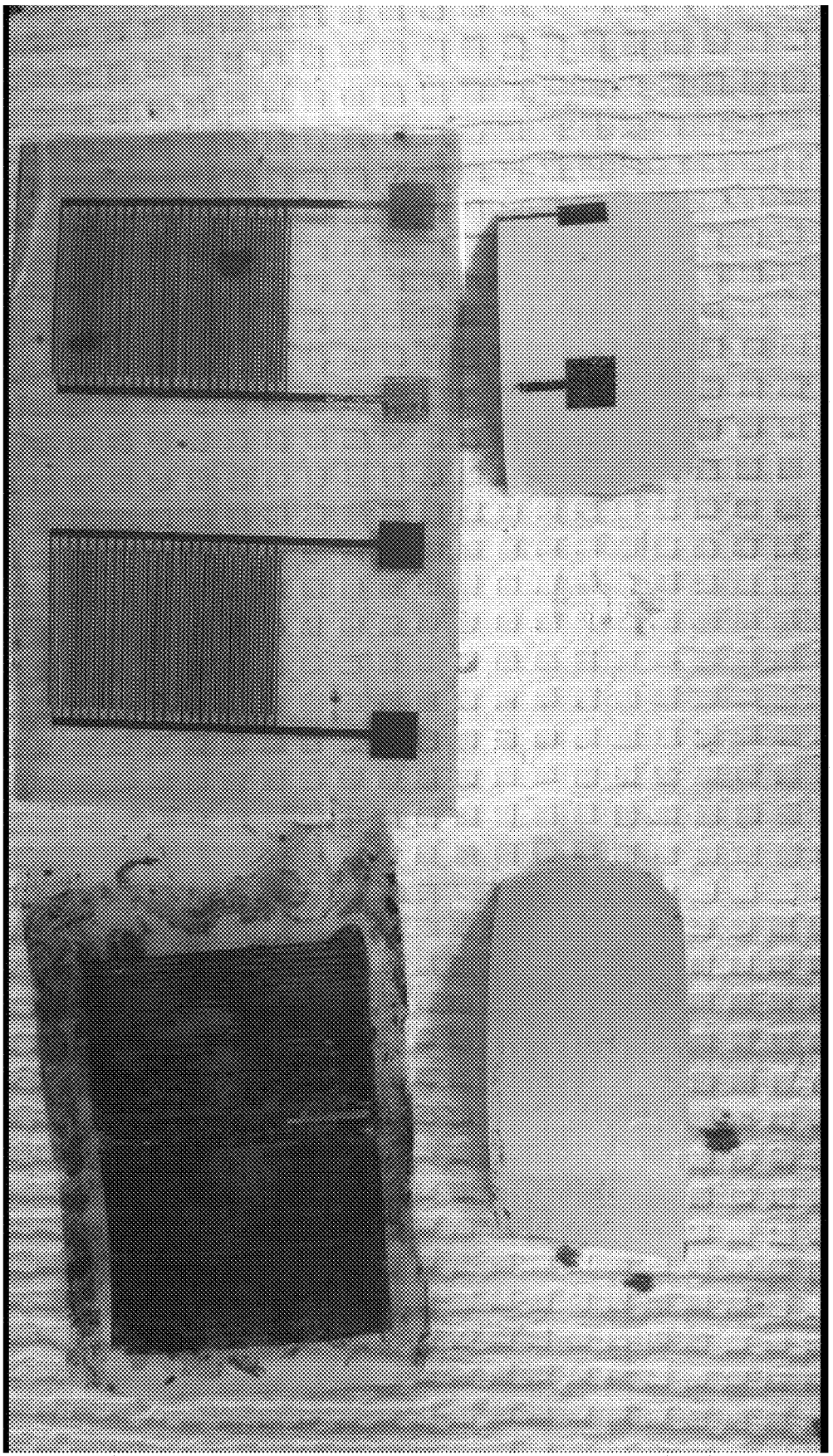

We also observed that the graphene circuits prepared using polymer casting approach possess significantly more mechanical stability than the circuits obtained by ink-jet printing. In FIG. 15, the graphene pattern is easily transferred from ink-jet printed polyimide surface to a regular tape, whereas the graphene pattern transferred to polymer film via solvent casting was more stable. This shows the stability of the graphene transferred to the polymeric film via solvent casting.

4.5.1 Supplemental Information for Casting Concept

By particular reference to FIGS. 25A-G, 26A-P, 27A-G, through 28A-K, additional details and examples regarding this concept.

FIGS. 25A to 26P

[From Supplementary Information Entitled "Demonstration of Graphene Transfer:

STEP 1: SOLID SUBSTRATE PREPARATION WITH PATTERNS"]

FIGS. 25A-26P show step one of this example. A first substrate is filled with conductive material as desired. In this example, a solid rigid substrate (e.g. silicone) having a preformed micro pattern of 3-D structural features (FIG. 25A), is filled by manual manipulation of microneedle and pipette. (FIGS. 25B to 25G show how the worker manually guides the discharge end of the pipette to desired positions in the pre-formed channels on the surface and fills either from above moving the tip along the surface or from a fixed position but allows capillary action to guide the fluid along channels. The user decides which channels to fill; which could be almost all across the surface.) See also FIG. 26A-B [from Supplementary information entitled "Shows first solid substrate microchannels filled with dried graphene-based materials."]. As will be appreciated, this manual control includes not only placement relative the surface but also thickness. The pipette can be controlled as to flow rate and amount. It can also be returned to the same location(s) and another dose of the liquid applied over an earlier dose. Of course, the dispension and control of dispension of the viscous or solution-based material over the patterned circuit can be automated or semi-automated by known fluidic control techniques. Once dried in place, that combination presents dried conductive material in the selected micro channels of the solid substrate. See below for more discussion.

[From Supplementary Information Entitled "STEP 2: STICK AND PEEL APPROACH"]

The second step is an optional cleaning step which can be conducted whereby an adhesive tape is lightly pressed against the dried in place conductive material and peeled off. This would clean off the top surface of the first substrate outside of the micro channels. FIGS. 26C-I.

[From Supplementary Information Entitled "Step 3: Solvent Casting"]

Step 3. A solvent casting is poured over the cleaned surface. FIGS. 26J-L.

[From Supplementary information entitled "
STEP 4: POLYMERIC FILM FORMATION and graphene transfer]

Step 4 that solvent is dried in place and then peeled. As shown in FIGS. 26M-P, the conductive material is substantially removed from the first substrate and transferred to that cured second substrate.

Figure 26M:

In particular note:

FIG. 26M illustrates peeling off of the polymeric film after drying from the corner with a tweezer.

Figure 26N:
Figure 260:

FIG. 26N illustrates peeling off of the polymeric film from the solid mold surface slowly allowing transfer of graphene from the mold surface to the film surface.

FIG. 26O illustrates transfer of graphene patterns to the film surface after slow peeling off.

Figure 26P:

FIG. 26P illustrates complete transfer of graphene patterns from solid mold surface to flexible polymeric film surface.

FIGS. 27A-28K

FIGS. 27A-G, and FIGS. 28A-K show a different version of creating a first substrate with a dried in place conductive material in the first substrate's micro patterned 3-D micro structures, followed by casting a polymeric solution over the same, followed by peeling the dried polymeric film to transfer substantially a conductive material from the first substrate to that second polymeric film substrate.

Figure 27A:
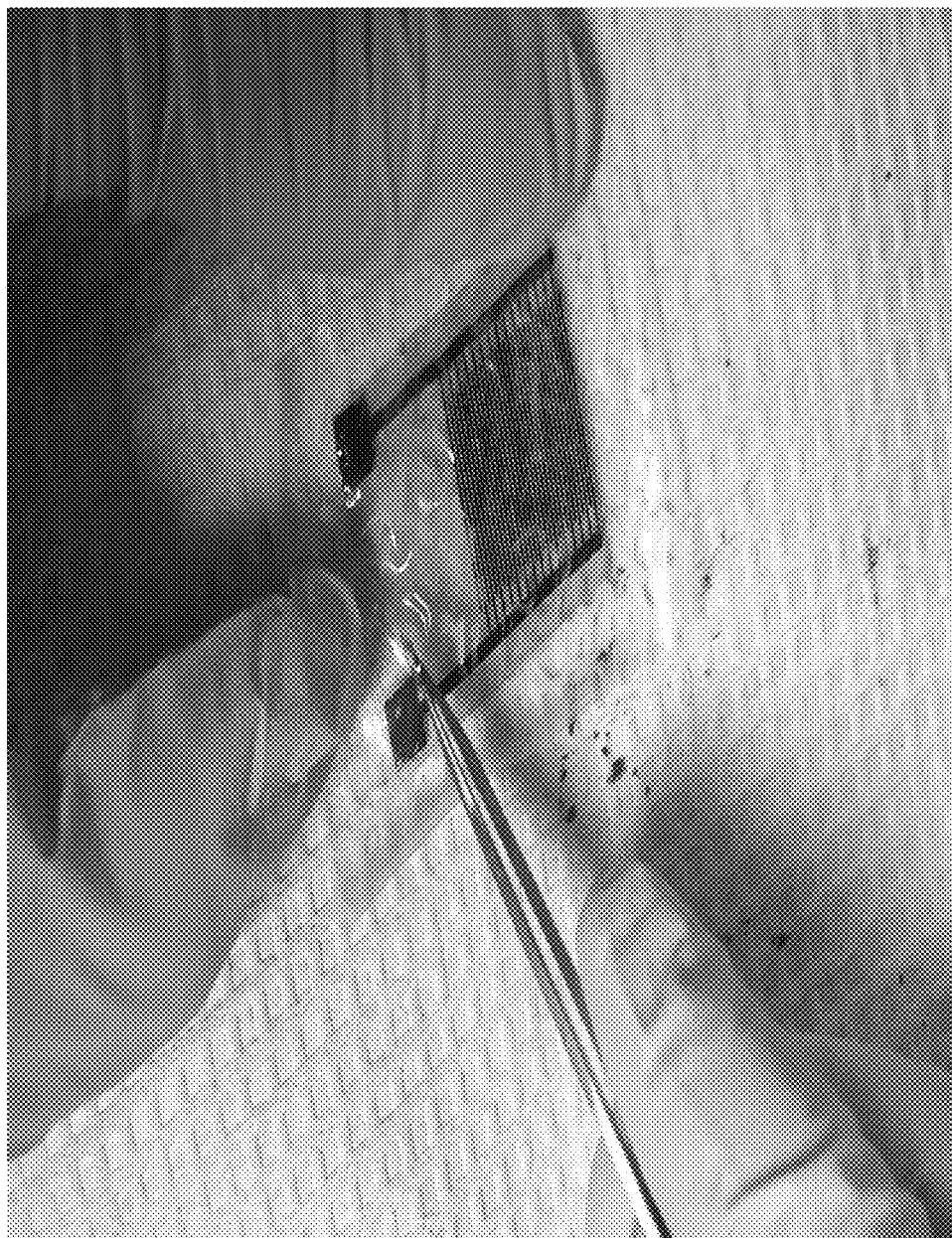

FIGS. 27A-G show the following:

FIG. 27A illustrates the transfer of graphene patterns from ink-jet printed and laser annealed polyimide surface to the flexible cellulose acetate-based polymeric film surface via polymer casting and peeling off approach. After drying, the cellulose acetate film (or flexible polyimide substrate; whichever is convenient and easy to peel) is slowly peeled off from the corner to transfer the graphene patterns.

Figure 27C:
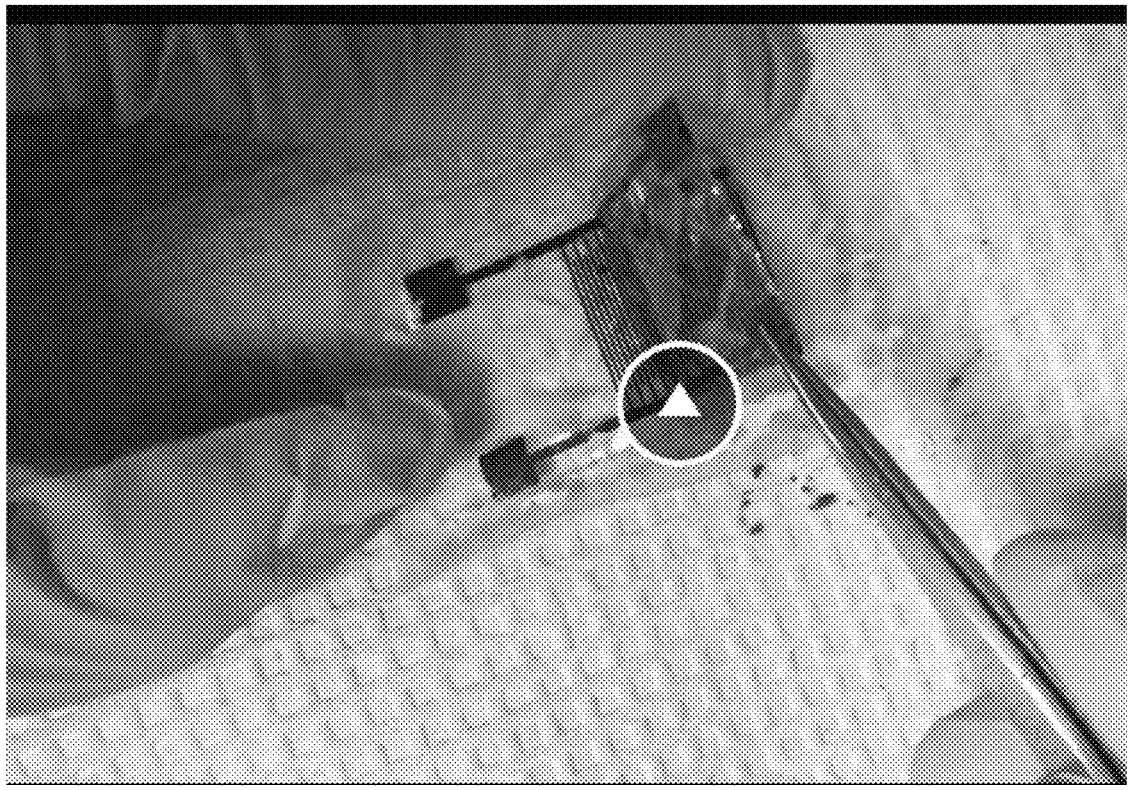
Figure 27B:
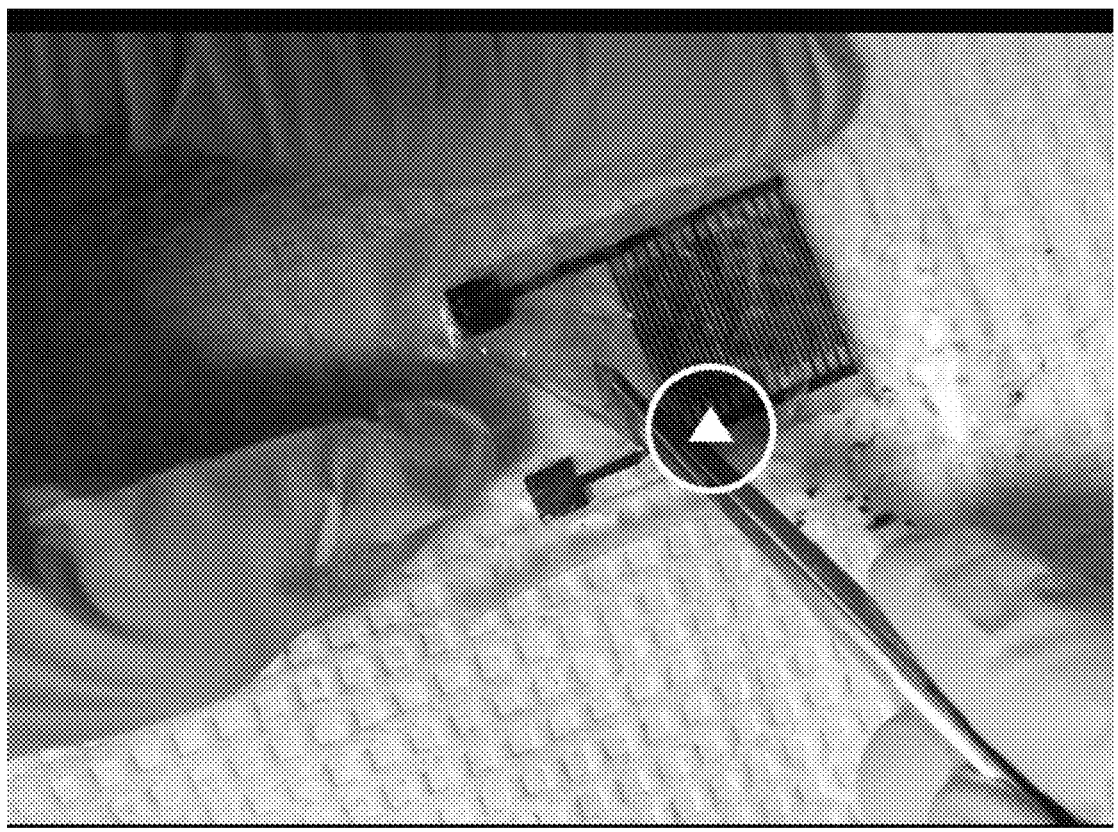

FIG. 27B illustrates polyimide substrate is peeled off from the corner.

FIG. 27C illustrates polyimide substrate is continued to slowly peel off from the cellulose acetate film.

Figure 27E:
Figure 27D:

FIG. 27D illustrates polyimide substrate is continued to slowly peel off from the cellulose acetate film FIG. 27E illustrates polyimide substrate is continued to slowly peel off from the cellulose acetate film.

Figure 27G:
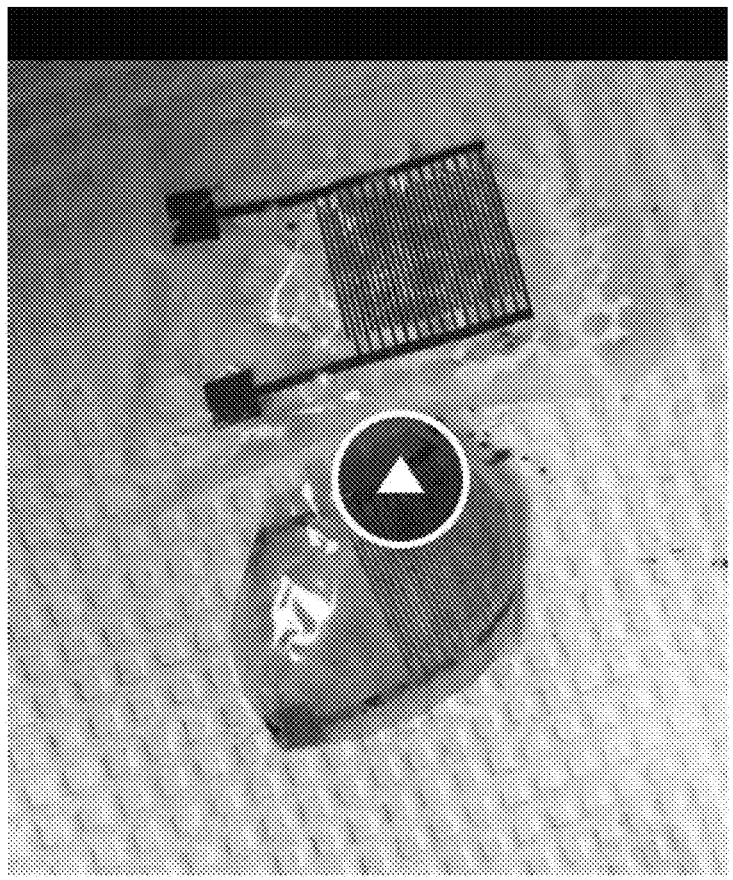
Figure 27F:
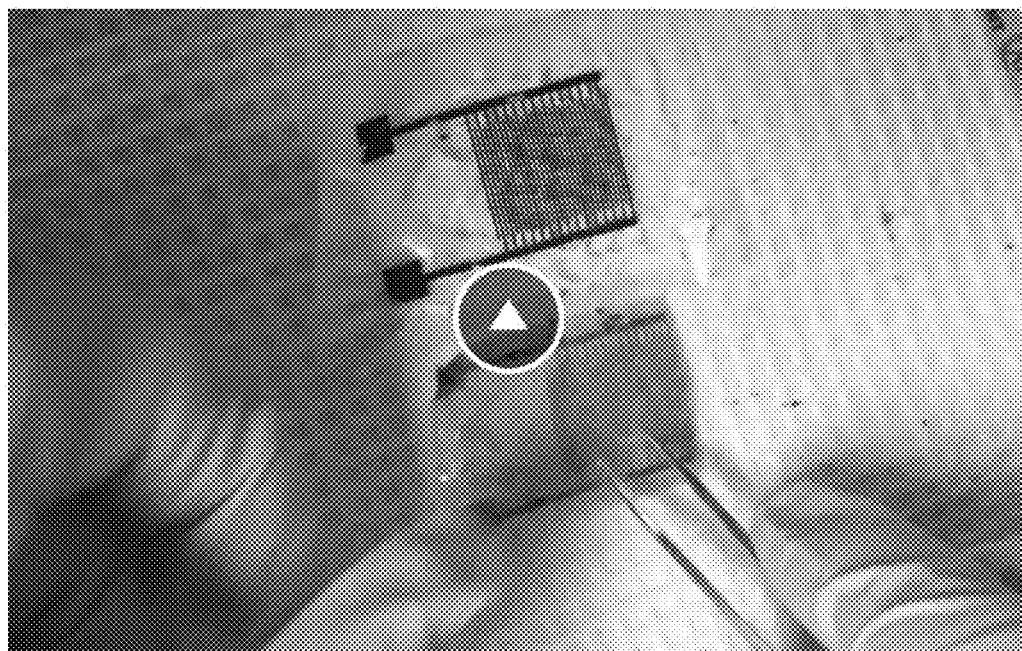

FIG. 27F illustrates complete transfer of graphene patterns from the polyimide surface to cellulose acetate film surface.

FIG. 27G illustrates complete transfer of graphene patterns from the polyimide surface to cellulose acetate film surface.

FIGS. 28A to K show the following: the transfer of graphene from solid silicon wafer substrate to cellulose acetate-based film using polymer casting and peeling off approach.

FIG. 28A illustrate a silicon wafer coated with graphene.

FIG. 28B illustrates cellulose acetate polymer solution cast of silicon wafer coated with graphene.

Figure 28C:

FIG. 28C illustrates drying of the cellulose acetate solution and formation of the film.

Figure 28D:

FIG. 28D illustrates peeling off of the polymeric film from silicon wafer surface.

Figure 28E:

FIG. 28E illustrates peeling off of the polymeric film from silicon wafer surface.

Figure 28F:

FIG. 28F illustrates peeling off of the polymeric film from silicon wafer surface.

Figure 28G:

FIG. 28G illustrates peeling off of the polymeric film from silicon wafer surface.

Figure 28H:

FIG. 28H illustrates peeling off of the polymeric film from silicon wafer surface.

Figure 28I:

FIG. 28I illustrates peeling off of the polymeric film from silicon wafer surface.

Figure 28J:
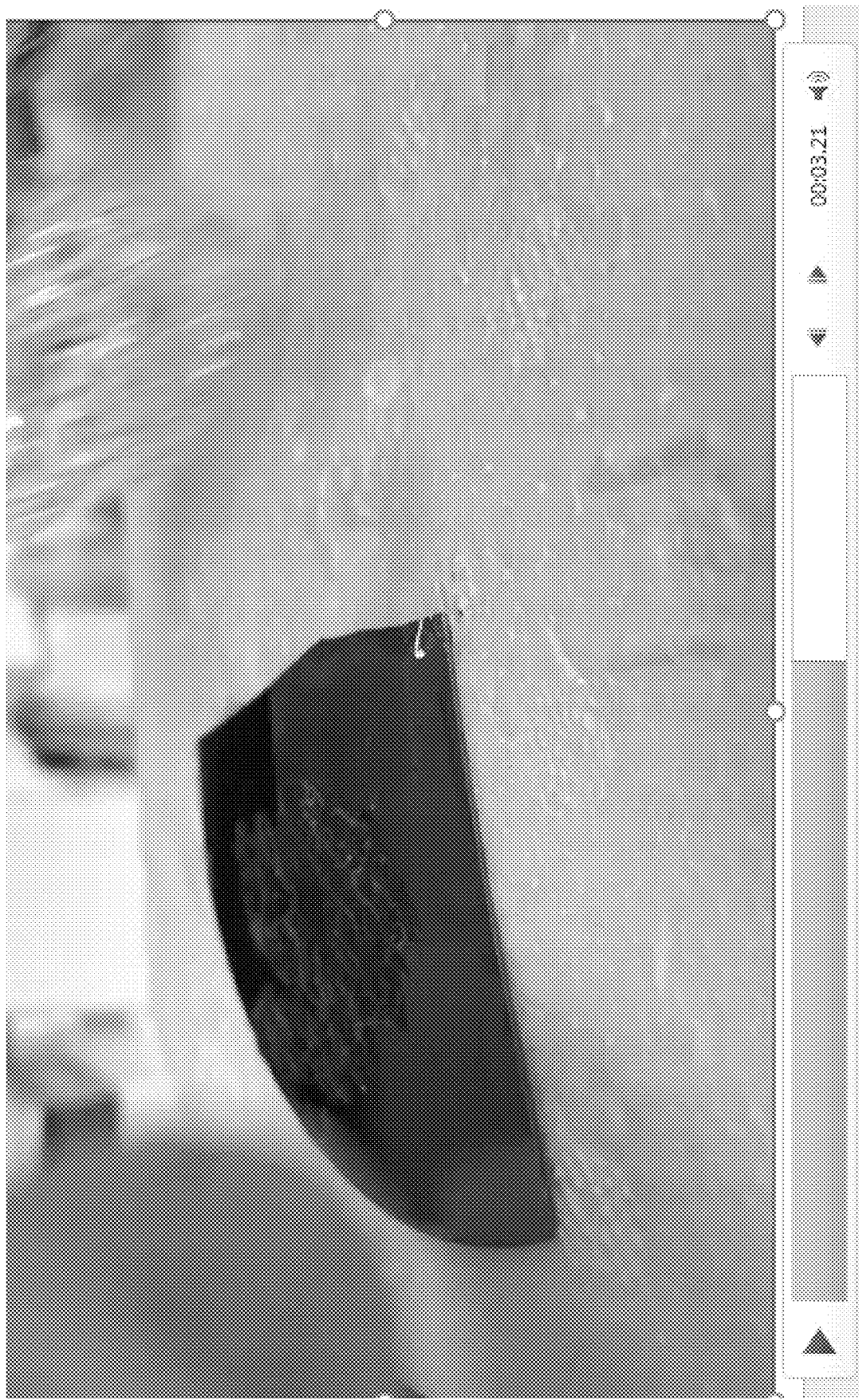

FIG. 28J illustrates peeling off of the polymeric film from silicon wafer surface.

Figure 28K:

FIG. 28K illustrates transfer of graphene from silicon wafer surface to cellulose acetate film surface.

FIGS. 29A-C

These photos illustrate in a highly magnified form the final transferred product.

FIG. 29A illustrates the graphene patters transferred from silicon wafer substrate to cellulose acetate film surface. The feature sizes are very small so that they can only be seen under the microscope.

FIG. 29B illustrates the graphene patters transferred from silicon wafer substrate to cellulose acetate film surface (different area on the film).

FIG. 29C illustrates the graphene patters transferred from silicon wafer substrate to cellulose acetate film surface (different area on the film).

4.6 Options and Alternatives

As will be appreciated by those skilled in this technical field, the invention can take many forms and embodiments. Variations obvious to those skilled in the art will be included within the invention.

Examples of options and alternatives have been mentioned in the description above. A few additional comments or examples follow.

By particular reference to FIGS. 30A through 36B, additional details and examples regarding options and alternatives regarding aspects of the invention are set forth.

FIGS. 30A-D

FIGS. 30A-D show how aspects of the invention have been demonstrated to produce an effective conductive micro electric circuit.

FIG. 30A illustrates resistance of graphene circuit ink-jet printed and laser annealed on polyimide substrate.

FIG. 30B illustrates the distance was kept 1 cm while measuring the resistance to make a reasonable comparison.

FIG. 30C illustrates resistance of graphene pattern obtained by microfluidic approach.

FIG. 30D illustrates the distance was kept 1 cm while measuring the resistance to make a reasonable comparison.

FIGS. 31A-C

FIGS. 31A-C show examples of technique one.

FIG. 31A illustrates Teflon mold with micropatterns (showing a mold with microstructures).

FIG. 31B illustrates the polymer solution (PLLA) cast on Teflon mold with micropatterns (showing a film cast on the mold).

FIG. 31C illustrates transfer of micro patterns from mold to PLLA film surface and formation of PLLA film with surface micropatterns (showing a PLLA film after being peeled off the mold).

FIGS. 32A-C

FIGS. 32A-C illustrate various examples of how conductive solution can be injected or pumped into micro patterned substitute.

FIG. 32A illustrates conductive graphene solution injection to the micropatterns on PLLA film using a manual micro pipette.

FIG. 32B illustrates conductive graphene solution injection to the micropatterns on PLLA film using an adjustable syringe pump set up with controllable flow rates.

FIG. 32C illustrates conductive graphene solution injection to the micropatterns on PLLA film (for very small feature size, lower than 50 μm) using an adjustable syringe pump set up attached with micromanipulators and microneedles under the microscope using controllable flow rates.

FIGS. 33A-C

FIGS. 33A-C show how the dried in place conductive material on the micro pattern provides a stable and robust combination.

FIG. 33A illustrates graphene patterns obtained by microfluidic approach on PLLA film surface (shows graphene added).

FIG. 33B illustrates stability of graphene patterns on PLLA films against water and mechanical bending/stretching.

FIG. 33C illustrates controlled filling of just one pattern with conductive graphene solution on PLLA film using a syringe pump at controlled flow rates.

FIG. 34

FIG. 34 is a diagrammatic depiction of a micro pattern in a planar surface.

FIG. 34 illustrates the preliminary channel designs with potential pattern dimension range.

FIGS. 35A-B

FIGS. 35A and B show an optional alternative, namely, creating two mirror image micro patterned substrates, in coating one and then combining them after coating of one or both of the micro channels to form an enclosed three-dimensional network of micro channels. As will be appreciated, formation of three-dimensional, at least partially closed, microchannels in various patterns with the assembly technique assembly as in FIGS. 35A and B (or other techniques of forming such a closed or partially closed network of microchannels), and filling of those microchannels with microfluidic pumping as described herein is possible, including with flexible substrates that enclose the microchannels. Another example is formation of at least partially closed patterns directly within a 3D structure (e.g. hydrogel) (e.g. via 3D printing, injection molding, or other techniques), and filling of these at least partially enclosed patterns with conductive solution via microfluidic approach, as discussed herein.

FIGS. 36A-B

FIGS. 36A and B illustrate the option of further coating the conductive material with other materials. An example here are stem cells. The micro patterned conductive path could be used to electro stimulate those cells. These figures show that bio cells can attach to graphene so that it can be used to electrostimulate cells in place on a microcircuit.

FIGS. 37A-H (Near Field Communications Circuit) One non-limiting example of a specific application for a microcircuit created by a method according to the present invention is illustrated at FIGS. 37A-H.

For example, using the microfluidic approach described earlier herein, a flexible or inflexible substrate 101 with fabricated pattern 100 (such as, e.g., produced by any of the techniques discussed above or otherwise) is produced (see circuit 100 on substrate in FIG. 37B). Using a microfluidic system where volume and flow rate is effectively controllable, a conductive material (e.g. graphene-based or other) is pumped into the pattern so as to at least substantially fill the channels of the pattern (as shown in the images of FIGS. 37A and B, which show the flexible substrate with the conductor-filled pattern connected electrically to a small microcircuit in the center). The substrate pattern filled by microfluidic technique (as described earlier) was based on the same design as an antenna extracted from a working near-field-communications card (NCR) 104 (credit card sized) (e.g. FIG. 37C), and as shown in the figures, the fabricated antenna 100 (e.g. FIGS. 37A, B and F) was demonstrated, with a commercially-available smart phone application 108 and smart phone 106, to be effective for NFC.

FIG. 37D shows on the display of phone 106 that phone 106/mobile app 108 is searching for card 104). FIG. 37E shows on the display of phone 106 that phone/mobile app 106/108 has achieved near field communication (NFC) with card 104.

In a testing of circuit 100 and phone/mobile app 106/108, FIG. 37F shows an NFC circuit 100 fabricated per aspects of the present invention on a substrate before placement in a smart card. FIG. 37G shows phone 106 with installed mobile app 108 searching for the fabricated NFC circuit 100 of FIGS. 37A, B, F. FIG. 37H shows a successful demonstration of acquisition of near field communication (NFC) between circuit 100 and phone/app 106/108.

In this example, the pattern 100 is essentially a continuous channel in the form of a coil, a series of loops or windings essentially in a plane (here each loop is rectangular or squared but it could be other shapes such as spiral, pentagonal, etc.). As shown, the conductor-filling thus produces a single continuous conductive path in that shape which functions effectively as a near field antenna for purposes of near field or RFID wireless radio frequency electromagnetic communications, as is well known. See, e.g., U.S. Patent U.S. Pat. No. 9,112,272B2 to inventors Finn et al., incorporated by reference herein, for details about how such small antennas with patterned windings in near field communications work. As further shown in the Figures, a small wire could be connected in electrical communication (e.g. by soldering) to each opposite end of the serpentine winding 100. The connecting wires could go to a microcircuit that facilitates the near field communications. As will be appreciated, this example could be used for a variety of such near field communications (NFC). One non-limiting example is with smartcards and smart phones. See U.S. Patent U.S. Pat. No. 9,836,684B2 to inventors Finn et al. (Smart cards, payment cards, smart phones) and Published Application US20160099614A1 to inventors Leabman et al (external or internal receivers for smart mobile devices).

The designer selects according to need or desire the antenna parameters. They can include the following parameters:

Antenna geometry parameters. Turns: number of complete turns (four segments per turn). Antenna length in mm. Antenna width in mm. Number of layers. Conductor parameters (see various exemplary possibilities noted in the Figures). Width of tracks in mm. Spacing between turns in mm. Thickness of the conductor in μm.

Substrate parameters. Thickness in mm. Dielectric permittivity.

The ability of the invention to produce with effective resolution and accuracy, these types of small circuits economically is an example of the benefits of the invention. Of course, a variety of other circuit shapes, types, and applications are possible with the invention. Such antenna modules can be small enough and thin enough to embed in a smart card of credit card form factor. As is known, a smart phone with the appropriate mobile app loaded in it can use near field techniques to allow communication between card and phone when the phone is brought near enough the card (such as in a commercial transaction).

The graphed test data of FIGS. 37A-B illustrates for understanding that the serpentine antenna of the present invention example could be fabricated at a small scale but with effective resolution and accuracy on a flexible substrate such that it could be embedded, with its microcircuit into a smart card, and has demonstrated efficacy for near field communications. It could be mounted or emplaced elsewhere, such as in a smart phone or device, or another passive device.

It is to be understood, however, that the techniques of the present invention can be applied to a wide variety of other applications, functions, circuit shapes/types, etc. As will be appreciated by those skilled in this art, the techniques of the invention can be used to produce and use a wide variety of small scale electrically conductive patterns with effective resolution, accuracy, and repeatability for a wide range of applications. Non-limiting examples, discussed earlier, include flexible electronics; biomedical implants; biomedical cell interfaces; biosensors; portable energy harvesting; electronic skin; wearable devices; strain sensors, electrochemical sensors, pressure sensors, transistors, energy harvesting devices, storage devices, to name just some.

Other options and alternatives are, of course, possible.

References for Background of the Invention and Specific Example 2

[1] H. Jang, Y. J. Park, X. Chen, T. Das, M. S. Kim, J. H. Ahn, Graphene-Based Flexible and Stretchable Electronics, Advanced Materials, 28 (2016) 4184-4202.

[2] H. Kizil, M. O. Pehlivaner, L. Trabzon, Surface Plasma Characterization of Polyimide Films for Flexible Electronics, Advanced Materials Research, 970 (2014) 132-135.

[3] A. R. Madaria, A. Kumar, F. N. Ishikawa, C. Zhou, Uniform, highly conductive, and patterned transparent films of a percolating silver nanowire network on rigid and flexible substrates using a dry transfer technique, Nano Research, 3 (2010) 564-573.

[4] G. Schwartz, B. C. K. Tee, J. Mei, A. L. Appleton, D. H. Kim, H. Wang, Z. Bao, Flexible polymer transistors with high pressure sensitivity for application in electronic skin and health monitoring, Nature Communications, 4 (2013) 1859.

[5] C. Wang, J.-C. Chien, K. Takei, T. Takahashi, J. Nah, A. M. Niknejad, A. Javey, Extremely Bendable, High-Performance Integrated Circuits Using Semiconducting Carbon Nanotube Networks for Digital, Analog, and Radio-Frequency Applications, Nano Letters, 12 (2012) 1527-1533.

[6] Y. Wang, R. Yang, Z. Shi, L. Zhang, D. Shi, E. Wang, G. Zhang, Super-Elastic Graphene Ripples for Flexible Strain Sensors, ACS Nano, 5 (2011) 3645-3650.

[7] F. E. Wiria, C. L. Tham, A. S. Subramanian, J. N. Tey, X. Qi, C. K. Cheng, B. Salam, Improving surface quality of polyethylene terephthalate film for large area flexible electronic applications, Journal of Solid State Electrochemistry, 20 (2016) 1895-1902.

[8] F. N. Ishikawa, H.-k. Chang, K. Ryu, P.-c. Chen, A. Badmaev, L. Gomez De Arco, G. Shen, C. Zhou, Transparent Electronics Based on Transfer Printed Aligned Carbon Nanotubes on Rigid and Flexible Substrates, ACS Nano, 3 (2009) 73-79.

[9] Y.-H. Lee, J.-S. Kim, J. Noh, I. Lee, H. J. Kim, S. Choi, J. Seo, S. Jeon, T.-S. Kim, J.-Y. Lee, J. W. Choi, Wearable Textile Battery Rechargeable by Solar Energy, Nano Letters, 13 (2013) 5753-5761.

[10] X. Pu, L. Li, H. Song, C. Du, Z. Zhao, C. Jiang, G. Cao, W. Hu, L. Wang Zhong, A Self-Charging Power Unit by Integration of a Textile Triboelectric Nanogenerator and a Flexible Lithium-Ion Battery for Wearable Electronics, Advanced Materials, 27 (2015) 2472-2478.

[11] Y. Zheng, Z. He, Y. Gao, J. Liu, Direct Desktop Printed-Circuits-on-Paper Flexible Electronics, Scientific Reports, 3 (2013) 1786.

[12] M. A. Ali, W. Hong, S. Oren, Q. Wang, Y. Wang, H. Jiang, L. Dong, Tunable bioelectrodes with wrinkled-ridged graphene oxide surfaces for electrochemical nitrate sensors, RSC Advances, 6 (2016) 67184-67195.

[13] S. Han, D. Wu, S. Li, F. Zhang, X. Feng, Porous Graphene Materials for Advanced Electrochemical Energy Storage and Conversion Devices, Advanced Materials, 26 (2013) 849-864.

[14] Y. H. Kim, S. J. Kim, Y.-J. Kim, Y.-S. Shim, S. Y. Kim, B. H. Hong, H. W. Jang, Self-Activated Transparent All-Graphene Gas Sensor with Endurance to Humidity and Mechanical Bending, ACS Nano, 9 (2015) 10453-10460.

[15] S. Lee, A. Reuveny, J. Reeder, S. Lee, H. Jin, Q. Liu, T. Yokota, T. Sekitani, T. Isoyama, Y. Abe, Z. Suo, T. Someya, A transparent bending-insensitive pressure sensor, Nature Nanotechnology, 11 (2016) 472.

[16] G. Lu, S. Park, K. Yu, R. S. Ruoff, L. E. Ocola, D. Rosenmann, J. Chen, Toward Practical Gas Sensing with Highly Reduced Graphene Oxide: A New Signal Processing Method To Circumvent Run-to-Run and Device-to-Device Variations, ACS Nano, 5 (2011) 1154-1164.

[17] Y. Pang, H. Tian, L. Tao, Y. Li, X. Wang, N. Deng, Y. Yang, T.-L. Ren, Flexible, Highly Sensitive, and Wearable Pressure and Strain Sensors with Graphene Porous Network Structure, ACS Applied Materials & Interfaces, 8 (2016) 26458-26462.

[18] S. J. Park, O. S. Kwon, S. H. Lee, H. S. Song, T. H. Park, J. Jang, Ultrasensitive Flexible Graphene Based Field-Effect Transistor (FET)-Type Bioelectronic Nose, Nano Letters, 12 (2012) 5082-5090.

[19] K. Sadasivuni Kishor, A. Kafy, L. Zhai, U. Ko Hyun, S. Mun, J. Kim, Transparent and Flexible Cellulose Nanocrystal/Reduced Graphene Oxide Film for Proximity Sensing, Small, 11 (2014) 994-1002.

[20] H. G. Sudibya, Q. He, H. Zhang, P. Chen, Electrical Detection of Metal Ions Using Field-Effect Transistors Based on Micropatterned Reduced Graphene Oxide Films, ACS Nano, 5 (2011) 1990-1994.

[21] C. Lee, X. Wei, J. W. Kysar, J. Hone, Measurement of the Elastic Properties and Intrinsic Strength of Monolayer Graphene, Science, 321 (2008) 385.

[22] K. Xu, K. Wang, W. Zhao, W. Bao, E. Liu, Y. Ren, M. Wang, Y. Fu, J. Zeng, Z. Li, W. Zhou, F. Song, X. Wang, Y. Shi, X. Wan, M. S. Fuhrer, B. Wang, Z. Qiao, F. Miao, D. Xing, The positive piezoconductive effect in graphene, Nature Communications, 6 (2015) 8119.

[23] M. Amjadi, K.-U. Kyung, I. Park, M. Sitti, Stretchable, Skin-Mountable, and Wearable Strain Sensors and Their Potential Applications: A Review, Advanced Functional Materials, 26 (2016) 1678-1698.

[24] H. Ho Dong, Q. Sun, Y. Kim So, T. Han Joong, H. Kim Do, H. Cho Jeong, Stretchable and Multimodal All Graphene Electronic Skin, Advanced Materials, 28 (2016) 2601-2608.

[25] C. Hou, H. Wang, Q. Zhang, Y. Li, M. Zhu, Highly Conductive, Flexible, and Compressible All-Graphene Passive Electronic Skin for Sensing Human Touch, Advanced Materials, 26 (2014) 5018-5024.

[26] Y. Jiao, C. W. Young, S. Yang, S. Oren, H. Ceylan, S. Kim, K. Gopalakrishnan, P. C. Taylor, L. Dong, Wearable Graphene Sensors With Microfluidic Liquid Metal Wiring for Structural Health Monitoring and Human Body Motion Sensing, IEEE Sensors Journal, 16 (2016) 7870-7875.

[27] M. S. Mannoor, H. Tao, J. D. Clayton, A. Sengupta, D. L. Kaplan, R. R. Naik, N. Verma, F. G. Omenetto, M. C. McAlpine, Graphene-based wireless bacteria detection on tooth enamel, Nature Communications, 3 (2012) 763.

[28] T. T. Tung, M. Castro, T. Y. Kim, K. S. Suh, J.-F. Feller, Graphene quantum resistive sensing skin for the detection of alteration biomarkers, Journal of Materials Chemistry, 22 (2012) 21754-21766.

[29] C. Wu, J. Feng, L. Peng, Y. Ni, H. Liang, L. He, Y. Xie, Large-area graphene realizing ultrasensitive photothermal actuator with high transparency: new prototype robotic motions under infrared-light stimuli, Journal of Materials Chemistry, 21 (2011) 18584-18591.

[30] K. S. Novoselov, A. K. Geim, S. V. Morozov, D. Jiang, Y. Zhang, S. V. Dubonos, I. V. Grigorieva, A. A. Firsov, Electric Field Effect in Atomically Thin Carbon Films, Science, 306 (2004) 666.

[31] L. Wang, J. Yu, Y. Zhang, H. Yang, L. Miao, Y. Song, Simple and Large-Scale Strategy to Prepare Flexible Graphene Tape Electrode, ACS Applied Materials & Interfaces, 9 (2017) 9089-9095.

[32] S. Lee Joong, H. Kim Nam, S. Kang Moon, H. Yu, R. Lee Dong, H. Oh Joon, T. Chang Suk, H. Cho Jeong, Wafer-Scale Patterning of Reduced Graphene Oxide Electrodes by Transfer-and-Reverse Stamping for High Performance OFETs, Small, 9 (2013) 2817-2825.

[33] Q. He, H. G. Sudibya, Z. Yin, S. Wu, H. Li, F. Boey, W. Huang, P. Chen, H. Zhang, Centimeter-Long and Large-Scale Micropatterns of Reduced Graphene Oxide Films: Fabrication and Sensing Applications, ACS Nano, 4 (2010) 3201-3208.

[34] S. Oren, H. Ceylon, P. S. Schnable, L. Dong, High-Resolution Patterning and Transferring of Graphene-Based Nanomaterials onto Tape toward Roll-to-Roll Production of Tape-Based Wearable Sensors, Advanced Materials Technologies, 2 (2017). (incorporated by reference herein)

[35] B. Aleman, W. Regan, S. Aloni, V. Altoe, N. Alem, C. Girit, B. Geng, L. Maserati, M. Crommie, F. Wang, A. Zettl, Transfer-Free Batch Fabrication of Large-Area Suspended Graphene Membranes, ACS Nano, 4 (2010) 4762-4768.

[36] S.-H. Bae, Y. Lee, B. K. Sharma, H.-J. Lee, J.-H. Kim, J.-H. Ahn, Graphene-based transparent strain sensor, Carbon, 51 (2013) 236-242.

[37] M. Hofmann, Y.-P. Hsieh, A. L. Hsu, J. Kong, Scalable, flexible and high resolution patterning of CVD graphene, Nanoscale, 6 (2014) 289-292.

[38] D. Kuzum, H. Takano, E. Shim, J. C. Reed, H. Juul, A. G. Richardson, J. de Vries, H. Bink, M. A. Dichter, T. H. Lucas, D. A. Coulter, E. Cubukcu, B. Litt, Transparent and flexible low noise graphene electrodes for simultaneous electrophysiology and neuroimaging, Nature Communications, 5 (2014) 5259.

[39] X. Li, W. Cai, J. An, S. Kim, J. Nah, D. Yang, R. Piner, A. Velamakanni, I. Jung, E. Tutuc, S. K. Banerjee, L. Colombo, R. S. Ruoff, Large-Area Synthesis of High-Quality and Uniform Graphene Films on Copper Foils, Science, 324 (2009) 1312.

[40] A. M. H. Ng, Y. Wang, W. C. Lee, C. T. Lim, K. P. Loh, H. Y. Low, Patterning of graphene with tunable size and shape for microelectrode array devices, Carbon, 67 (2014) 390-397.

[41] K. Yong, A. Ashraf, P. Kang, S. Nam, Rapid Stencil Mask Fabrication Enabled One-Step Polymer-Free Graphene Patterning and Direct Transfer for Flexible Graphene Devices, Scientific Reports, 6 (2016) 24890.

[42] L. Zhang, S. Diao, Y. Nie, K. Yan, N. Liu, B. Dai, Q. Xie, A. Reina, J. Kong, Z. Liu, Photocatalytic Patterning and Modification of Graphene, Journal of the American Chemical Society, 133 (2011) 2706-2713.

[43] C. M. Weber, C. N. Berglund, P. Gabella, Mask Cost and Profitability in Photomask Manufacturing: An Empirical Analysis, IEEE Transactions on Semiconductor Manufacturing, 19 (2006) 465-474.

[44] J. Hyun Woo, B. Secor Ethan, C. Hersam Mark, C. D. Frisbie, F. Francis Lorraine, High-Resolution Patterning of Graphene by Screen Printing with a Silicon Stencil for Highly Flexible Printed Electronics, Advanced Materials, 27 (2014) 109-115.

[45] N. E. Sanjana, S. B. Fuller, A fast flexible ink-jet printing method for patterning dissociated neurons in culture, Journal of Neuroscience Methods, 136 (2004) 151-163.

[46] B. Secor Ethan, S. Lim, H. Zhang, C. D. Frisbie, F. Francis Lorraine, C. Hersam Mark, Gravure Printing of Graphene for Large-area Flexible Electronics, Advanced Materials, 26 (2014) 4533-4538.

[47] M. F. El-Kady, R. B. Kaner, Scalable fabrication of high-power graphene micro-supercapacitors for flexible and on-chip energy storage, Nature Communications, 4 (2013) 1475.

[48] J. Lin, Z. Peng, Y. Liu, F. Ruiz-Zepeda, R. Ye, E. L. G. Samuel, M. J. Yacaman, B. I. Yakobson, J. M. Tour, Laser-induced porous graphene films from commercial polymers, Nature Communications, 5 (2014) 5714.

[49] B. Senyuk, N. Behabtu, A. Martinez, T. Lee, D. E. Tsentalovich, G. Ceriotti, J. M. Tour, M. Pasquali, I. I. Smalyukh, Three-dimensional patterning of solid microstructures through laser reduction of colloidal graphene oxide in liquid-crystalline dispersions, Nature Communications, 6 (2015) 7157.

[50] H. Tian, Y. Shu, Y.-L. Cui, W.-T. Mi, Y. Yang, D. Xie, T.-L. Ren, Scalable fabrication of high-performance and flexible graphene strain sensors, Nanoscale, 6 (2014) 699-705.

[51] H. Tian, Y. Shu, X.-F. Wang, M. A. Mohammad, Z. Bie, Q.-Y. Xie, C. Li, W.-T. Mi, Y. Yang, T.-L. Ren, A Graphene-Based Resistive Pressure Sensor with Record-High Sensitivity in a Wide Pressure Range, Scientific Reports, 5 (2015) 8603.

[52] Y. Aleeva, B. Pignataro, Recent advances in upscalable wet methods and ink formulations for printed electronics, Journal of Materials Chemistry C, 2 (2014) 6436-6453.

[53] X. Zhou, F. Boey, F. Huo, L. Huang, H. Zhang, Chemically Functionalized Surface Patterning, Small, 7 (2011) 2273-2289.

[54] M. Beidaghi, C. Wang, Micro-Supercapacitors Based on Interdigital Electrodes of Reduced Graphene Oxide and Carbon Nanotube Composites with Ultrahigh Power Handling Performance, Advanced Functional Materials, 22 (2012) 4501-4510.

[55] E. B. Secor, P. L. Prabhumirashi, K. Puntambekar, M. L. Geier, M. C. Hersam, Inkjet Printing of High Conductivity, Flexible Graphene Patterns, The Journal of Physical Chemistry Letters, 4 (2013) 1347-1351.

[56] M. Singh, M. Haverinen Hanna, P. Dhagat, E. Jabbour Ghassan, Inkjet Printing-Process and Its Applications, Advanced Materials, 22 (2009) 673-685.

[57] J. A. Hondred, L. R. Stromberg, C. L. Mosher, J. C. Claussen, High-Resolution Graphene Films for Electrochemical Sensing via Inkjet Maskless Lithography, ACS Nano, (2017).

[58] S. R. Das, Q. Nian, A. A. Cargill, J. A. Hondred, S. Ding, M. Saei, G. J. Cheng, J. C. Claussen, 3D nanostructured inkjet printed graphene via UV-pulsed laser irradiation enables paper-based electronics and electrochemical devices, Nanoscale, 8 (2016) 15870-15879. (incorporated by reference herein)

[59] K.-Y. Shin, J.-Y. Hong, J. Jang, Micropatterning of Graphene Sheets by Inkjet Printing and Its Wideband Dipole-Antenna Application, Advanced Materials, 23 (2011) 2113-2118.

[60] F. Torrisi, T. Hasan, W. Wu, Z. Sun, A. Lombardo, T. S. Kulmala, G.-W. Hsieh, S. Jung, F. Bonaccorso, P. J. Paul, D. Chu, A. C. Ferrari, Inkjet-Printed Graphene Electronics, ACS Nano, 6 (2012) 2992-3006.

[61] B. Secor Ethan, Y. Ahn Bok, Z. Gao Theodore, A. Lewis Jennifer, C. Hersam Mark, Rapid and Versatile Photonic Annealing of Graphene Inks for Flexible Printed Electronics, Advanced Materials, 27 (2015) 6683-6688.

[62] K.-Y. Shin, J.-Y. Hong, J. Jang, Flexible and transparent graphene films as acoustic actuator electrodes using inkjet printing, Chemical Communications, 47 (2011) 8527-8529.

For additional details about such things as flexible substrates, different types of 3D microcircuit patterns, mass production techniques such as tape-to-roll, and applications such as strain sensors see, the following resources, each of which is inocrporated by reference herein:

Hassani, Biodegradable Nanofibrous Polymeric Substrates for Generating Elastic and Flexible Electronics, Adv. Mater., 2014, 26, 5832-5830.

Jung et al., High-performance green flexible electronics based on biodegradable cellulose nanofibril paper, Nature Communications, 6, Article number: 7170 (2015)

S. R. Das, Q. Nian, A. A. Cargill, J. A. Hondred, S. Ding, M. Saei, G. J. Cheng, J. C. Claussen, 3D nanostructured inkjet printed graphene via UV-pulsed laser irradiation enables paper-based electronics and electrochemical devices, Nanoscale, 8 (2016) 15870-15879.

Das, et al., Superhydrophobic inkjet printed flexible graphene circuits via direct-pulsed laser writing, Nanoscale, 2017, 9, 19058-19065

S. Oren, H. Ceylon, P. S. Schnable, L. Dong, High-Resolution Patterning and Transferring of Graphene-Based Nanomaterials onto Tape toward Roll-to-Roll Production of Tape-Based Wearable Sensors, Advanced Materials Technologies, 2 1700223 (14 pages)(2017).

Han et al., Multiscale nanowire-microfluidic hybrid strain sensors with high sensitivity and stretchability, Flexible Electronics (2018) 16 (10 pages)

What is claimed is:

1. A method of fabricating a 2D or 3D conductive pattern or circuit in a substrate having a length, width, and thickness including but not limited to millimeter and micrometer scales without requiring post-processing steps comprising:
    a. providing a substrate with a predetermined pattern or circuit of three-dimensional structural features in the thickness of the substrate to create three-dimensional open or closed microchannels in directions of any of the length, width, and thickness of the substrate, the microchannels having surfaces; and
    b. coating at least some of said microchannel surfaces of selected said microchannels by:
        i. controlling flow of a liquid comprising viscous or solution-form carbon-based conductive materials or nano-materials, through the selected said microchannels to control filling of the selected channels with the liquid by one or more of:
            1. flow direction;
            2. flow volume;
            3. flow rate;
            4. concentration of particles in the solution;
            5. size of the particles in the solution;
            6. solution viscosity;
            7. capillary action; and
        ii. adhering the electrically-conductive components of the liquid at a controlled thickness and coverage of the surfaces of the selected said microchannels;
    c. without needing any postprocessing using chemicals or lasers or use of elevated temperatures;
further comprising transferring the conductive three-dimensional pattern or circuit to a second substrate by:
    a. placing a polymer solution over the conductive three-dimensional pattern;
    b. curing the polymer solution in place to;
        i. create a second substrate;
        ii. promote adherence of the conductive three-dimensional pattern to the second substrate;
    c. transferring the conductive three-dimensional pattern to the second substrate by separating the second substrate from the first substrate.

2. The method of claim 1 wherein the substrate with a predetermined pattern or circuit is at least one of:
    a. flexible;
    b. non-flexible;
    c. solid;
    d. rigid;
    e. non-porous;
    f. porous;
    g. nondegradable;
    h. degradable;
    i. stretchable; and
    j. hydrogel.

3. The method of claim 2 wherein the predetermined pattern
    a. in a said non-flexible substrate is created by one of:
        i. machining;
        ii. photolithography;
        iii. laser etching; or
        iv. deep reactive ion etching; or
    b. in flexible substrates by:
        i. formation in flexible polymers without molds.

4. The method of claim 3 wherein the non-flexible substrate comprises:
    a. silicon wafer;
    b. Teflon;
    c. Delrin;
    d. glass;
    e. wafer;
    f. metal; or
    g. biodegradable or non-biodegradable polymer based material.

5. The method of claim 1 wherein the predetermined pattern or circuit is created by:
    a. creating a mold comprising:
        i. a material capable of high resolution forming of three-dimensional microstructural features with heights, widths, and thicknesses on the order of several tens of micrometers to several hundreds of micrometers, the material comprising:
            1. silicon;
            2. Teflon;
            3. superhydrophobic material; or
            4. glass, metal or Delrin, and
    b. transferring from the mold to the substrate a negative of the three-dimensional microstructural features of the mold to create the microchannels.

6. The method of claim 5 wherein the substrate comprises a film of a natural or synthetic polymeric material having preselected material properties comprising one or more of:
    a. flexibility;
    b. porosity in the approximate range of 1% to 90%;
    c. biodegradability;
    d. biocompatibility;
    e. mechanical properties including porosity, pore size, and elasticity; and
    f. 3D microstructure.

7. The method of claim 6 wherein the natural or synthetic polymeric material comprises:
    a. gelatin;
    b. collagen;
    c. chitosan;
    d. alginate;
    e. PVA;
    f. PLLA;
    g. PLGA;
    h. whey protein isolate;
    i. cellulose acetate;
    j. polysulfone; or
    k. polystyrene.

8. The method of claim 1 wherein the predetermined pattern is created by forming a pair of films, each with a predetermined pattern in a patterned surface and sandwiching the films with patterned surfaces of each facing one another.

9. The method of claim 8 wherein the patterns on each patterned surface of each film are predetermined to form three-dimensional microchannels relative to the length, width, and thickness of the sandwiched pair of films, including some at least partially closed microchannels or formation of close patterns directly within a 3D hydrogel structure (via 3D printing or injection molding) and filling of these close patterns with conductive solution via microfluidic approach.

10. The method of claim 1 wherein the liquid comprises:
   a. a solution of a solvent and a solute comprising an adjustable concentration of electrically conductive particles.

11. The method of claim 10 wherein the electrically-conductive particles are graphene-based.

12. The method of claim 1 wherein the liquid comprises:
   a. liquid metal or metal nanoparticles dispersed in a solvent; or
   b. carbon nanotubes or nanofibers.

13. The method of claim 11 wherein the graphene-based conductive components are preprocessed prior to the step of coating the substrate by one or more of:
   a. heating or annealing at a temperature and for a time period;
   b. sonicating; and
   c. cooling;
at predetermined temperatures and time periods and whether in solution or not, or in powder form or not to tune the coating relative to different electrical, mechanical, or microstructural properties.

14. The method of claim 1 wherein the controlling flow comprises one or more of:
   a. adjusting flow rate;
   b. adjusting flow volume;
   c. promoting capillary action;
   d. at room temperature; and
   e. without post processing.

15. The method of claim 1 wherein the controlling flow comprises a microfluidic system adapted to pump, push, or guide the liquid into said selected channels at the controllable direction, volume, rate, number of passes, and concentration.

16. The method of claim 1 wherein the microchannels are only partially filled.

17. The method of claim 1 further comprising:
   a. coating or adhering another substance over the coating.

18. The method of claim 17 wherein the another substance comprises:
   a. biological cells.

19. The method of claim 1 further comprising using the fabricated conductive pattern in the film for one of:
   a. flexible electronics;
   b. biomedical implants;
   c. biomedical cell interfaces;
   d. biosensors;
   e. sensors;
   f. portable energy harvesting;
   g. electronic skin; or
   h. wearable devices.

20. A method of fabricating a 2D or 3D conductive pattern or circuit in a substrate having a length, width, and thickness including but not limited to millimeter and micrometer scales without requiring post-processing steps comprising:
   a. providing a substrate with a predetermined pattern or circuit of three-dimensional structural features in the thickness of the substrate to create three-dimensional open or closed microchannels in directions of any of the length, width, and thickness of the substrate, the microchannels having surfaces; and
   b. coating at least some of said microchannel surfaces of selected said microchannels by:
      i. controlling flow of a liquid comprising viscous or solution-form carbon-based conductive materials or nano-materials, through the selected said microchannels to control filling of the selected channels with the liquid by one or more of:
         1. flow direction;
         2. flow volume;
         3. flow rate;
         4. concentration of particles in the solution;
         5. size of the particles in the solution;
         6. solution viscosity;
         7. capillary action; and
      ii. adhering the electrically-conductive components of the liquid at a controlled thickness and coverage of the surfaces of the selected said microchannels;
   c. without needing any postprocessing using chemicals or lasers or use of elevated temperatures;
wherein the predetermined pattern or circuit is created by:
   a. creating a mold comprising:
      i. a material capable of high resolution forming of three-dimensional microstructural features with heights, widths, and thicknesses on the order of several tens of micrometers to several hundreds of micrometers, the material comprising:
         1. silicon;
         2. Teflon;
         3. Superhydrophobic material; or
         4. glass, metal or Delrin, and
   b. transferring from the mold to the substrate a negative of the three-dimensional microstructural features of the mold to create the microchannels;
wherein the substrate comprises a film of a natural or synthetic polymeric material having preselected material properties comprising one or more of:
   a. flexibility;
   b. porosity in the approximate range of 1% to 90%;
   c. biodegradability;
   d. biocompatibility;
   e. mechanical properties including porosity, pore size, and elasticity; and
   f. 3D microstructure; and
wherein the film is formed by:
   a. casting a precursor solution onto the mold by direct pouring, drop casting, or spin casting;
   b. dry phase inversion or pore forming agent leaching; and
   c. removal from the mold.

21. A method of fabricating a 2D or 3D conductive pattern or circuit in a substrate having a length, width, and thickness including but not limited to millimeter and micrometer scales without requiring post-processing steps comprising:
   a. providing a substrate with a predetermined pattern or circuit of three-dimensional structural features in the thickness of the substrate to create three-dimensional open or closed microchannels in directions of any of the length, width, and thickness of the substrate, the microchannels having surfaces; and
   b. coating at least some of said microchannel surfaces of selected said microchannels by:
      i. controlling flow of a liquid comprising viscous or solution-form carbon-based conductive materials or nano-materials, through the selected said microchannels to control filling of the selected channels with the liquid by one or more of:
         1. flow direction;
         2. flow volume;
         3. flow rate;
         4. concentration of particles in the solution;
         5. size of the particles in the solution;
         6. solution viscosity;
         7. capillary action; and ii. adhering the electrically-conductive components of the liquid at a controlled thickness and coverage of the surfaces of the selected said microchannels;
c. without needing any postprocessing using chemicals or lasers or use of elevated temperatures;
wherein the liquid comprises:
  a. a solution of a solvent and a solute comprising an adjustable concentration of electrically conductive particles; and
wherein:
  a. the solute of electrically conductive particles comprises:
    i. graphene nanoplatelets, graphene flakes, carbon nanotubes, or combinations of them; or
    ii. conductive metal particle-based enhancements of graphene-based particles in solution at different ratios;
  b. the solvent comprises:
    i. alcohol; or
    ii. water; and
  c. the concentration of solute to solvent comprises in the approximate range of 30% to 90%.

22. A method of fabricating a 2D or 3D conductive pattern or circuit in a substrate having a length, width, and thickness including but not limited to millimeter and micrometer scales without requiring post-processing steps comprising:
  a. providing a substrate with a predetermined pattern or circuit of three-dimensional structural features in the thickness of the substrate to create three-dimensional open or closed microchannels in directions of any of the length, width, and thickness of the substrate, the microchannels having surfaces; and
  b. coating at least some of said microchannel surfaces of selected said microchannels by:
    i. controlling flow of a liquid comprising viscous or solution-form carbon-based conductive materials or nano-materials, through the selected said microchannels to control filling of the selected channels with the liquid by one or more of:
      1. flow direction;
      2. flow volume;
      3. flow rate;
      4. concentration of particles in the solution;
      5. size of the particles in the solution;
      6. solution viscosity;
      7. capillary action; and
    ii. adhering the electrically-conductive components of the liquid at a controlled thickness and coverage of the surfaces of the selected said microchannels;
  c. without needing any postprocessing using chemicals or lasers or use of elevated temperatures;
wherein the liquid comprises:
  a. a solution of a solvent and a solute comprising an adjustable concentration of electrically conductive particles;
wherein the electrically-conductive particles are graphene-based; and
wherein the concentration comprises 20 mg/mL graphene nanoplatelets in 70% ethanol.

23. A method of fabricating a 2D or 3D conductive pattern or circuit in a substrate having a length, width, and thickness including but not limited to millimeter and micrometer scales without requiring post-processing steps comprising:
  a. providing a substrate with a predetermined pattern or circuit of three-dimensional structural features in the thickness of the substrate to create three-dimensional open or closed microchannels in directions of any of the length, width, and thickness of the substrate, the microchannels having surfaces; and
  b. coating at least some of said microchannel surfaces of selected said microchannels by:
    i. controlling flow of a liquid comprising viscous or solution-form carbon-based conductive materials or nano-materials, through the selected said microchannels to control filling of the selected channels with the liquid by one or more of:
      1. flow direction;
      2. flow volume;
      3. flow rate;
      4. concentration of particles in the solution;
      5. size of the particles in the solution;
      6. solution viscosity;
      7. capillary action; and
    ii. adhering the electrically-conductive components of the liquid at a controlled thickness and coverage of the surfaces of the selected said microchannels;
  c. without needing any postprocessing using chemicals or lasers or use of elevated temperatures; and
wherein the coating comprises on the order of 10 $\mu g/cm^2$ on the surfaces.

24. A method of fabricating a 2D or 3D conductive pattern or circuit in a substrate having a length, width, and thickness including but not limited to millimeter and micrometer scales without requiring post-processing steps comprising:
  a. providing a substrate with a predetermined pattern or circuit of three-dimensional structural features in the thickness of the substrate to create three-dimensional open or closed microchannels in directions of any of the length, width, and thickness of the substrate, the microchannels having surfaces; and
  b. coating at least some of said microchannel surfaces of selected said microchannels by:
    i. controlling flow of a liquid comprising viscous or solution-form carbon-based conductive materials or nano-materials, through the selected said microchannels to control filling of the selected channels with the liquid by one or more of:
      1. flow direction;
      2. flow volume;
      3. flow rate;
      4. concentration of particles in the solution;
      5. size of the particles in the solution;
      6. solution viscosity;
      7. capillary action; and
    ii. adhering the electrically-conductive components of the liquid at a controlled thickness and coverage of the surfaces of the selected said microchannels;
  c. without needing any postprocessing using chemicals or lasers or use of elevated temperatures; and
wherein the coating comprises on the order of 20 $\mu m$ in thickness.

25. A flexible electronic device made according to a process comprising:
  a. a substrate with a high resolution two- or three-dimensional millimeter or micrometer scale pattern, the high-resolution pattern comprising channels in the substrate;
  b. filling selected said channels with a viscous or solution-form material which includes electrically-conductive content at a controlled concentration and flow rate;
  c. at least partially coating the selected channels to create conductive pathways; and
  d. adding electrical connection points to the conductive pathways adapted for connection to an electrical circuit wherein the substrate comprises one or more of the following properties:
  a. flexible;
  b. non-flexible;
  c. solid;
  d. rigid;
  e. non-porous;
  f. porous;
  g. nondegradable; and
  h. degradable,
wherein if flexible, the flexible substrate is a film comprises a natural or synthetic polymeric material having preselected material properties comprising one or more of:
  a. flexibility;
  b. porosity;
  c. biodegradability;
  d. biocompatibility;
  e. planar form factor; and
  f. non-planar form factor; and
wherein the film comprises 10% PLLA in chloroform and is formed by:
  a. casting onto the mold;
  b. dry phase inversion or pore forming agent leaching; and
  c. removal from the mold.

26. A flexible electronic device made according to a process comprising:
  a. a substrate with a high resolution two- or three-dimensional millimeter or micrometer scale pattern, the high-resolution pattern comprising channels in the substrate;
  b. filling selected said channels with a viscous or solution-form material which includes electrically-conductive content at a controlled concentration and flow rate;
  c. at least partially coating the selected channels to create conductive pathways; and
  d. adding electrical connection points to the conductive pathways adapted for connection to an electrical circuit and wherein the electrically-conductive content comprises:
  a. a graphene nanoplatelet solution comprising approximately 20 mg/1 mL in 70% ETOH.

27. The device of claim 25 wherein the electrically conductive content comprises liquid metal.

28. The device of claim 25 adapted for:
  a. flexible electronics;
  b. bioimplants;
  c. biosensors;
  d. sensors and interfaces;
  e. hand-held electronics;
  f. low cost electronics including but not limited to toys and games, or
  g. near field communications or RFID antennas and applications.

29. A system for fabricating 2D or 3D milli- or micro scale circuits on a substrate comprising:
  a. a pre-fabricated substrate having a predetermined pattern or circuit of three-dimensional channels;
  b. a supply of pre-configured liquid having pre-processed electrical properties;
  c. a microfluidic subsystem in fluid communication with the supply of the liquid;
  d. a manipulator to position the substrate relative the fluidic subsystem; and
  e. a controller for controlling flow rate from the supply of the pre-configured liquid by the fluidic subsystem into selected said channels to coat at least partially the selected channels.

30. The system of claim 29 wherein the substrate comprises a natural or synthetic polymer.

31. The system of claim 29 wherein the liquid comprises:
  a. a solution of a solvent and a solute of conductive particles; or
  b. a liquid metal or metal nanoparticles in a solvent.

32. The system of claim 31 wherein the solution comprises carbon-based particles, including but not limited to graphene-based particles.

* * * * *